US012545697B2

(12) United States Patent
Chen et al.

(10) Patent No.: US 12,545,697 B2
(45) Date of Patent: Feb. 10, 2026

(54) METAL COMPLEX AND USE THEREOF

(71) Applicant: SICHUAN AG-RAY NEW MATERIALS CO., LTD, Meishan (CN)

(72) Inventors: Shaofu Chen, Foshan (CN); Liangliang Yan, Foshan (CN); Lei Dai, Foshan (CN); Lifei Cai, Foshan (CN)

(73) Assignee: SICHUAN AG-RAY NEW MATERIALS CO., LTD, Meishan (CN)

( * ) Notice: Subject to any disclaimer, the term of this patent is extended or adjusted under 35 U.S.C. 154(b) by 421 days.

(21) Appl. No.: 18/031,132

(22) PCT Filed: Aug. 23, 2021

(86) PCT No.: PCT/CN2021/113932
§ 371 (c)(1),
(2) Date: Apr. 10, 2023

(87) PCT Pub. No.: WO2022/088873
PCT Pub. Date: May 5, 2022

(65) Prior Publication Data

US 2023/0389408 A1 Nov. 30, 2023

(30) Foreign Application Priority Data

Oct. 29, 2020 (CN) ......................... 202011178409.4

(51) Int. Cl.
*H10K 85/30* (2023.01)
*C07F 15/00* (2006.01)
(Continued)

(52) U.S. Cl.
CPC .......... *C07F 15/0086* (2013.01); *C09K 11/06* (2013.01); *H10K 50/17* (2023.02);
(Continued)

(58) Field of Classification Search
CPC ................. C07F 15/0086; C09K 11/06; C09K 2211/1033; C09K 2211/1037;
(Continued)

(56) References Cited

U.S. PATENT DOCUMENTS 8,772,485 B2 7/2014 Che et al.
8,877,353 B2 * 11/2014 Che ...................... C07D 213/30 428/917

(Continued)

FOREIGN PATENT DOCUMENTS

CN 103097395 A 5/2013
CN 104245713 A 12/2014

(Continued)

*Primary Examiner* — Ermias T Woldegeorgis
(74) *Attorney, Agent, or Firm* — Maschoff Brennan

(57) ABSTRACT

The present disclosure relates to a metal complex and use thereof. The metal complex has a structure as shown in a formula (1). The metal complex provided by the present disclosure has advantages of good optical, electrical and thermal stability, high luminous efficiency, long service life, high color saturation and the like, can be used in an organic light-emitting device, particularly can be used as a green light-emitting phosphorescent material, and is possible to be used in the active-matrix organic light-emitting diode (AMOLED) industry.

(Continued)

Formula (1)

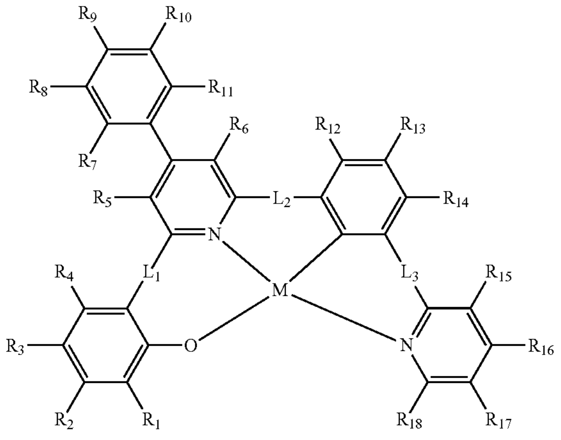

20 Claims, 2 Drawing Sheets

(51) Int. Cl.

| | |
|---|---|
| ***C09K 11/06*** | (2006.01) |
| ***H10K 50/17*** | (2023.01) |
| ***H10K 59/80*** | (2023.01) |
| ***H10K 85/00*** | (2023.01) |
| *H10K 50/12* | (2023.01) |

(52) U.S. Cl.

CPC ........... *H10K 59/875* (2023.02); *H10K 85/00* (2023.02); *H10K 85/342* (2023.02); *C09K 2211/1033* (2013.01); *C09K 2211/1037* (2013.01); *C09K 2211/185* (2013.01); *H10K 50/12* (2023.02)

(58) Field of Classification Search

CPC ............. C09K 2211/185; H10K 50/17; H10K 59/875; H10K 85/00; H10K 85/342; H10K 50/12; H10K 50/11; H10K 85/654; H10K 85/6572; H10K 2101/10; H10K 2101/90; H10K 85/346

See application file for complete search history.

(56) References Cited

U.S. PATENT DOCUMENTS

| | | | | |
|---|---|---|---|---|
| 9,783,564 | B2 * | 10/2017 | Kottas | C07F 15/0006 |
| 11,011,711 | B2 * | 5/2021 | Kim | C07F 15/0086 |
| 2006/0134461 | A1 * | 6/2006 | Huo | C09K 11/06 313/506 |
| 2012/0018711 | A1 * | 1/2012 | Che | C07D 213/30 257/E51.026 |
| 2018/0062088 | A1 * | 3/2018 | Cho | C07F 15/0086 |
| 2018/0141969 | A1 | 5/2018 | Hwang et al. | |
| 2018/0233679 | A1 | 8/2018 | Baik et al. | |
| 2021/0332290 | A1 | 10/2021 | Peng et al. | |

FOREIGN PATENT DOCUMENTS

| | | | | |
|---|---|---|---|---|
| CN | 107056844 A | | 8/2017 | |
| CN | 110872325 A | | 3/2020 | |
| WO | WO-2005042444 A2 | * | 5/2005 | H05B 33/14 |
| WO | WO-2012009957 A1 | * | 1/2012 | C07F 17/02 |
| WO | WO-2019128895 A1 | * | 7/2019 | C09K 11/06 |
| WO | WO-2020134569 A1 | * | 7/2020 | C09K 11/06 |

* cited by examiner

METAL COMPLEX AND USE THEREOF

TECHNICAL FIELD

The present disclosure relates to the technical field of organic electroluminescence, particularly relates to the technical field of organic electroluminescent devices, and especially relates to a metal complex and use thereof in an organic electroluminescent device.

BACKGROUND

At present, as a new-generation display technology, an organic electroluminescent device (OLED) has attracted more and more attention in display and lighting technologies, and thus has a wide use prospect. However, compared with market use requirements, performances of luminous efficiency, driving voltage, service life, etc. of the OLED still need to be continuously strengthened and improved.

In generally, the OLED includes various organic functional material thin films with different functions sandwiched between metal electrodes as a basic structure, which is similar to a sandwich structure. Under driving of a current, a hole and an electron are injected from a cathode and an anode separately. After moving a certain distance, the hole and the electron are compounded in a light-emitting layer, and then released in a form of light or heat to achieve luminescence of the OLED. However, organic functional materials are core components of the OLED. Thermal stability, photochemical stability, electrochemical stability, quantum yield, film-forming stability, crystallinity, color saturation, etc. of the materials are main factors affecting performances of the device.

Generally, the organic functional materials comprise a fluorescent material and a phosphorescent material. The fluorescent material is usually an organic small molecule material and generally can only utilize 25% of singlet excitons to emit light, such that the luminous efficiency is low. However, the phosphorescent material can utilize an energy of 75% triplet excitons in addition to 25% of singlet excitons due to a spin-orbit coupling effect caused by a heavy atom effect, such that the luminous efficiency can be improved. However, compared to the fluorescent material, the phosphorescent material starts relatively late. Besides, thermal stability, service life, color saturation, etc. of the material are all expected to be improved, which is a challenging issue. In the prior art, various metallo-organic compounds have been developed as such phosphorescent material. However, the market still expects to further improve a development of a new material that can further improve performances of the organic electroluminescent device.

SUMMARY

The present disclosure provides a high-performance organic electroluminescent device and a novel material that can obtain such an organic electroluminescent device.

The present inventors have made intensive studies to achieve the above objective repeatedly. As a result, it is found that a high-performance organic electroluminescent device can be obtained by using a metal complex containing a structure represented by the following formula (1) as a ligand.

One of the objectives of the present disclosure is to provide a metal complex. The metal complex has advantages of a relatively low sublimation temperature, high light and electrochemical stability, a high color saturation, a high luminous efficiency, a long service life of the device and the like, and can be used in the organic electroluminescent device. Especially, as a green light-emitting dopant, the metal complex has the potential to be used in the OLED industry.

A metal complex, having a structure as shown in a formula (1), formula (1)

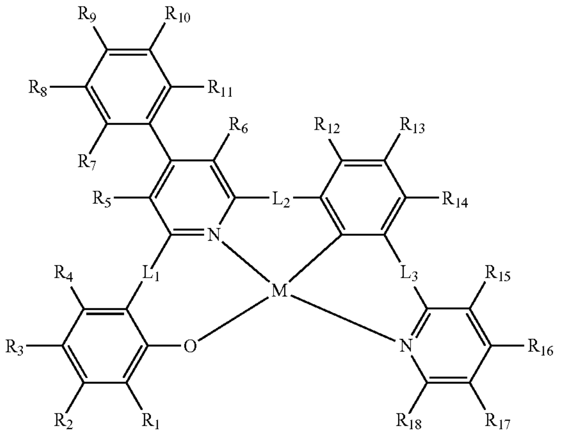

wherein at least one of the $R_1$-$R_{18}$ has a structure shown in a formula (2), formula (2)

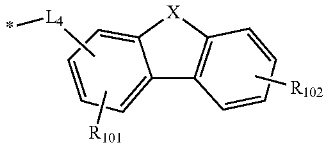

where

* represents a position of a linkage to the formula (1);

M is independently Pt or Pd;

X independently represents O, S, Se, and CRaRb;

$L_1$-$L_3$ are each independently selected from a direct bonding single bond, O, S, Se, NRc, CRdRe, SO, SO2, and PO (Rf) (Rg);

$L_4$ is a single bond, O, substituted or unsubstituted $C_1$-$C_{20}$ alkylene, substituted or unsubstituted $C_3$-$C_{30}$ cycloalkylene, substituted or unsubstituted $C_1$-$C_{20}$ heteroalkylene, substituted or unsubstituted $C_7$-$C_{30}$ aralkylene, substituted or unsubstituted $C_2$-$C_{20}$ alkenylene, substituted or unsubstituted $C_3$-$C_{30}$ alkylidenesilyl, substituted or unsubstituted $C_6$-$C_{30}$ arylene, substituted or unsubstituted $C_3$-$C_{30}$ heteroarylene, substituted or unsubstituted $C_3$-$C_{30}$ arylenesilyl, or substituted or unsubstituted $C_0$-$C_{20}$ imino; and the remaining $R_1$-$R_{18}$, $R_{101}$-$R_{102}$, and $R_a$-$R_g$ are independently selected from hydrogen, deuterium, halogen, substituted or unsubstituted $C_1$-$C_{20}$ alkyl, substituted or unsubstituted $C_3$-$C_{30}$ cycloalkyl, substituted or unsubstituted $C_1$-$C_{20}$ heteroalkyl, substituted or unsubstituted $C_7$-$C_{30}$ aralkyl, substituted or unsubstituted $C_1$-$C_{20}$ alkoxy, substituted or unsubstituted $C_6$-$C_{30}$ aryloxy, substituted or unsubstituted $C_2$-$C_{20}$ alkenyl, substituted or unsubstituted $C_3$-$C_{30}$ alkylsilyl, substituted or unsubstituted $C_6$-$C_{30}$ aryl, substituted or unsubstituted $C_3$-$C_{30}$ heteroaryl, substituted or unsubstituted $C_3$-$C_{30}$ arylsilyl, substituted or unsubstituted $C_0$-$C_{20}$ amine, cyano, nitrile, isonitrile, or phosphino; or a ring structure or a fused-ring structure formed by linking any two adjacent groups with each other; and the "substituted" refers to substitution with deuterium, halogen, $C_1$-$C_4$ alkyl, or cyano; and the substitution number of $R_{101}$ and $R_{102}$ independently represents a range from a non-substitution number to a maximum substitution number.

Preferably, the metal complex, having a structure as shown in a formula (3), formula (3)

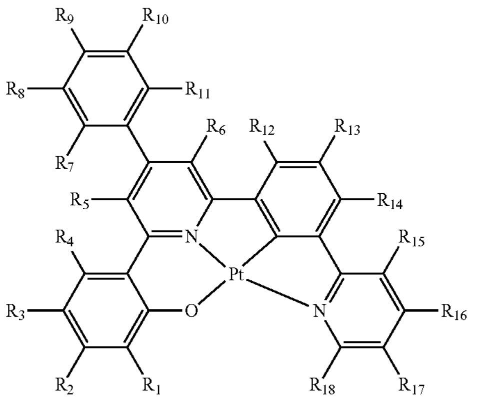

wherein at least one of the $R_1$-$R_{18}$ has a structure shown in the formula (2), formula (2)

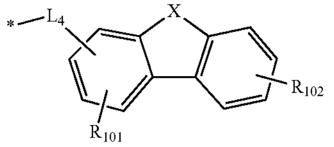

wherein the *, the X, the $L_4$, the $R_1$-$R_{18}$, the $R_{101}$-$R_{102}$, and $R_a$-$R_b$ are as defined above.

Preferably, the metal complex, having a structure as shown in a formula (4), formula (4)

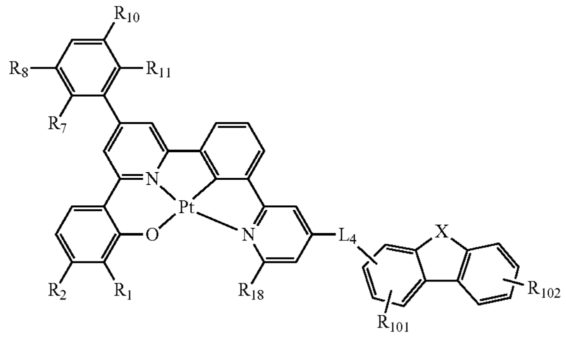

where the X independently represents O, S, Se, and CRaRb;

the $L_4$ is a single bond, O, substituted or unsubstituted $C_1$-$C_{10}$ alkylene, substituted or unsubstituted $C_3$-$C_{10}$ cycloalkylene, substituted or unsubstituted $C_2$-$C_{10}$ heteroalkylene, substituted or unsubstituted $C_7$-$C_{20}$ aralkylene, substituted or unsubstituted $C_2$-$C_{20}$ alkenylene, substituted or unsubstituted $C_3$-$C_{30}$ alkylidenesilyl, substituted or unsubstituted $C_6$-$C_{30}$ arylene, substituted or unsubstituted $C_3$-$C_{30}$ heteroarylene, substituted or unsubstituted $C_3$-$C_{30}$ arylenesilyl, or substituted or unsubstituted $C_0$-$C_{20}$ imino; and $R_1$, $R_2$, $R_7$, $R_8$, $R_{10}$, $R_{11}$, $R_{18}$, the $R_{101}$, the $R_{102}$, $R_a$, and $R_b$ are as defined above.

Preferably, the $L_4$ is a single bond, O, and one of the following structures:

formula (a)

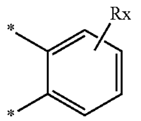

formula (b)

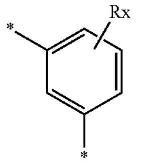

formula (c)

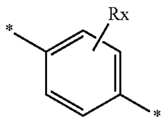

formula (d)

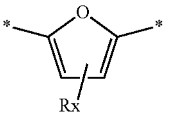

formula (e)

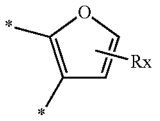

formula (f)

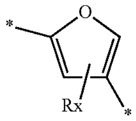

formula (g)

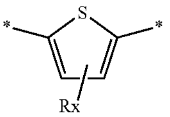

formula (h)

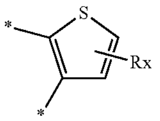

formula (i)

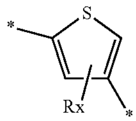

-continued formula (j)

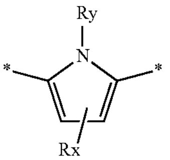

formula (k)

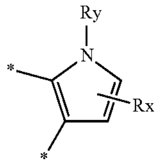

formula (l)

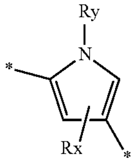

where

* represents a position of a linkage of the formula (1) and the formula (2);

the number of $R_x$ represents a range from a non-substitution number to a maximum substitution number, and when the $R_x$ is polysubstituted, adjacent two substituents may be linked to each other to form a ring or fused-ring structure; and the $R_x$ and $R_y$ are independently selected from hydrogen, deuterium, halogen, substituted or unsubstituted $C_1$-$C_{20}$ alkyl, substituted or unsubstituted $C_3$-$C_{30}$ cycloalkyl, substituted or unsubstituted $C_1$-$C_{20}$ heteroalkyl, substituted or unsubstituted $C_7$-$C_{30}$ aralkyl, substituted or unsubstituted $C_1$-$C_{20}$ alkoxy, substituted or unsubstituted $C_6$-$C_{30}$ aryloxy, substituted or unsubstituted $C_2$-$C_{20}$ alkenyl, substituted or unsubstituted $C_3$-$C_{30}$ alkylsilyl, substituted or unsubstituted $C_6$-$C_{30}$ aryl, substituted or unsubstituted $C_3$-$C_{30}$ heteroaryl, substituted or unsubstituted $C_3$-$C_{30}$ arylsilyl, substituted or unsubstituted $C_0$-$C_{20}$ amine, cyano, nitrile, isonitrile, or phosphino.

Preferably, the $R_1$, the $R_2$, the $R_7$, the $R_8$, the $R_{10}$, the $R_{11}$, the $R_{18}$, the $R_{101}$, the $R_{102}$, the $R_a$, the $R_b$, the $R_x$, and the $R_y$ are independently selected from hydrogen, deuterium, halogen, substituted or unsubstituted $C_1$-$C_8$ alkyl, substituted or unsubstituted $C_3$-$C_{10}$ cycloalkyl, substituted or unsubstituted $C_1$-$C_8$ heteroalkyl, substituted or unsubstituted $C_7$-$C_{10}$ aralkyl, substituted or unsubstituted $C_2$-$C_{20}$ alkenyl, substituted or unsubstituted $C_3$-$C_8$ alkylsilyl, substituted or unsubstituted $C_6$-$C_{10}$ aryl, substituted or unsubstituted $C_3$-$C_{10}$ heteroaryl, substituted or unsubstituted $C_3$-$C_{10}$ arylsilyl, substituted or unsubstituted $C_0$-$C_6$ amido, or cyano.

Preferably, the $R_1$, the $R_2$, the $R_7$, the $R_8$, the $R_{10}$, the $R_{11}$, the $R_{18}$, the $R_{101}$, the $R_{102}$, the $R_a$, the $R_b$, the $R_x$, and the $R_y$ are independently selected from hydrogen, deuterium, halogen, substituted or unsubstituted $C_1$-$C_8$ alkyl, substituted or unsubstituted $C_3$-$C_{10}$ cycloalkyl, substituted or unsubstituted $C_1$-$C_8$ heteroalkyl, substituted or unsubstituted phenylalkyl, substituted or unsubstituted $C_6$-$C_{10}$ aryl, or substituted or unsubstituted $C_3$-$C_{10}$ heteroaryl.

Preferably, the $R_{18}$ is deuterium, substituted or unsubstituted straight-chain carbon atom $C_1$-$C_4$ alkyl, or substituted or unsubstituted $C_1$-$C_6$ cycloalkyl, and the "substituted" refers to substitution with deuterium or halogen.

Preferably, at least one of the $R_1$ and the $R_2$ is not hydrogen.

As a preferable metal complex, the metal complex preferably has one of the following structures:

A 1

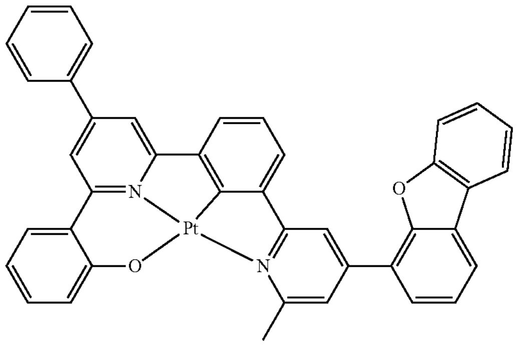

A 2

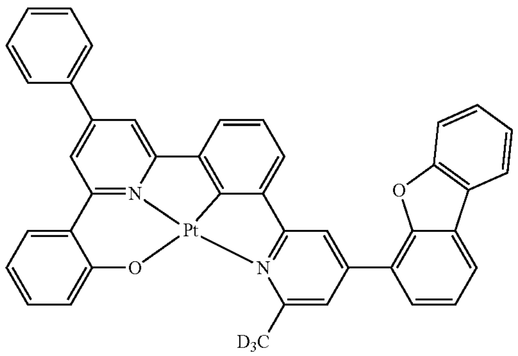

A 3

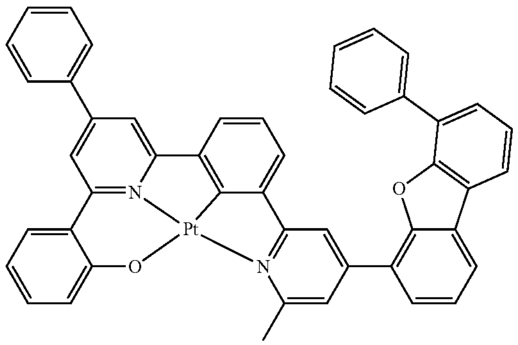

A 4

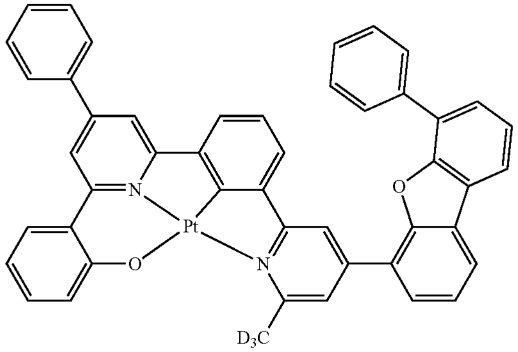

-continued
A 5
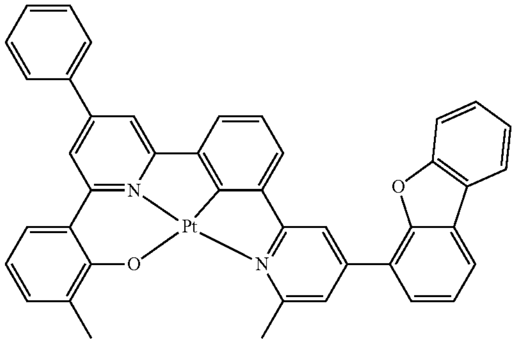
A 6
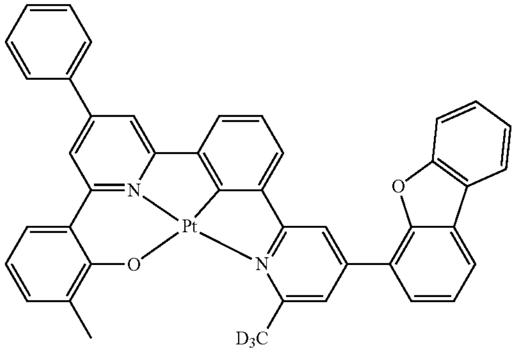
A 7
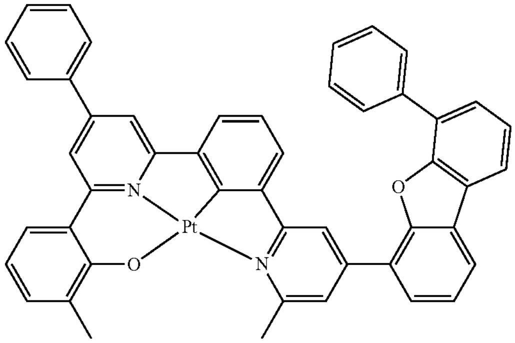
A 8
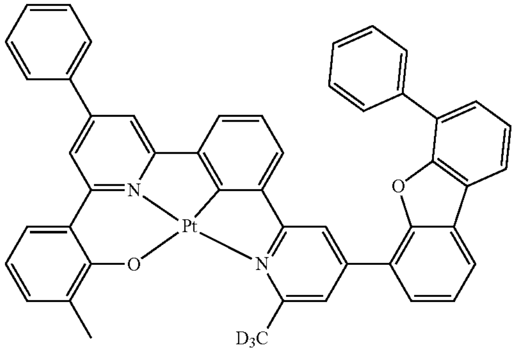
-continued
A 9
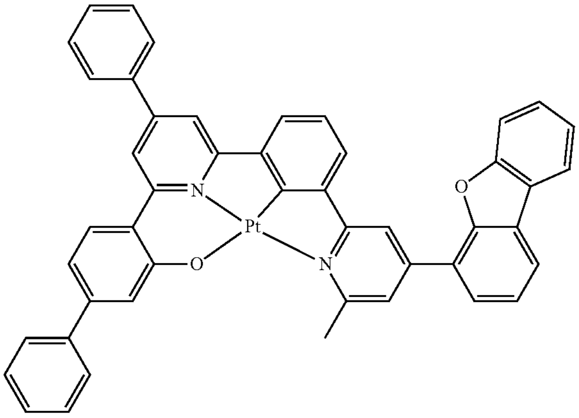
A 10
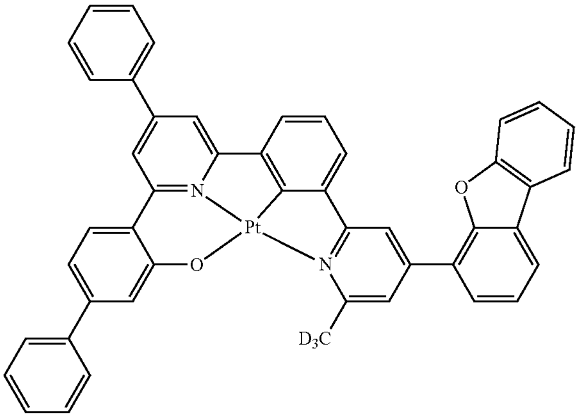
A 11
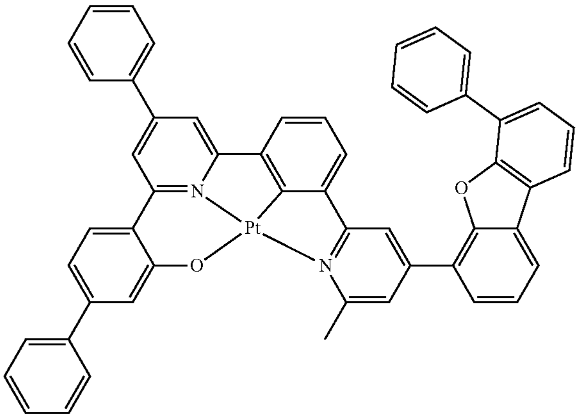

-continued
A 12
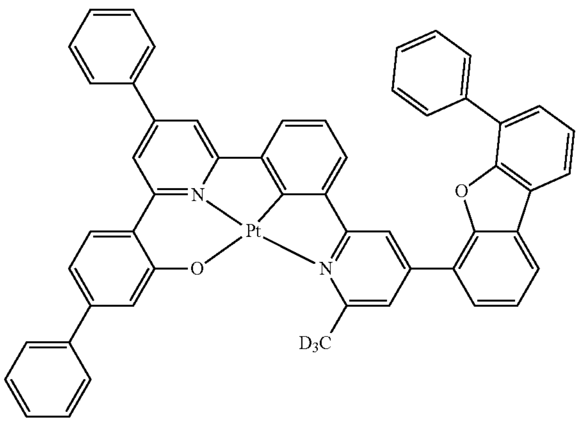
A 13
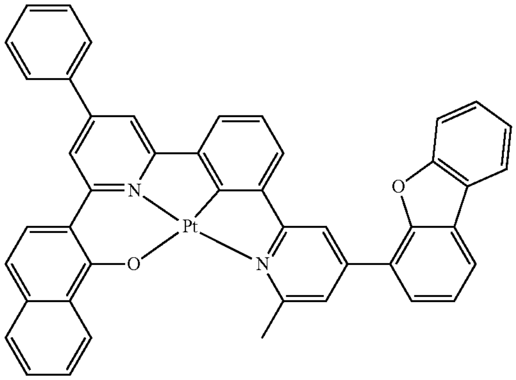
A 14
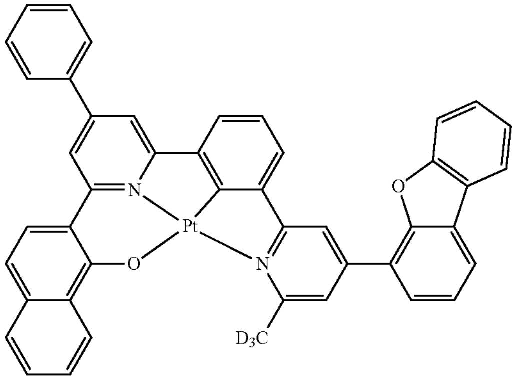
A 15
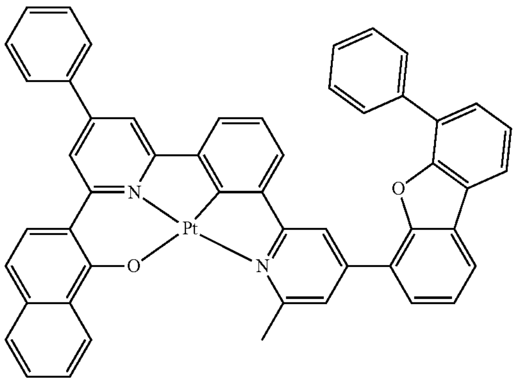
-continued
A 16
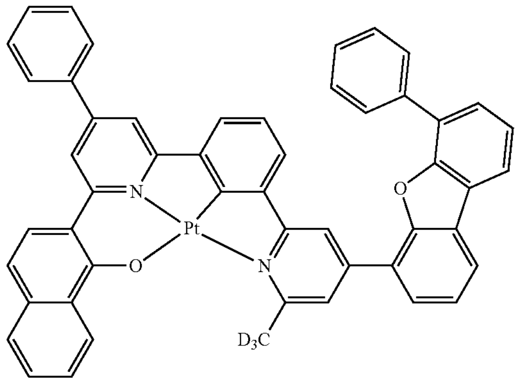
A 17
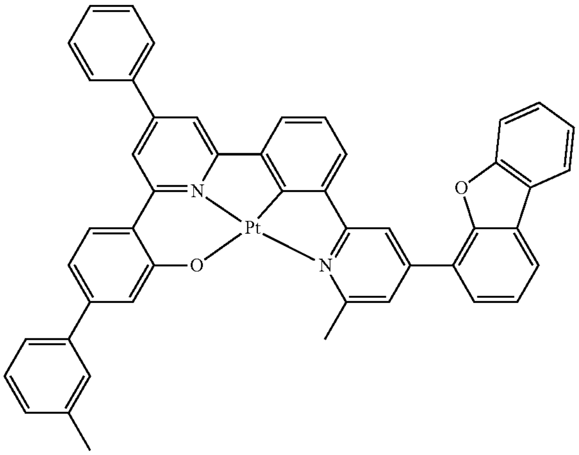
A 18
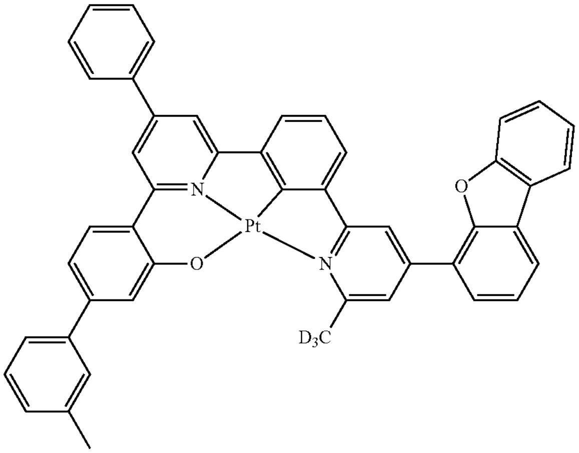

-continued
A 19
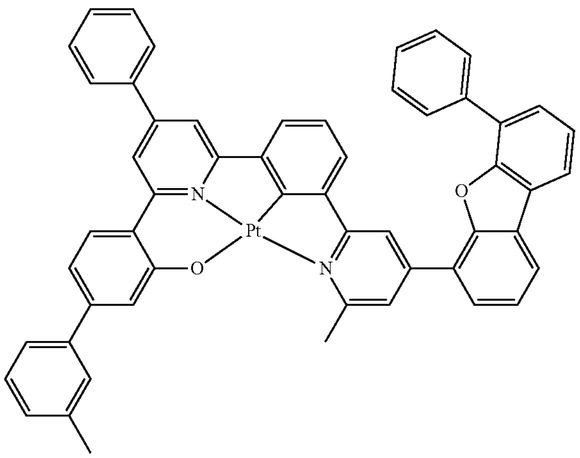
A 20
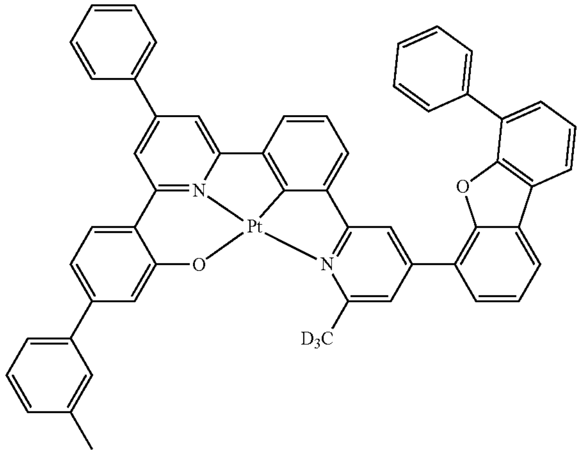
A 21
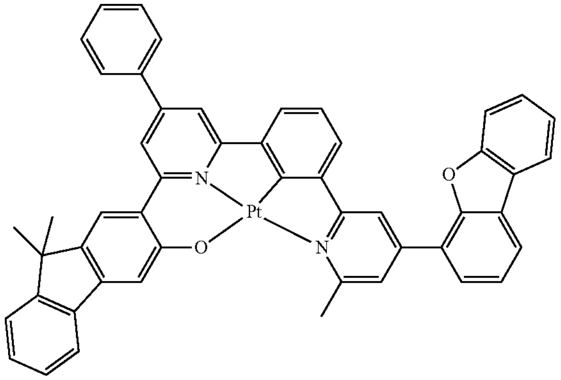
-continued
A 22
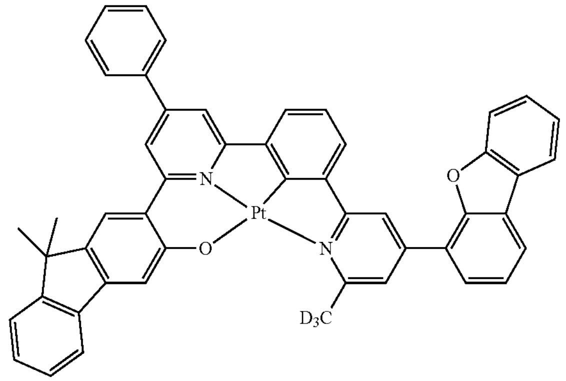
A 23
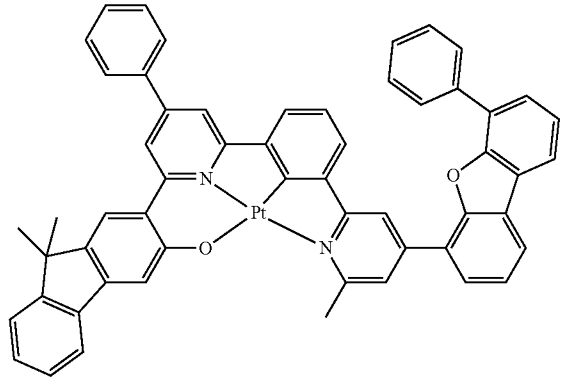
A 24
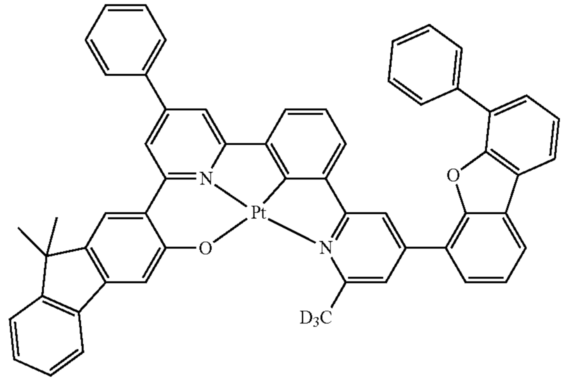
A 25
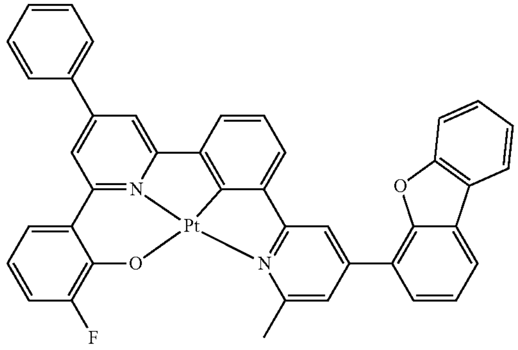

-continued
A 26
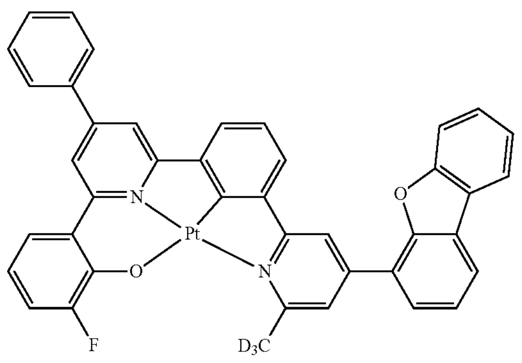
A 27
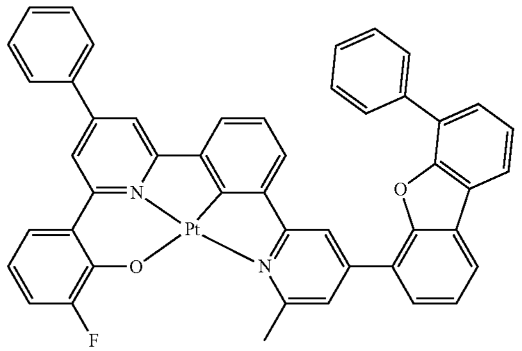
A 28
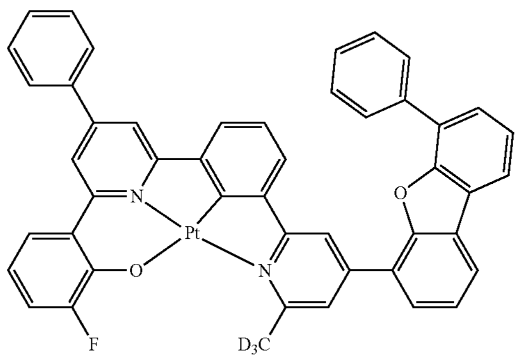
A 29
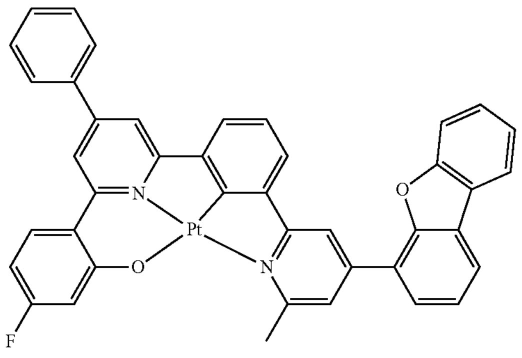
-continued
A 30
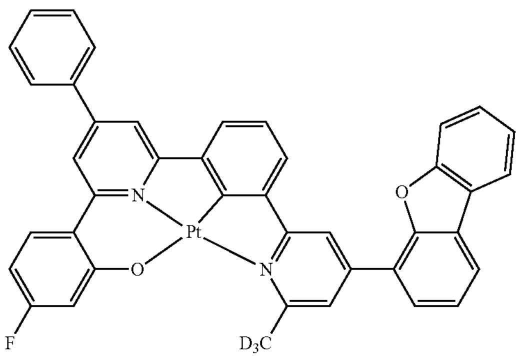
A 31
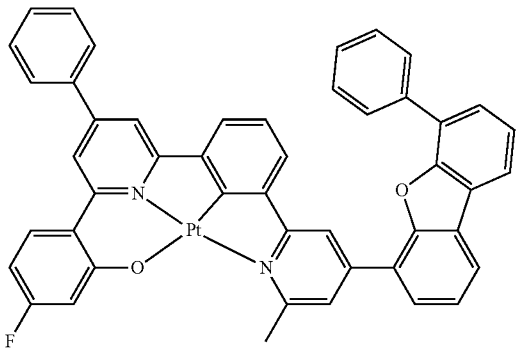
A 32
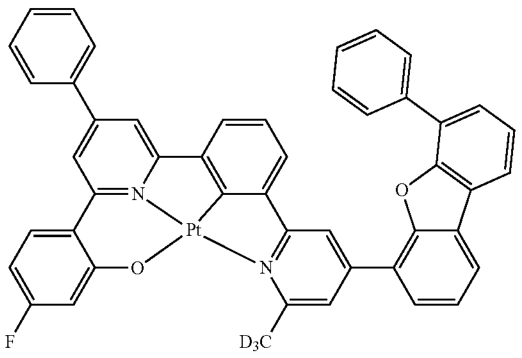
A 33
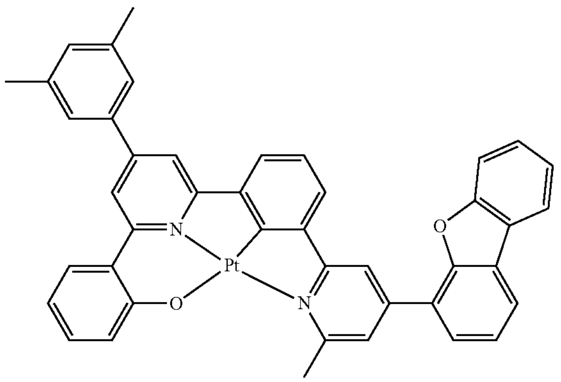

-continued
A 34
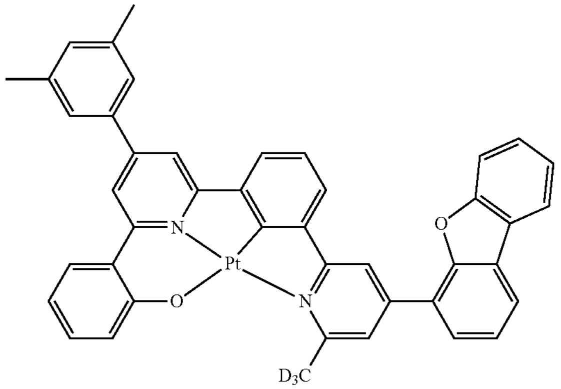
A 35
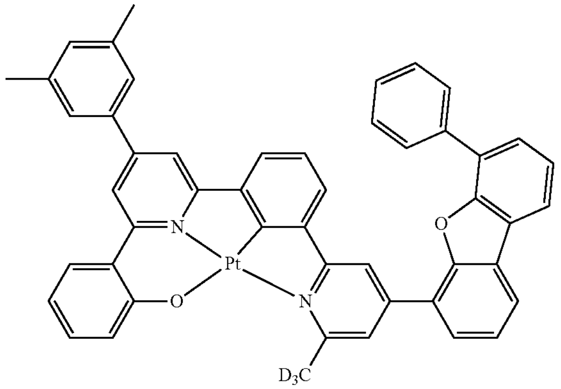
A 36
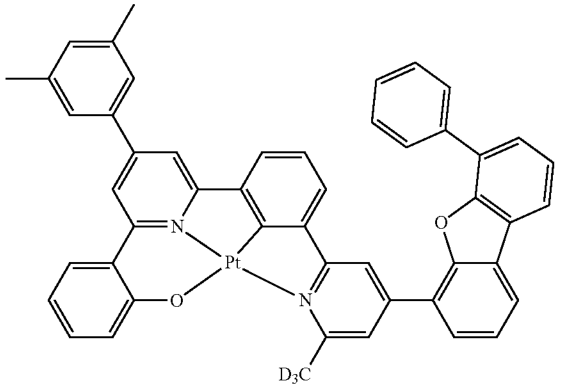
A 37
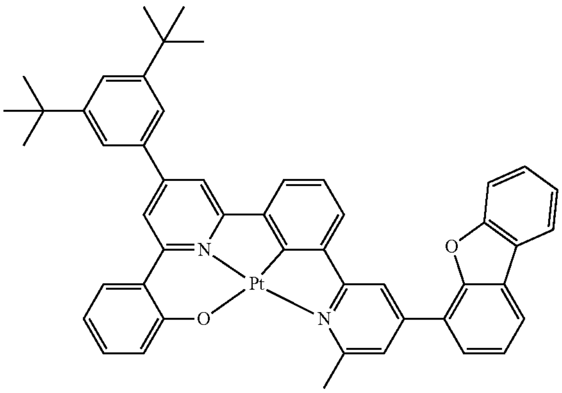
-continued
A 38
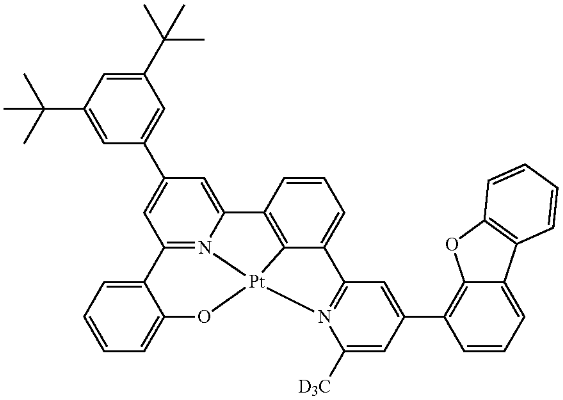
A 39
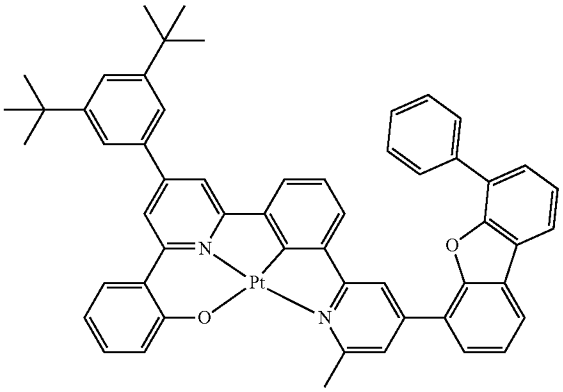
A 40
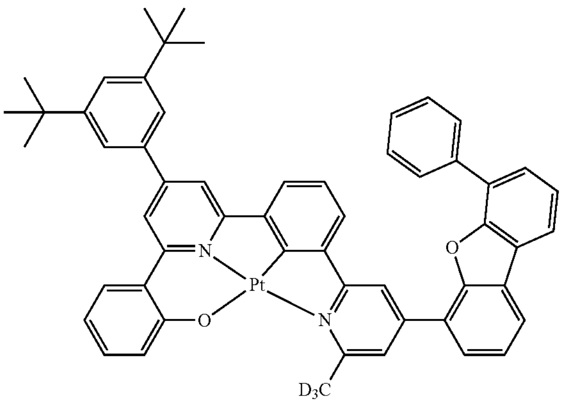

-continued
A 41
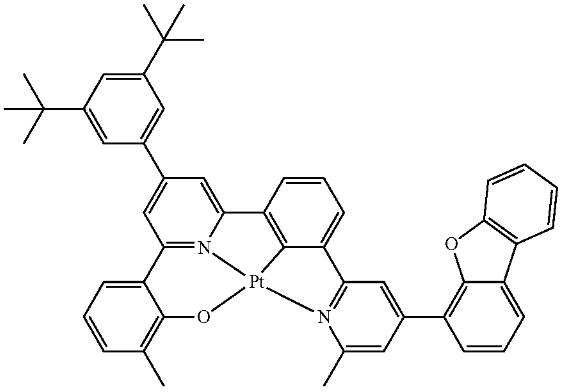
A 42
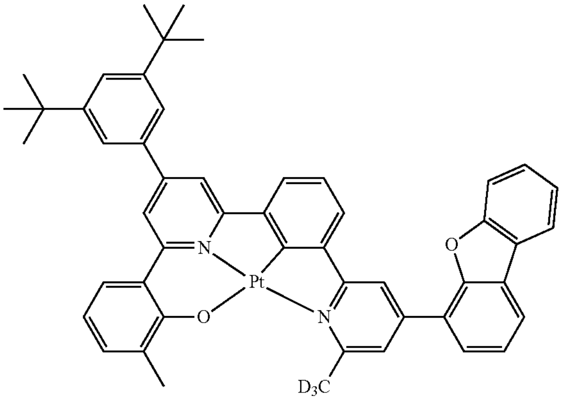
A 43
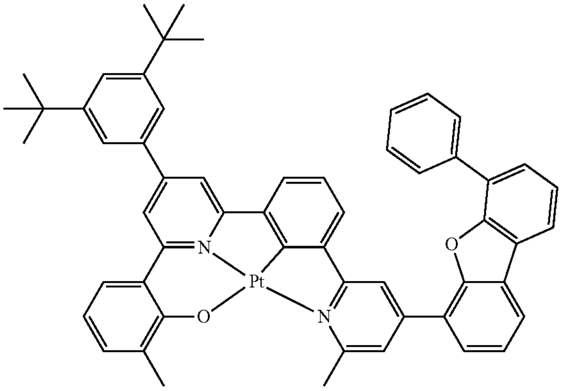
-continued
A 44
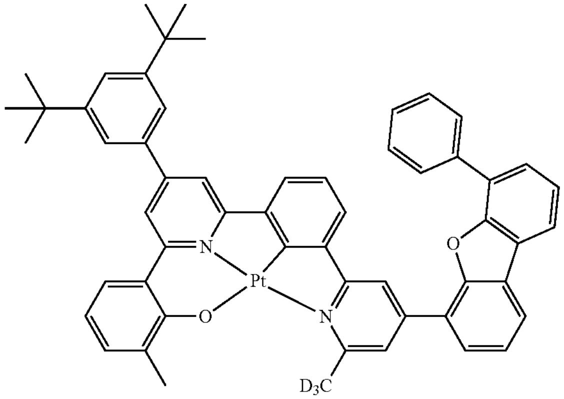
A 45
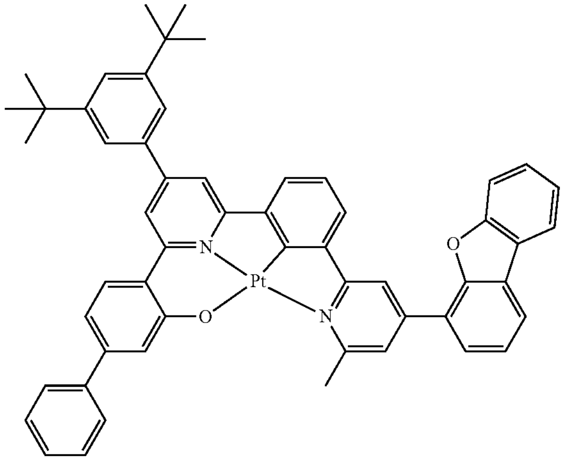
A 46
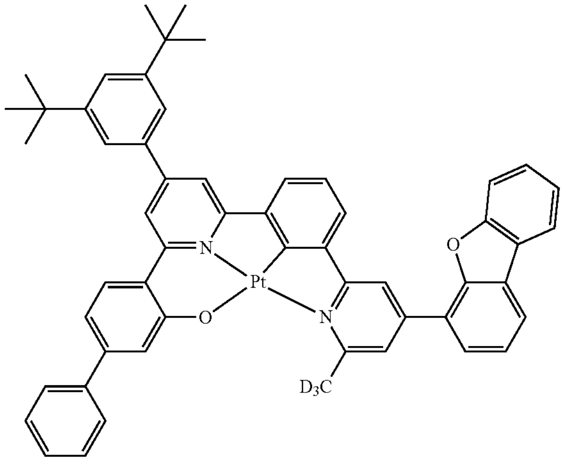

-continued
A 47
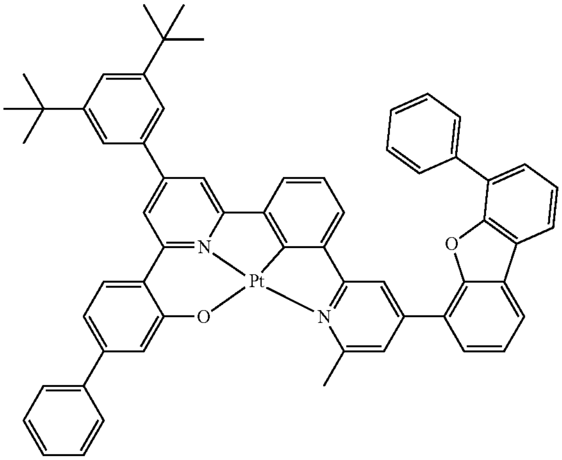
A 48
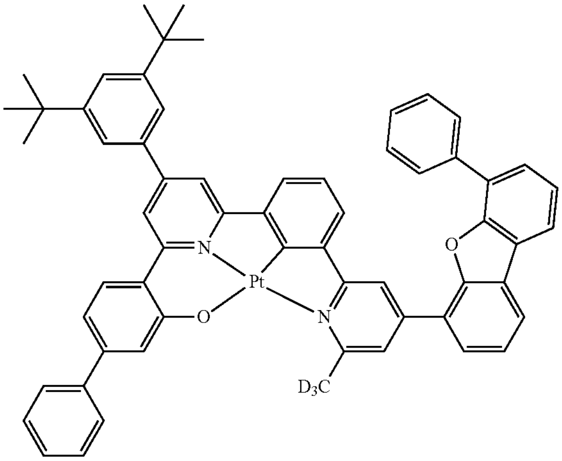
A 49
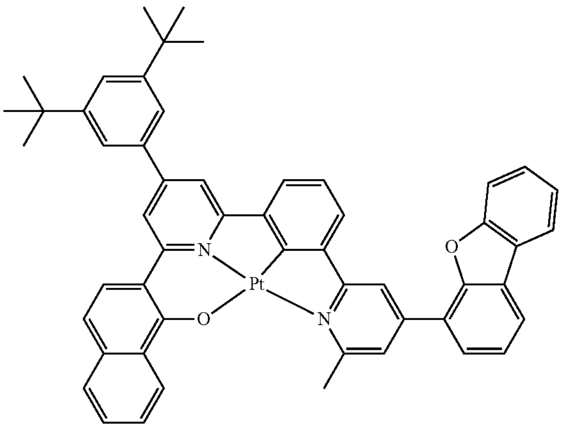
-continued
A 50
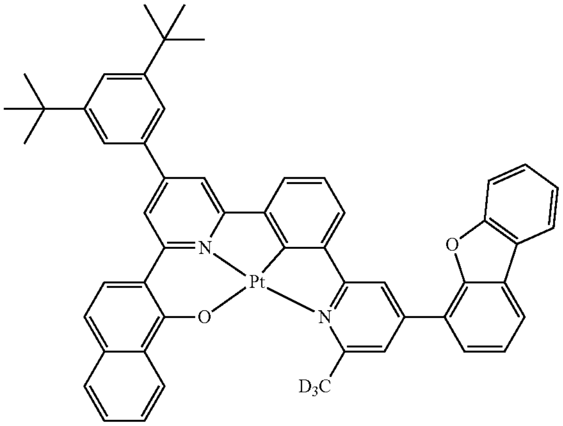
A 51
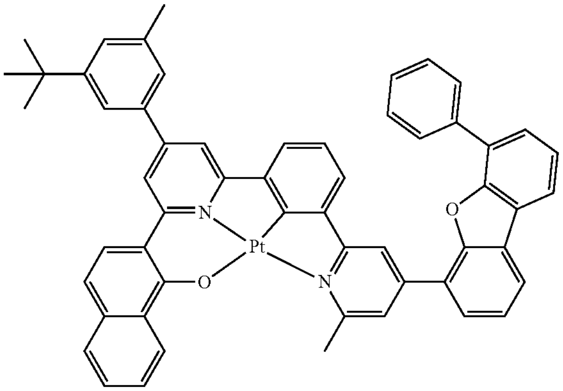
A 52
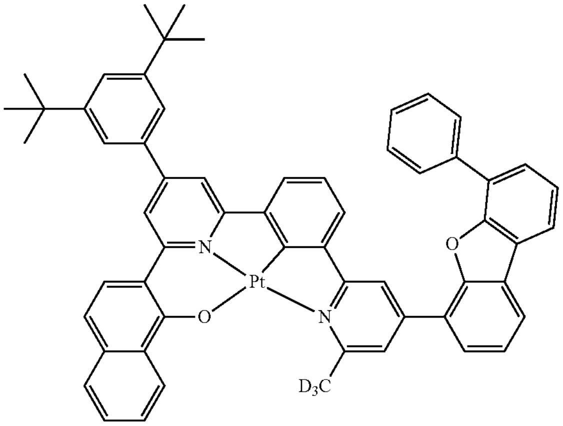

-continued
A 53
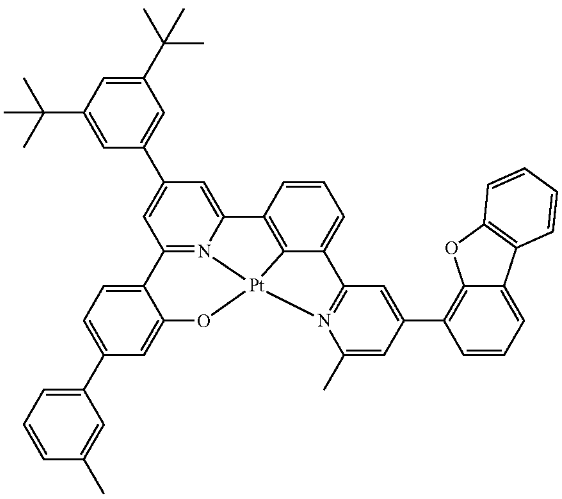
A 54
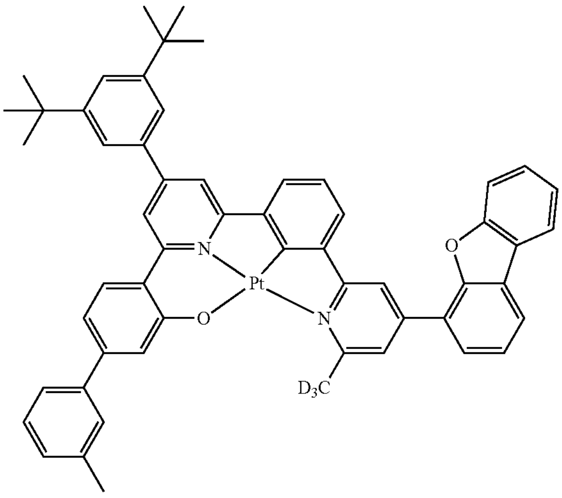
A 55
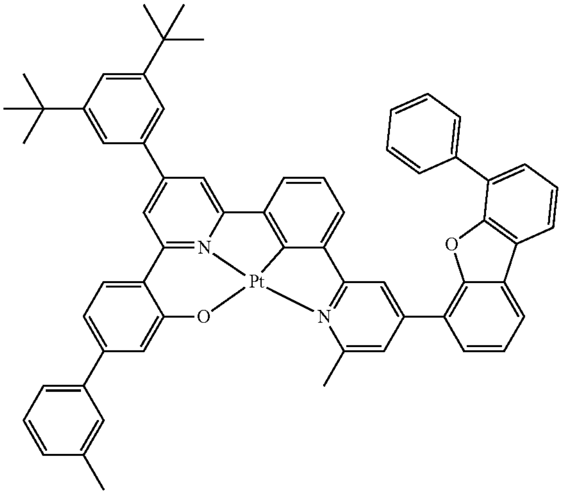
-continued
A 56
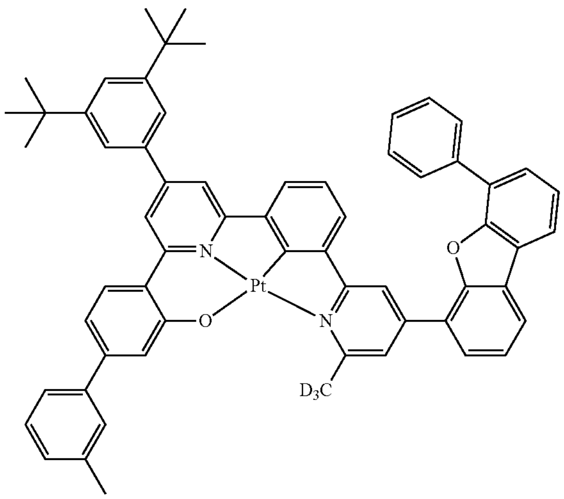
A 57
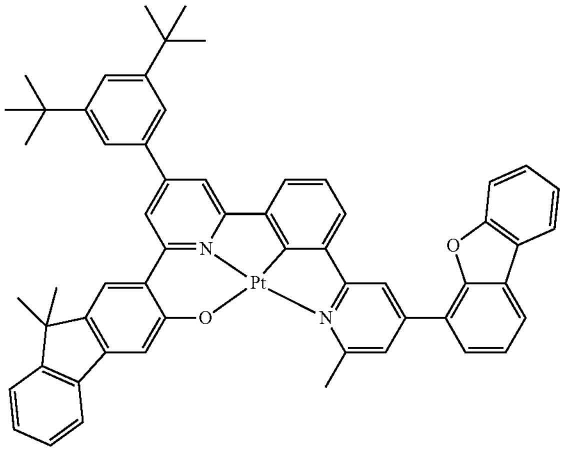
A 58
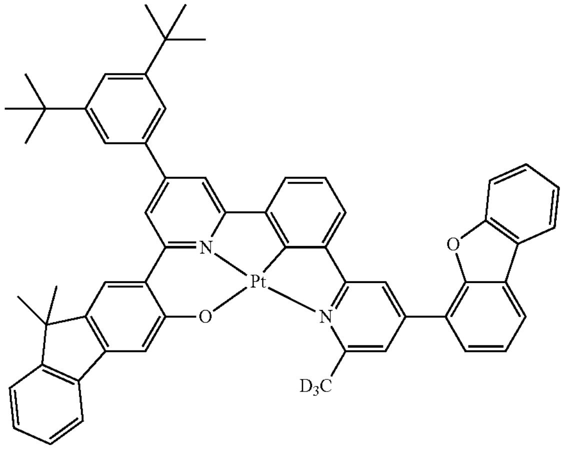

-continued
A 59
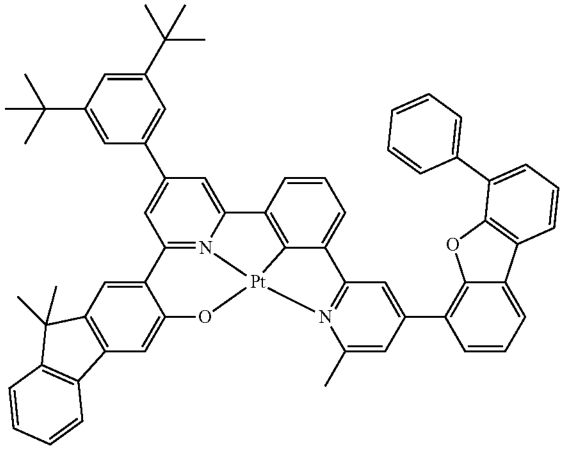
A 60
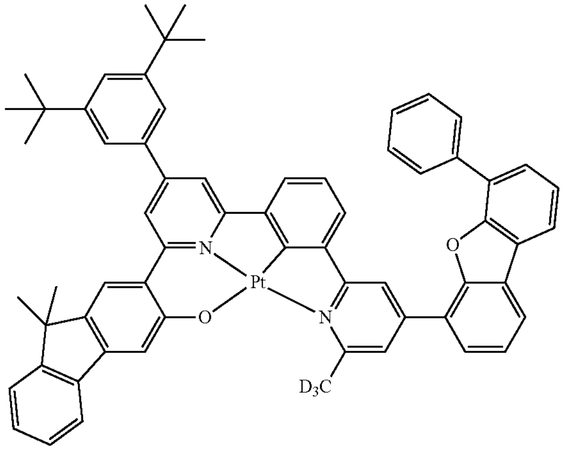
A 61
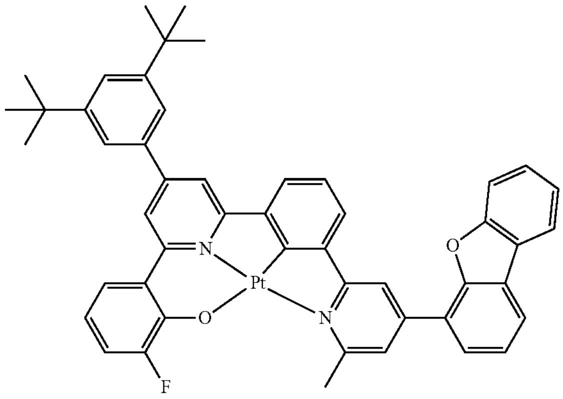
-continued
A 62
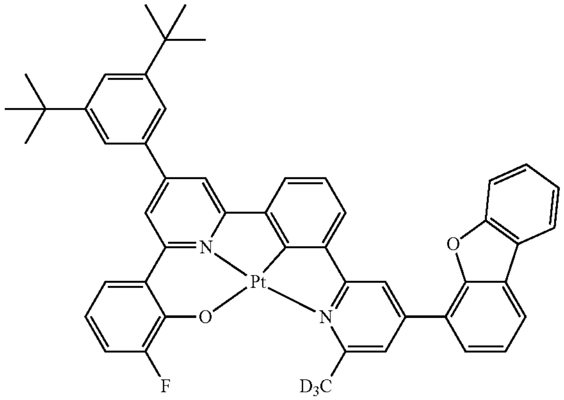
A 63
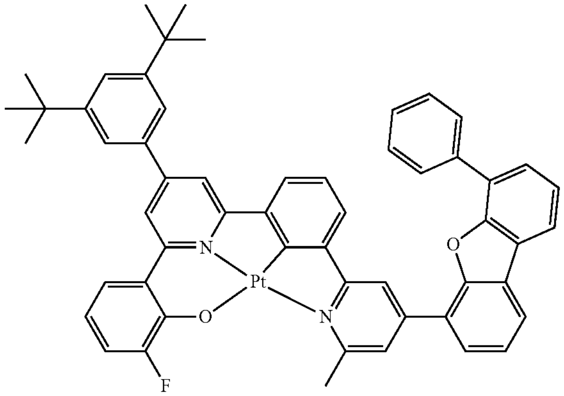
A 64
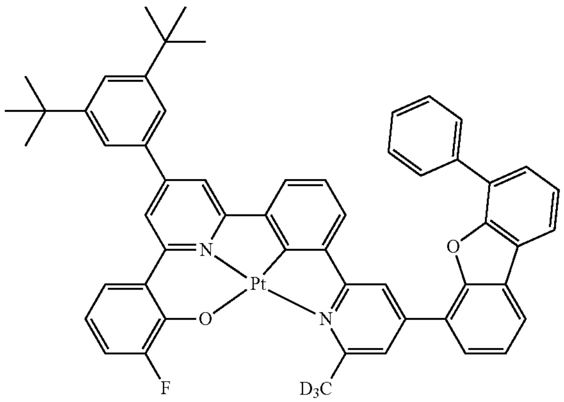

-continued
A 65
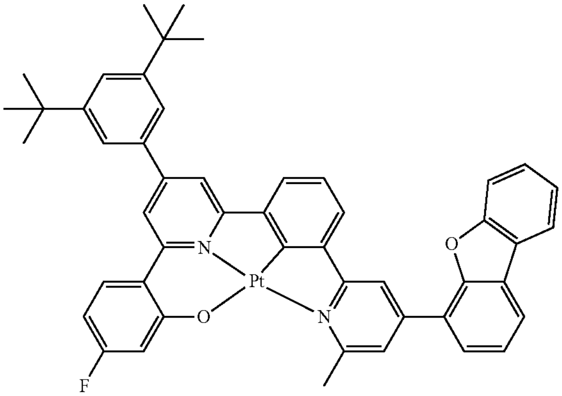
A 66
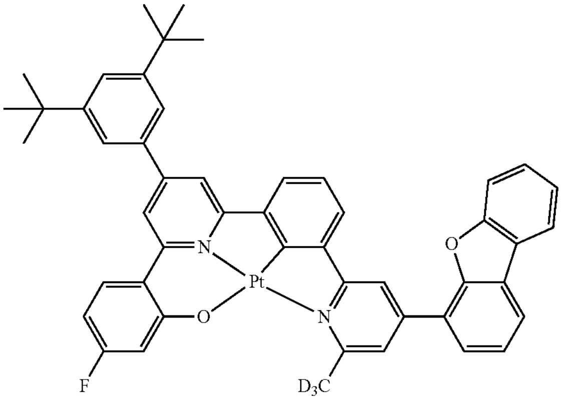
A 67
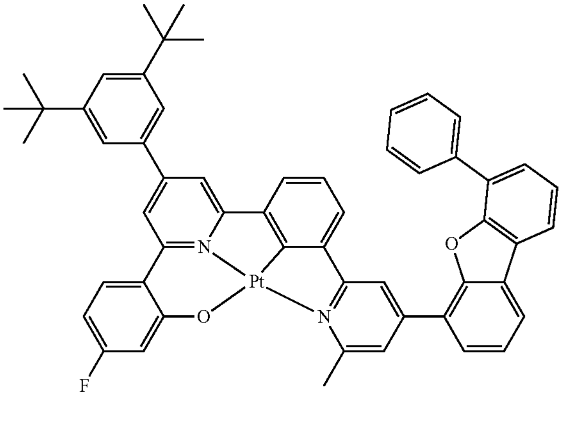
-continued
A 68
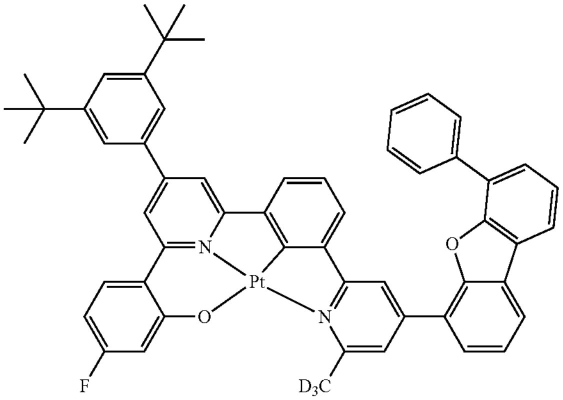
A 69
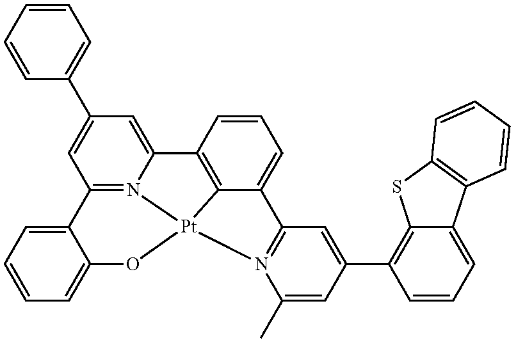
A 70
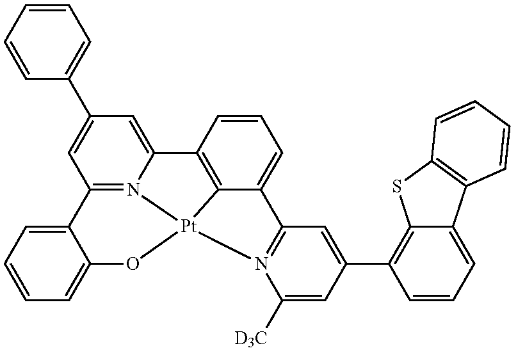
A 71
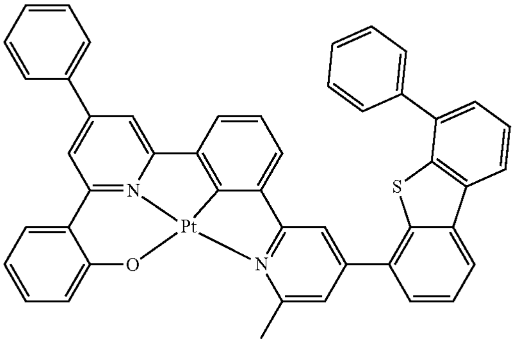

-continued
A 72
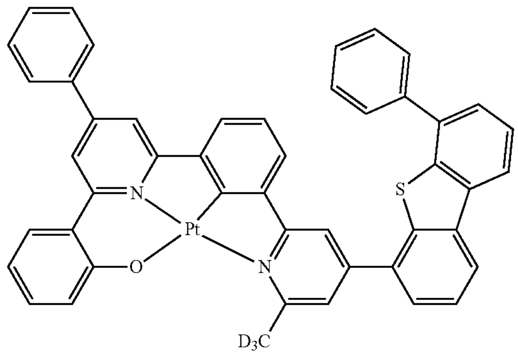
A 73
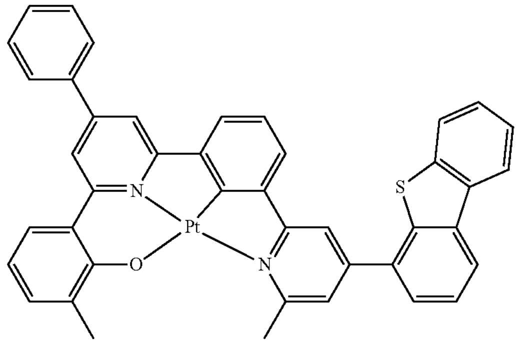
A 74
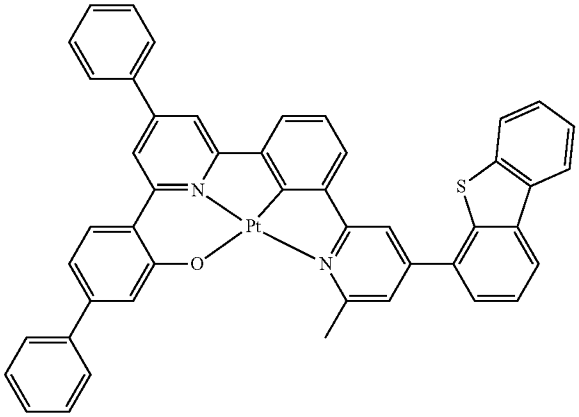
A 75
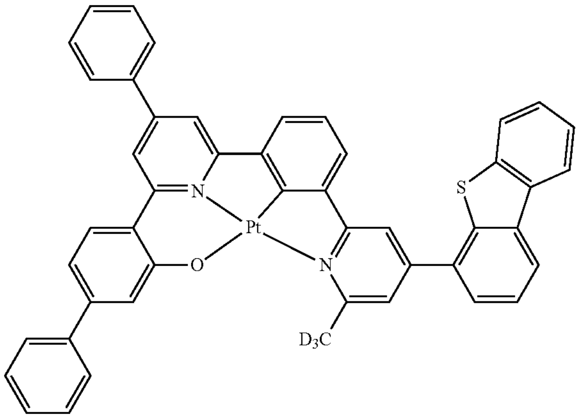
-continued
A 76
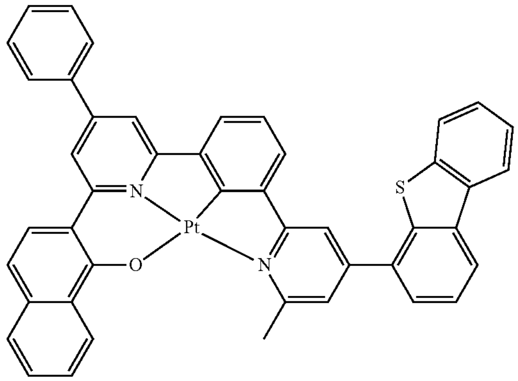
A 77
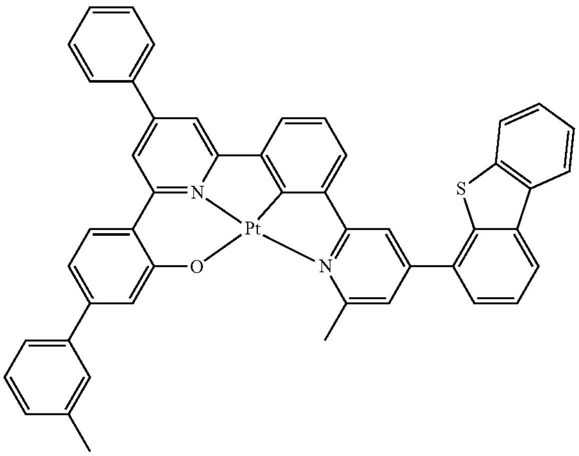
A 78
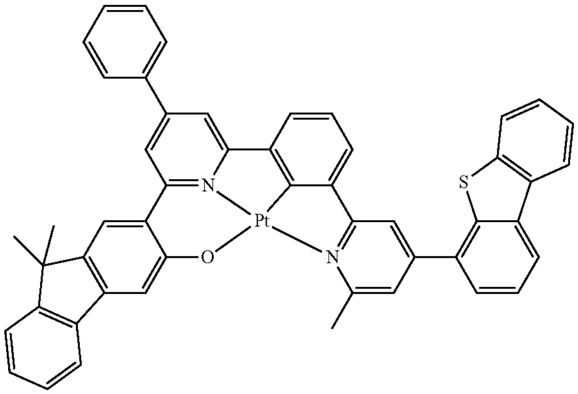

-continued
A 79
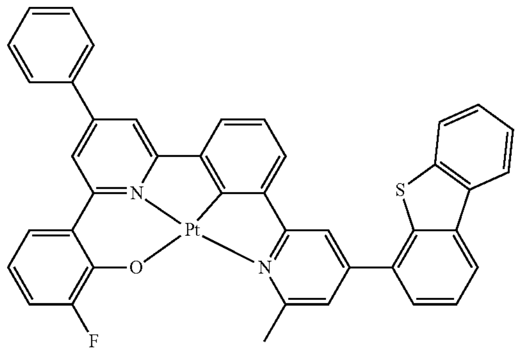
A 80
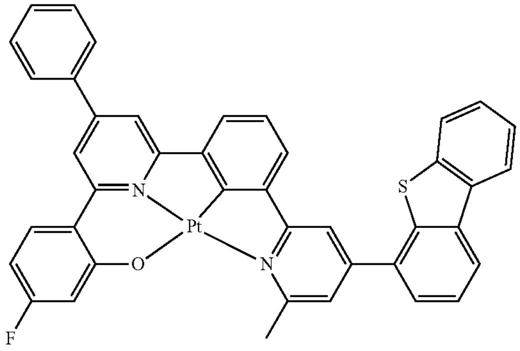
A 81
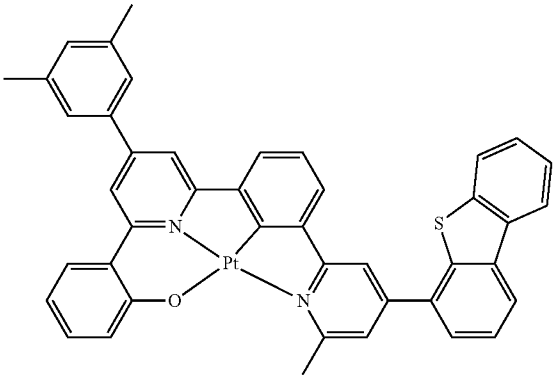
A 82
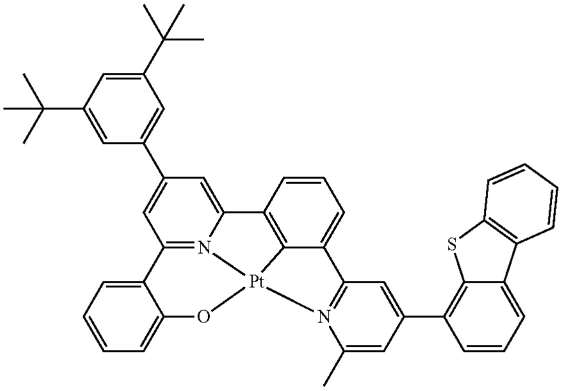
-continued
A 83
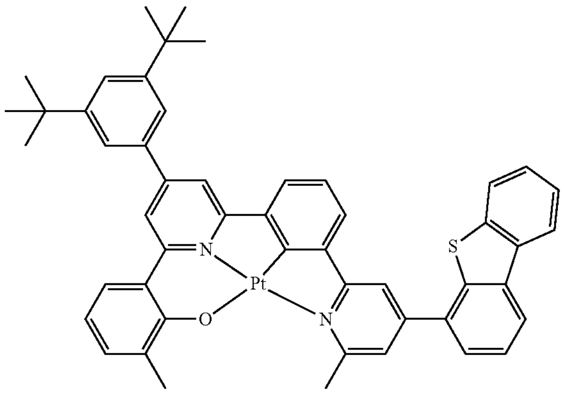
A 84
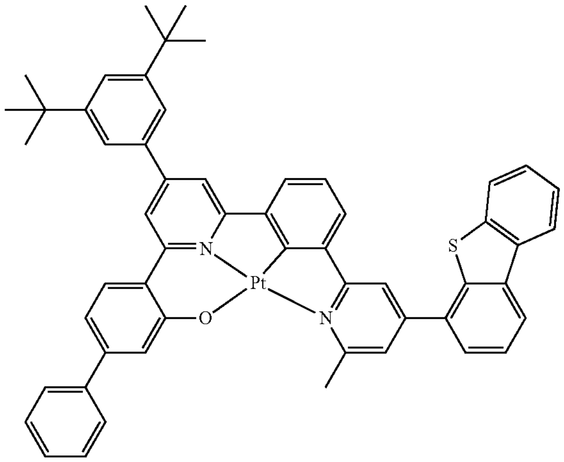
A 85
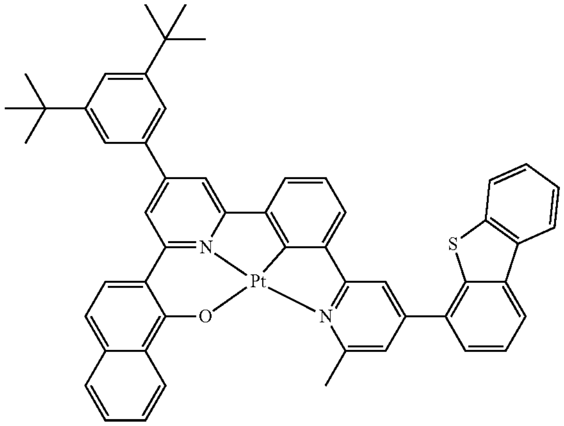

-continued
A 86
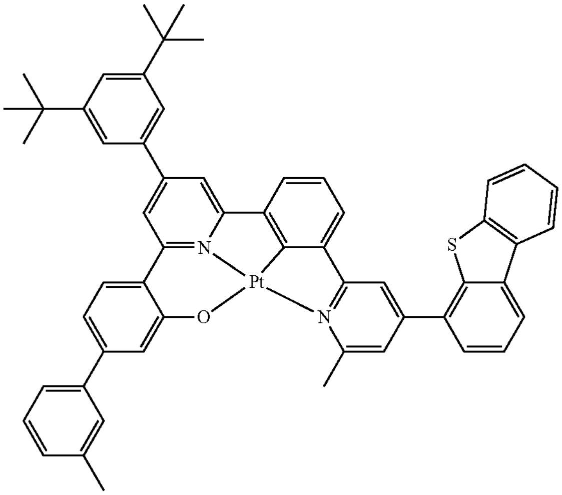
A 87
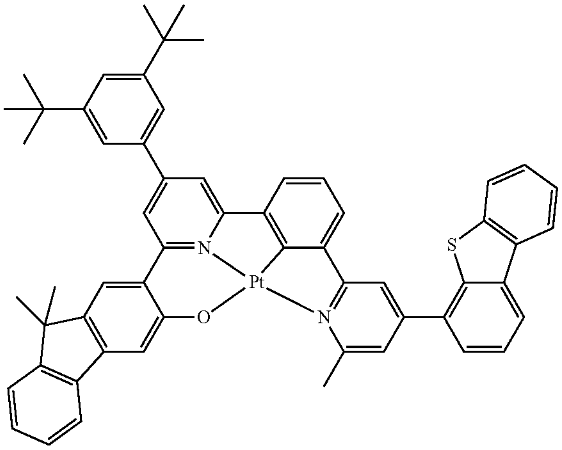
A 88
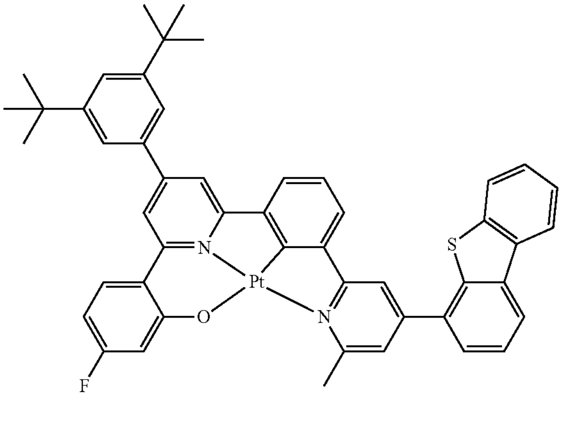
-continued
A 89
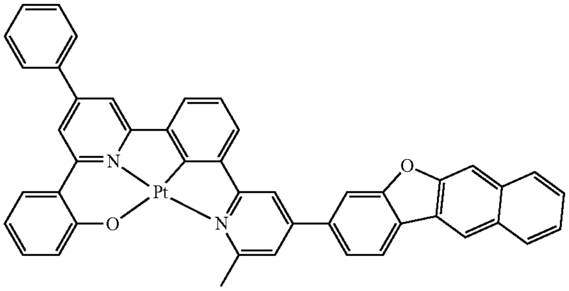
A 90
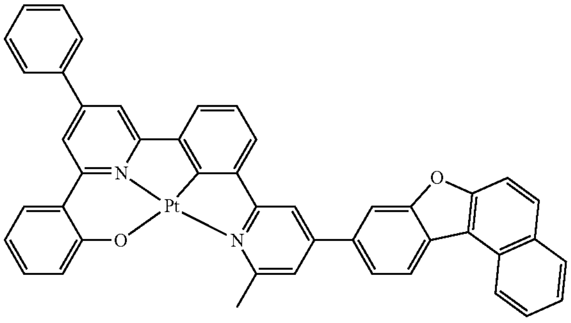
A 91
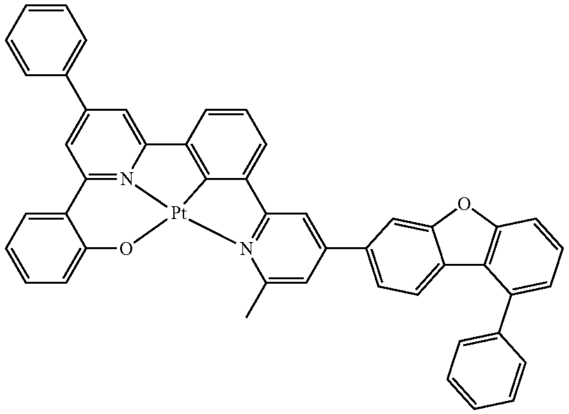
A 92
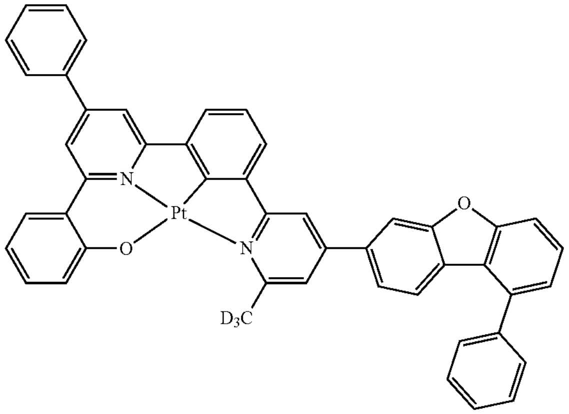

-continued
A 93
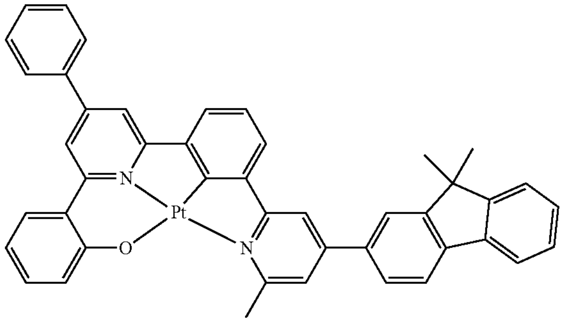
A 94
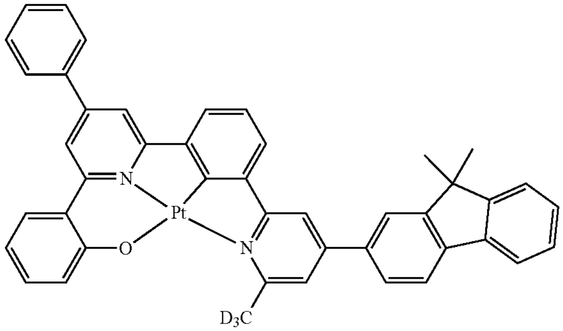
A 95
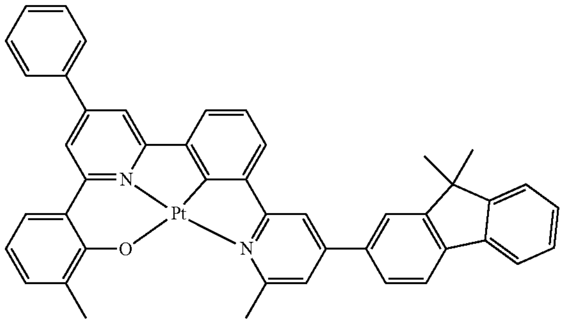
A 96
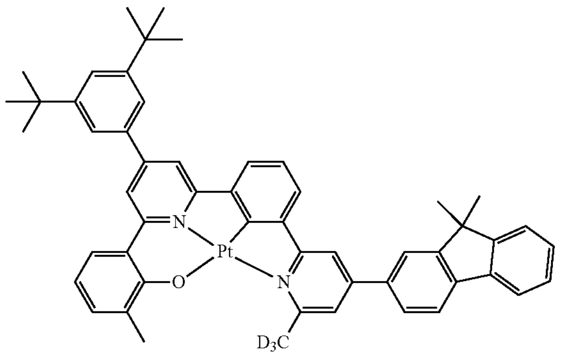
-continued
A 97
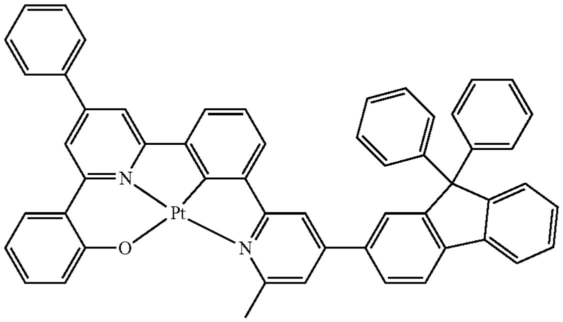
A 98
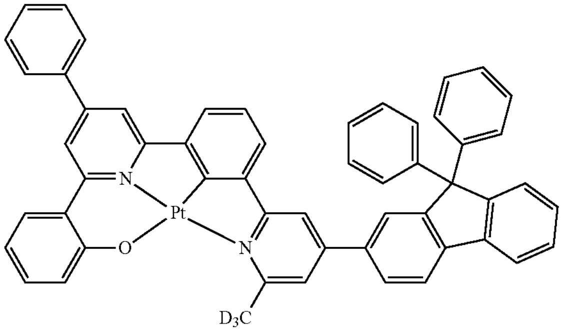
A 99
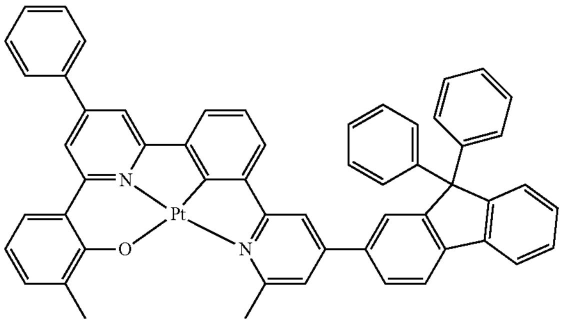
A 100
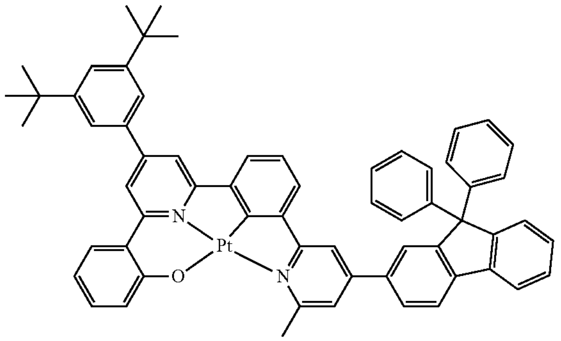

A 101
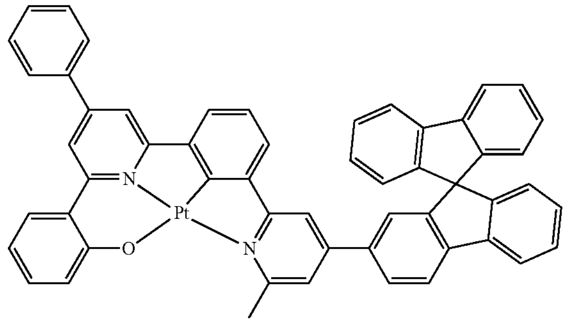
A 102
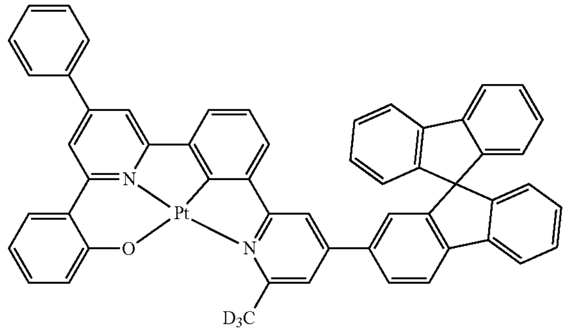
A 103
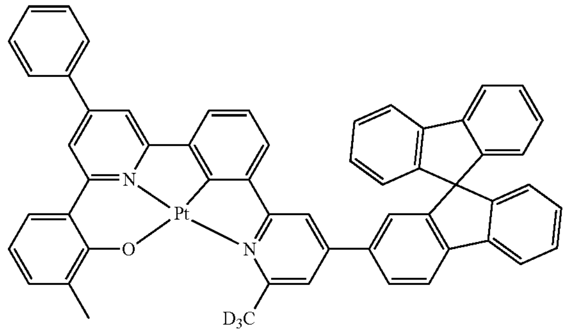
A 104
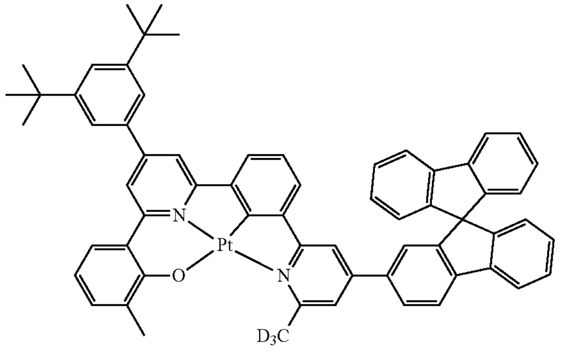
A 105
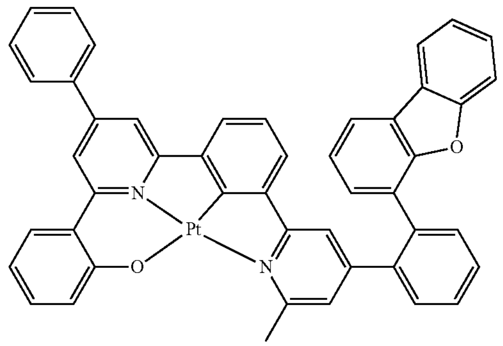
A 106
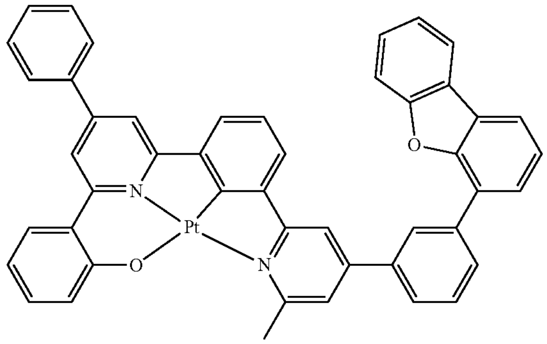
A 107
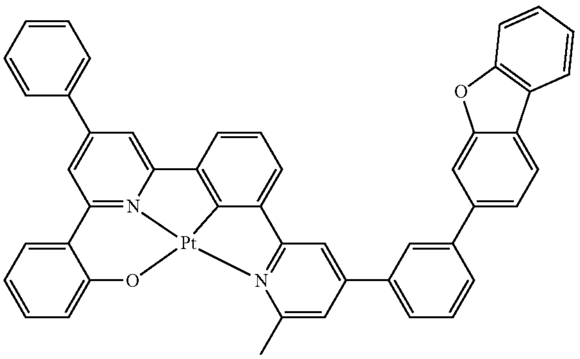
A 108
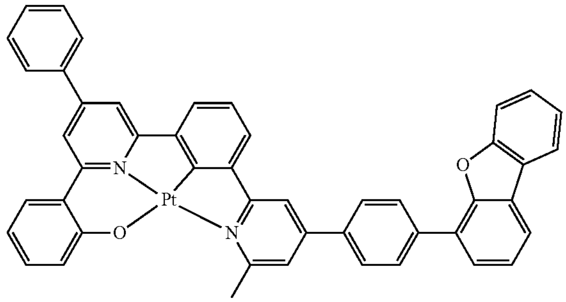

-continued
A 109
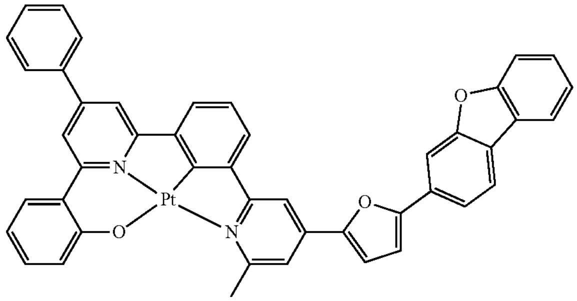
A 110
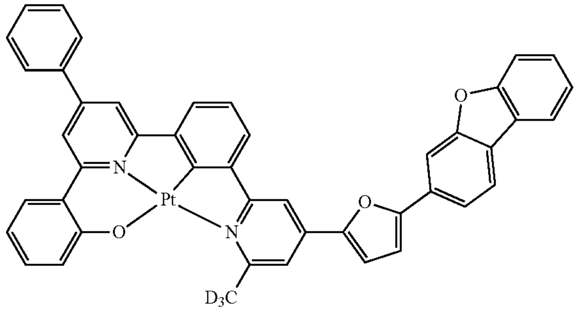
A 111
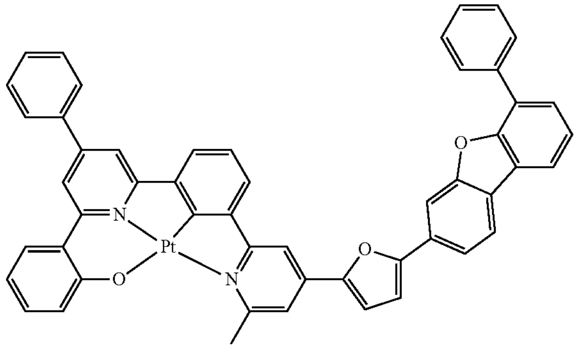
A 112
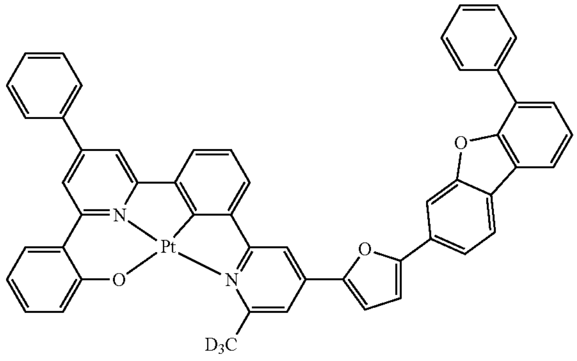
-continued
A 113
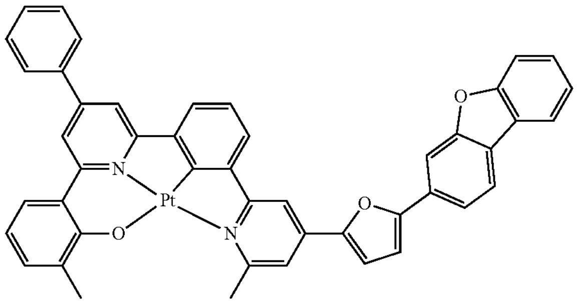
A 114
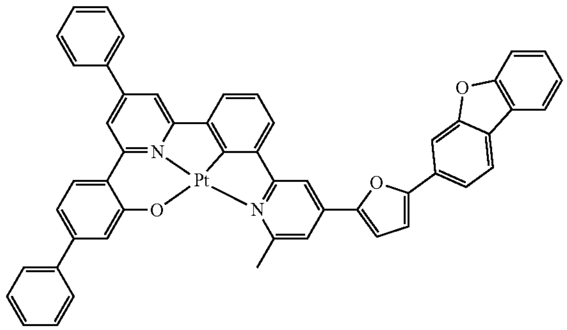
A 115
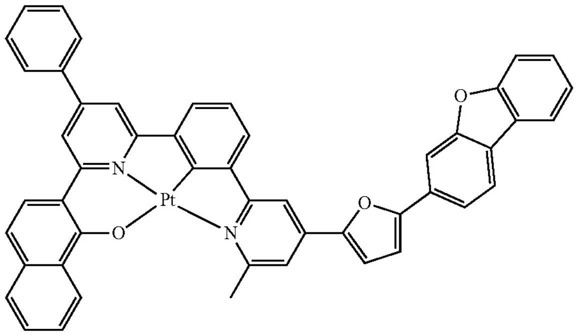
A 116
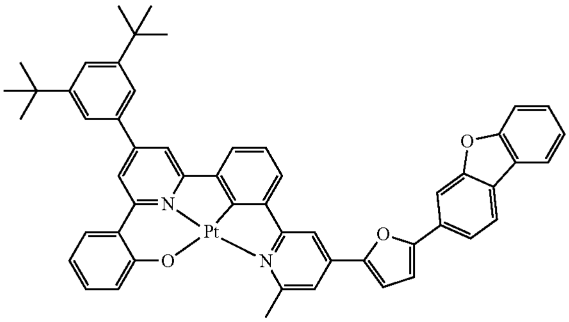

-continued
A 117
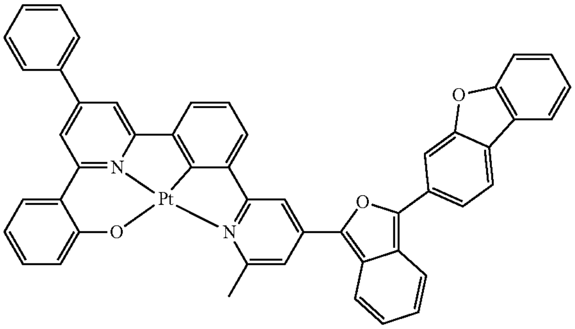
A 118
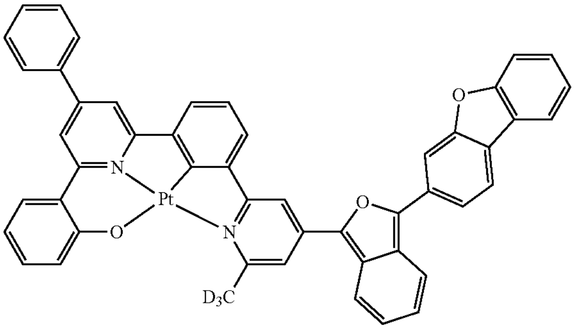
A 119
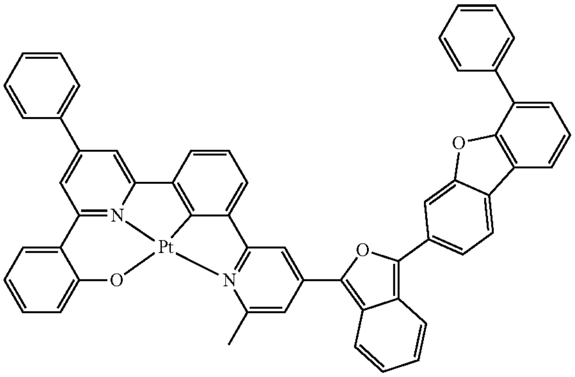
A 120
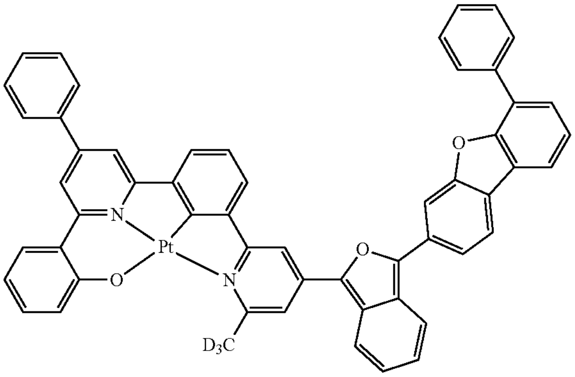
-continued
A 121
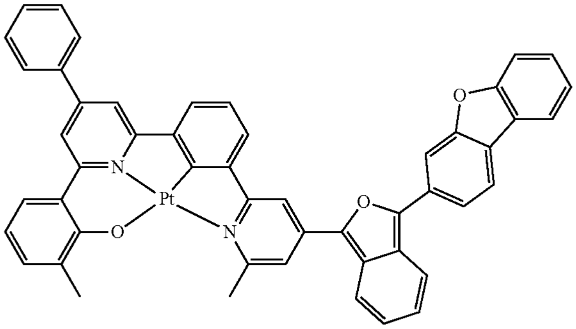
A 122
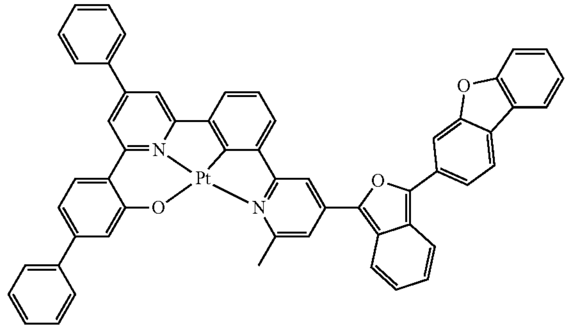
A 123
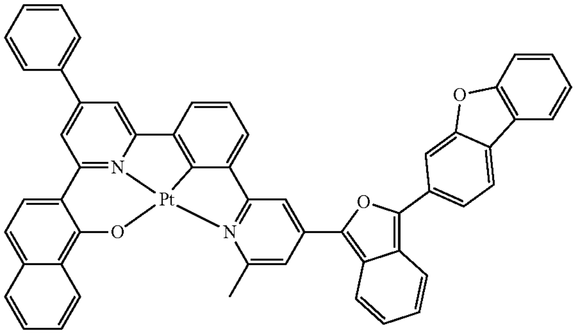
A 124
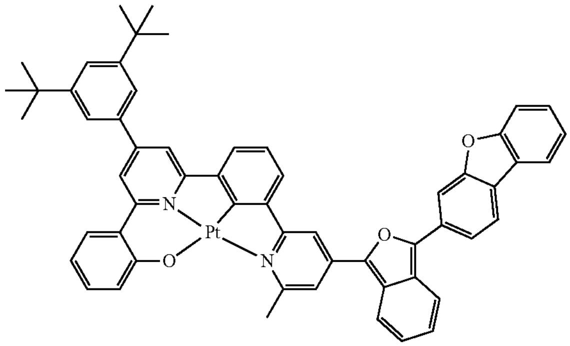

-continued
A 125
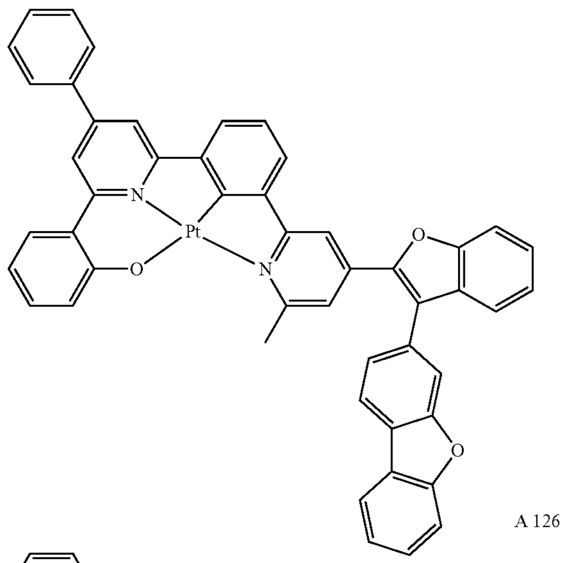
A 126
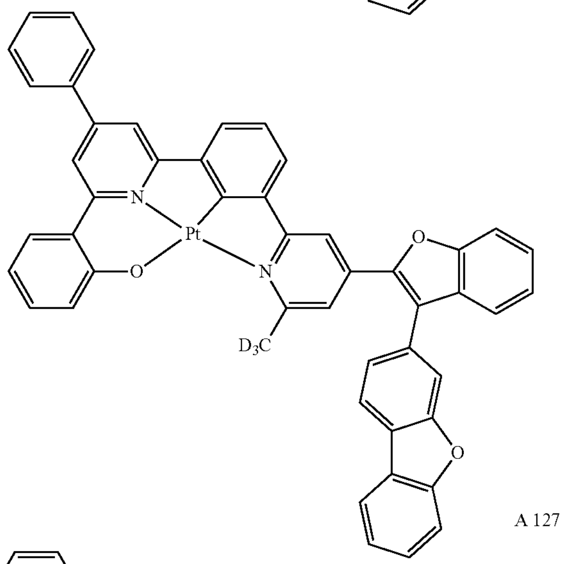
A 127
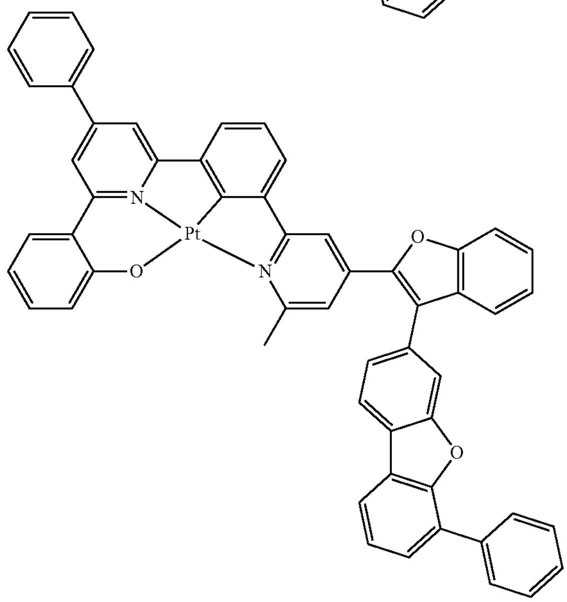
-continued
A 128
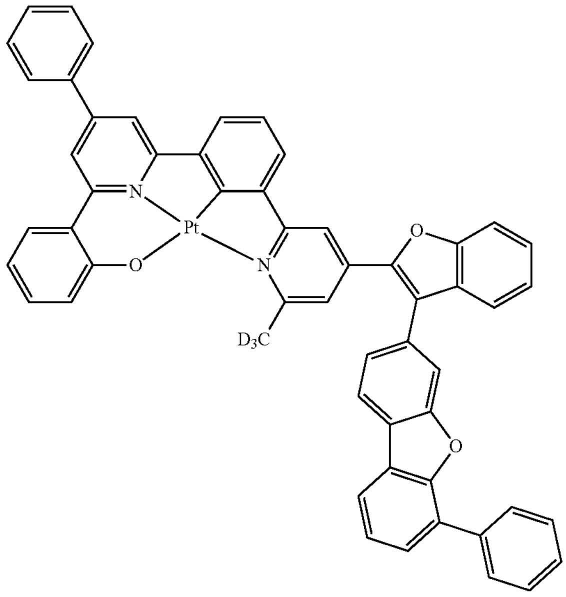
A 129
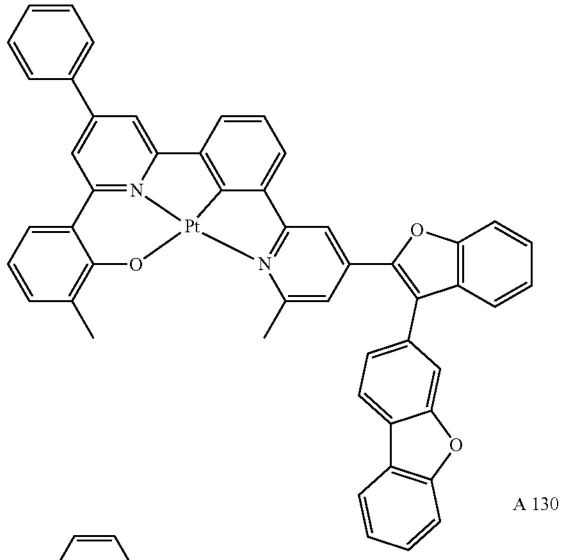
A 130
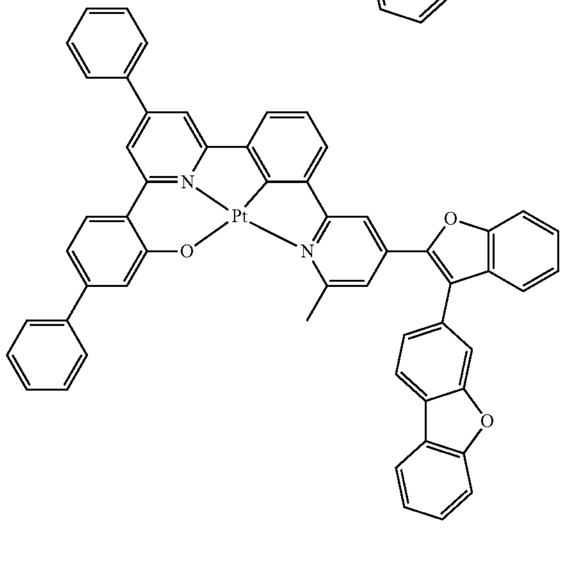

-continued
A 131
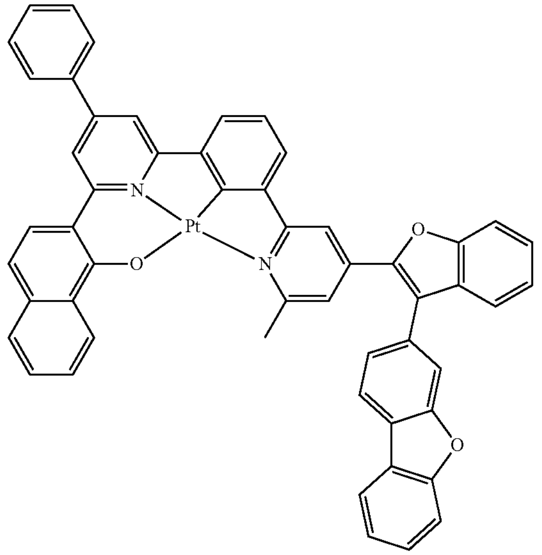
A 132
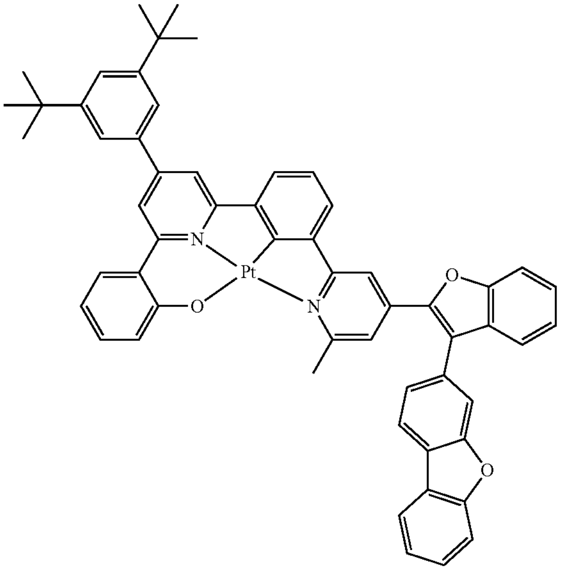
A 133
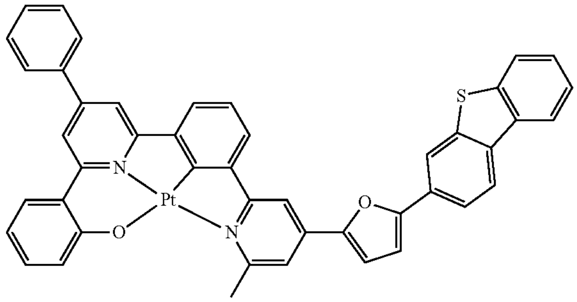
-continued
A 134
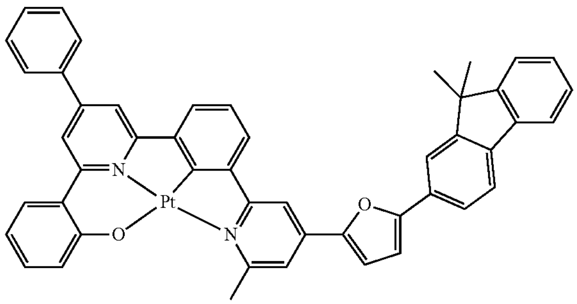
A 135
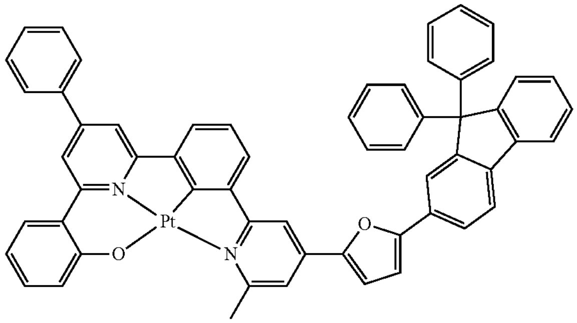
A 136
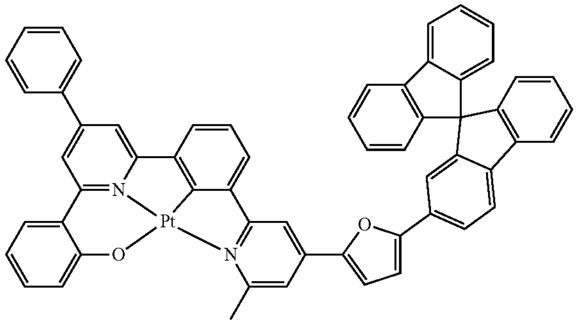
A 137
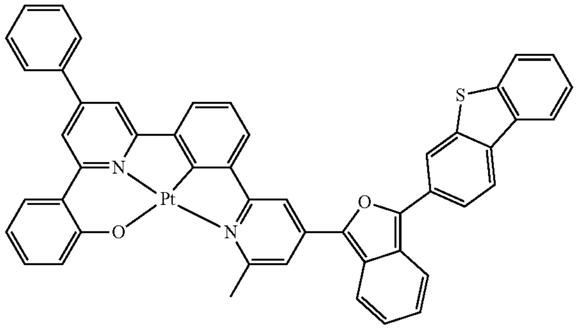

-continued
A 138
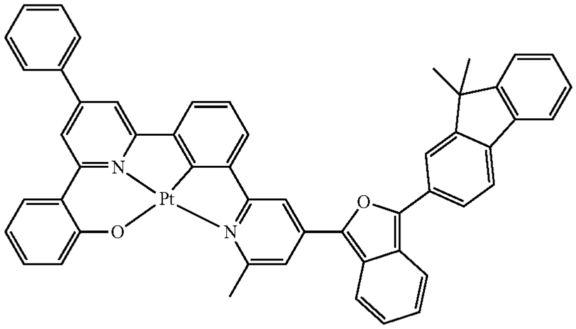
A 139
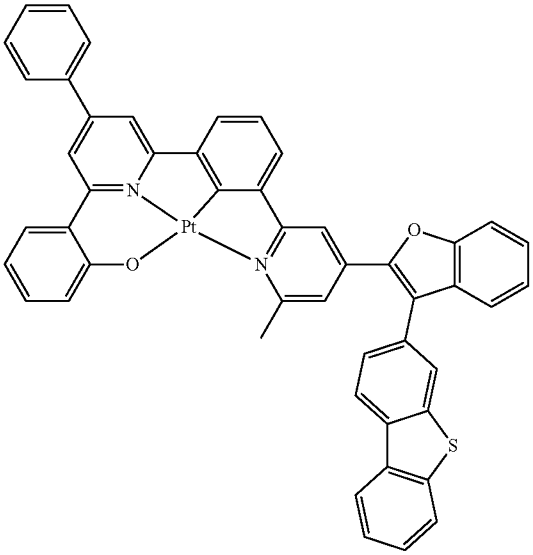
A 140
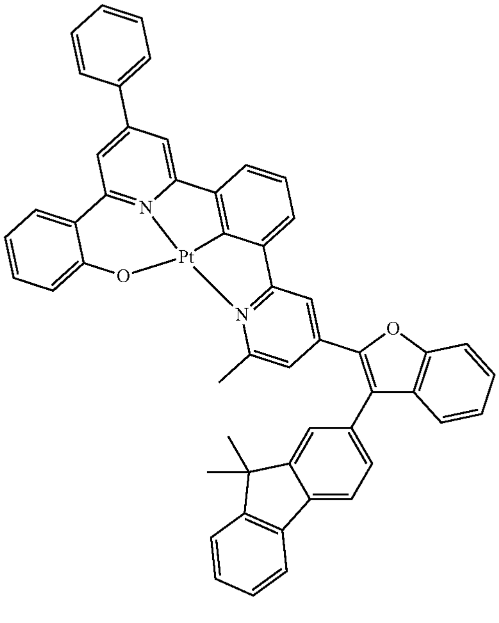
-continued
A 141
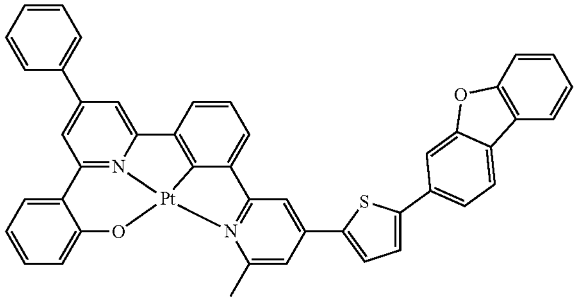
A 142
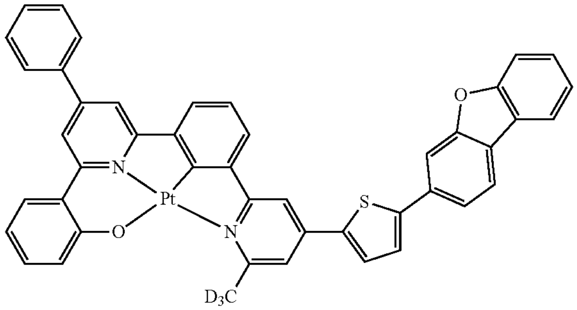
A 143
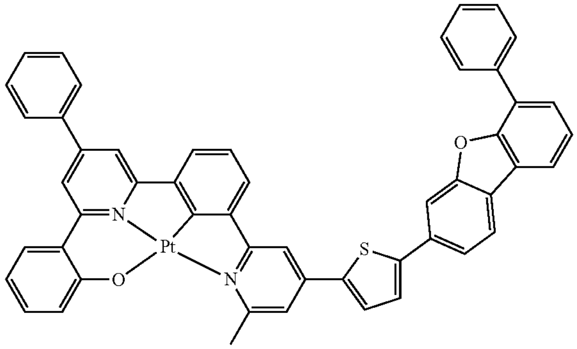
A 144
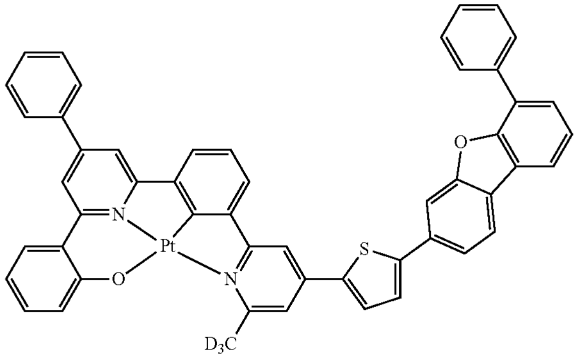

-continued
A 145
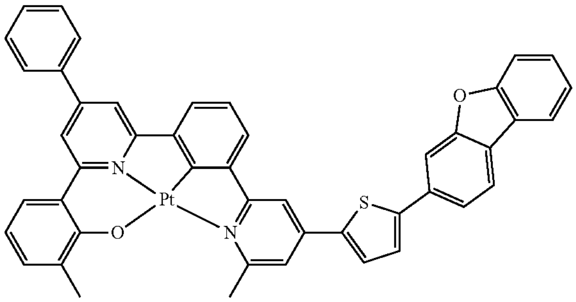
A 146
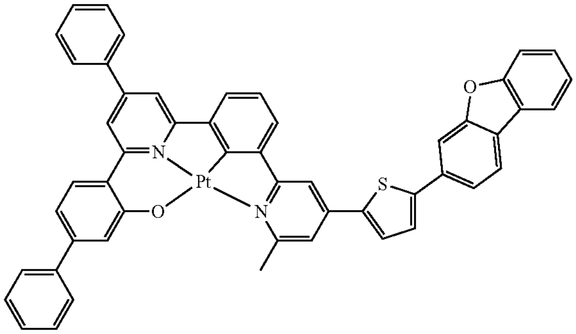
A 147
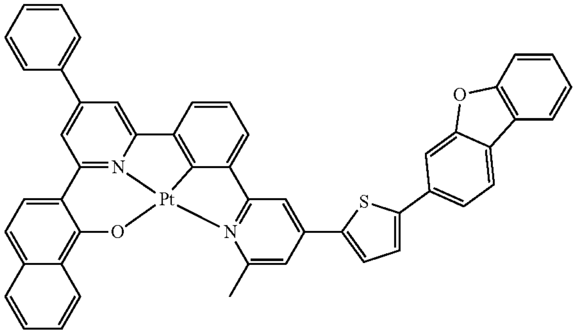
A 148
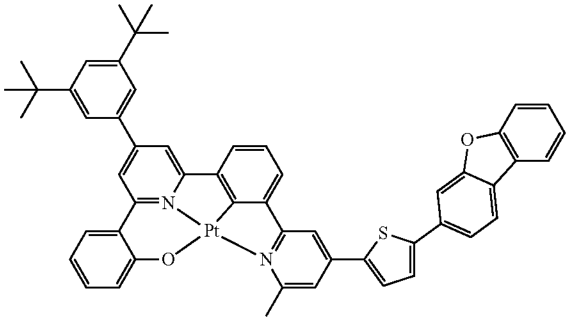
-continued
A 149
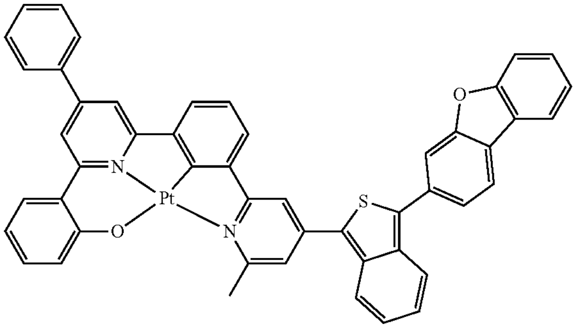
A 150
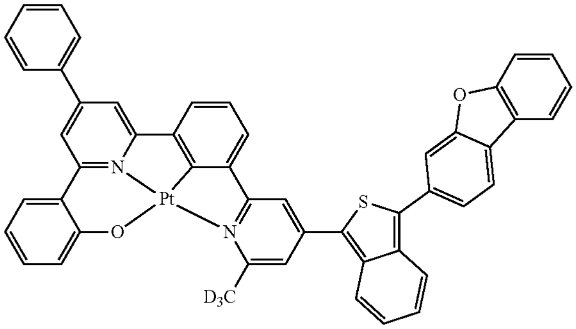
A 151
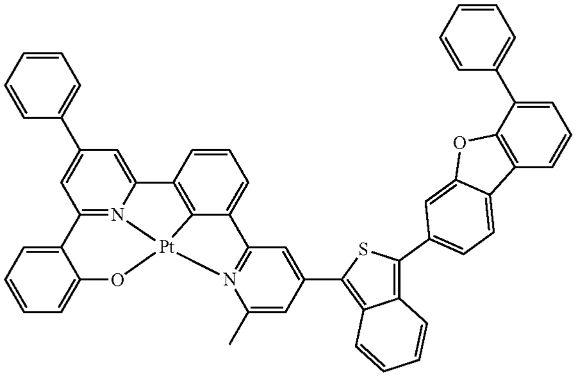
A 152
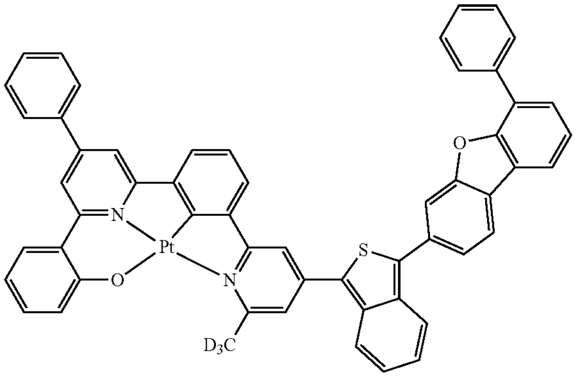

-continued
A 153
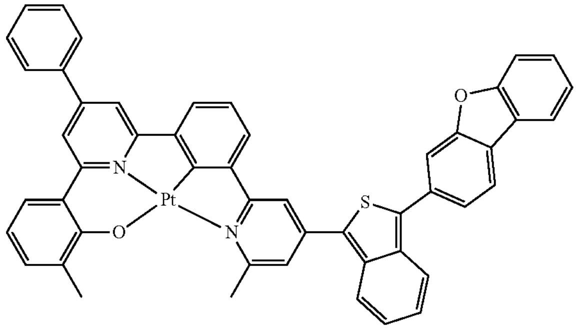
A 154
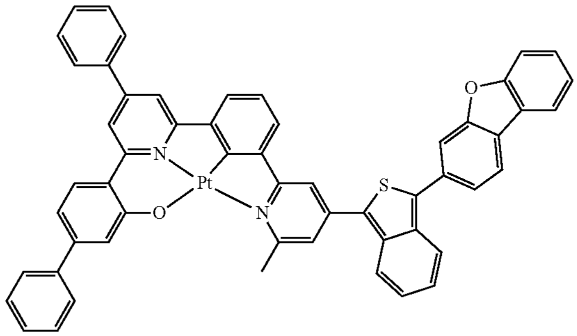
A 155
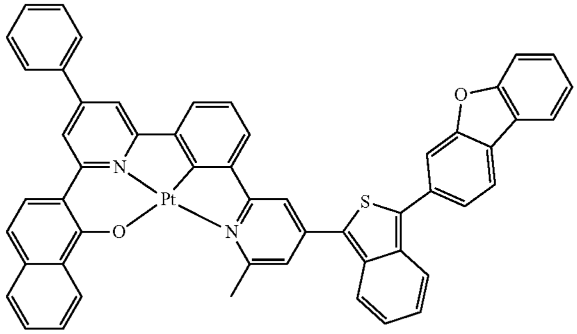
A 156
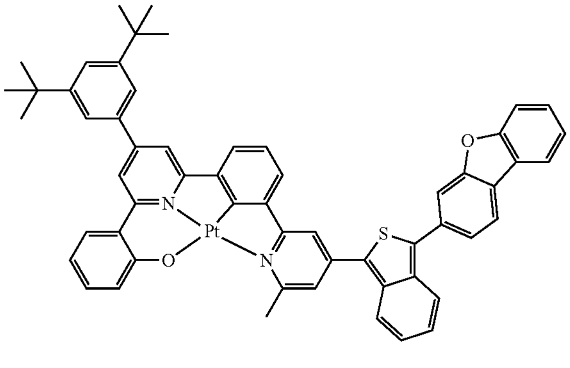
-continued
A 157
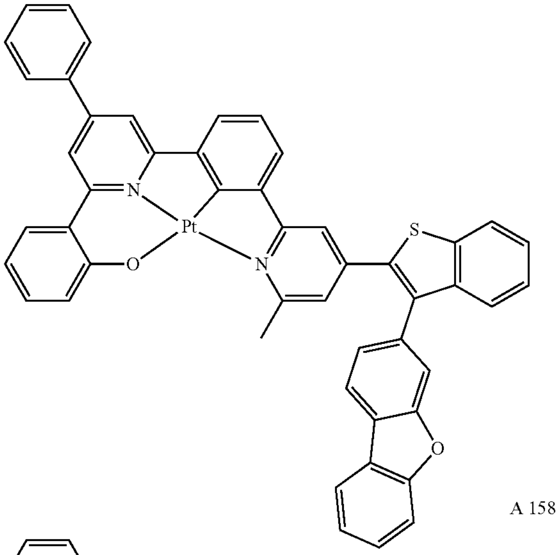
A 158
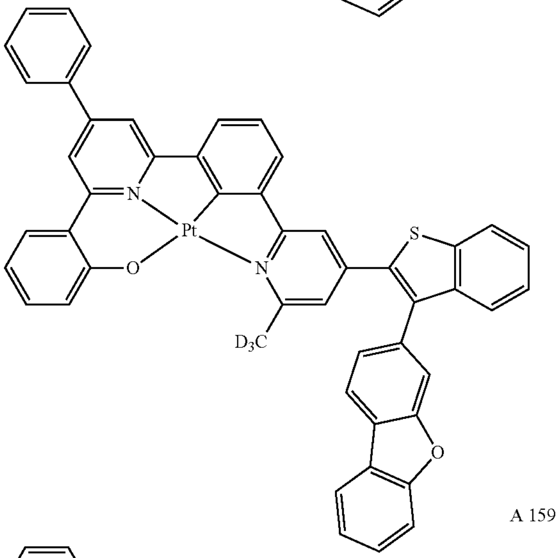
A 159
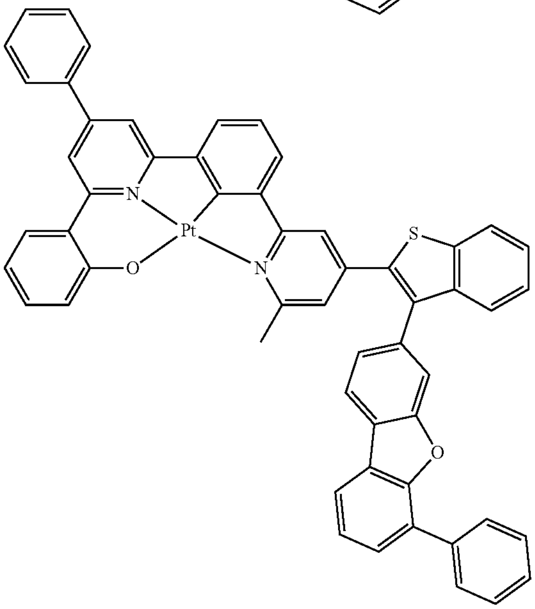

-continued
A 160
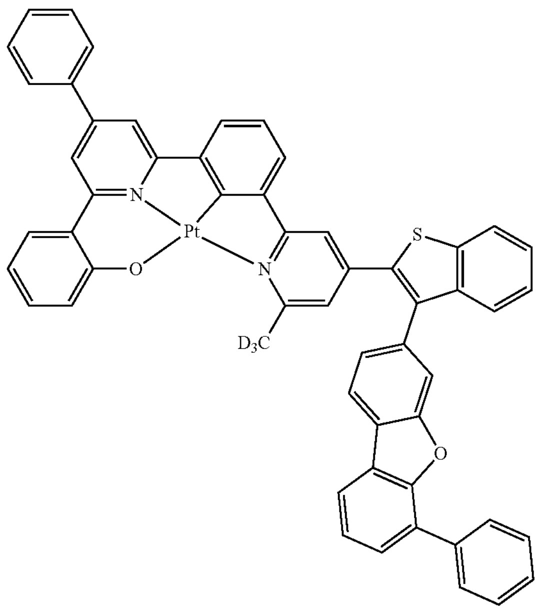
A 161
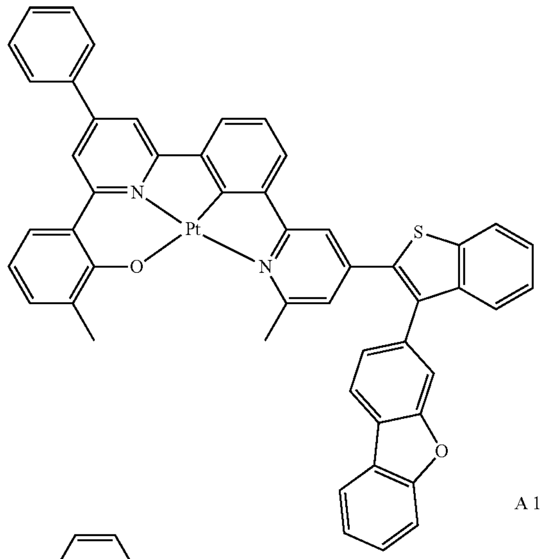
A 162
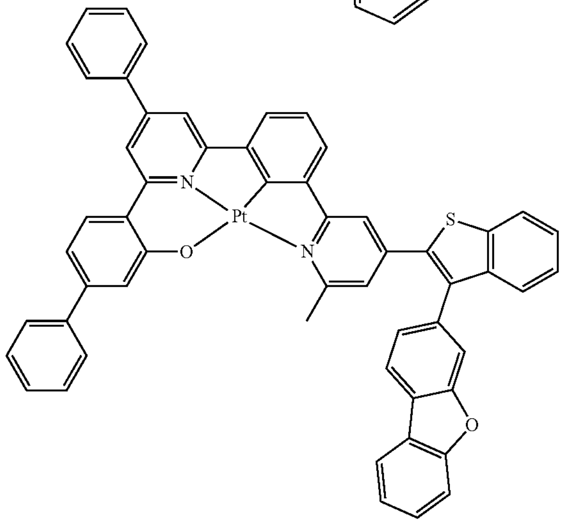
-continued
A 163
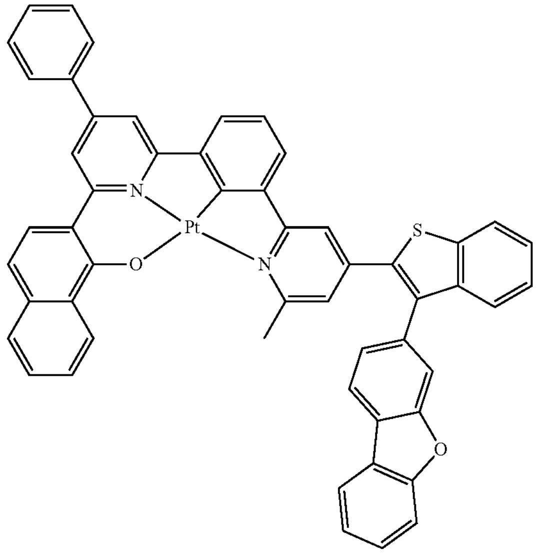
A 164
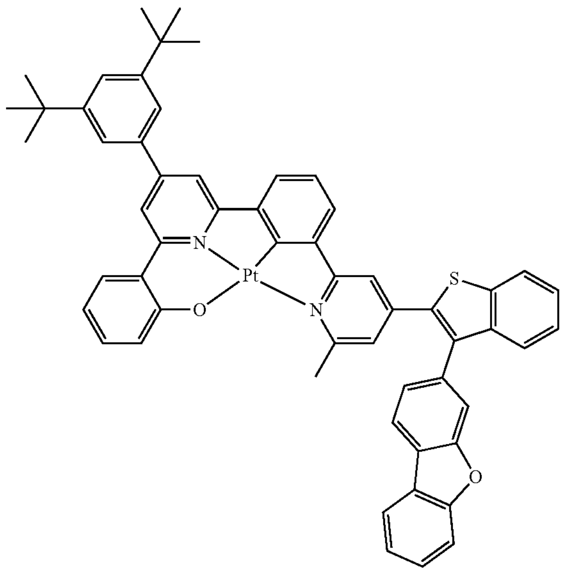
A 165
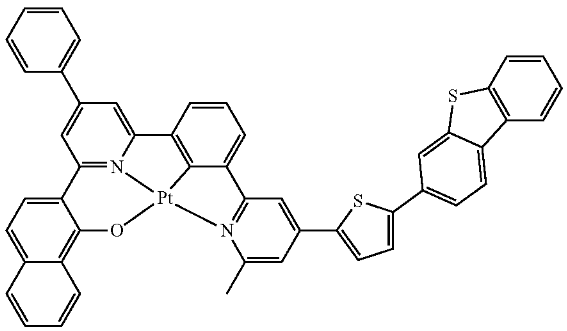

A 166
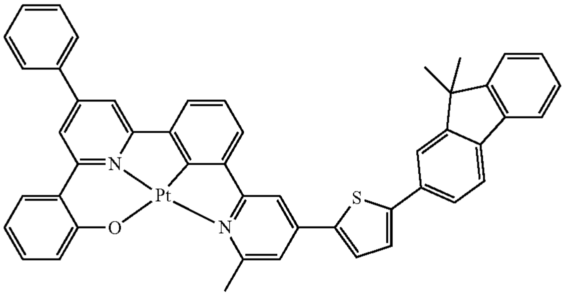
A 167
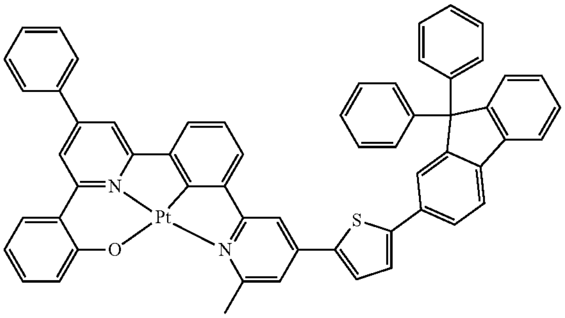
A 168
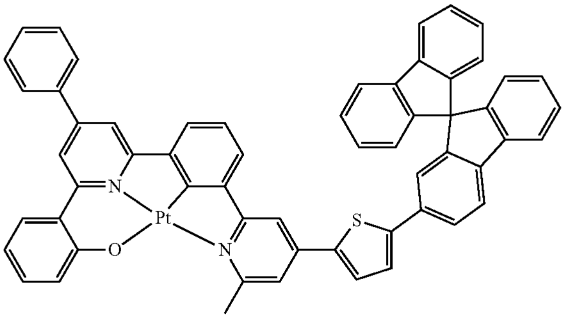
A 169
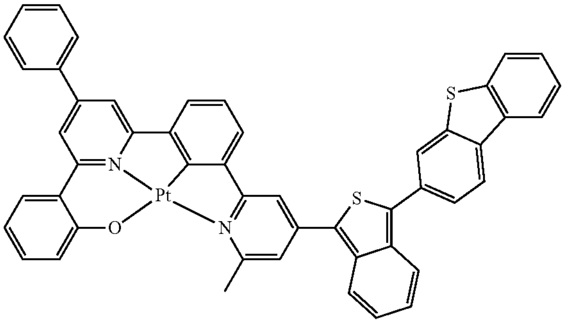
A 170
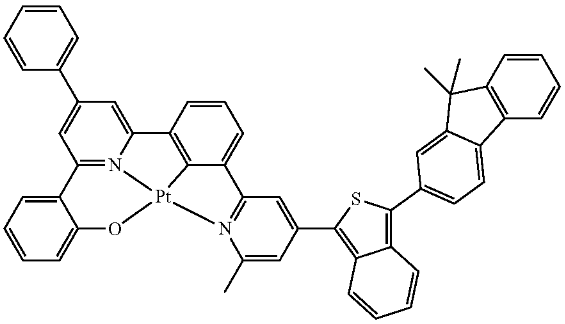
A 171
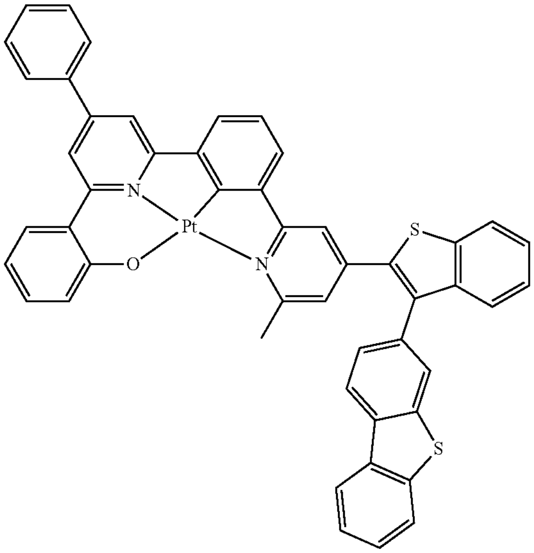
A 172
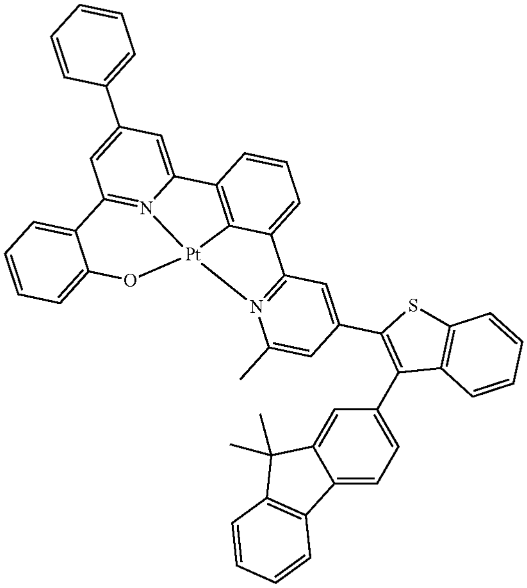

-continued
A 173
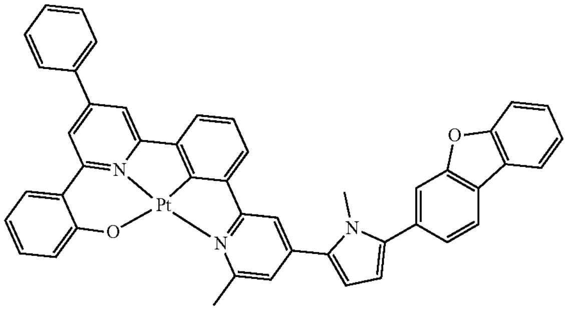
A 174
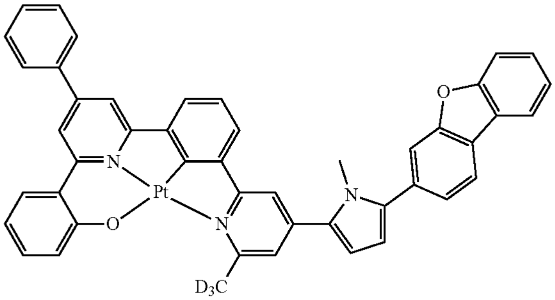
A 175
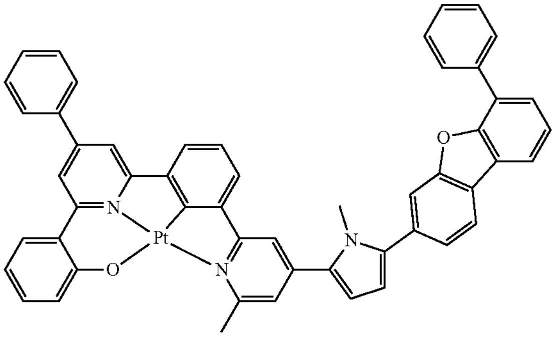
A 176
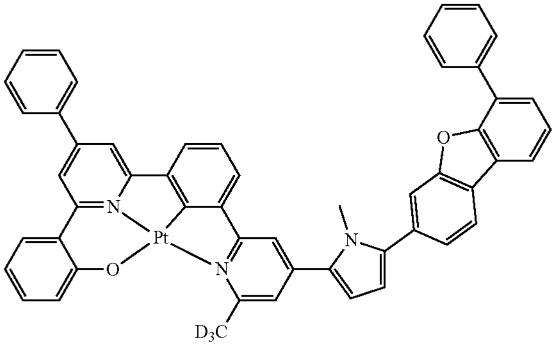
-continued
A 177
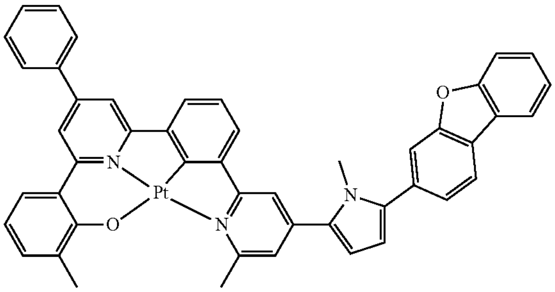
A 178
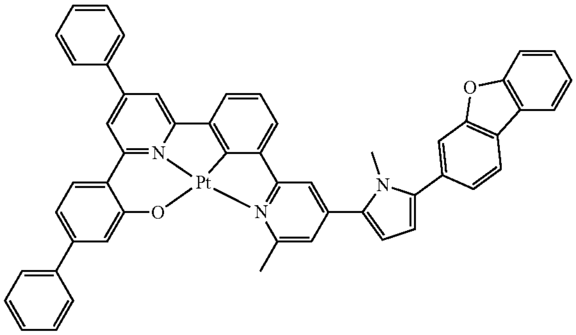
A 179
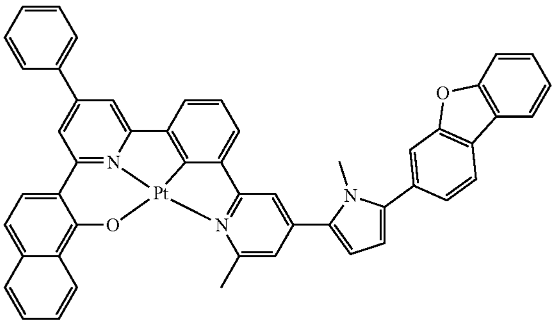
A 180
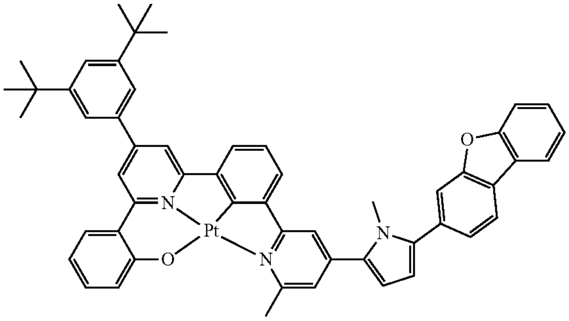

-continued
A 181
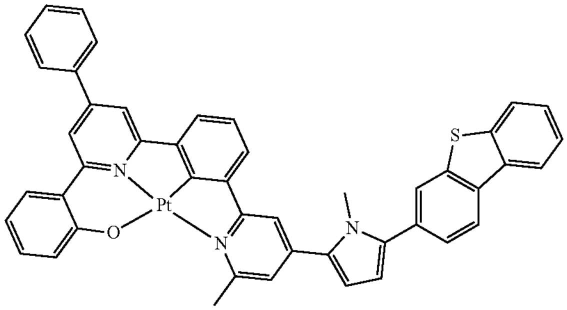
A 182
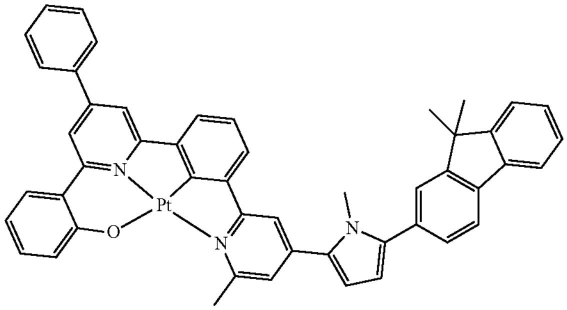
A 183
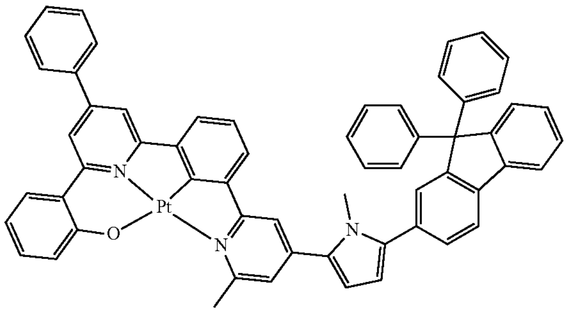
A 184
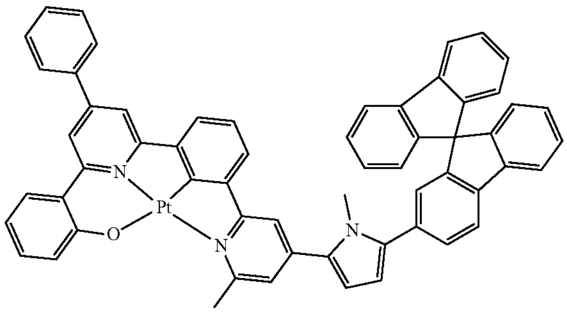
-continued
A 185
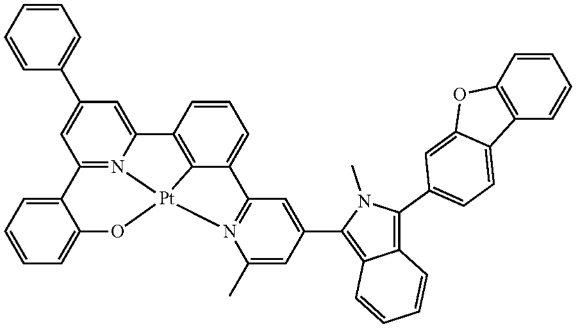
A 186
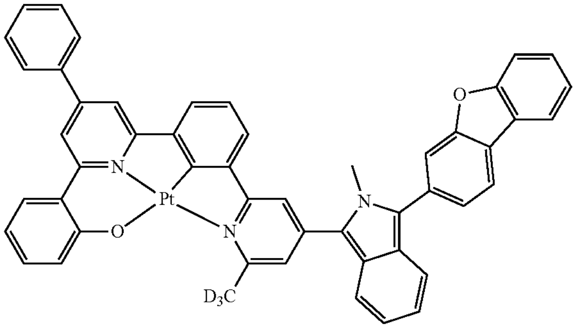
A 187
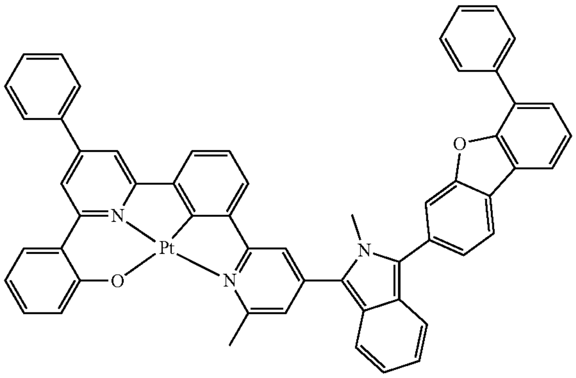
A 188
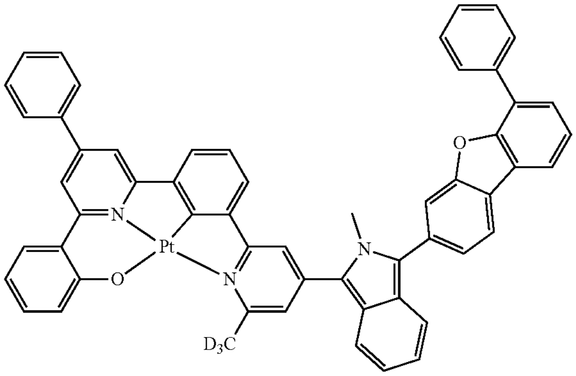

-continued
A 189
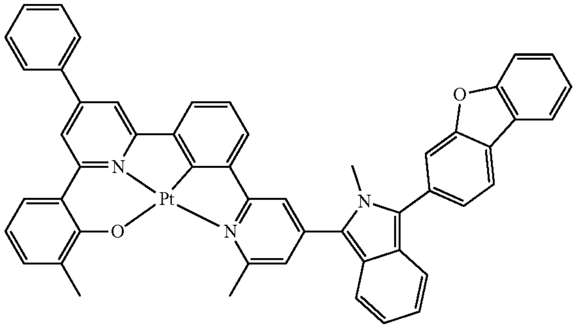
A 190
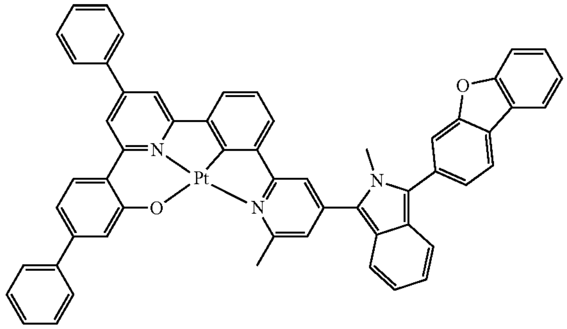
A 191
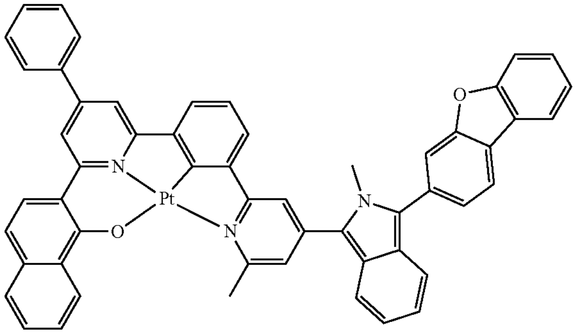
A 192
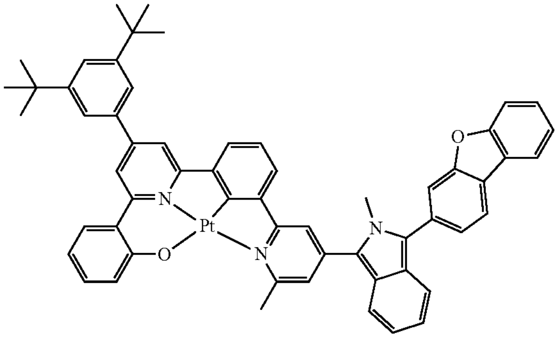
-continued
A 193
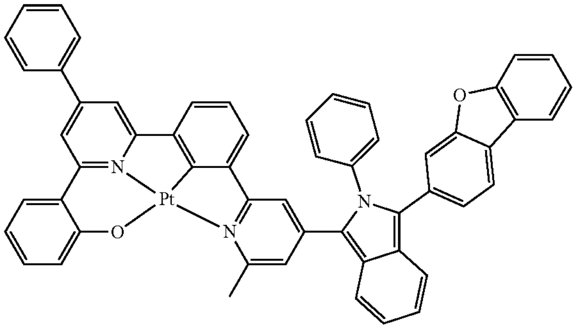
A 194
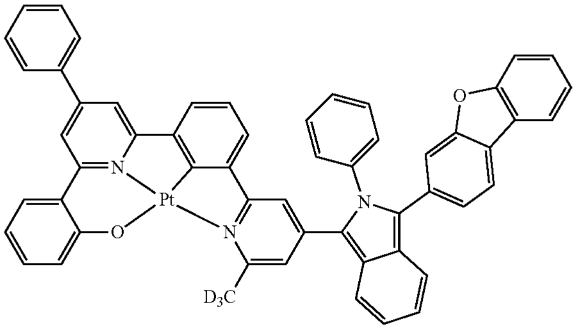
A 195
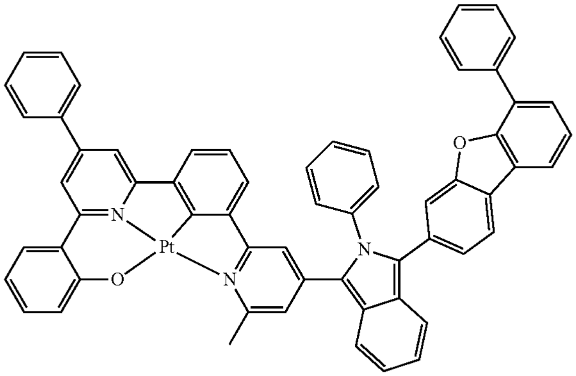
A 196
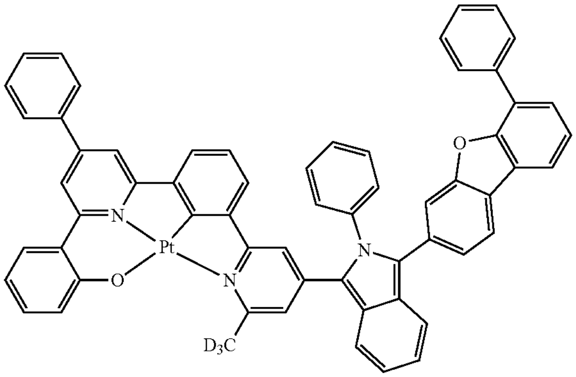

-continued
A 197
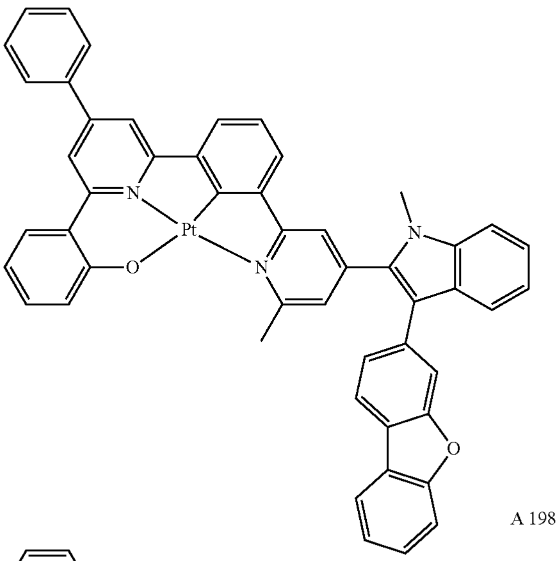
A 198
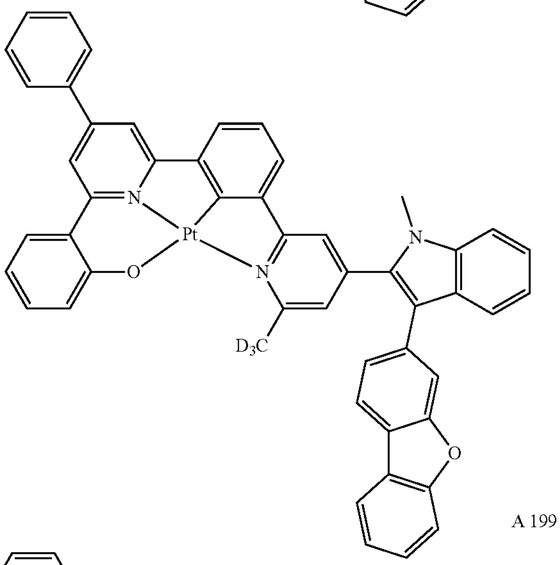
A 199
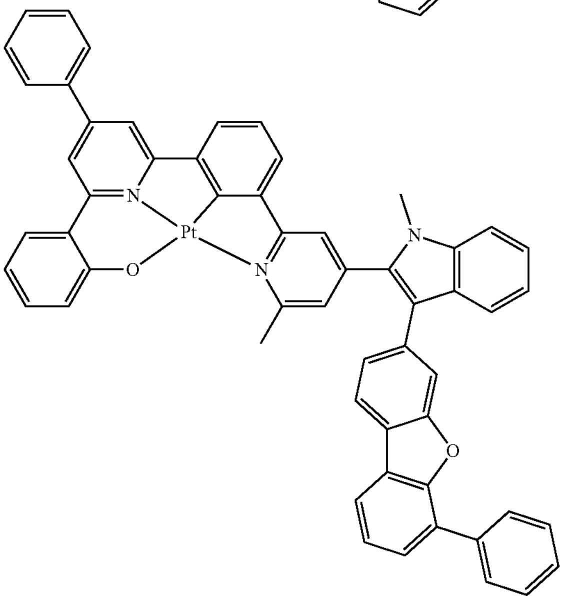
-continued
A 200
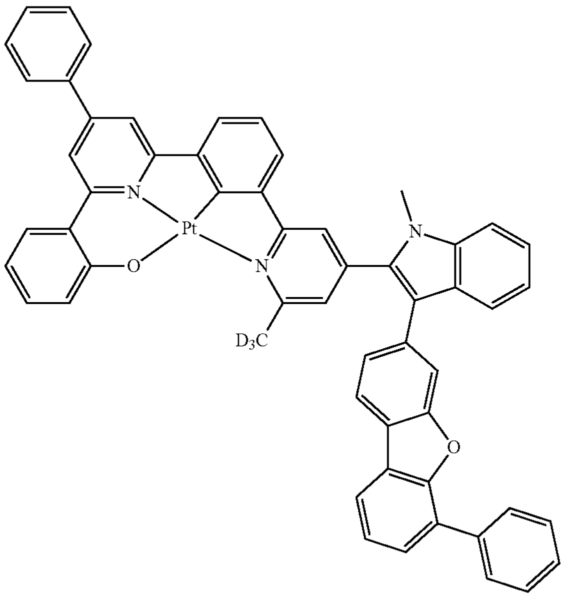
A 201
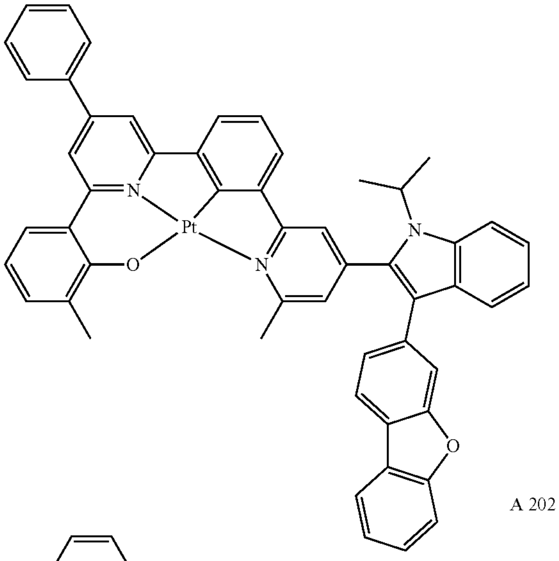
A 202
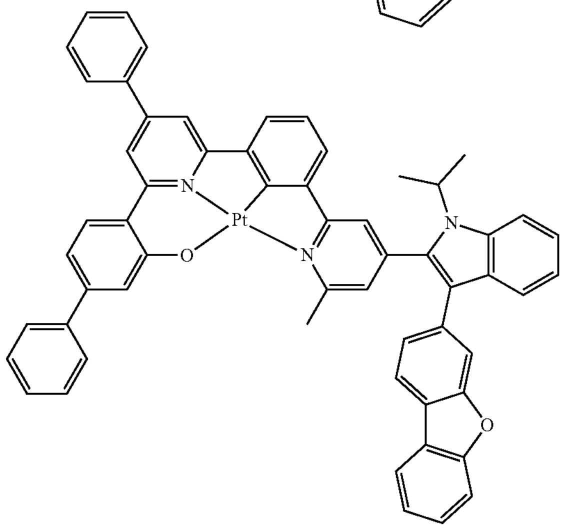

-continued
A 203
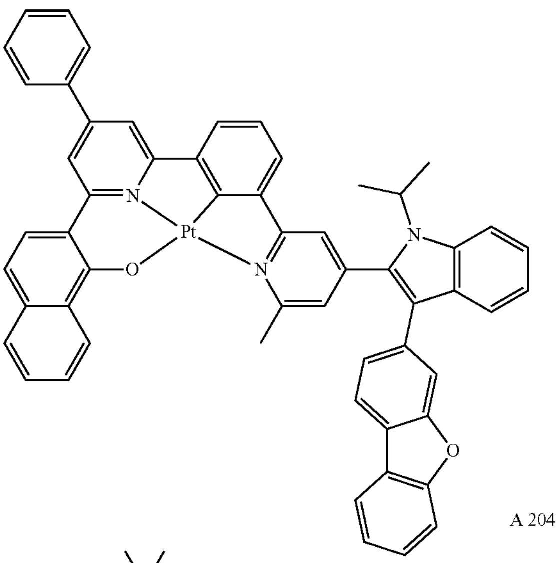
A 204
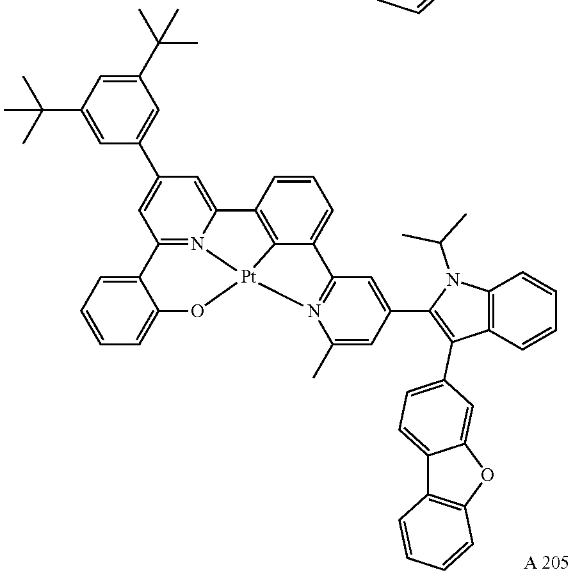
A 205
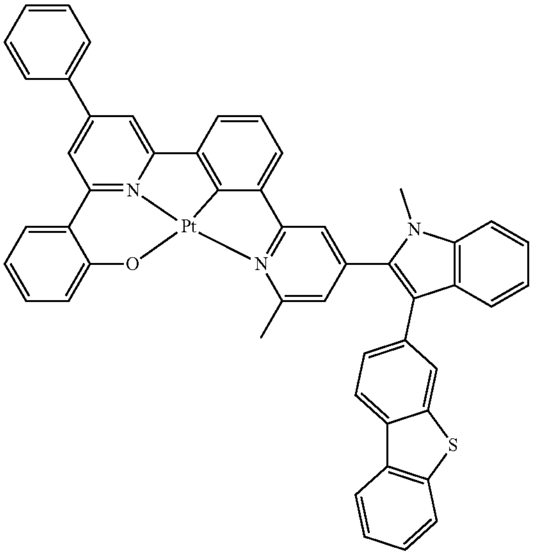
-continued
A 206
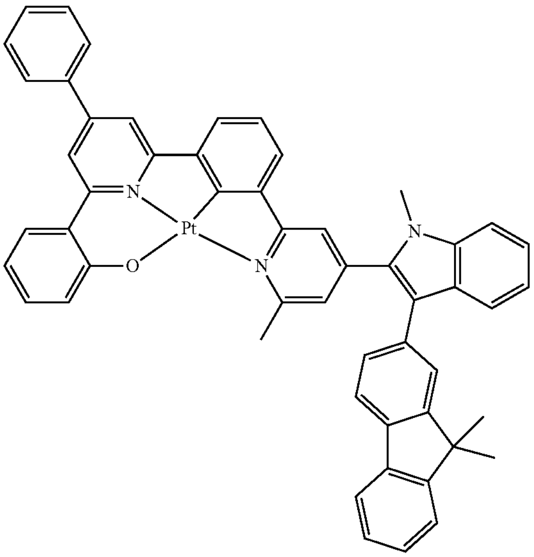
A 207
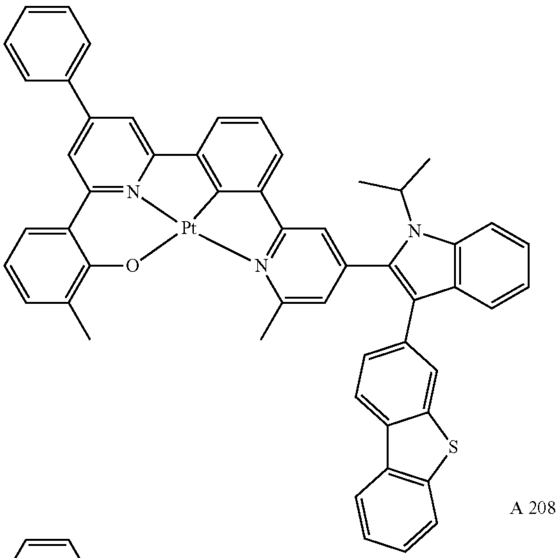
A 208
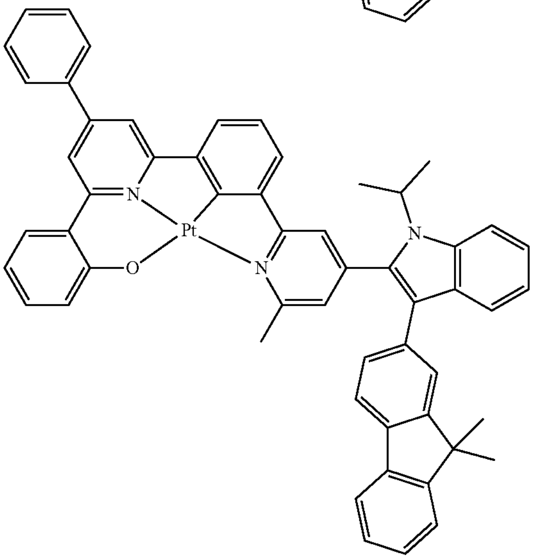

-continued
A 209
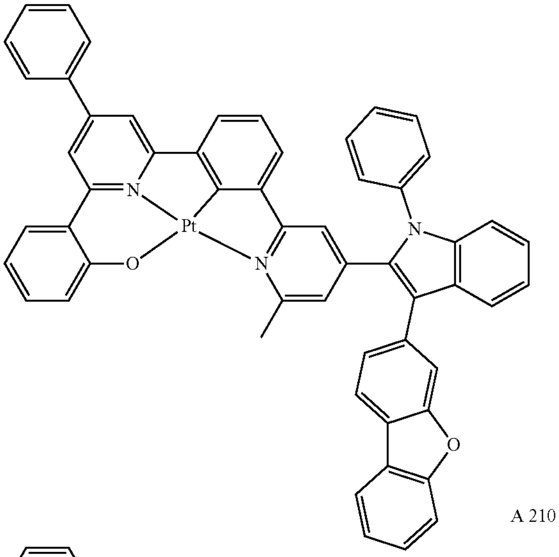
A 210
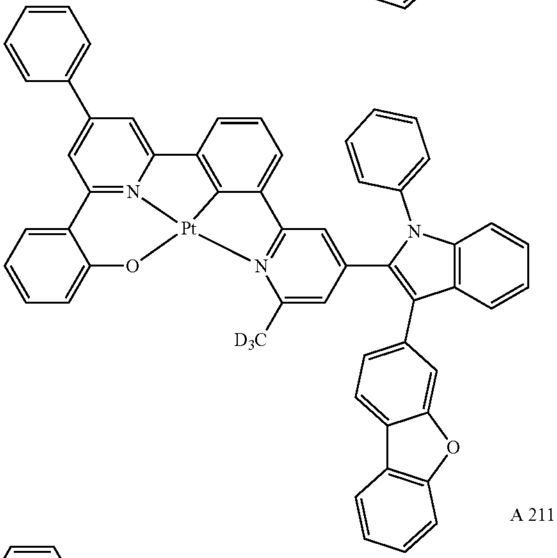
A 211
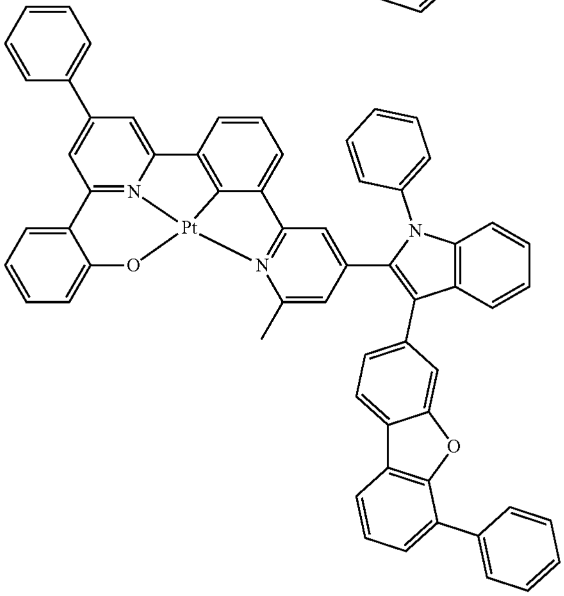
-continued
A 212
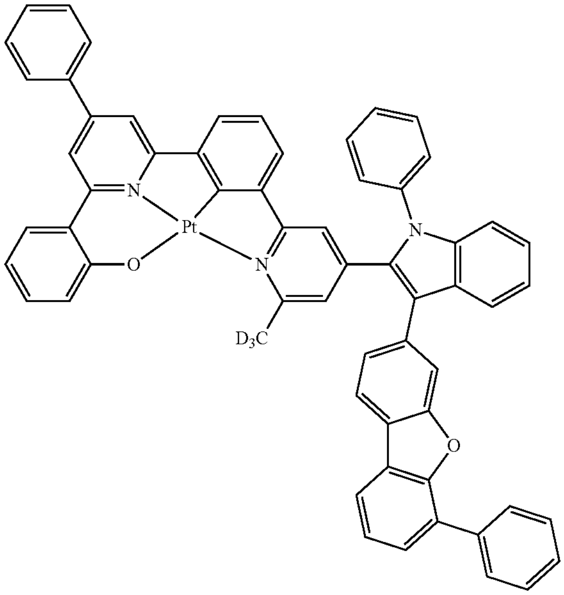
A 213
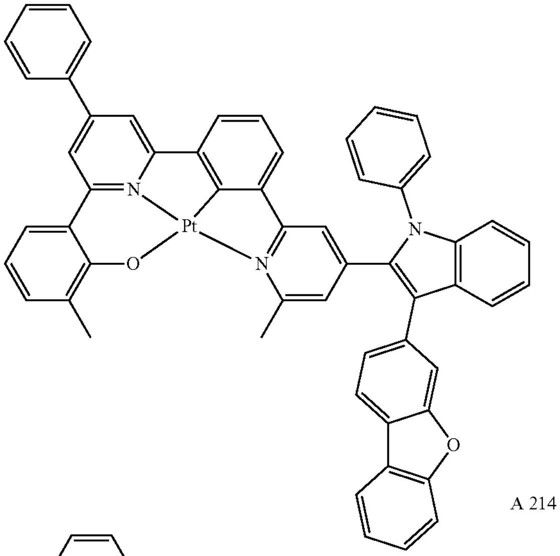
A 214
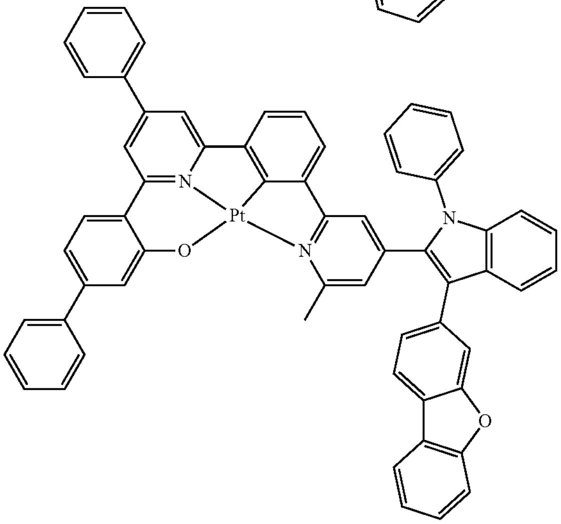

-continued
A 215
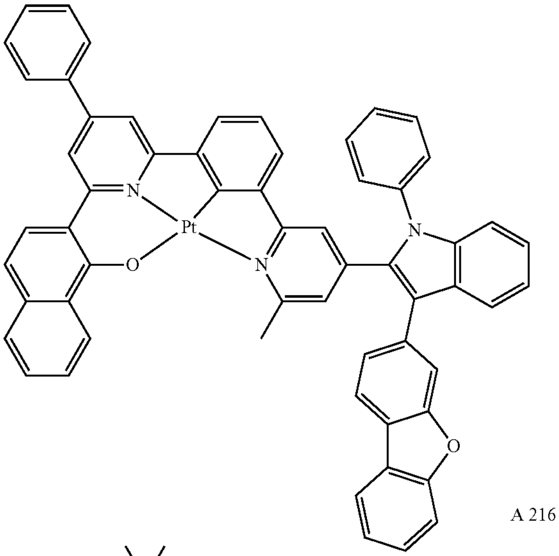
A 216
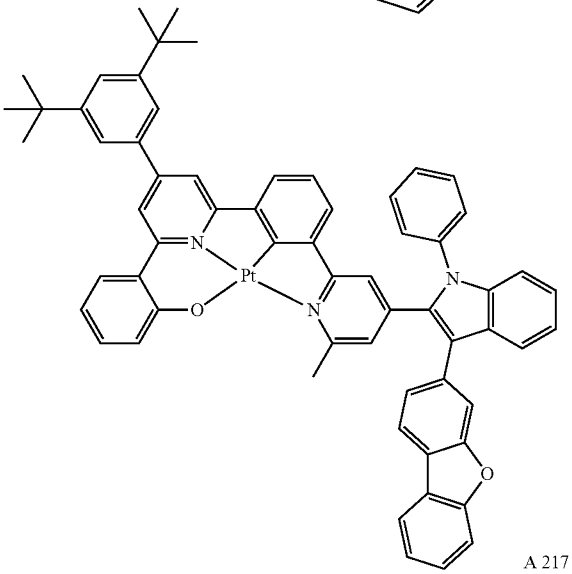
A 217
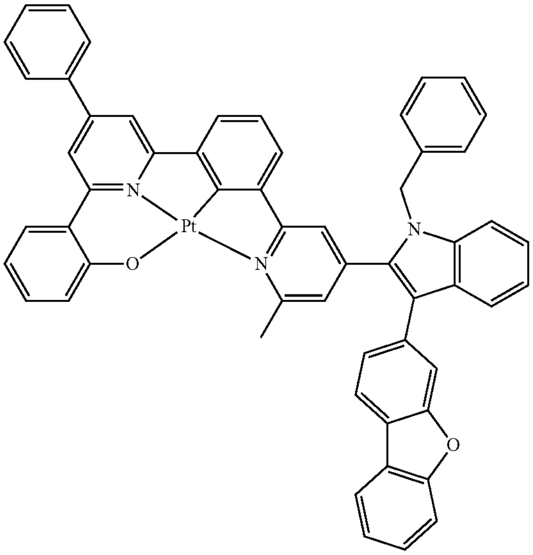
-continued
A 218
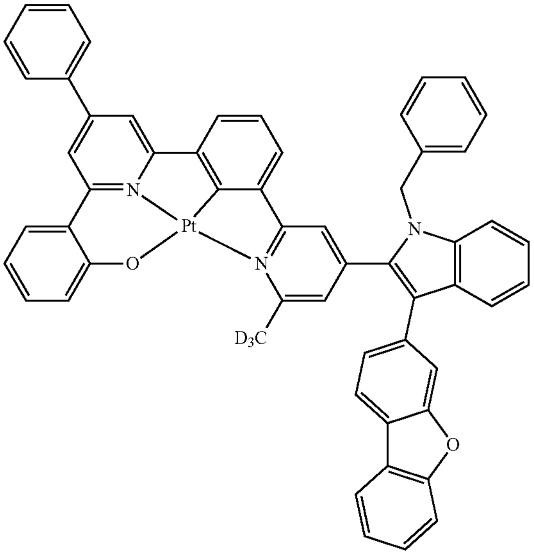
A 219
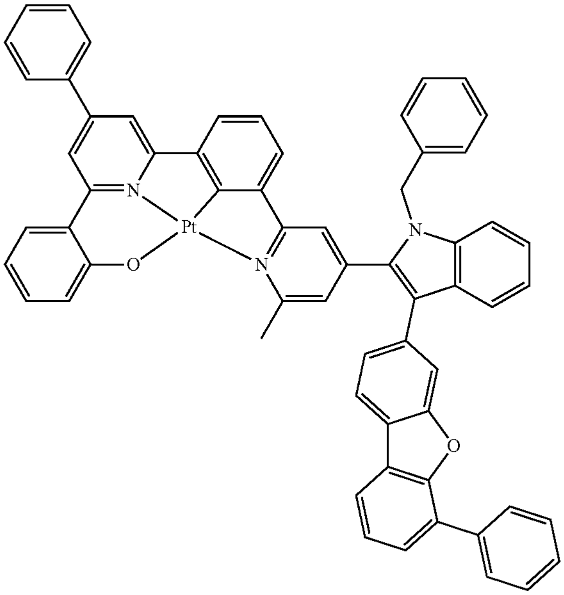

-continued
A 220
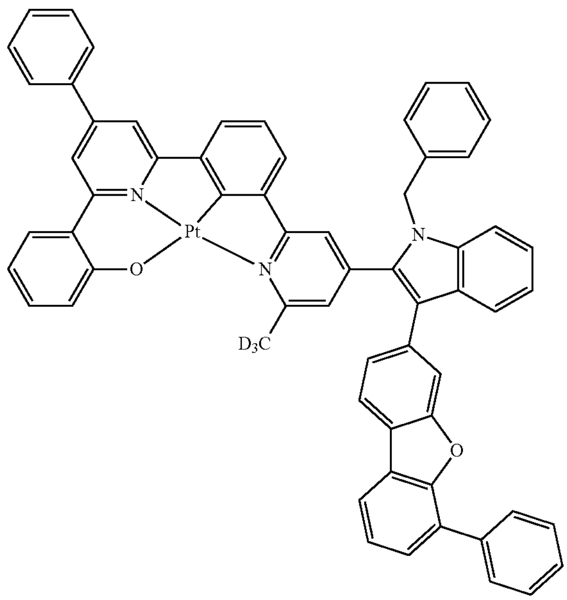
A 221
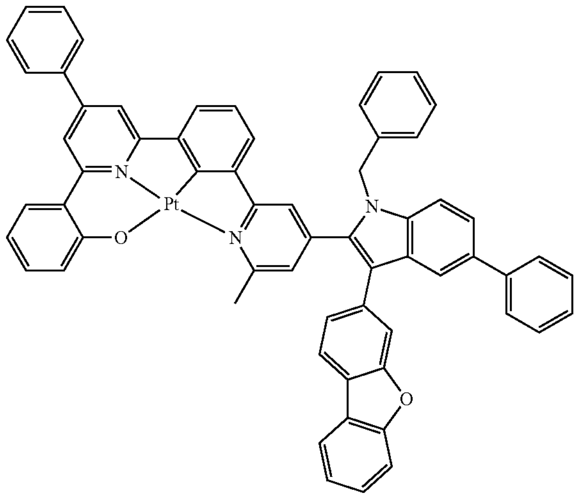
A 222
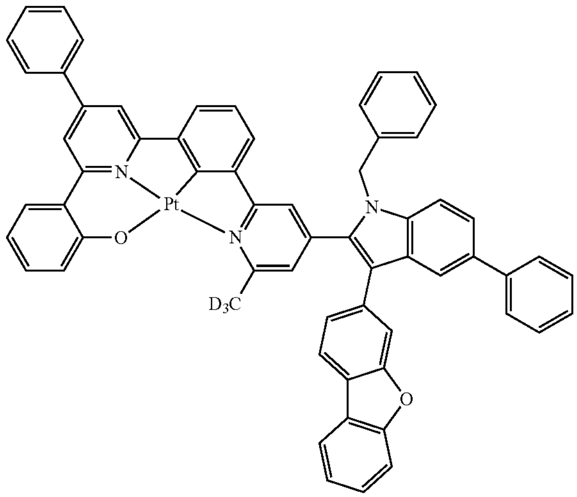
-continued
A 223
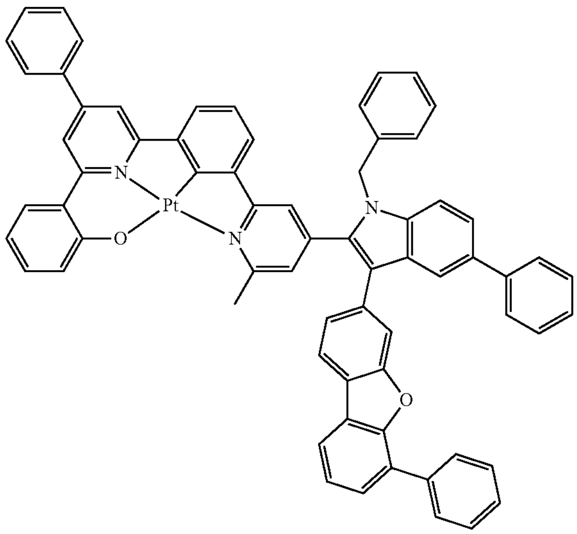
A 224
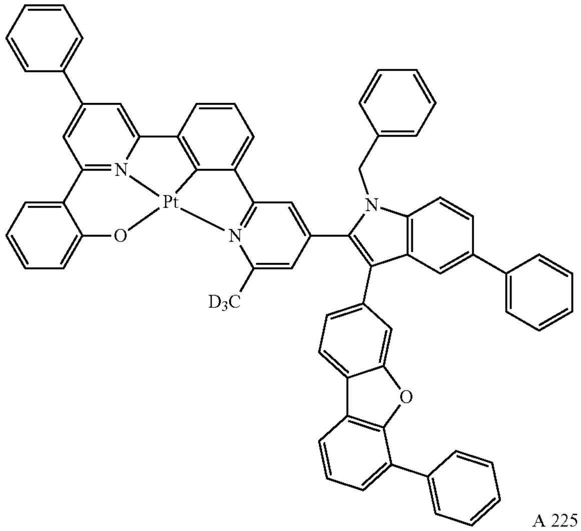
A 225
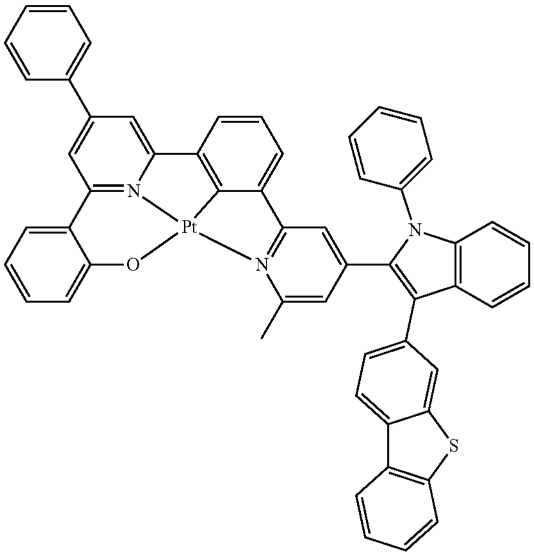

-continued
A 226
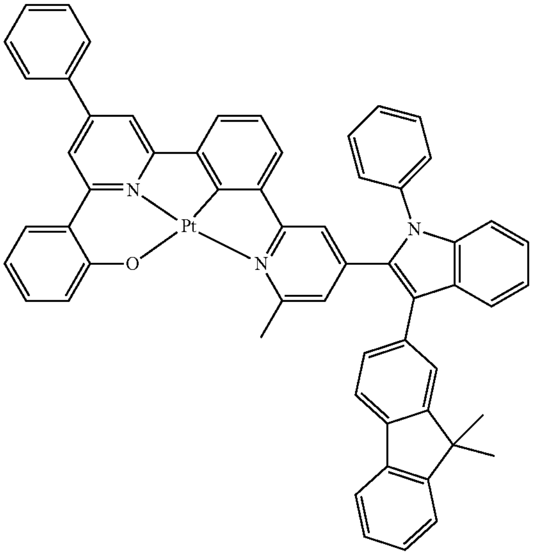
A 227
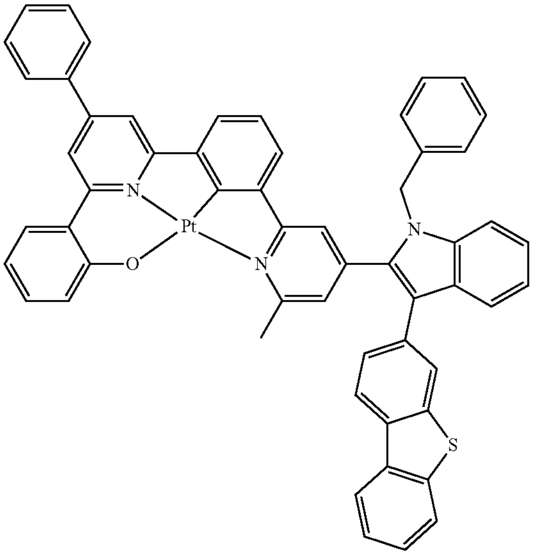
-continued
A 228
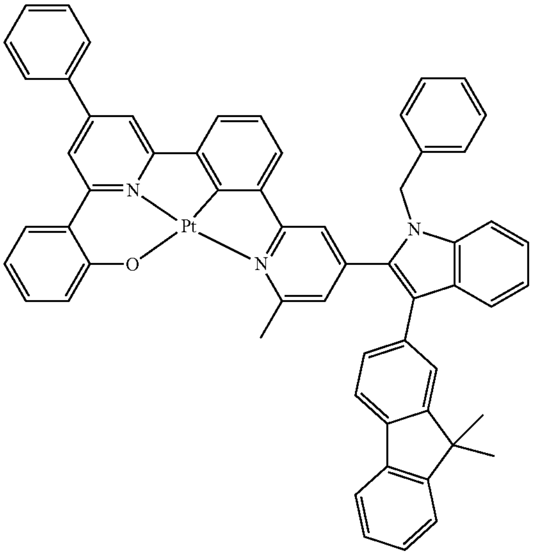
A 229
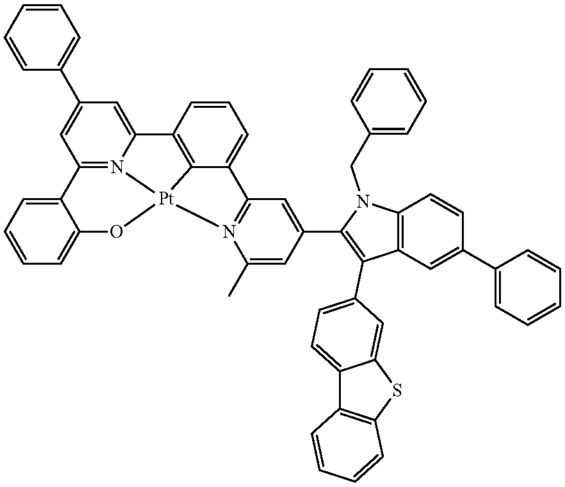
A 230
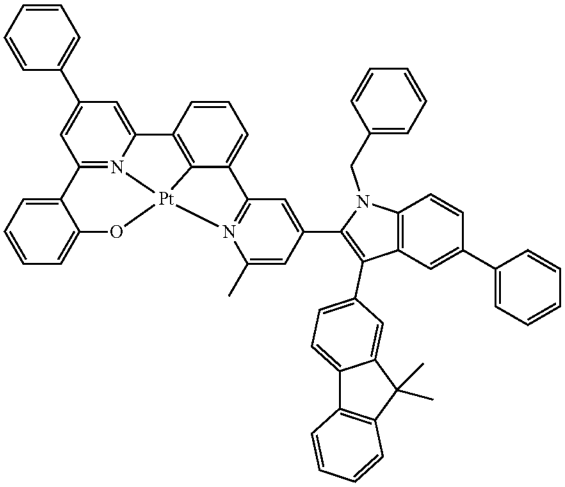

A precursor of the metal complex, having a structure as shown in a formula (5), formula (5)

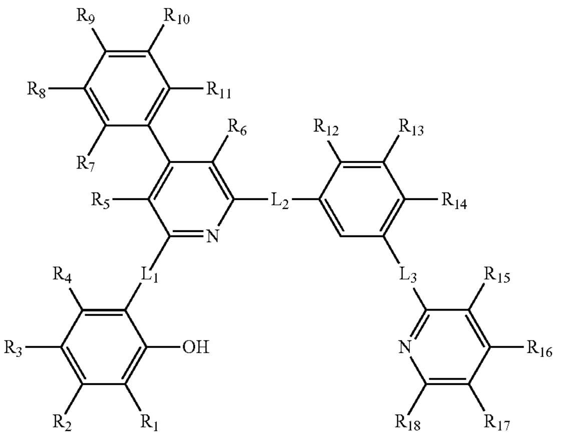

wherein at least one of the $R_1$-$R_{18}$ has a structure shown in the formula (2), formula (2)

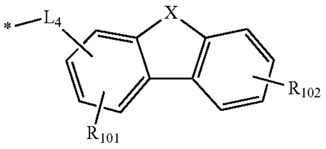

wherein the $R_1$-$R_{18}$, the $R_{101}$, and the $R_{102}$ are as defined above.

One of the objectives of the present disclosure is further to provide an electroluminescent device, comprising a cathode, an anode, and an organic layer arranged between the cathode and the anode, wherein at least one of the organic layer comprises the metal complex.

One of the objectives of the present disclosure is to provide an electroluminescent device, wherein the organic layer comprises a light-emitting layer, and the metal complex is used as a material in the light-emitting layer, especially a green light-emitting material.

One of the objectives of the present disclosure is to provide an electroluminescent device, the organic layer comprises a hole injection layer, and the metal complex is used as a material in the hole injection layer.

Results of the device indicate that the compounds of the present disclosure have advantages of high light and electrochemical stability, a high color saturation, a high luminous efficiency, a long service life of the device and the like, and can be used in the organic electroluminescent device. Especially, as a green phosphorescent material, the metal complex has the potential to be used in the OLED industry.

DETAILED DESCRIPTION OF EMBODIMENTS

Figure 1:
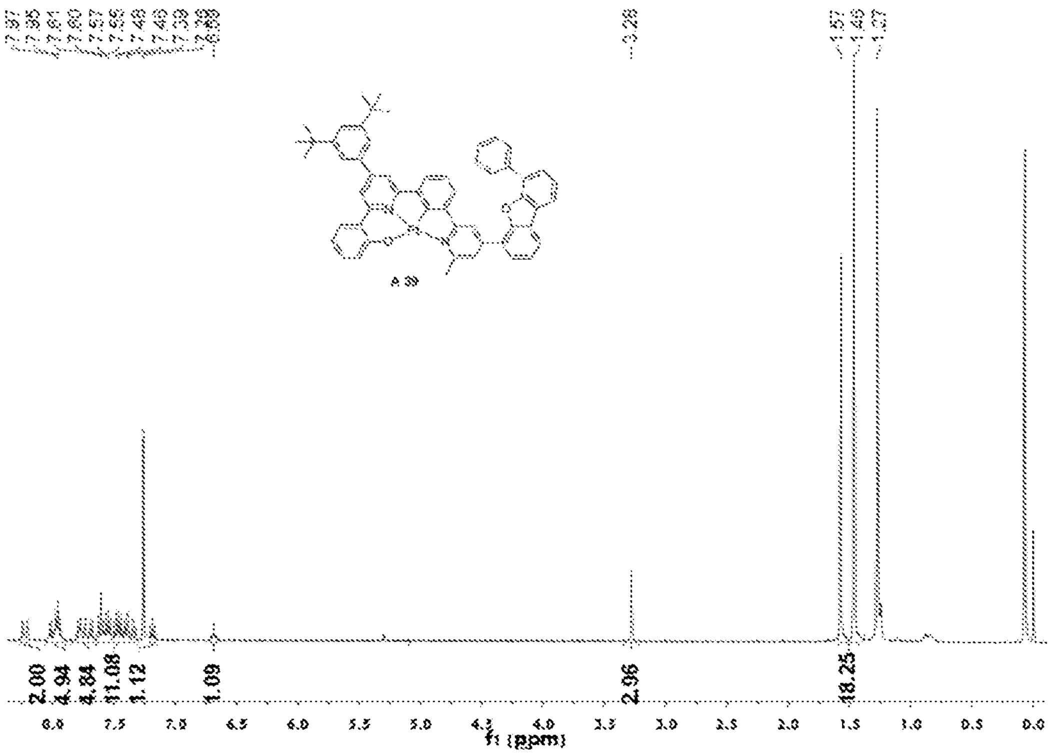
FIG. 1 is a HNMR spectrum of a compound A 39.
Figure 2:
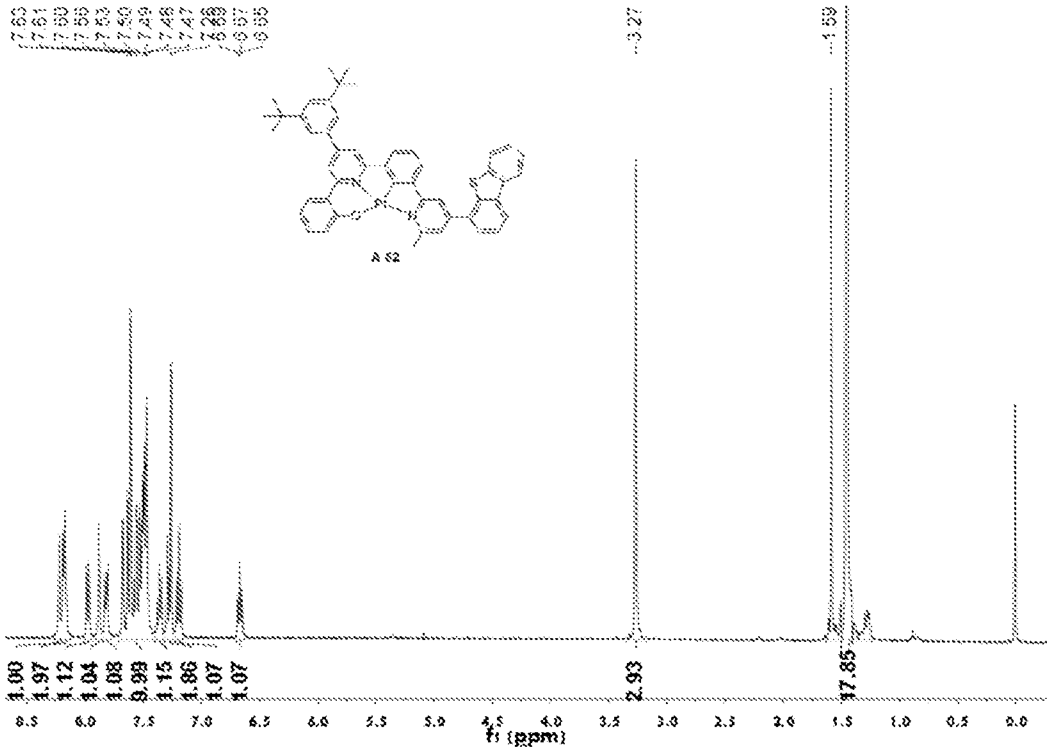
FIG. 2 is a HNMR spectrum of a compound A 82.
Figure 3:
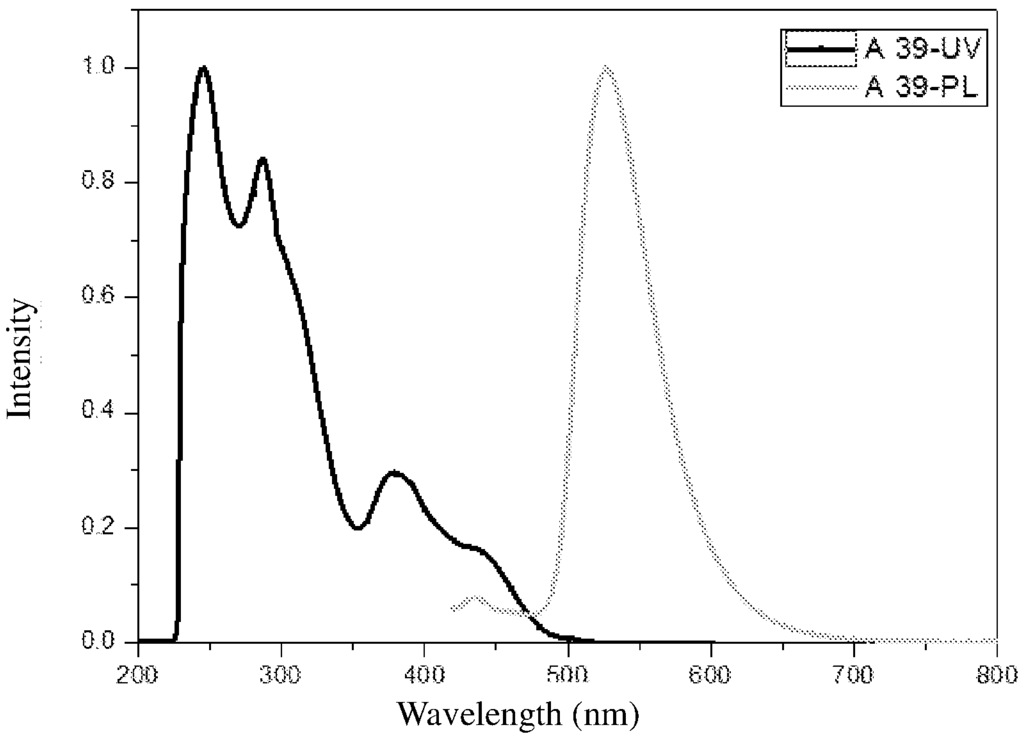
FIG. 3 is a UV/PL spectrum of the compound A 39.
Figure 4:
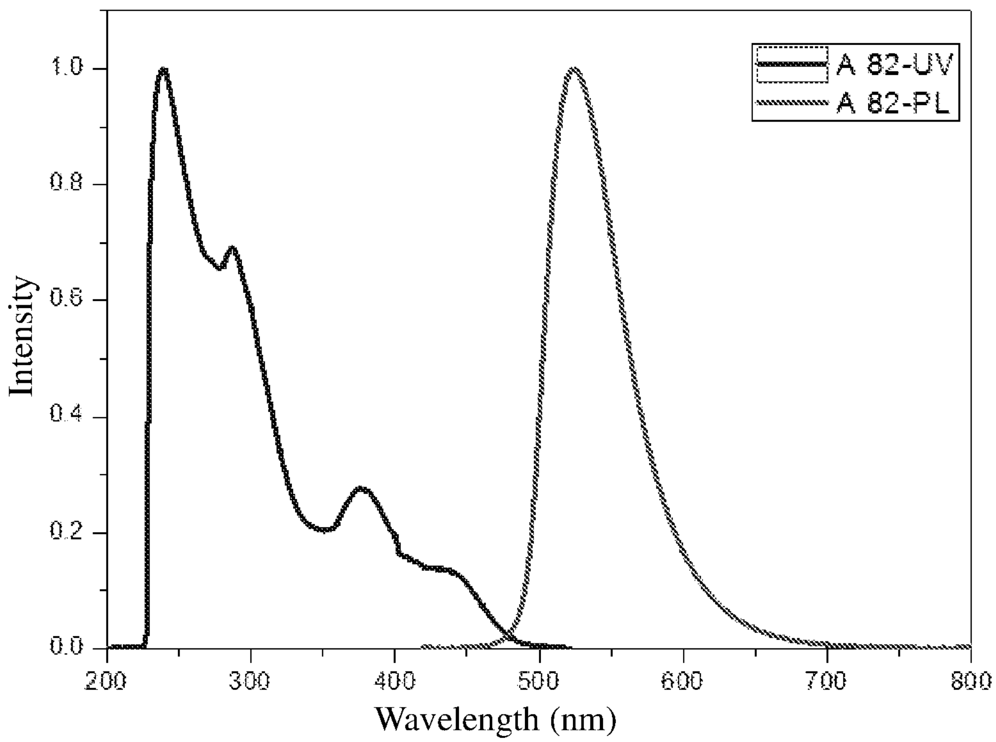
FIG. 4 is a UV/PL spectrum of the compound A 82.

The examples are only for conveniently understand the present disclosure and should not be regarded as specific limitations to the present disclosure.

Raw materials and solvents involved in the synthesis of the compounds of the present disclosure are all purchased from suppliers well known to a person skilled in the art, such as Alfa, Acros, and the like.

Example 1

Synthesis of Compound A1

Synthesis of Intermediate A1-6

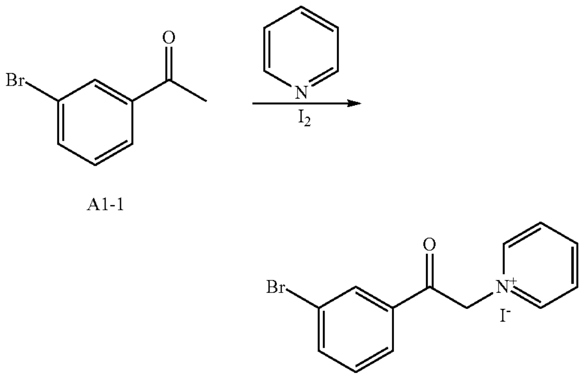

A1-1

A1-2

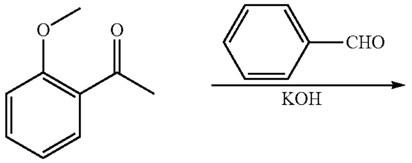

A1-3

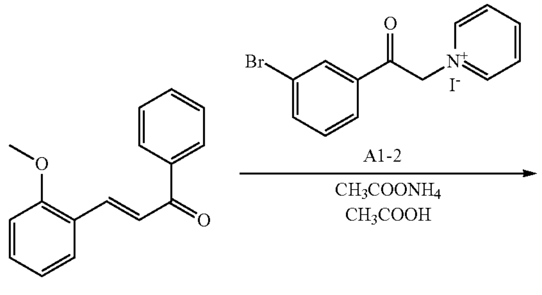

A1-4

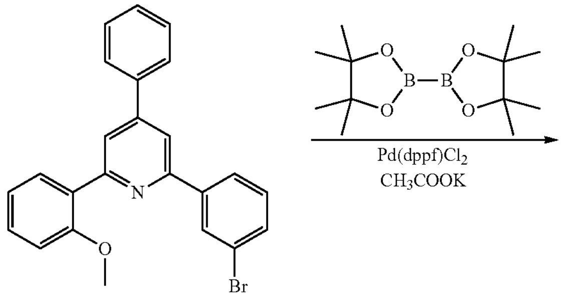

A1-5

-continued

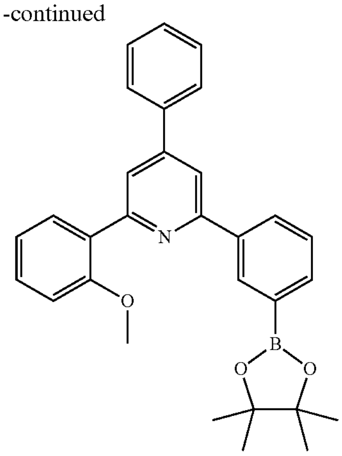

A1-6

Synthesis of Compound A1-2

An A1-1 (120 g, 0.6 mol, 1.0 eq), an iodine simple substance (168.3 g, 0.6 mol, 1.0 eq), and pyridine (600 ml) were sequentially added into a 1-L single-neck flask, subjected to nitrogen replacement for three times in vacuum, heated, and subjected to a reflux reaction overnight. A large amount of a solid was separated out in the reaction. An obtained product was cooled to room temperature and filtered. A filter cake was eluted twice using methanol with a total amount of 200 ml. After the filter cake was drained by suction, a solid was thermally pulped using the methanol for 2 times with 200 ml each time. The solid was collected and dried to obtain an off-white solid A1-2 (207.3 g and yield of 85.1%). Mass spectrum: 405.0 (M+H)

Synthesis of Compound A1-4

An A1-3 (96 g, 0.63 mol, 1.0 eq), benzaldehyde (74.6 g, 0.7 mol, 1.1 eq), potassium hydroxide (179.3 g, 3.2 mol, 4.0 eq), deionized water (195 ml), and methanol (670 ml) were sequentially added into a 3-L three-neck flask, subjected to nitrogen replacement for three times in vacuum, heated to 50° C., and subjected to a reaction overnight. A large amount of a solid was separated out. An obtained product was cooled to room temperature and filtered. A solid was collected and added into ethyl acetate (500 ml), and stirred to dissolve. Deionized water was added for washing twice with 200 ml each time. An organic phase was concentrated to a small amount. Methanol (250 ml) was added. An obtained mixture was pulped, purified, and filtered under suction. A filter cake was collected and dried to obtain a white solid A1-4 (93.5 g and yield of 61.4%). Mass spectrum: 239.2 (M+H)

Synthesis of Compound A1-5

An A1-4 (80 g, 0.33 mol, 1.0 eq), the A1-2 (135.6 g, 0.33 mol, 1.0 eq), ammonium acetate (155.2 g, 2.0 mol, 6.0 eq), and acetic acid (350 ml) were sequentially added into a 1-L single-neck flask, subjected to nitrogen replacement for three times in vacuum, heated, and subjected to a reflux reaction overnight. An obtained product was cooled to room temperature and concentrated to remove the acetic acid. A solid obtained by a rotary evaporation was added into dichloromethane (1.0 L) and stirred to dissolve. Deionized water was added for washing twice with 300 ml each time. An organic phase was concentrated to a small amount. Methanol (250 ml) was added for crystallization purification. A suction filtration was performed. A solid was collected and thermally pulped using the methanol (300 ml) for 2 times. The solid was dried to obtain a white solid A1-5 (119.6 g and yield of 85.6%). Mass spectrum: 417.3 (M+H)

Synthesis of Compound A1-6

The compound A1-5 (110.0 g, 0.260 mol, 1.0 eq), bis(pinacolato)diboron (80.5 g, 0.31 mol, 1.2 eq), [1,1'-bis(diphenylphosphino)ferrocene]palladium dichloride (3.87 g, 5.28 mmol, 0.02 eq), potassium acetate (51.8 g, 0.52 mol, 2.0 eq), and dioxane (900 ml) were sequentially added into a 1-L single-neck flask, subjected to nitrogen replacement for three times, heated to 100° C., and stirred under heat preservation for 6 h. A monitoring by TLC was performed (a developing solvent:ethyl acetate/n-hexane=1/10) and the raw material A1-5 was basically reacted completely. A reaction solution was cooled to 40° C. and filtered with a diatomite. A filter cake was washed with a small amount of dioxane, a filtrate was concentrated to 200 ml under reduced pressure, methanol (400 ml) was added, and the materials were stirred at room temperature for 2 h and filtered to obtain a solid. The solid was recrystallized twice using tetrahydrofuran/methanol (100 ml/200 ml), filtered, and dried to obtain a creamy white solid compound A1-6 (84.1 g and yield of 68.7%). Mass spectrum: 464.3 (M+H).

Synthesis of Compound A1

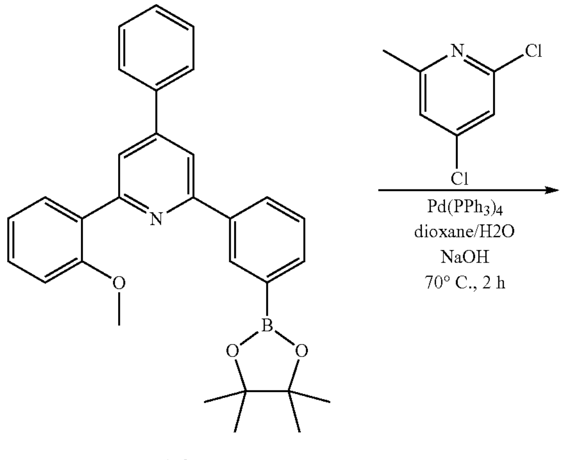

A1-6

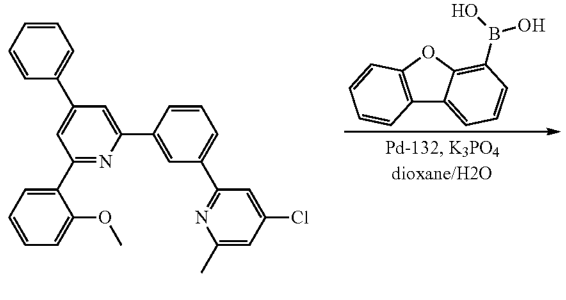

A1-7

-continued

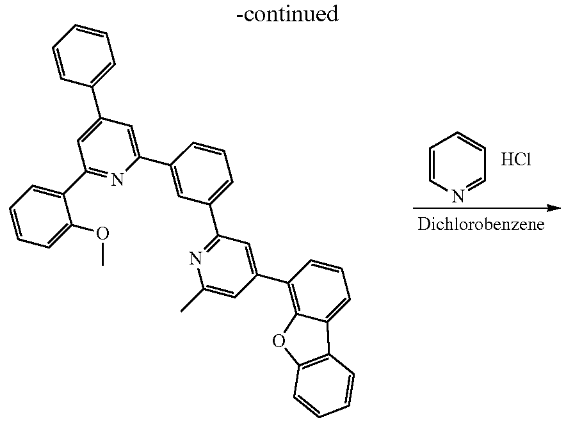

A1-8

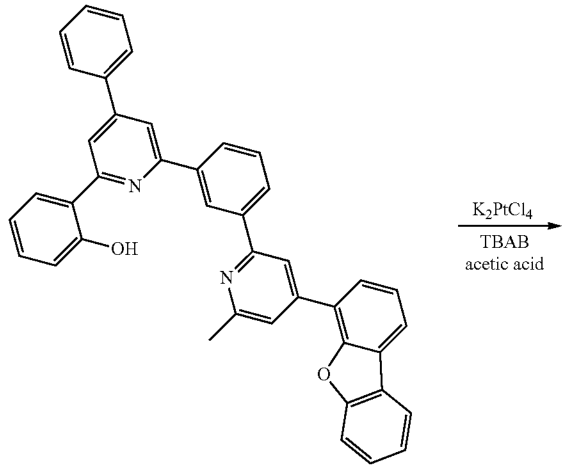

A1-9

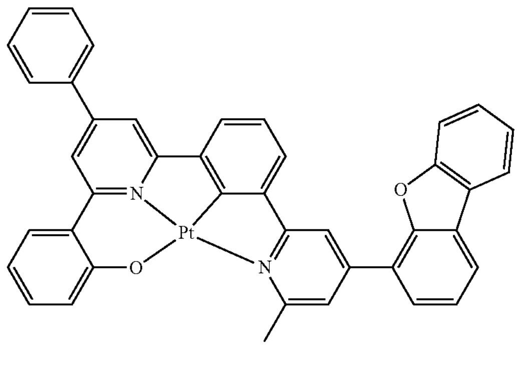

A1

Synthesis of Compound A1-7

The compound A1-6 (75.0 g, 0.16 mol, 1.0 eq), 2,4-dichloro-6-methylpyridine (39.3 g, 0.24 mol, 1.5 eq), tetra (triphenylphosphine)palladium (9.35 g, 8.09 mmol, 0.05 eq), sodium hydroxide (51.8 g, 0.52 mol, 3.0 eq), dioxane (650 ml), and deionized water (130 ml) were sequentially added into a 3-L three-neck flask, subjected to nitrogen replacement for three times, heated to 70° C., and stirred under heat preservation for 6 h. A monitoring by TLC was performed (a developing solvent:dichloromethane/n-hexane=1/10) and the raw material A1-6 was basically reacted completely. A reaction solution was cooled to room temperature, dichloromethane (300 mL) and deionized water (300 mL) were added to a system, the system was extracted, an organic phase was collected and passed through silica gel, the silica gel was washed with dichloromethane (200 mL), and a filtrate was subjected to a rotary evaporation to obtain a solid. The solid was added into toluene (150 mL)/methanol (350 mL) to be recrystallized 3 times and dried to obtain a white solid compound A1-7 (54.1 g and yield 72.3%). Mass spectrum: 464.0 (M+H).

Synthesis of Compound A1-8

The compound A1-7 (10.5 g, 22.6 mmol, 1.0 eq), dibenzofuran-4-boronic acid (7.2 g, 34.0 mmol, 1.5 eq), dichlorobis[di-tert-butyl(4-dimethylaminophenyephosphine]palladium(II) (0.24 g, 0.34 mmol, 0.015 eq), tripotassium phosphate (9.63 g, 45.3 mmol, 2.0 eq), dioxane (300 ml), and deionized water (100 ml) were sequentially added into a 1-L three-neck flask, subjected to nitrogen replacement for three times, heated to 60° C., and stirred under heat preservation for 3 h. A monitoring by TLC was performed (a developing solvent:ethyl acetate/n-hexane=1/20) and the raw material A1-7 was basically reacted completely. A reaction solution was cooled to room temperature, dichloromethane (200 mL) and deionized water (100 mL) were added to a system, the system was extracted, an organic phase was collected, subjected to a rotary evaporation, subjected to a purification by a column chromatography (an eluent: ethyl acetate/n-hexane=1/40), and dried to obtain a white solid compound A1-8 (10.6 g and yield of 79.1%). Mass spectrum: 595.7 (M+H).

Synthesis of Compound A1-9

The A1-8 (10.6 g, 17.8 mmol, 1.0 eq) and pyridine hydrochloride (98.8 g, 0.85 mol, 48 eq) were added to a 500-mL single-neck flask, then dichlorobenzene (24 mL) was added, the materials were stirred, subjected to nitrogen replacement for three times, heated to 190° C., and reacted for 2.5 h. A monitoring by TLC was performed (a developing solvent:ethyl acetate/n-hexane=1/3) and the raw materials were reacted completely. The reaction was cooled to room temperature. A saturated sodium bicarbonate solution (120 ml) and toluene (120 ml) were added to the reaction, and stirred to dissolve, and subjected to a liquid separation. An organic phase was then washed 2 times with water (150 ml/time), collected, and subjected to a rotary evaporation. A crude product was purified by a silica gel column chromatography (an eluent: ethyl acetate/n-hexane=1/20) and dried to obtain a yellow solid A1-9 (8.33 g and yield of 80.5%). Mass spectrum: 581.2 (M+H).

Synthesis of Compound A1

The A1-9 (6.5 g, 11.19 mmol, 1.0 eq), potassium chloroplatinite (8.11 g, 17.35 mmol, 1.55 eq), tetrabutylammonium bromide (541 mg, 1.68 mmol, 0.15 eq), and acetic acid (650 ml) were added into a 1-L single-neck bottle. The materials were subjected to nitrogen replacement for three times under vacuum, heated to 125° C. under the protection of nitrogen, and reacted for 72 h. A monitoring by TLC (a developing solvent:dichloromethane/n-hexane=1/2) was performed. The raw material A1-9 was reacted completely. The reaction was cooled to room temperature. A reaction solution was added to a beaker containing deionized water (650 ml) and stirred to separate out a solid. The reaction solution was filtered to collect the solid. A crude product was separated by a silica gel column chromatography (an eluent: dichloromethane/n-hexane=1/8). An obtained orange-yellow solid was recrystallized 1 time using dichloromethane (60 ml)/methanol (80 ml) to obtain an orange-yellow compound A1 (5.23 g and yield of 60.3%). 5.23 g of the crude product A1 was subjected to a sublimation purification to obtain a sublimation-pure A1 (3.64 g and 69.5% of yield). Mass spectrum: 774.2 (M+H). $^1$H NMR (400 MHz, $CDCl_3$) δ 8.65 (s, 1H), 8.44 (s, 1H), 8.23 (d, J=30.0 Hz, 4H), 8.12-7.94 (m, 3H), 7.72 (d, J=25.0 Hz, 3H), 7.58-7.22 (m, 10H), 6.97 (s, 1H), 3.27 (s, 3H).

Example 2

Synthesis of Compound A3

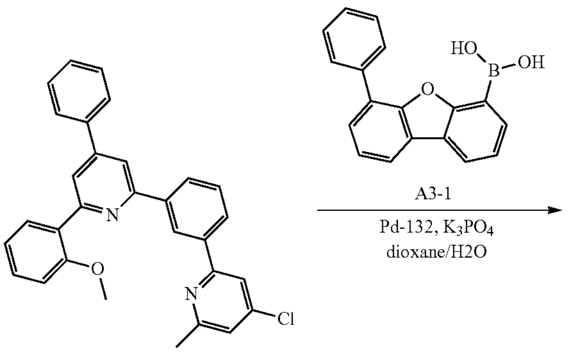

A1-7

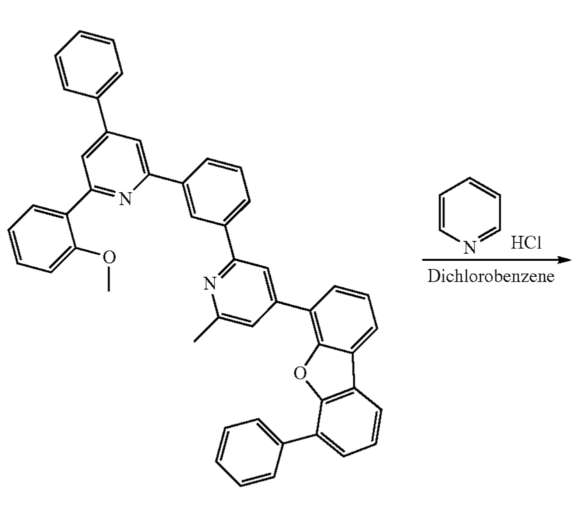

A3-2

-continued

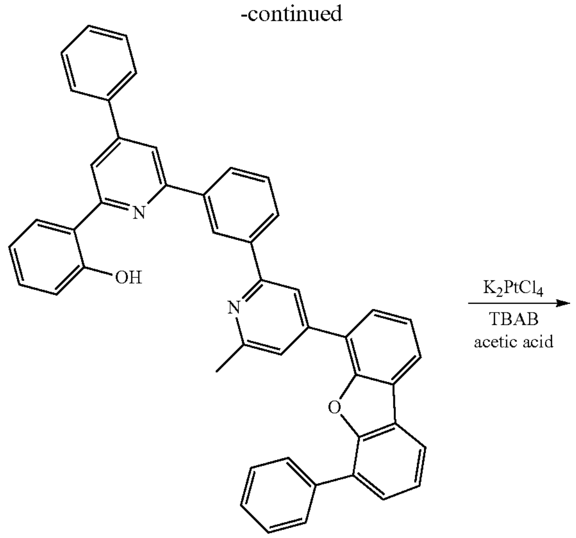

A3-3

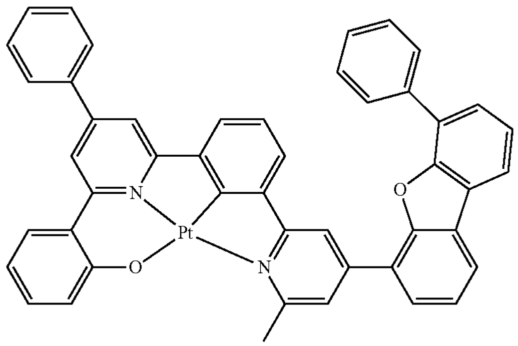

A3

Synthesis of Compound A3-2

Referring to a synthesis process and a post-treatment purification method of the compound A1-8, only corresponding raw materials needed to be changed. Mass spectrum: 671.8 (M+H).

Synthesis of Compound A3-3

Referring to a synthesis process and a post-treatment purification method of the compound A1-9, only corresponding raw materials needed to be changed. Mass spectrum: 657.8 (M+H).

Synthesis of Compound A3

Referring to a synthesis process and a post-treatment purification method of the compound A1, an orange-yellow compound A3 (4.66 g and yield of 59.4%) can be obtained by changing corresponding raw materials. 4.66 g of the crude product A3 was subjected to a sublimation purification to obtain a sublimation-pure A3 (2.91 g and yield of 61.4%). Mass spectrum: 850.8 (M+H). $^1$H NMR (400 MHz, $CDCl_3$) δ 8.64 (s, 1H), 8.42 (s, 1H), 8.24 (d, J=30.0 Hz, 4H), 8.05 (d, J=30.0 Hz, 4H), 7.72 (d, J=25.0 Hz, 3H), 7.59-7.34 (m, 11H), 7.29 (d, J=5.0 Hz, 2H), 6.98 (s, 1H), 3.28 (s, 3H).

Example 3

Synthesis of a Compound A28

Synthesis of Intermediate A28-4

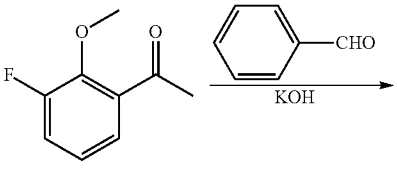

A28-1

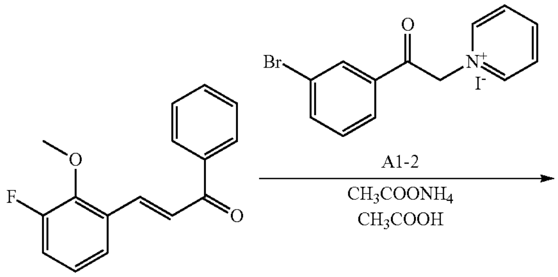

A28-2

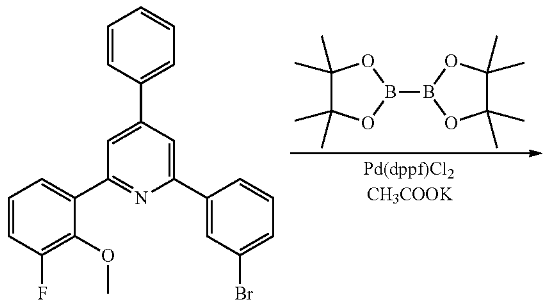

A28-3

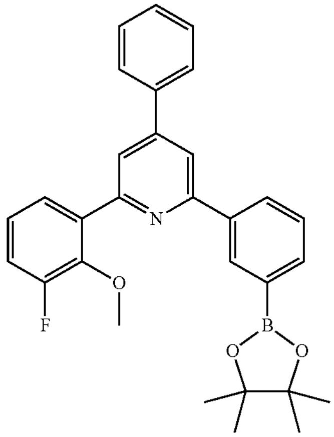

A28-4

Synthesis of Compound A28-2

Referring to a synthesis process and a post-treatment purification method of the compound A1-4, only corresponding raw materials needed to be changed. Mass spectrum: 257.3 (M+H).

Synthesis of Compound A28-3

Referring to a synthesis process and a post-treatment purification method of the compound A1-5, only corresponding raw materials needed to be changed. Mass spectrum: 435.3 (M+H).

Synthesis of Compound A28-4

Referring to a synthesis process and a post-treatment purification method of the compound A1-5, only corresponding raw materials needed to be changed. Mass spectrum: 482.4 (M+H).

Synthesis of Compound A28

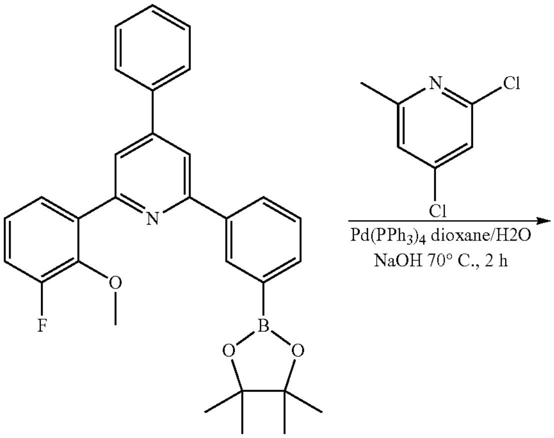

A28-4

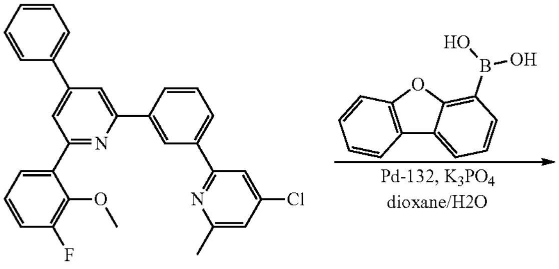

A28-5

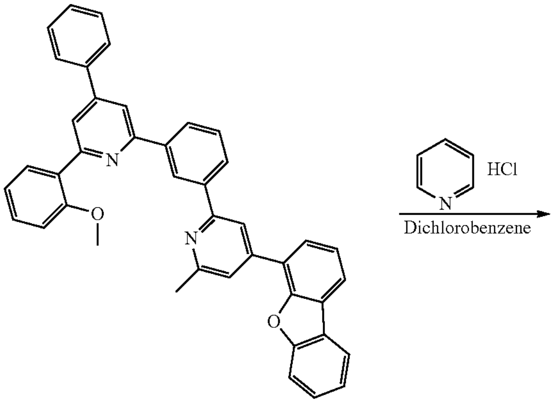

A28-6

-continued

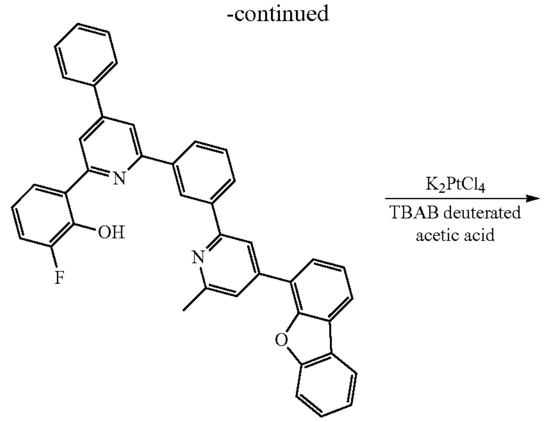

A28-7

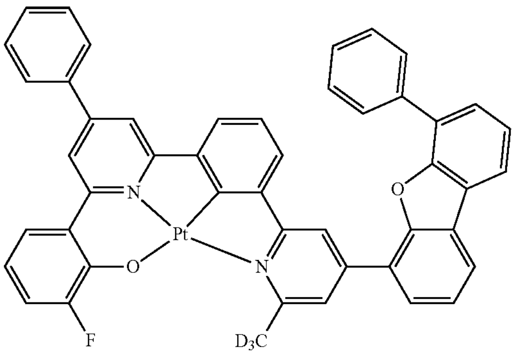

A 28

Synthesis of Compound A28-5

Referring to a synthesis process and a post-treatment purification method of the compound A1-7, only corresponding raw materials needed to be changed. Mass spectrum: 482.0 (M+H).

Synthesis of Compound A28-6

Referring to a synthesis process and a post-treatment purification method of the compound A1-8, only corresponding raw materials needed to be changed. Mass spectrum: 595.7 (M+H).

Synthesis of Compound A28-9

Referring to a synthesis process and a post-treatment purification method of the compound A1-9, only corresponding raw materials needed to be changed. Mass spectrum: 599.7 (M+H).

Synthesis of Compound A28

Referring to a synthesis process and a post-treatment purification method of the compound A1, only corresponding raw materials needed to be changed. At the same time, deuterated acetic acid was used as a reaction solvent to obtain an orange-yellow compound A28 (4.24 g and yield of 64.1%). 4.24 g of the crude product A28 was subjected to a sublimation purification to obtain a sublimation-pure A28 (2.64 g and yield of 62.2%). Mass spectrum: 871.8 (M+H). $^1H$ NMR (400 MHz, $CDCl_3$) δ 8.43 (d, J=10.0 Hz, 2H), 8.23

(d, J=30.0 Hz, 4H), 8.05 (d, J=30.0 Hz, 4H), 7.72 (d, J=25.0 Hz, 3H), 7.57-7.34 (m, 11H), 7.09 (d, J=35.0 Hz, 2H).

Example 4

Synthesis of Compound A39

Synthesis of Intermediate A39-3

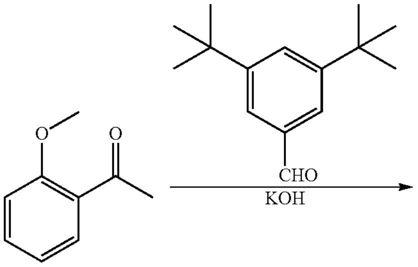

A1-3

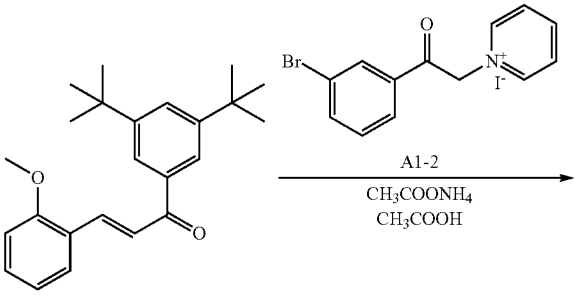

A39-1

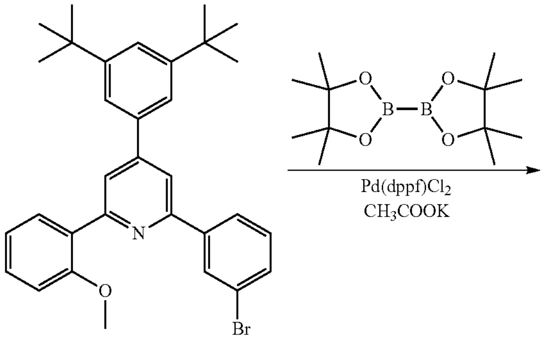

A39-2

-continued

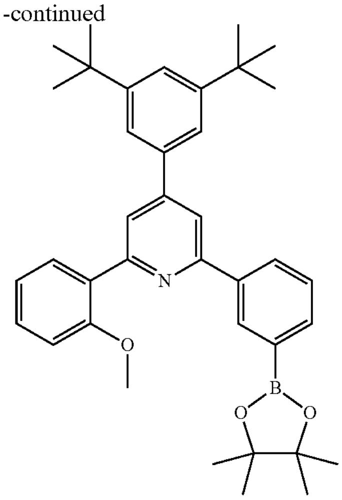

A39-3

Synthesis of Compound A39-1

Referring to a synthesis process and a post-treatment purification method of the compound A1-4, only corresponding raw materials needed to be changed. Mass spectrum: 257.3 (M+H).

Synthesis of Compound A39-2

Referring to a synthesis process and a post-treatment purification method of the compound A1-5, only corresponding raw materials needed to be changed. Mass spectrum: 435.3 (M+H).

Synthesis of Compound A39-3

Referring to a synthesis process and a post-treatment purification method of the compound A1-5, only corresponding raw materials needed to be changed. Mass spectrum: 482.4 (M+H).

Synthesis of Compound A39

-continued

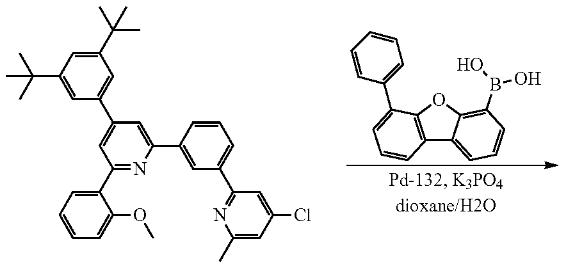

A39-4

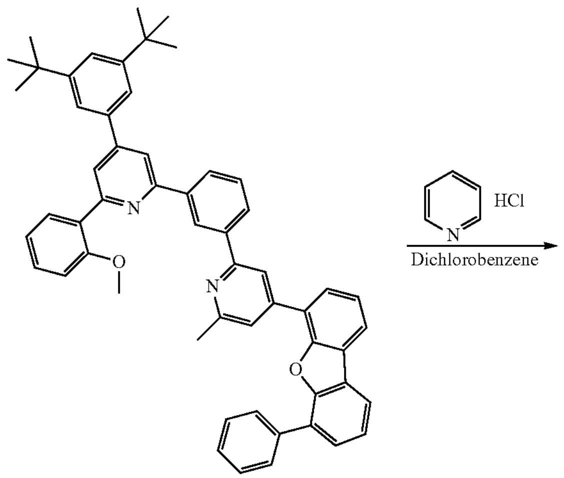

A39-5

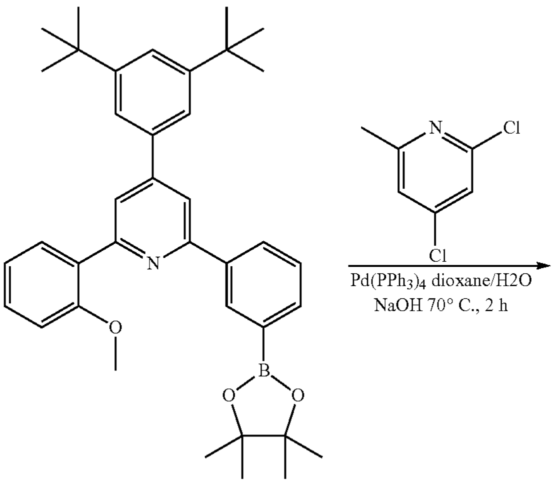

A39-3

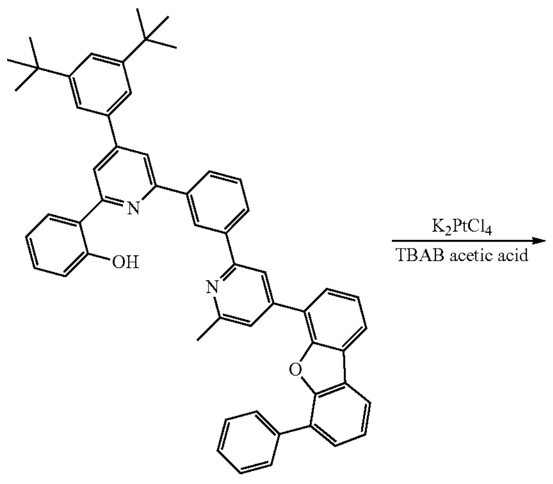

A39-6

-continued

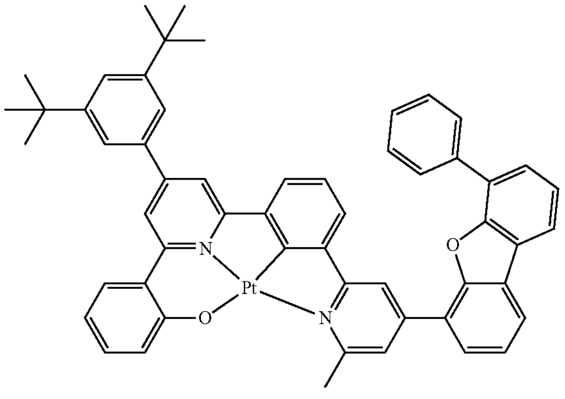

A 39

Synthesis of Compound A39-4

Referring to a synthesis process and a post-treatment purification method of the compound A1-7, only corresponding raw materials needed to be changed. Mass spectrum: 576.2 (M+H).

Synthesis of Compound A39-5

Referring to a synthesis process and a post-treatment purification method of the compound A1-8, only corresponding raw materials needed to be changed. Mass spectrum: 784.0 (M+H).

Synthesis of Compound A39-6

Referring to a synthesis process and a post-treatment purification method of the compound A1-9, only corresponding raw materials needed to be changed. Mass spectrum: 770.0 (M+H).

Synthesis of Compound A39

Referring to a synthesis process and a post-treatment purification method of the compound A1, only corresponding raw materials needed to be changed. At the same time, deuterated acetic acid was used as a reaction solvent to obtain an orange-yellow compound A39 (4.37 g and yield of 67.4%). 4.37 g of the crude product A39 was subjected to a sublimation purification to obtain a sublimation-pure A39 (2.66 g and yield of 60.8%). Mass spectrum: 963.0 (M+H). $^1$H NMR (400 MHz, $CDCl_3$) δ 8.22 (d, J=15.9 Hz, 2H), 7.98 (dt, J=15.0, 7.3 Hz, 5H), 7.84-7.65 (m, 5H), 7.64-7.31 (m, 11H), 7.18 (t, J=7.8 Hz, 1H), 6.69 (t, 1H), 3.28 (s, 3H), 1.52 (d, J=44.0 Hz, 18H).

Example 5

Synthesis of Compound A71

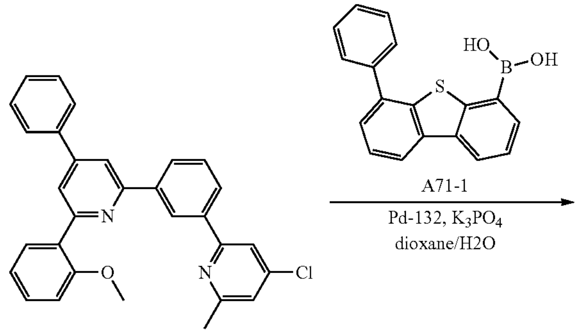

A1-7

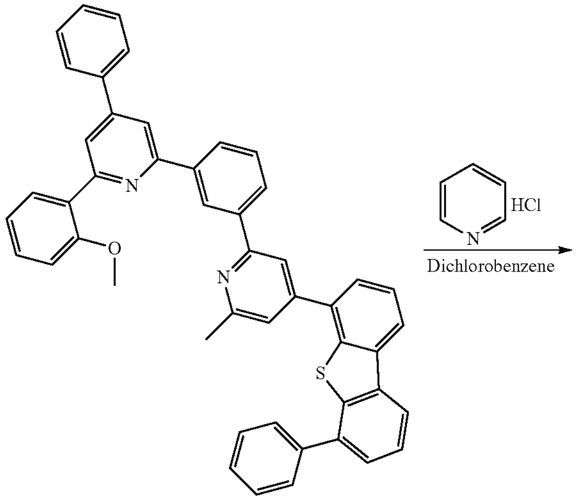

A71-2

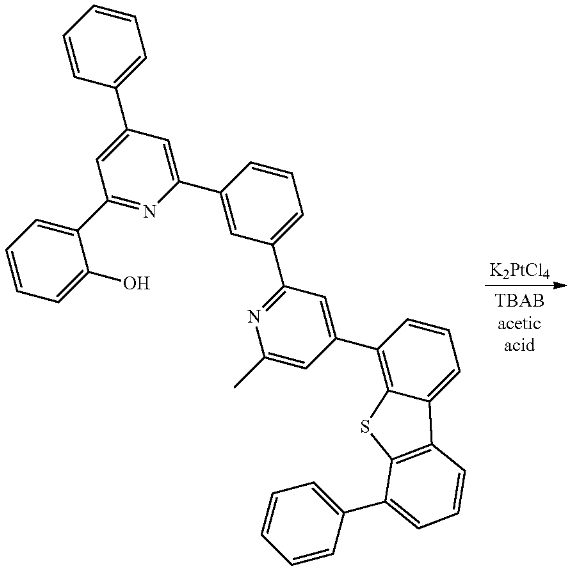

A71-3

-continued

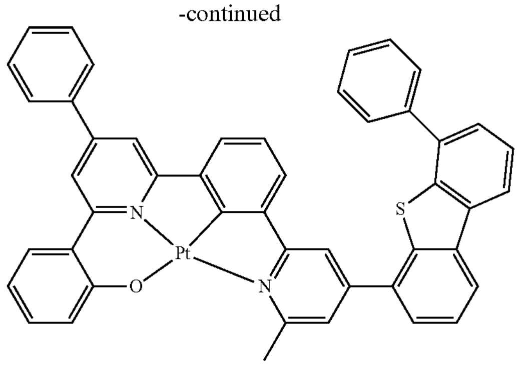

A71

Synthesis of Compound A71-2

Referring to a synthesis process and a post-treatment purification method of the compound A1-8, only corresponding raw materials needed to be changed. Mass spectrum: 687.9 (M+H).

Synthesis of Compound A71-3

Referring to a synthesis process and a post-treatment purification method of the compound A1-9, only corresponding raw materials needed to be changed. Mass spectrum: 672.8 (M+H).

Synthesis of Compound A71

Referring to a synthesis process and a post-treatment purification method of the compound A1, an orange-yellow compound A71 (4.37 g and yield of 56.2%) can be obtained by changing corresponding raw materials. 4.37 g of the crude product A71 was subjected to a sublimation purification to obtain a sublimation-pure A71 (2.4 g and yield of 54.9%). Mass spectrum: 866.9 (M+H). H NMR (400 MHz, $CDCl_3$) δ 8.63 (s, 1H), 8.53 (s, 2H), 8.41 (s, 1H), 8.37-8.17 (m, 6H), 7.72 (d, J=25.0 Hz, 3H), 7.55-7.37 (m, 11H), 7.29 (d, J=5.0 Hz, 2H), 7.01 (s, 1H), 3.28 (s, 3H).

Example 6

Synthesis of Compound A82

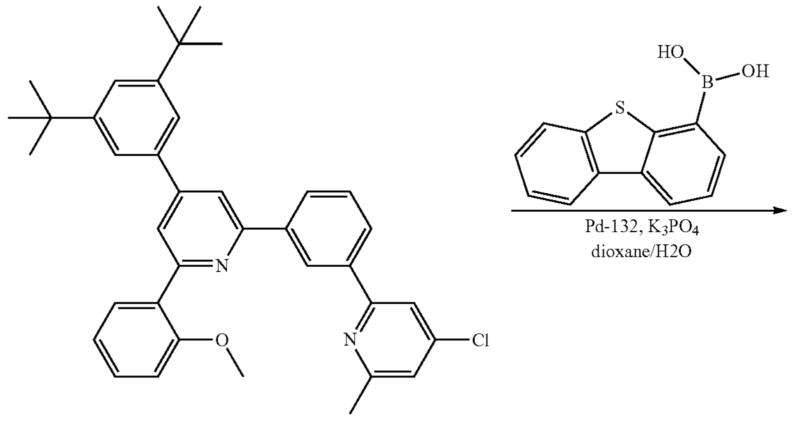

A37-4

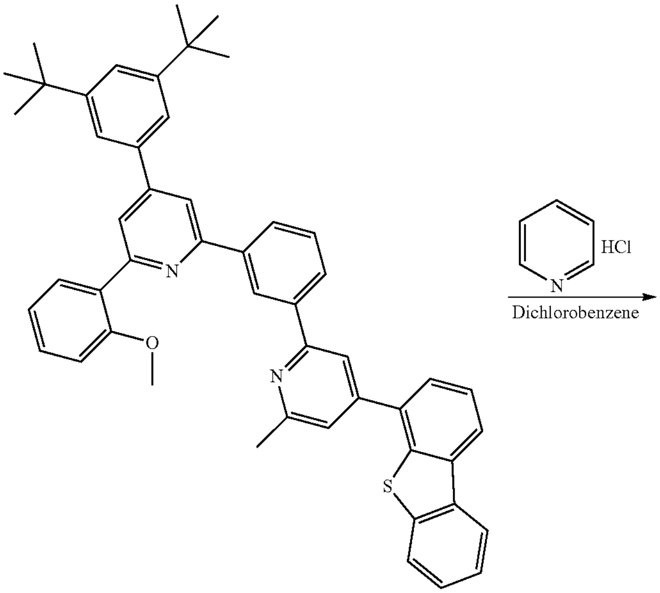

A82-1

-continued

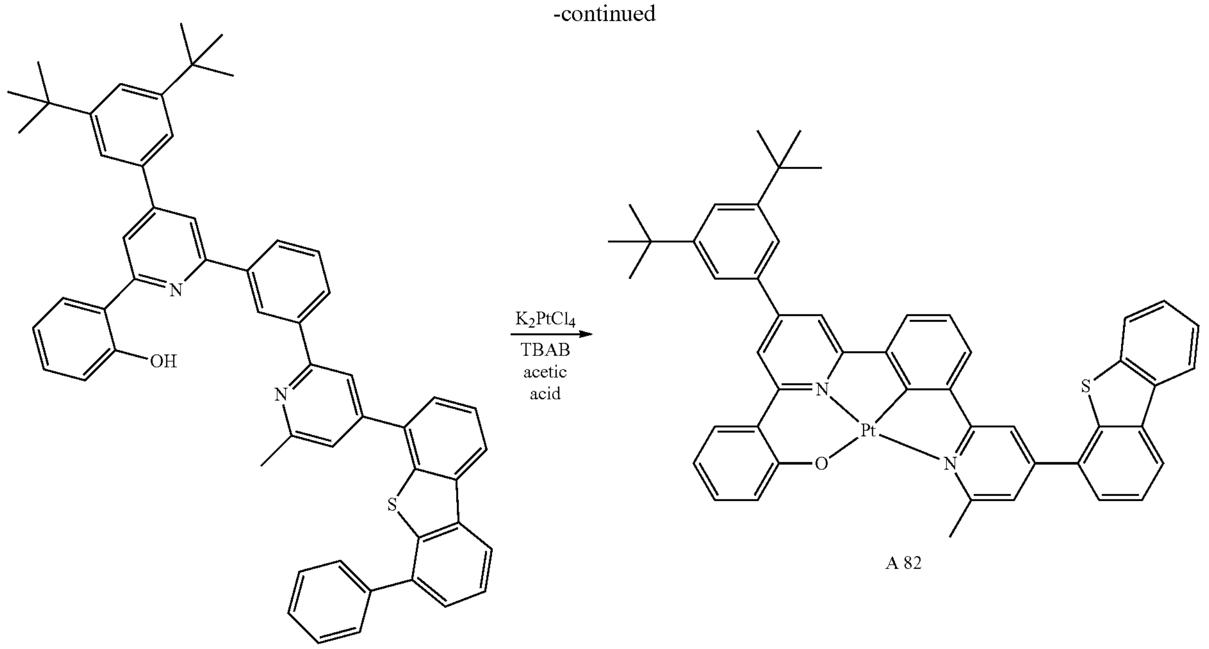

A82-2

A 82

Synthesis of Compound A82-1

Referring to a synthesis process and a post-treatment purification method of the compound A1-8, only corresponding raw materials needed to be changed. Mass spectrum: 724.0 (M+H).

Synthesis of Compound A82-2

Referring to a synthesis process and a post-treatment purification method of the compound A1-9, only corresponding raw materials needed to be changed. Mass spectrum: 710.0 (M+H).

Synthesis of Compound A82

Referring to a synthesis process and a post-treatment purification method of the compound A1, an orange-yellow compound A82 (3.97 g and yield of 63.7%) can be obtained by changing corresponding raw materials. 3.97 g of the crude product A82 was subjected to a sublimation purification to obtain a sublimation-pure A82 (2.58 g and yield of 64.9%). Mass spectrum: 903.0 (M+H). $^1$H NMR (400 MHz, $CDCl_3$) δ 8.22 (s, 1H), 8.18 (d, J=5.9 Hz, 2H), 7.98 (d, J=7.7 Hz, 1H), 7.88 (s, 1H), 7.85-7.78 (m, 1H), 7.71-7.41 (m, 10H), 7.39-7.32 (m, 1H), 7.31-7.23 (m, 2H), 7.19 (t, J=7.6 Hz, 1H), 6.67 (t, J=6.8 Hz, 1H), 3.27 (s, 3H), 1.59 (s, 18H).

Example 7

Synthesis of Compound A89

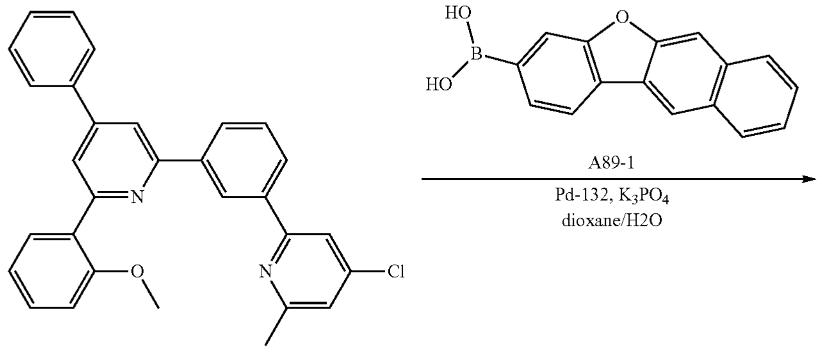

A1-7

-continued

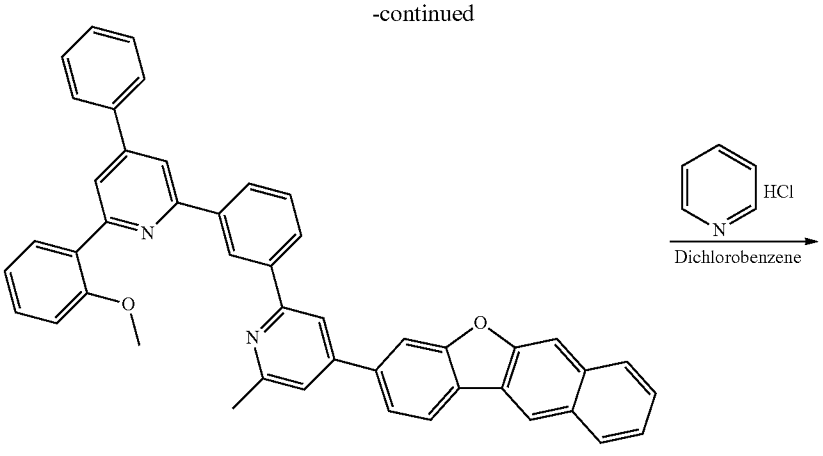

A89-2

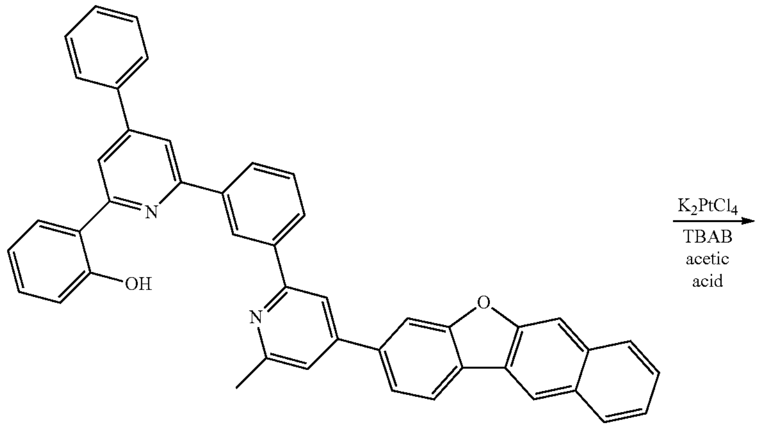

A89-3

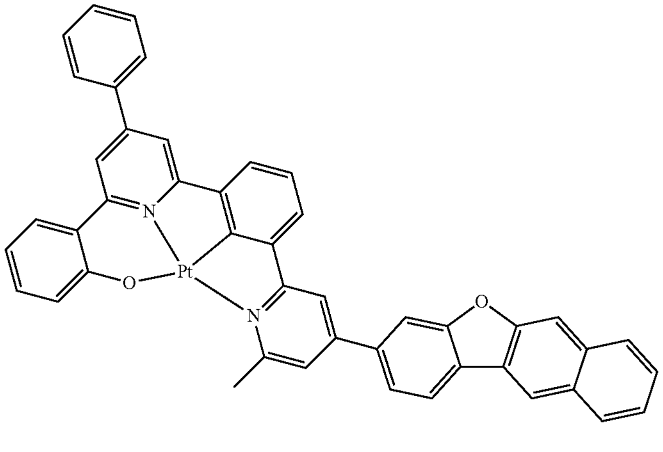

A 89

Synthesis of Compound A89-2

Referring to a synthesis process and a post-treatment purification method of the compound A1-8, only corresponding raw materials needed to be changed. Mass spectrum: 645.8 (M+H).

Synthesis of Compound A89-3

Referring to a synthesis process and a post-treatment purification method of the compound A1-9, only corresponding raw materials needed to be changed. Mass spectrum: 631.7 (M+H).

Synthesis of Compound A89

Referring to a synthesis process and a post-treatment purification method of the compound A1, an orange-yellow compound A89 (3.57 g and yield of 56.7%) can be obtained by changing corresponding raw materials. 3.57 g of the crude product A89 was subjected to a sublimation purification to obtain a sublimation-pure A89 (2.16 g and yield of 60.5%). Mass spectrum: 824.8 (M+H). $^{1}H$ NMR (400 MHz, $CDCl_3$) δ 8.66 (s, 1H), 8.45 (s, 1H), 8.24 (d, J=30.0 Hz, 4H), 8.13-7.95 (m, 3H), 7.73 (d, J=25.0 Hz, 3H), 7.58-7.22 (m, 10H), 6.99 (s, 1H), 3.28 (s, 3H).

Example 8

Synthesis of Compound A100

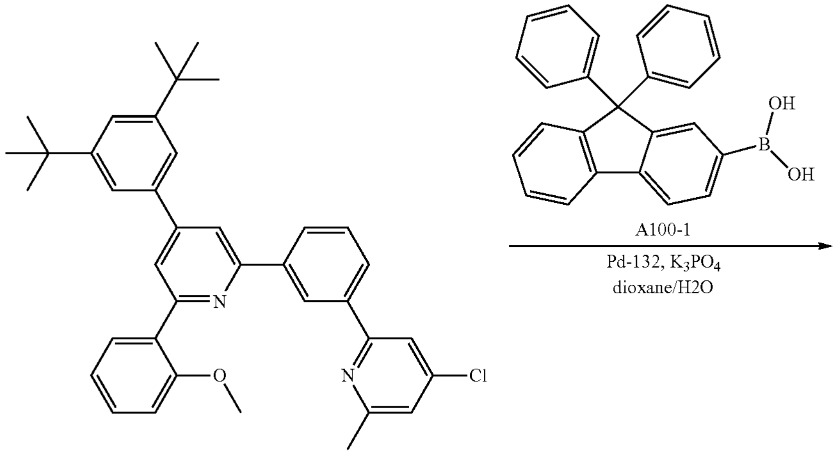

A37-4

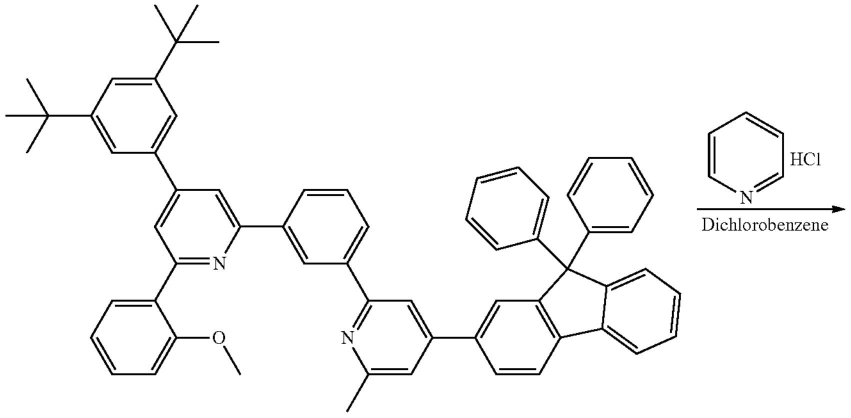

A100-2

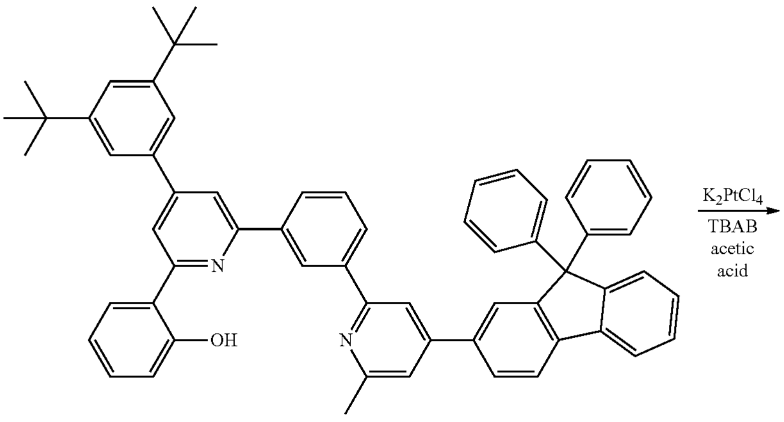

A100-3

-continued

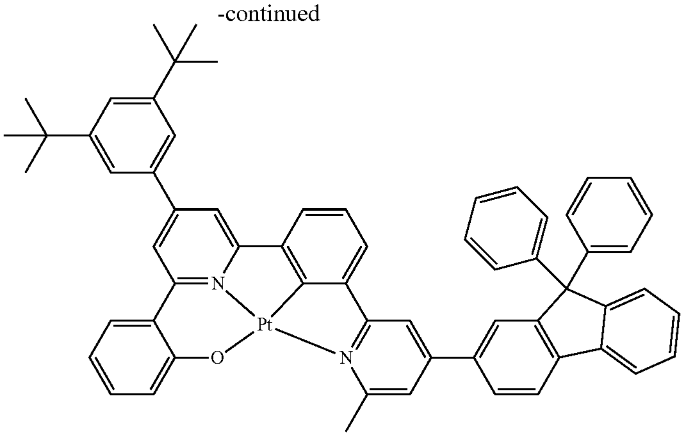

A 100

Synthesis of Compound A100-2

Referring to a synthesis process and a post-treatment purification method of the compound A1-8, only corresponding raw materials needed to be changed. Mass spectrum: 858.1 (M+H).

Synthesis of Compound A100-3

Referring to a synthesis process and a post-treatment purification method of the compound A1-9, only corresponding raw materials needed to be changed. Mass spectrum: 844.1 (M+H).

Synthesis of Compound A100

Referring to a synthesis process and a post-treatment purification method of the compound A1, an orange-yellow compound A100 (4.12 g and yield of 58.8%) can be obtained by changing corresponding raw materials. 4.12 g of the crude product A100 was subjected to a sublimation purification to obtain a sublimation-pure A100 (2.59 g and yield of 62.86%). Mass spectrum: 1037.2 (M+H). $^1$H NMR (400 MHz, $CDCl_3$) δ 8.66 (s, 1H), 8.44 (s, 1H), 8.22 (d, J=30.0 Hz, 4H), 8.11 (s, 1H), 7.90 (s, 1H), 7.83-7.66 (m, 4H), 7.54-7.38 (m, 4H), 7.37-7.14 (m, 10H), 7.10 (s, 4H), 6.99 (s, 1H), 3.28 (s, 3H), 1.60 (s, 18H).

Example 9

Synthesis of Compound A111

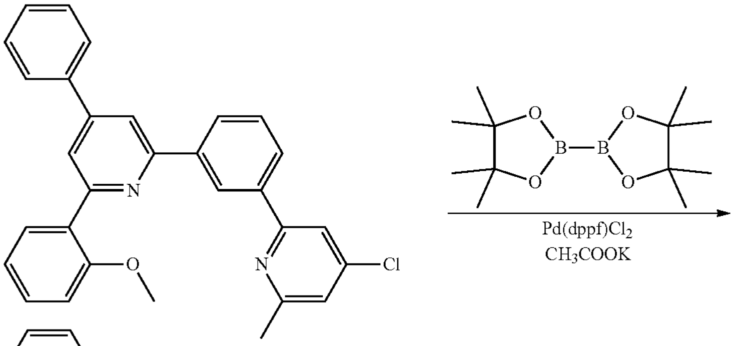

A1-7

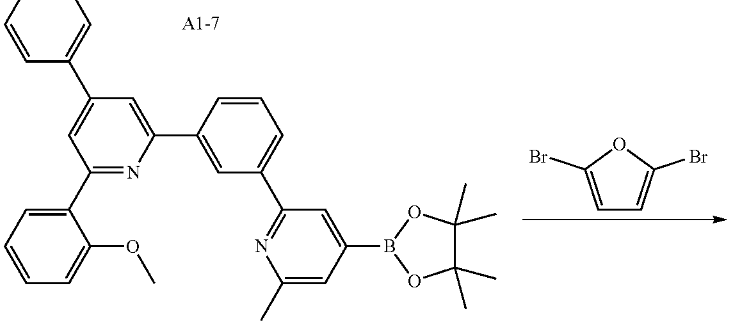

A111-1

-continued
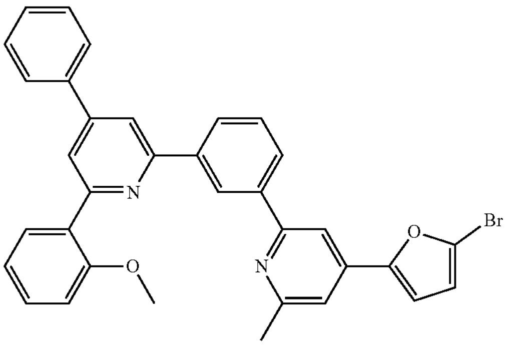
A111-2
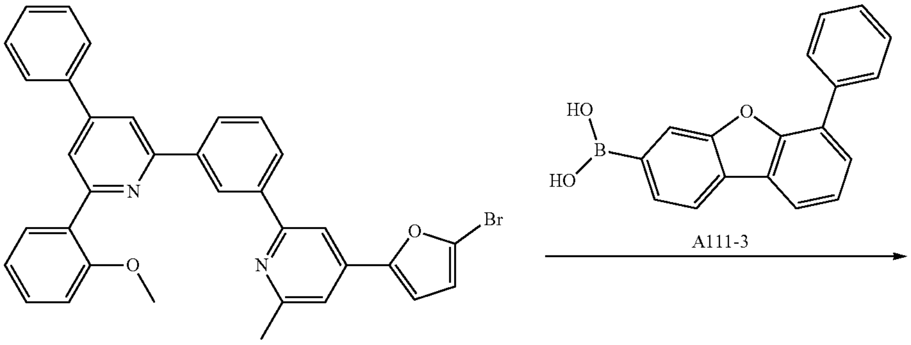
A111-2
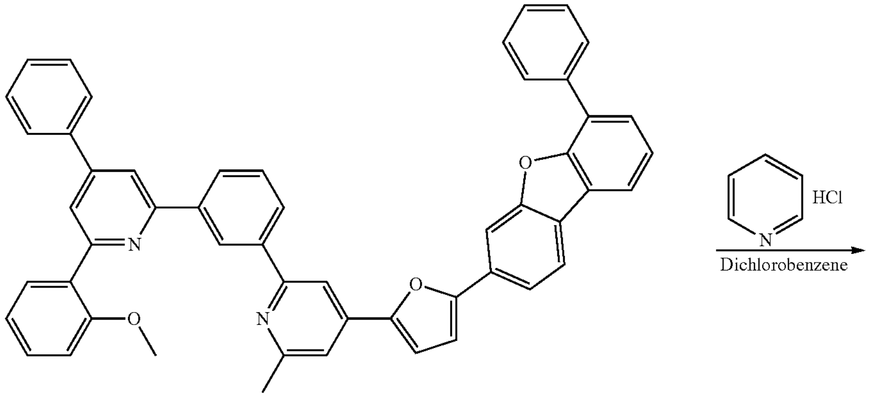
A111-4
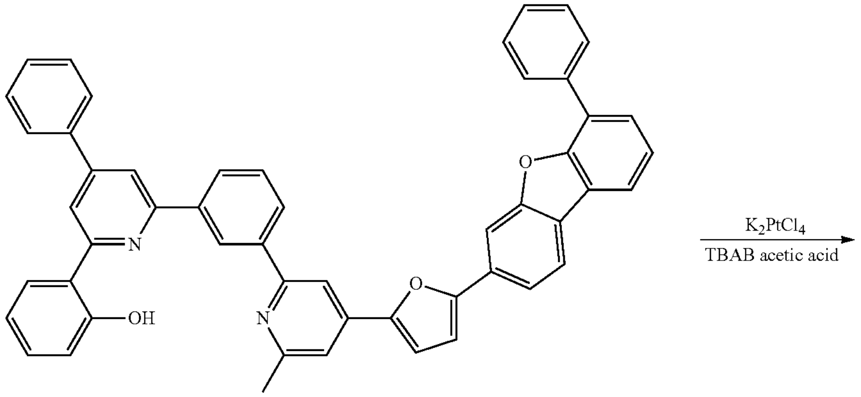
A111-5

-continued

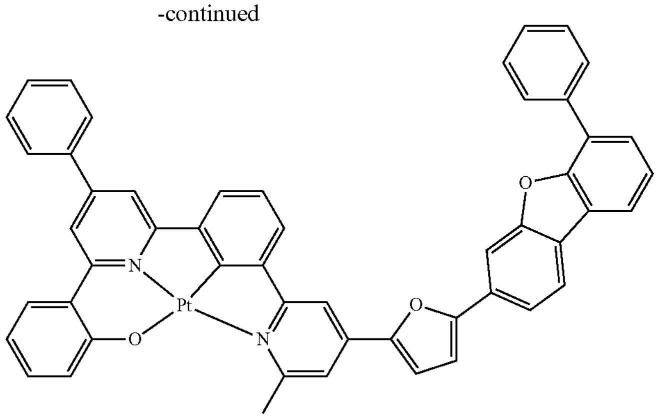

A111

Synthesis of Compound A111-1

Referring to a synthesis process and a post-treatment purification method of the compound A1-6, only corresponding raw materials needed to be changed. Mass spectrum: 555.5 (M+H).

Synthesis of Compound A111-2

The compound A111-1 (11.5 g, 20.7 mmol, 1.0 eq), 2,5-dibromofuran (7.03 g, 31.1 mmol, 1.5 eq), [1,1'-bis (diphenylphosphino)ferrocene]dichloropalladium (0.3 g, 0.41 mmol, 0.02 eq), potassium carbonate (5.73 g, 41.8 mmol, 2.0 eq), toluene (115 ml), ethanol (25 ml), and deionized water (25 ml) were successively added into a 500-ml three-necked flask, subjected to nitrogen replacement for three times, heated to 65° C., and stirred under heat preservation for 6 h. A monitoring by TLC was performed (a developing solvent:dichloromethane/n-hexane=1/15) and the raw material A111-1 was basically reacted completely. A reaction solution was cooled to room temperature, dichloromethane (150 mL) and deionized water (100 mL) were added to a system, the system was extracted, and an organic phase was collected and subjected to a rotary evaporation. A crude product was separated by a silica gel column chromatography (an eluent: dichloromethane/n-hexane=1/40) to obtain an off-white solid A111-2 (7.46 g and yield of 62.7%). Mass spectrum: 574.5 (M+H).

Synthesis of Compound A111-4

Referring to a synthesis process and a post-treatment purification method of the compound A1-8, only corresponding raw materials needed to be changed. Mass spectrum: 745.9 (M+H).

Synthesis of Compound A111-5

Referring to a synthesis process and a post-treatment purification method of the compound A1-9, only corresponding raw materials needed to be changed. Mass spectrum: 731.7 (M+H).

Synthesis of Compound A111

Referring to a synthesis process and a post-treatment purification method of the compound A1, an orange-yellow compound A111 (3.75 g and yield of 61.1%) can be obtained by changing corresponding raw materials. 3.75 g of the crude product A111 was subjected to a sublimation purification to obtain a sublimation-pure A111 (2.17 g and yield of 57.8%). Mass spectrum: 916.9 (M+H). $^1$H NMR (400 MHz, $CDCl_3$) δ 8.65 (s, 1H), 8.32-8.17 (m, 5H), 8.05 (d, J=30.0 Hz, 2H), 7.81-7.66 (m, 5H), 7.62-7.37 (m, 11H), 7.29 (d, J=5.0 Hz, 2H), 7.05 (s, 2H), 6.99 (s, 1H), 3.28 (s, 3H)

Example 10

Synthesis of Compound A125

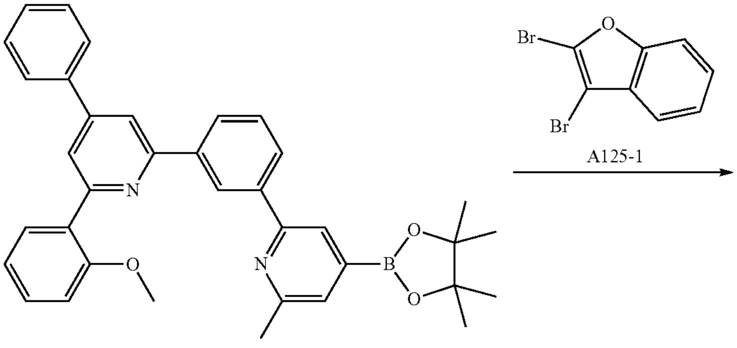

A111-1

-continued
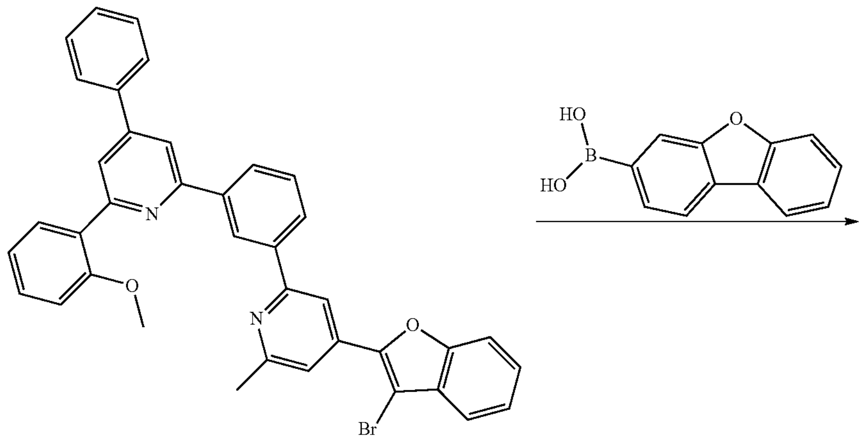
A125-2
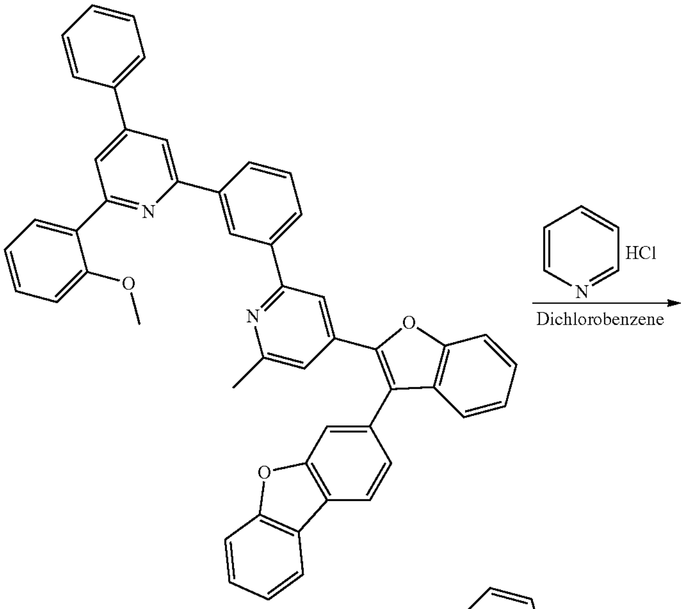
A125-3
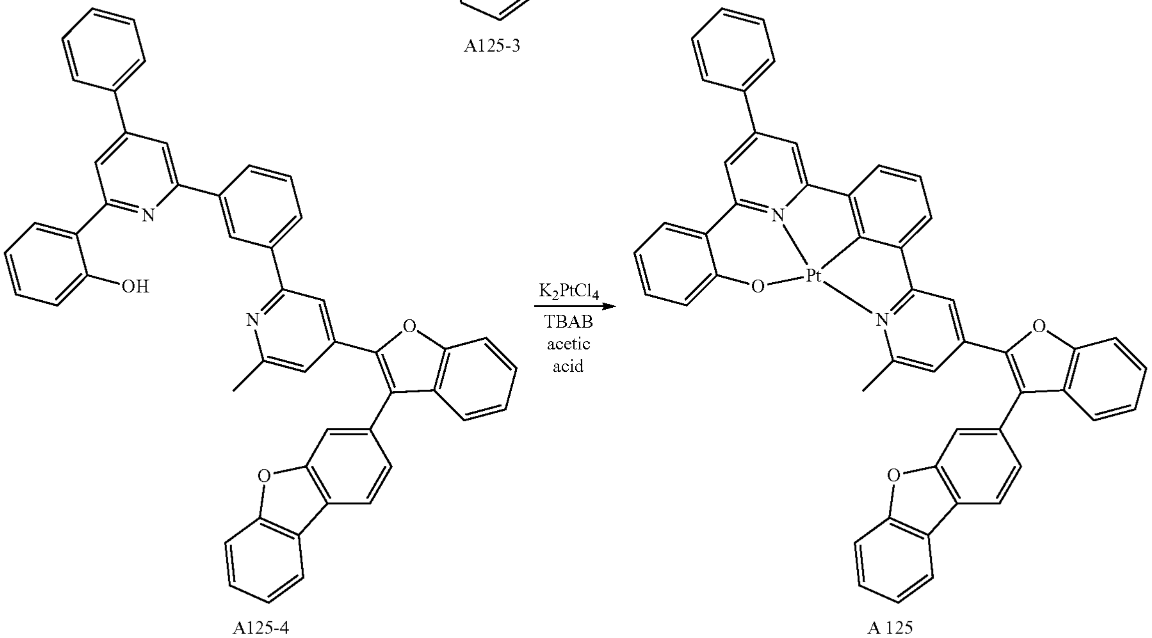
A125-4
A 125

Synthesis of Compound A125-2

Referring to a synthesis process and a post-treatment purification method of the compound A111-2, only corresponding raw materials needed to be changed. Mass spectrum: 624.5 (M+H).

Synthesis of Compound A125-3

Referring to a synthesis process and a post-treatment purification method of the compound A1-8, only corresponding raw materials needed to be changed. Mass spectrum: 711.8 (M+H).

Synthesis of Compound A125-4

Referring to a synthesis process and a post-treatment purification method of the compound A1-8, only corresponding raw materials needed to be changed. Mass spectrum: 697.8 (M+H).

Synthesis of Compound A125

Referring to a synthesis process and a post-treatment purification method of the compound A1, an orange-yellow compound A125 (3.93 g and yield of 59.3%) can be obtained by changing corresponding raw materials. 3.93 g of the crude product A125 was subjected to a sublimation purification to obtain a sublimation-pure A125 (2.28 g and yield of 58.0%). Mass spectrum: 890.9 (M+H). $^{1}$H NMR (400 MHz, $CDCl_3$) δ 8.64 (s, 1H), 8.32-8.17 (m, 5H), 7.98 (s, 2H), 7.81-7.67 (m, 6H), 7.61-7.45 (m, 5H), 7.46-7.24 (m, 8H), 6.98 (s, 1H), 3.27 (s, 3H).

Example 11

Synthesis of Compound A168

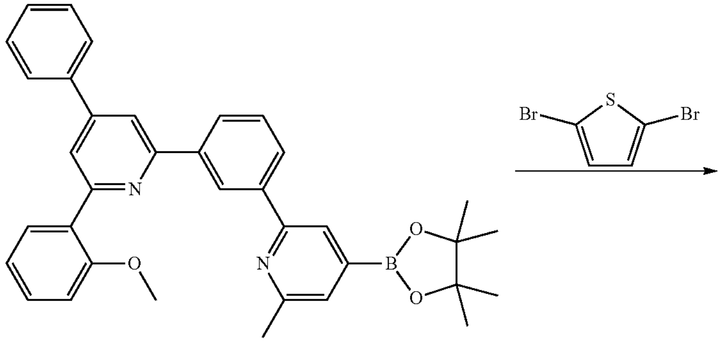

A111-1

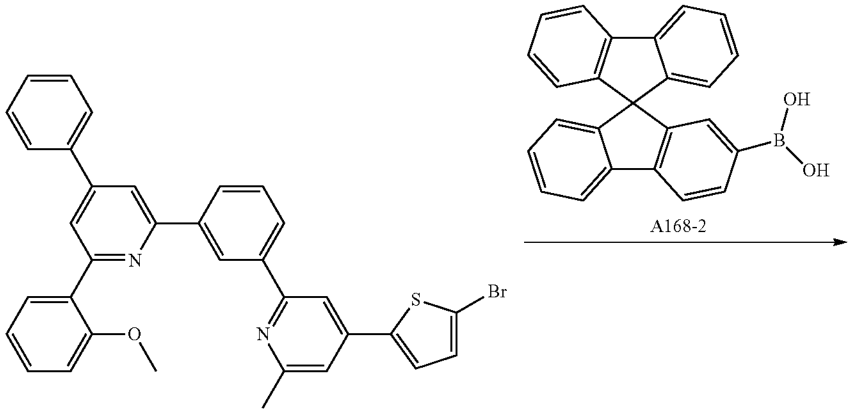

A168-1

-continued

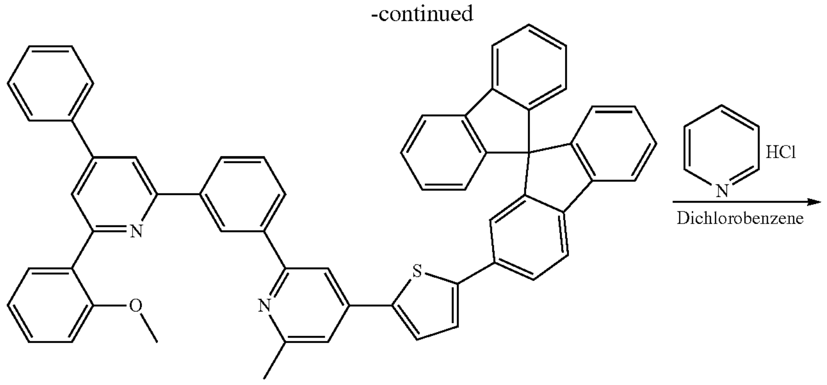

A168-2

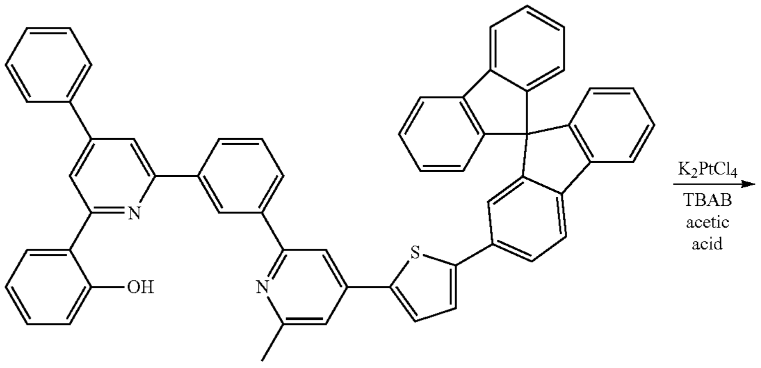

A168-3

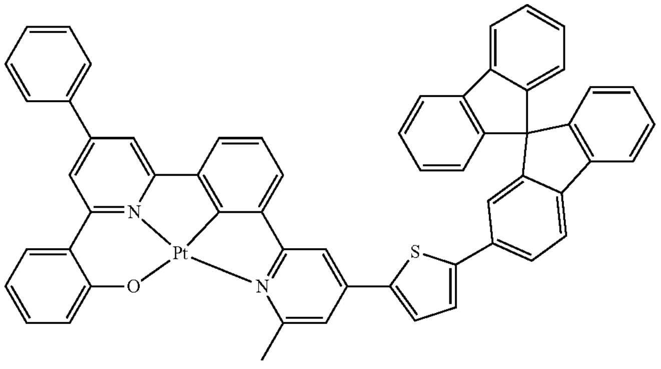

A 168

Synthesis of Compound A168-1

Referring to a synthesis process and a post-treatment purification method of the compound A111-2, only corresponding raw materials needed to be changed. Mass spectrum: 590.5 (M+H).

Synthesis of Compound A168-2

Referring to a synthesis process and a post-treatment purification method of the compound A1-8, only corresponding raw materials needed to be changed. Mass spectrum: 826.0 (M+H).

Synthesis of Compound A168-3

Referring to a synthesis process and a post-treatment purification method of the compound A1-8, only corresponding raw materials needed to be changed. Mass spectrum: 811.0 (M+H).

Synthesis of Compound A168

Referring to a synthesis process and a post-treatment purification method of the compound A1, an orange-yellow compound A168 (4.22 g and yield of 63.1%) can be obtained by changing corresponding raw materials. 4.22 g of the crude product A168 was subjected to a sublimation purification to obtain a sublimation-pure A168 (2.69 g and yield of 63.7%). Mass spectrum: 1005.1 (M+H). $^1H$ NMR (400 MHz, $CDCl_3$) δ 8.66 (s, 1H), 8.31-8.18 (m, 5H), 8.09 (s, 1H), 7.90 (d, J=5.0 Hz, 6H), 7.82-7.65 (m, 5H), 7.54-7.18 (m, 14H), 6.99 (s, 1H), 3.28 (s, 3H), Example 12
Synthesis of Compound A197
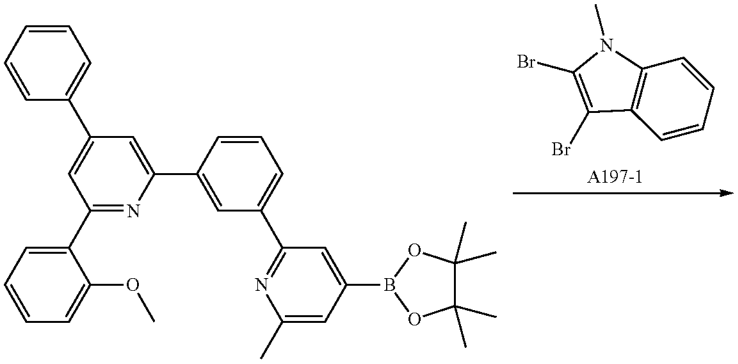
A111-1
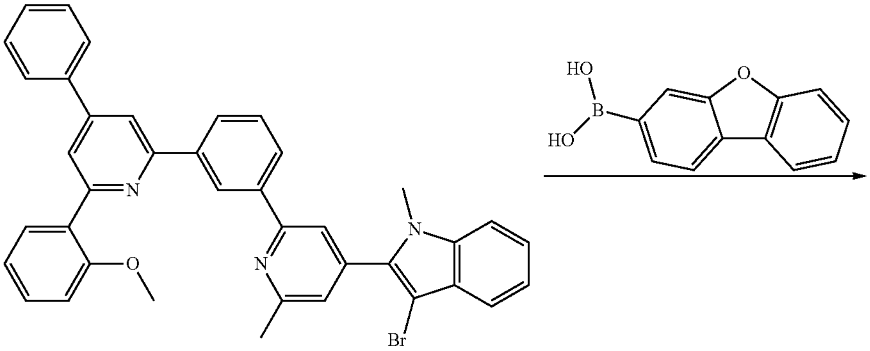
A197-2
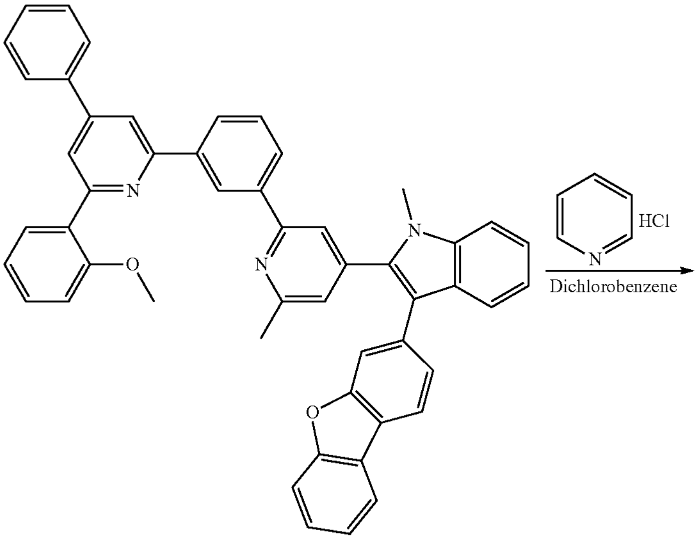
A197-3

-continued

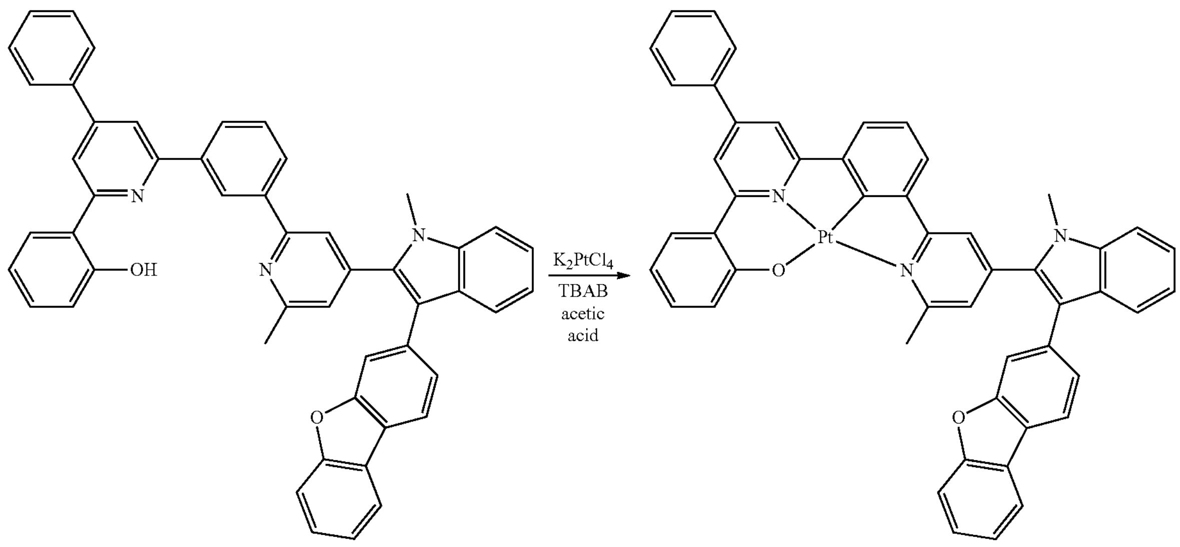

A197-4 A 197

Synthesis of Compound A197-2

Referring to a synthesis process and a post-treatment purification method of the compound A111-2, only corresponding raw materials needed to be changed. Mass spectrum: 637.6 (M+H).

Synthesis of Compound A197-3

Referring to a synthesis process and a post-treatment purification method of the compound A1-8, only corresponding raw materials needed to be changed. Mass spectrum: 724.9 (M+H).

Synthesis of Compound A197-4

Referring to a synthesis process and a post-treatment purification method of the compound A1-8, only corresponding raw materials needed to be changed. Mass spectrum: 710.8 (M+H).

Synthesis of Compound A197

Referring to a synthesis process and a post-treatment purification method of the compound A1, an orange-yellow compound A197 (3.67 g and yield of 55.8%) can be obtained by changing corresponding raw materials. 3.67 g of the crude product A197 was subjected to a sublimation purification to obtain a sublimation-pure A197 (2.08 g and yield of 56.6%). Mass spectrum: 903.9 (M+H). H NMR (400 MHz, $CDCl_3$) δ 8.67 (s, 1H), 8.33-8.17 (m, 5H), 7.98 (s, 1H), 7.75 (dd, J=30.0, 15.0 Hz, 6H), 7.61-7.23 (m, 12H), 7.01 (d, J=45.0 Hz, 2H), 3.82 (s, 3H), 3.27 (s, 3H).

Application Example

Manufacture of Organic Electroluminescent Device

A glass substrate with a size of 50 mm*50 mm*1.0 mm including an ITO (100 nm) transparent electrode was ultrasonically cleaned in ethanol for 10 minutes, dried at 150° C., and then treated with N2 plasma for 30 minutes. The washed glass substrate was arranged on a substrate support of a vacuum evaporation device. Firstly, a compound HATCN for covering the transparent electrode was evaporated on a surface of a side having a transparent electrode line to form a thin film with a thickness of 5 nm. Next, a layer of HTM1 was evaporated to form a thin film with a thickness of 60 nm. Then, a layer of HTM2 was evaporated on the HTM1 thin film to form a thin film with a thickness of 10 nm. Then, a host material 1, a host material 2, and a doping compound (a comparative compound X and CPD X) were co-evaporated on the HTM2 film layer to obtain a film with a thickness of 30 nm, where a ratio of the host materials to the doping material was 45%:45%:10%. A light-emitting layer was then sequentially evaporated with an ETL film layer (25 nm) and a LiQ film layer (1 nm), and finally evaporated with a layer of metal A1 (100 nm) as an electrode.

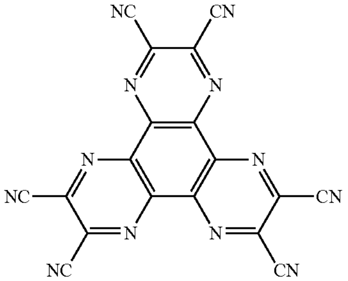

HATCN

-continued

HTM 1

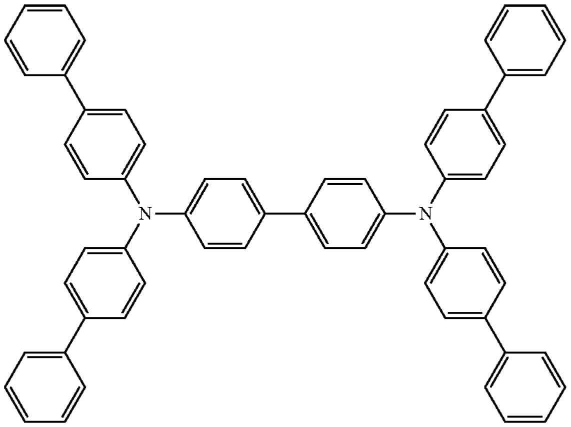

HTM 2

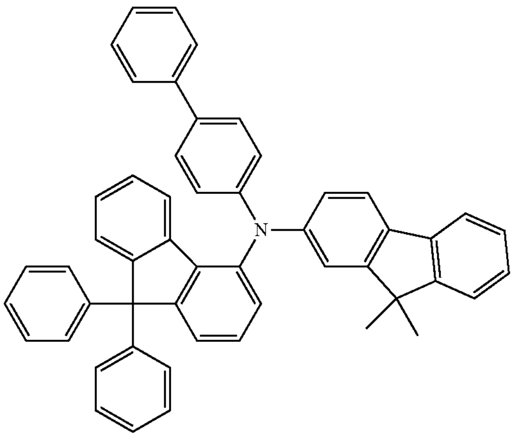

Host material 1

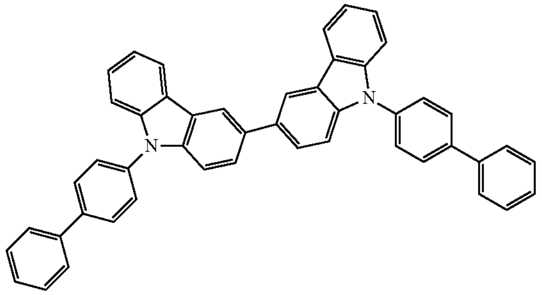

Host material 2

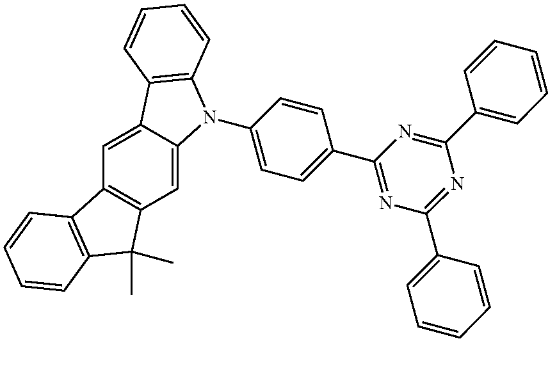

-continued

ETL

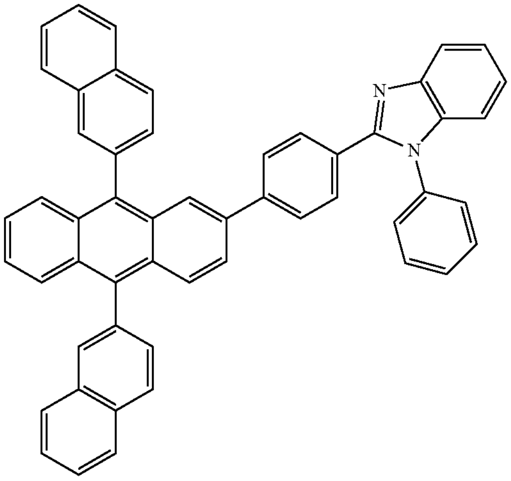

EIL

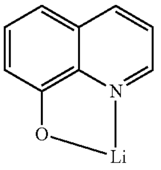

Comparative compound 1

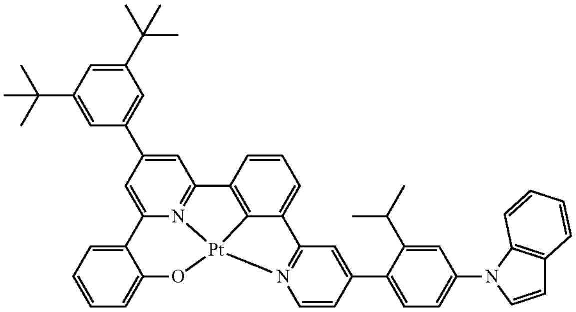

Comparative compound 2

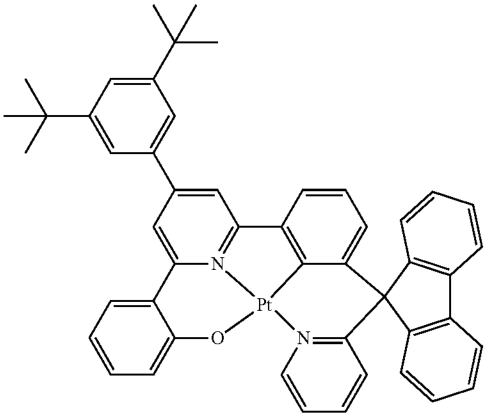

Evaluation:

Performances of a device obtained above were tested. In the examples and comparative examples, a constant-current power supply (Keithley 2400) was used, a current at a fixed density was used for flowing through light-emitting elements, and a spectroradiometer (CS 2000) was used for testing a light-emitting spectrum. Meanwhile, a voltage value was measured and the time to reach 90% of initial luminance (LT90) was tested. Results were shown as follows:

| | Doping material | Starting voltage V | Current efficiency Cd/A | Peak value wavelength nm | LT90 @ 3000 nits |
|---|---|---|---|---|---|
| Example 1 | A1 | 4.77 | 41 | 523 | 140 |
| Example 2 | A 3 | 4.73 | 44 | 525 | 143 |
| Example 3 | A 28 | 4.71 | 46 | 528 | 149 |
| Example 4 | A 39 | 4.68 | 51 | 527 | 177 |
| Example 5 | A 71 | 4.69 | 48 | 525 | 172 |
| Example 6 | A 82 | 4.68 | 53 | 523 | 189 |
| Example 7 | A 89 | 4.73 | 45 | 529 | 158 |
| Example 8 | A 100 | 4.78 | 51 | 531 | 186 |
| Example 9 | A 111 | 4.81 | 49 | 529 | 176 |
| Example 10 | A 125 | 4.67 | 51 | 533 | 169 |
| Example 11 | A 168 | 4.73 | 47 | 535 | 181 |
| Example 12 | A 197 | 4.69 | 54 | 534 | 191 |
| Comparative example 1 | Comparative compound 1 | 4.84 | 31 | 510 | 115 |
| Comparative example 2 | Comparative compound 2 | 4.86 | 38 | 517 | 136 |

It can be known from comparison of the data in the above table that the organic electroluminescent devices prepared from the compounds of the present disclosure as a green dopant exhibited superior performances in driving voltage, luminous efficiency, and device lifetime compared to those prepared from the comparative compounds.

The above results indicated that the compounds of the present disclosure have advantages of high light and electrochemical stability, a high color saturation, a high luminous efficiency, a long service life of the device and the like, and can be used in the organic electroluminescent device. Especially, as a green phosphorescent material, the metal complex has the potential to be used in the OLED industry.

The invention claimed is:

1. A metal complex, having a structure as shown in a formula (1), formula (1)

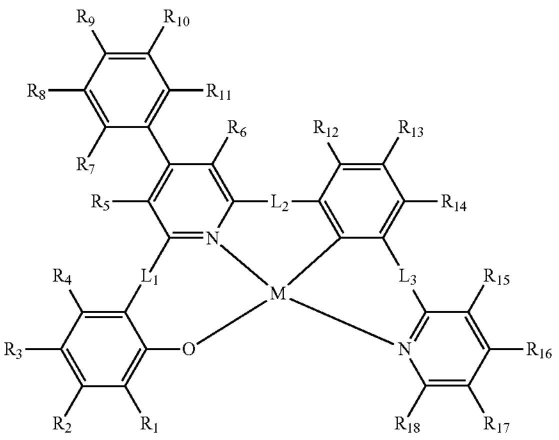

wherein at least one of $R_1$-$R_{18}$ has a structure shown in a formula (2), formula (2)

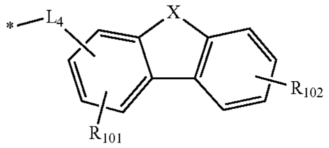

wherein

* represents a position of a linkage to the formula (1);

M is independently Pt or Pd;

X independently represents O, S, Se, and CRaRb;

$L_1$-$L_3$ are each independently selected from a direct bonding single bond, O, S, Se, NRc, CRdRe, SO, $SO_2$, and PO (Rf) (Rg);

$L_4$ is a single bond, O, substituted or unsubstituted $C_1$-$C_{20}$ alkylene, substituted or unsubstituted $C_3$-$C_{30}$ cycloalkylene, substituted or unsubstituted $C_1$-$C_{20}$ heteroalkylene, substituted or unsubstituted $C_7$-$C_{30}$ aralkylene, substituted or unsubstituted $C_2$-$C_{20}$ alkenylene, substituted or unsubstituted $C_3$-$C_{30}$ alkylidenesilyl, substituted or unsubstituted $C_6$-$C_{30}$ arylene, substituted or unsubstituted $C_3$-$C_{30}$ heteroarylene, substituted or unsubstituted $C_3$-$C_{30}$ arylenesilyl, or substituted or unsubstituted $C_0$-$C_{20}$ imino; and the remaining $R_1$-$R_{18}$, $R_{101}$-$R_{102}$, and $R_a$-$R_g$ are independently selected from hydrogen, deuterium, halogen, substituted or unsubstituted $C_1$-$C_{20}$ alkyl, substituted or unsubstituted $C_3$-$C_{30}$ cycloalkyl, substituted or unsubstituted $C_1$-$C_{20}$ heteroalkyl, substituted or unsubstituted $C_7$-$C_{30}$ aralkyl, substituted or unsubstituted $C_1$-$C_{20}$ alkoxy, substituted or unsubstituted $C_6$-$C_{30}$ aryloxy, substituted or unsubstituted $C_2$-$C_{20}$ alkenyl, substituted or unsubstituted $C_3$-$C_{30}$ alkylsilyl, substituted or unsubstituted $C_6$-$C_{30}$ aryl, substituted or unsubstituted $C_3$-$C_{30}$ heteroaryl, substituted or unsubstituted $C_3$-$C_{30}$ arylsilyl, substituted or unsubstituted $C_0$-$C_{20}$ amine, cyano, nitrile, isonitrile, or phosphino; or a ring structure formed by linking any two adjacent groups with each other; and the "substituted" refers to substitution with deuterium, halogen, $C_1$-$C_4$ alkyl, or cyano; and the substitution number of $R_{101}$ and $R_{102}$ independently represents a range from a non-substitution number to a maximum substitution number.

2. The metal complex according to claim 1, wherein the $L_4$ is a single bond, O, and one of the following structures:

formula (a)

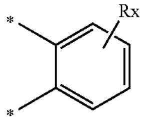

formula (b)

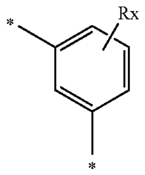

formula (c)

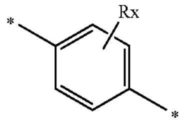

-continued formula (d)

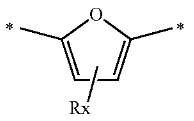

formula (e)

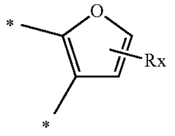

formula (f)

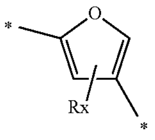

formula (g)

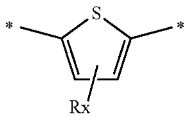

formula (h)

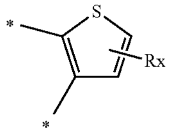

formula (i)

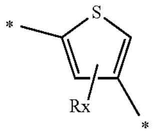

formula (j)

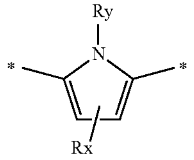

formula (k)

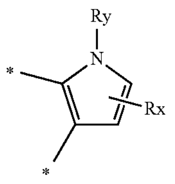

formula (l)

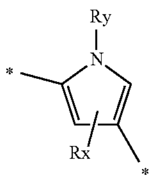

wherein

* represents a position of a linkage of the formula (1) and the formula (2);

the number of $R_x$ represents a range from a non-substitution number to a maximum substitution number, and when the $R_x$ is polysubstituted, adjacent two substituents may be linked to each other to form a ring structure; and the $R_x$ and $R_y$ are independently selected from hydrogen, deuterium, halogen, $C_1$-$C_4$ alkyl, or cyano.

3. The metal complex according to claim 2, wherein the $R_1$, the $R_2$, the $R_7$, the $R_8$, the $R_{10}$, the $R_{11}$, the $R_{18}$, the $R_{101}$, the $R_{102}$, the $R_a$ and the $R_b$ are independently selected from hydrogen, deuterium, halogen, substituted or unsubstituted $C_1$-$C_8$ alkyl, substituted or unsubstituted $C_3$-$C_{10}$ cycloalkyl, substituted or unsubstituted $C_1$-$C_8$ heteroalkyl, substituted or unsubstituted $C_7$-$C_{10}$ aralkyl, substituted or unsubstituted $C_2$-$C_{20}$ alkenyl, substituted or unsubstituted $C_3$-$C_8$ alkylsilyl, substituted or unsubstituted $C_6$-$C_{10}$ aryl, substituted or unsubstituted $C_3$-$C_{10}$ heteroaryl, substituted or unsubstituted $C_3$-$C_{10}$ arylsilyl, substituted or unsubstituted $C_0$-$C_6$ amido, or cyano.

4. The metal complex according to claim 3, wherein the $R_1$, the $R_2$, the $R_7$, the $R_8$, the $R_{10}$, the $R_{11}$, the $R_{18}$, the $R_{101}$, the $R_{102}$, the $R_a$ and the $R_b$ are independently selected from hydrogen, deuterium, halogen, substituted or unsubstituted $C_1$-$C_8$ alkyl, substituted or unsubstituted $C_3$-$C_{10}$ cycloalkyl, substituted or unsubstituted $C_1$-$C_8$ heteroalkyl, substituted or unsubstituted $C_7$-$C_{10}$ phenylalkyl, substituted or unsubstituted $C_6$-$C_{10}$ aryl, or substituted or unsubstituted $C_3$-$C_{10}$ heteroaryl;

the $R_x$ and the $R_y$ are independently selected from hydrogen, deuterium, halogen, or $C_1$-$C_4$ alkyl.

5. The metal complex according to claim 4, wherein the $R_{18}$ is deuterium, substituted or unsubstituted straight-chain carbon atom $C_1$-$C_4$ alkyl, or substituted or unsubstituted $C_3$-$C_6$ cycloalkyl, and the "substituted" refers to substitution with deuterium or halogen.

6. An electroluminescent device, comprising a cathode, an anode, and an organic layer arranged between the cathode and the anode, wherein at least one of the organic layer comprises the metal complex according to claim 5.

7. An electroluminescent device, comprising a cathode, an anode, and an organic layer arranged between the cathode and the anode, wherein at least one of the organic layer comprises the metal complex according to claim 4.

8. The metal complex according to claim 4, wherein at least one of the $R_1$ and the $R_2$ is not hydrogen.

9. An electroluminescent device, comprising a cathode, an anode, and an organic layer arranged between the cathode and the anode, wherein at least one of the organic layer comprises the metal complex according to claim 8.

10. An electroluminescent device, comprising a cathode, an anode, and an organic layer arranged between the cathode and the anode, wherein at least one of the organic layer comprises the metal complex according to claim 3.

11. An electroluminescent device, comprising a cathode, an anode, and an organic layer arranged between the cathode and the anode, wherein at least one of the organic layer comprises the metal complex according to claim 2.

12. The metal complex according to claim 1, having a structure as shown in a formula (3), formula (3)

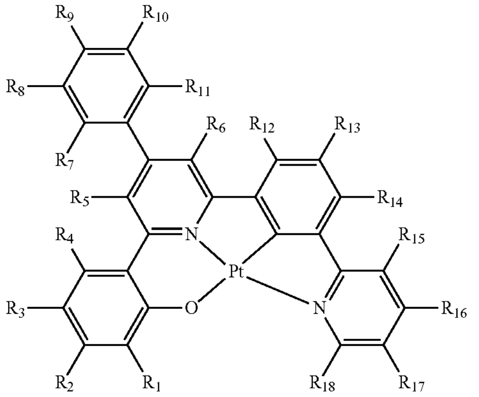

wherein at least one of $R_1$-$R_{18}$ has a structure shown in a formula (2), formula (2)

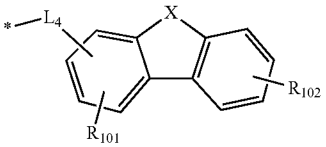

wherein the *, the X, the $L_4$, the $R_1$-$R_{18}$, the $R_{101}$-$R_{102}$, and $R_a$-$R_b$ are as defined above.

13. The metal complex according to claim 12, having a structure as shown in a formula (4), formula (4)

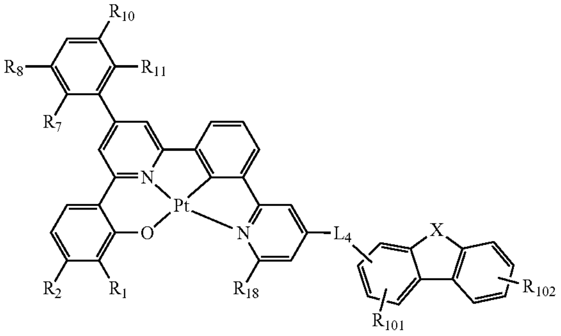

wherein the X independently represents O, S, Se, and CRaRb;

the $L_4$ is a single bond, O, substituted or unsubstituted $C_1$-$C_{10}$ alkylene, substituted or unsubstituted $C_3$-$C_{10}$ cycloalkylene, substituted or unsubstituted $C_2$-$C_{10}$ heteroalkylene, substituted or unsubstituted $C_7$-$C_{20}$ aralkylene, substituted or unsubstituted $C_2$-$C_{20}$ alkenylene, substituted or unsubstituted $C_3$-$C_{30}$ alkylidenesilyl, substituted or unsubstituted $C_6$-$C_{30}$ arylene, substituted or unsubstituted $C_3$-$C_{30}$ heteroarylene, substituted or unsubstituted $C_3$-$C_{30}$ arylenesilyl, or substituted or unsubstituted $C_0$-$C_{20}$ imino; and $R_1$, $R_2$, $R_7$, $R_8$, $R_{10}$, $R_{11}$, $R_{18}$, the $R_{101}$, the $R_{102}$, $R_a$, and $R_b$ are as defined above.

14. An electroluminescent device, comprising a cathode, an anode, and an organic layer arranged between the cathode and the anode, wherein at least one of the organic layer comprises the metal complex according to claim 13.

15. An electroluminescent device, comprising a cathode, an anode, and an organic layer arranged between the cathode and the anode, wherein at least one of the organic layer comprises the metal complex according to claim 12.

16. An electroluminescent device, comprising a cathode, an anode, and an organic layer arranged between the cathode and the anode, wherein at least one of the organic layer comprises the metal complex according to claim 1.

17. The electroluminescent device according to claim 16, wherein the organic layer comprises a light-emitting layer, and the metal complex is used as a green light-emitting material in the light-emitting layer; or the organic layer comprises a hole injection layer, and the metal complex is used as a hole injection material in the hole injection layer.

18. A metal complex, having one of the following structural formulas,

A 1

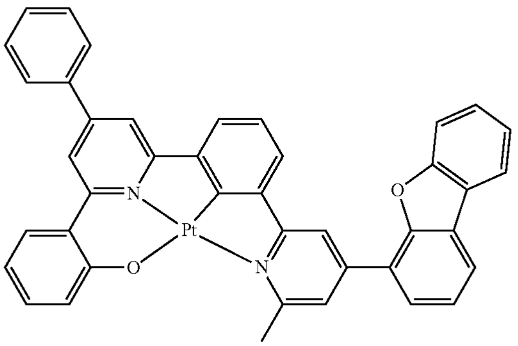

A 2

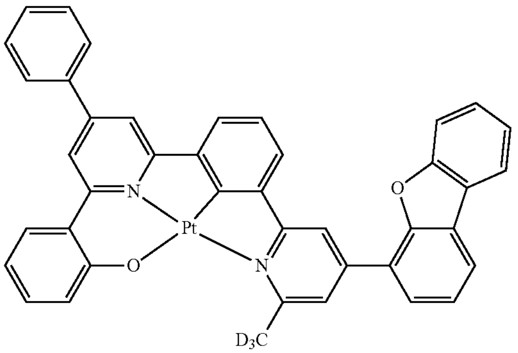

A 3

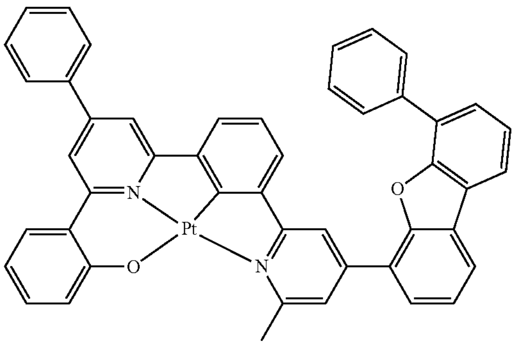

A 4
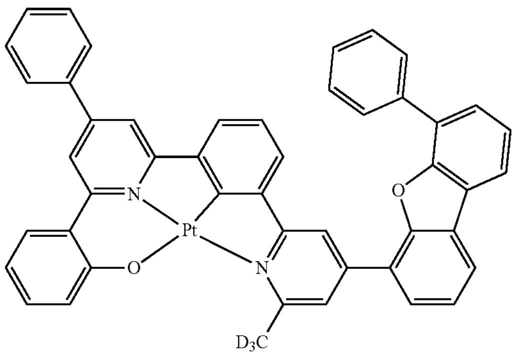
A 5
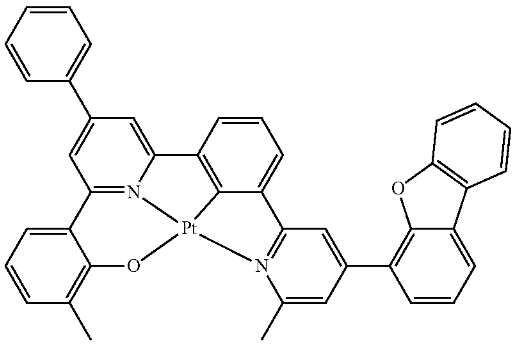
A 6
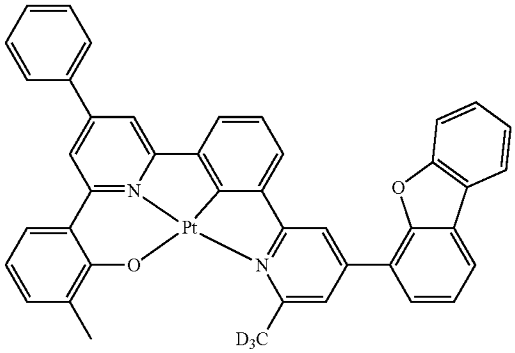
A 7
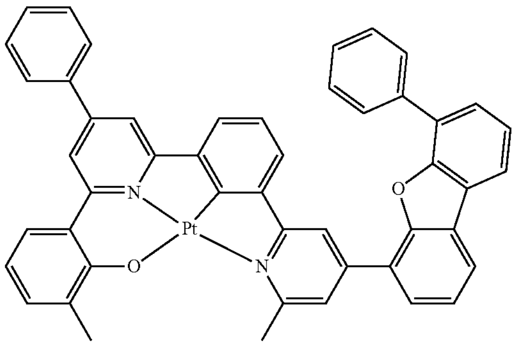
A 8
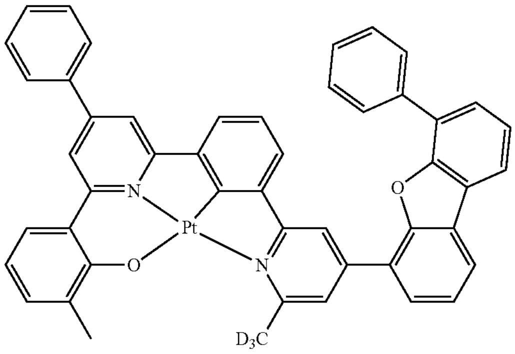
A 9
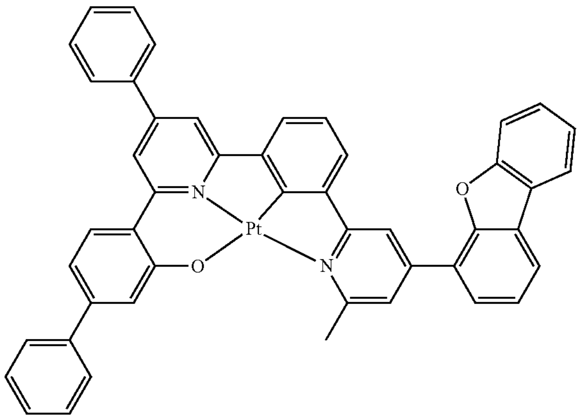
A 10
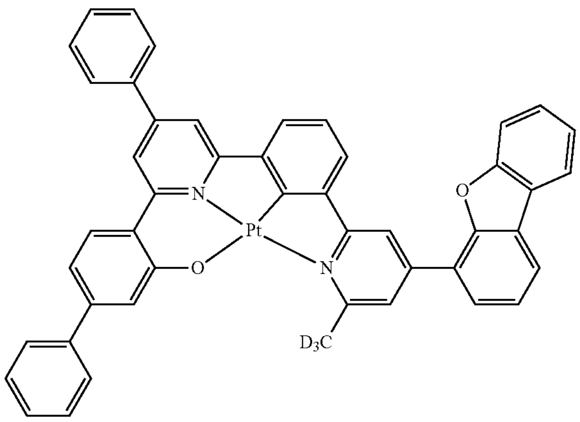

-continued
A 11
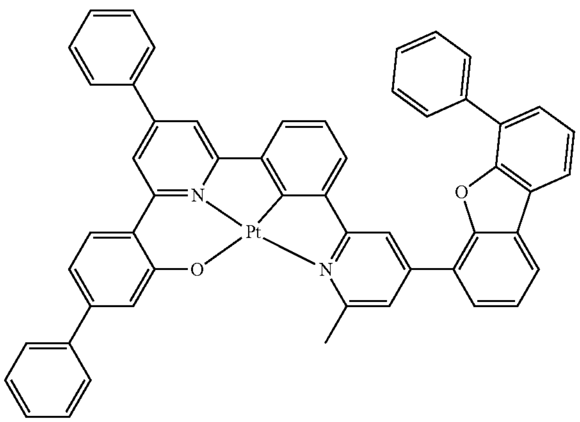
A 12
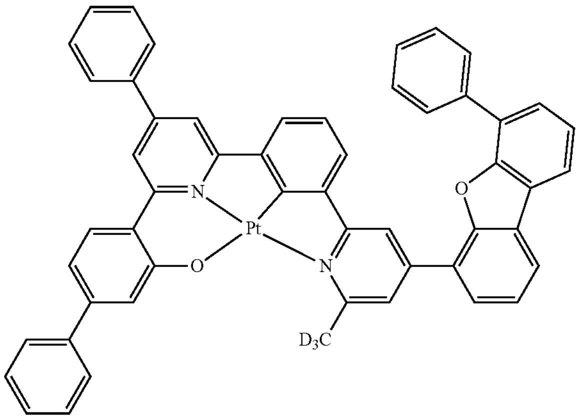
A 13
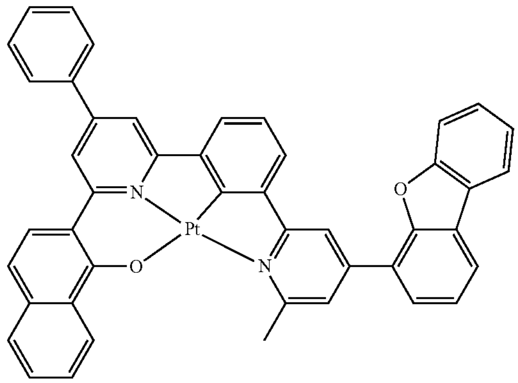
-continued
A 14
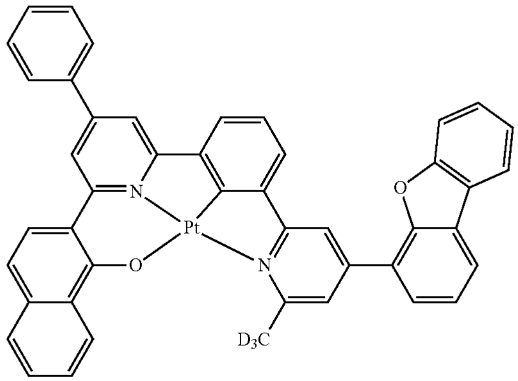
A 15
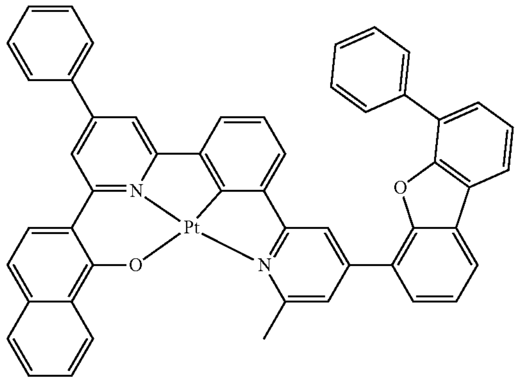
A 16
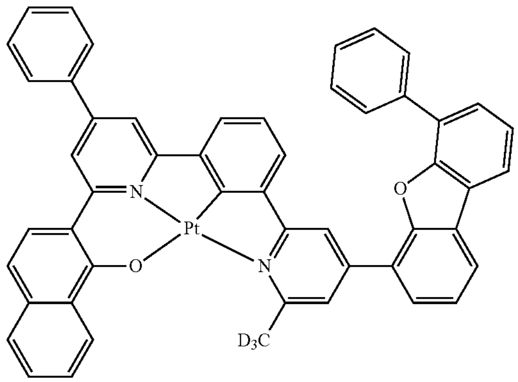

-continued
A 17
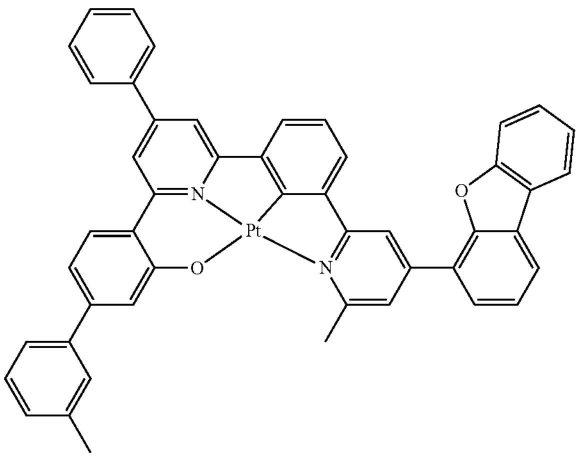
A 18
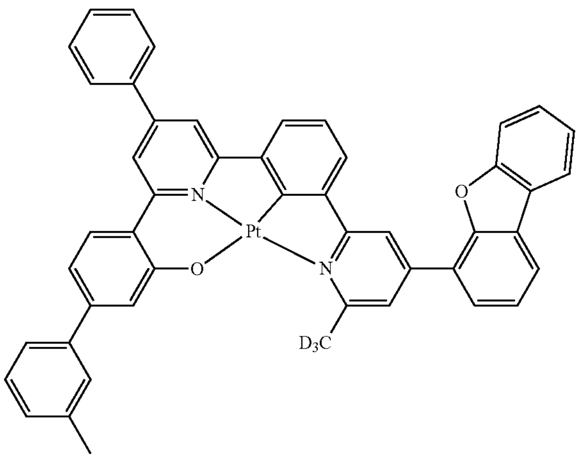
A 19
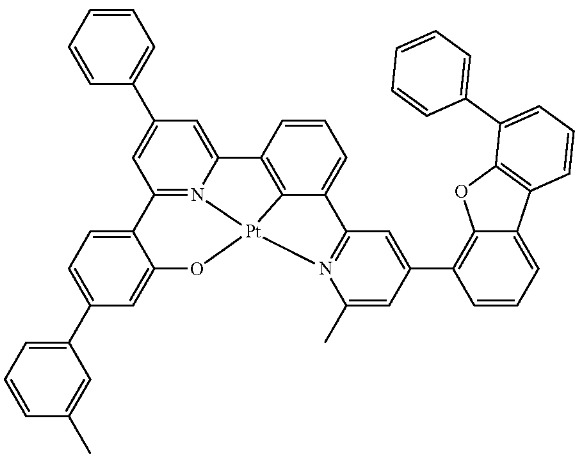
-continued
A 20
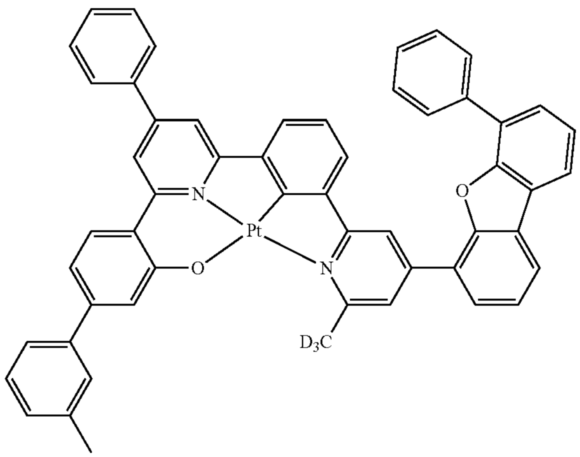
A 21
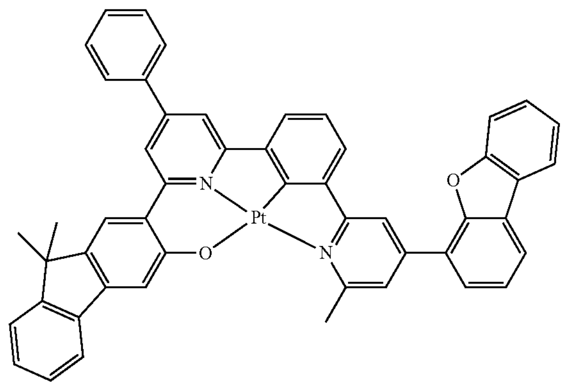
A 22
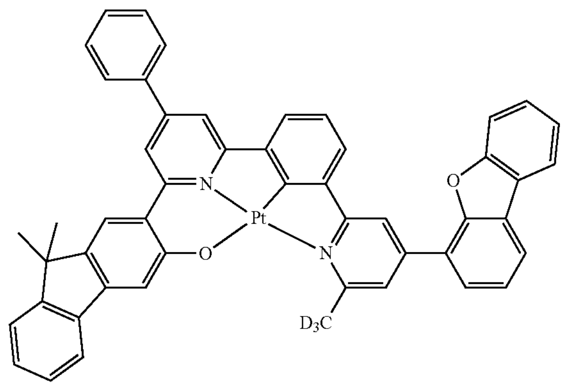

A 23
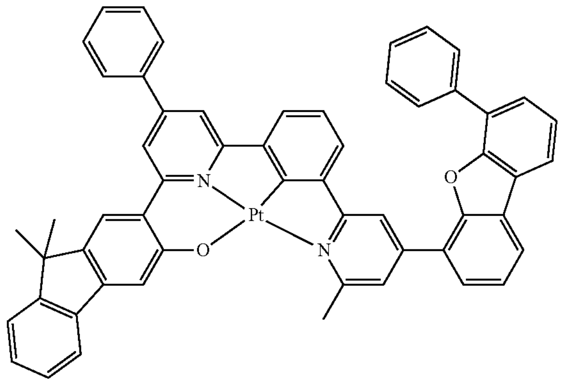
A 24
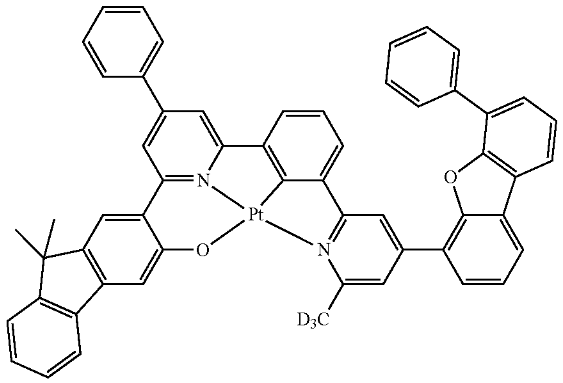
A 25
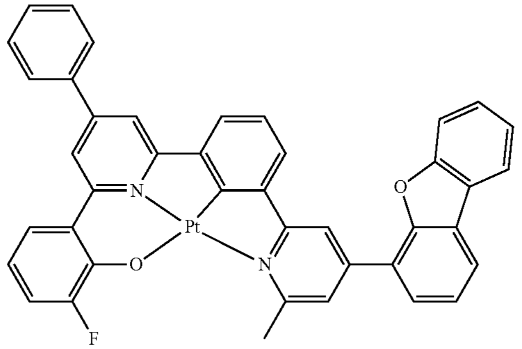
A 26
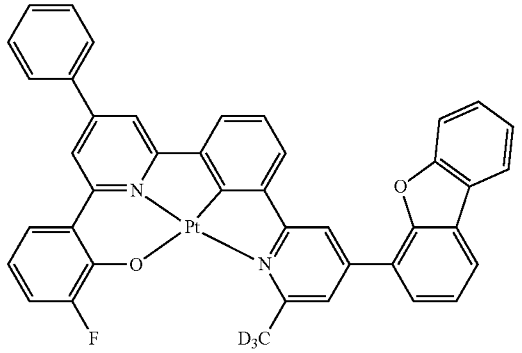
A 27
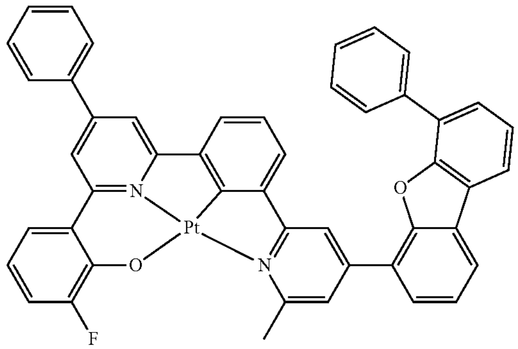
A 28
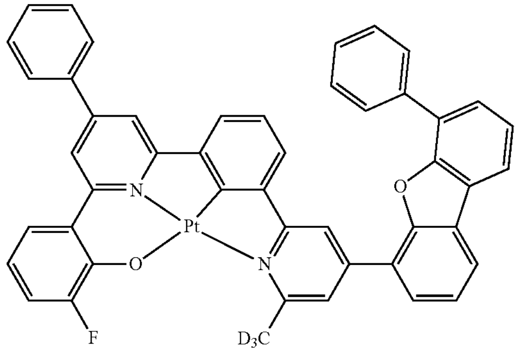
A 29
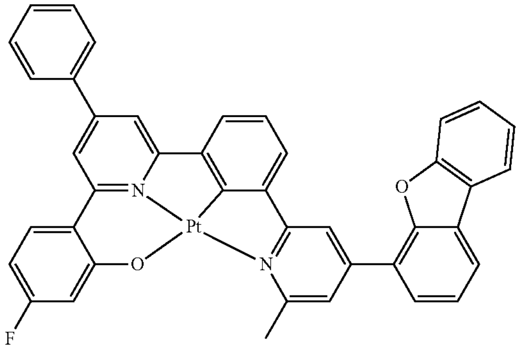
A 30
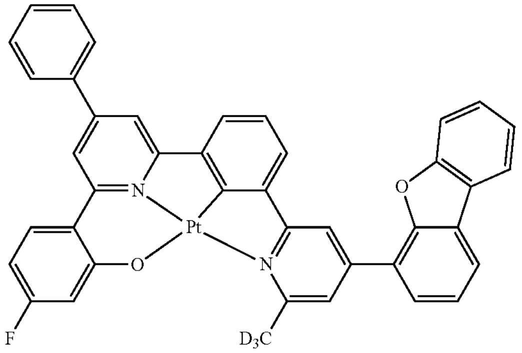

-continued
A 31
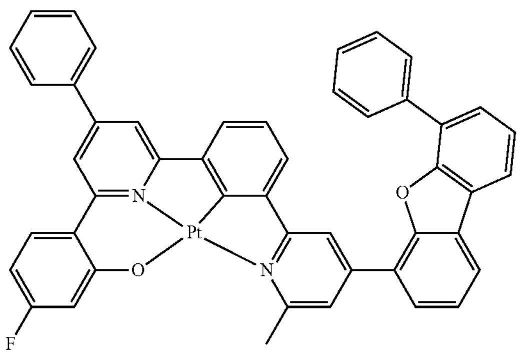
A 32
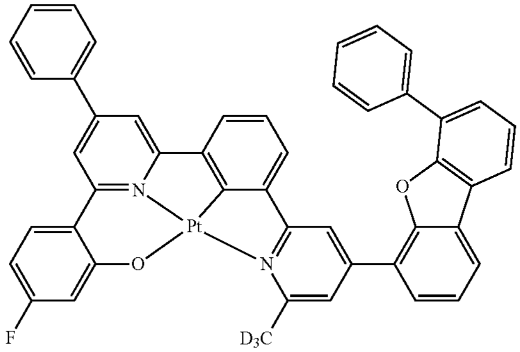
A 33
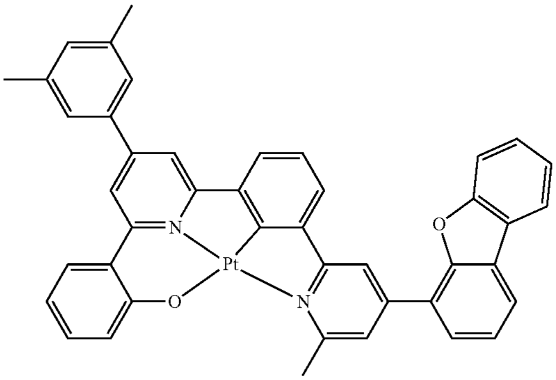
A 34
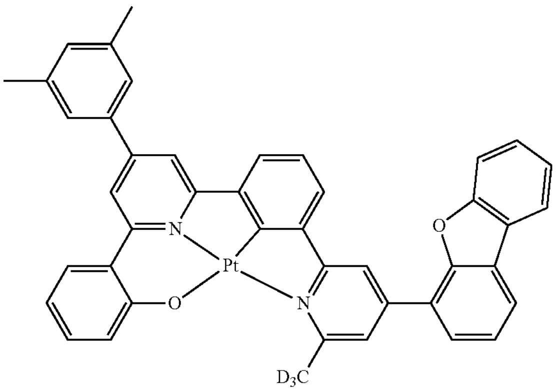
-continued
A 35
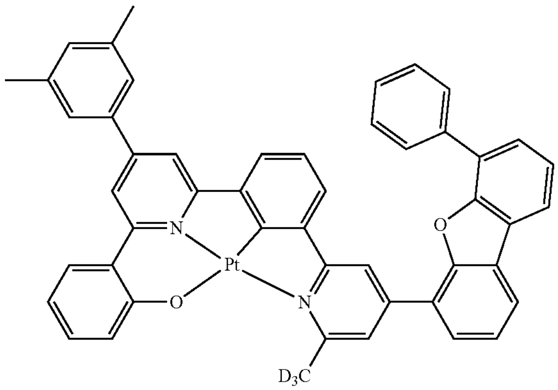
A 36
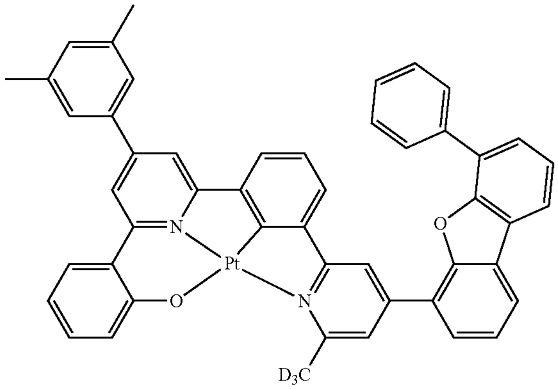
A 37
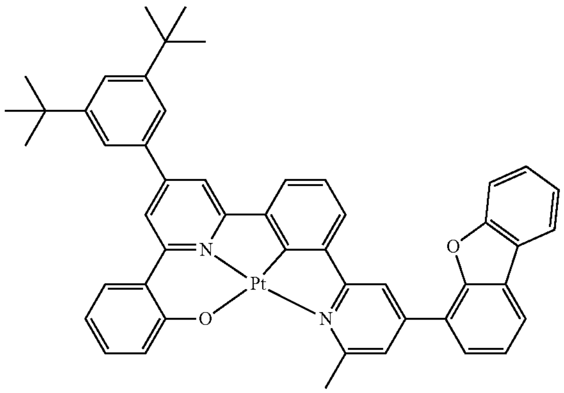

-continued
A 38
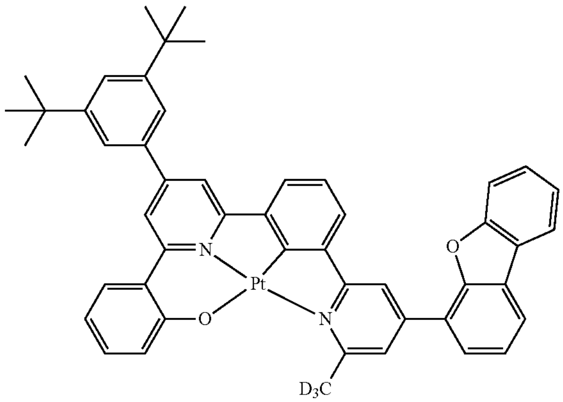
A 39
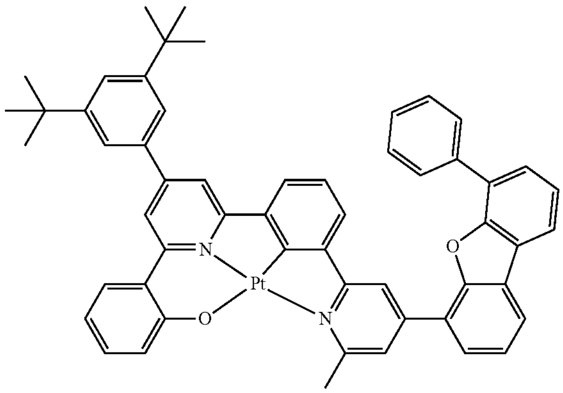
A 40
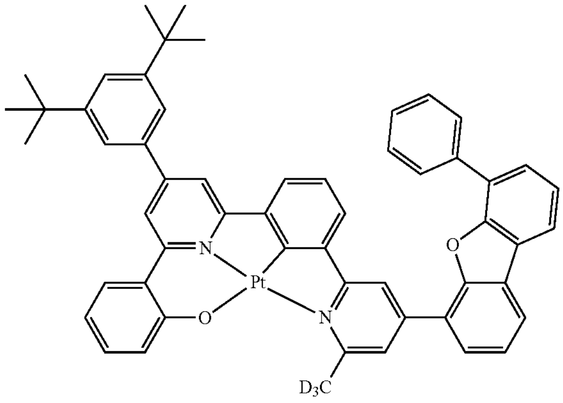
-continued
A 41
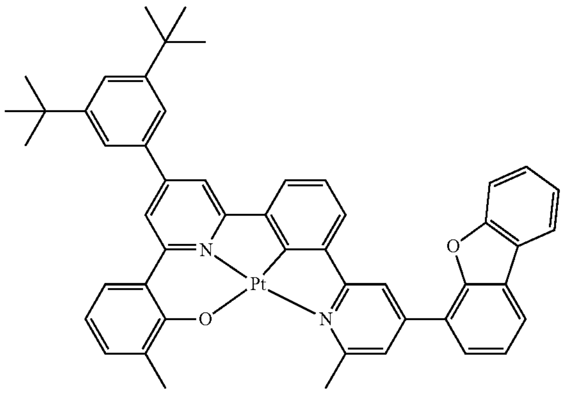
A 42
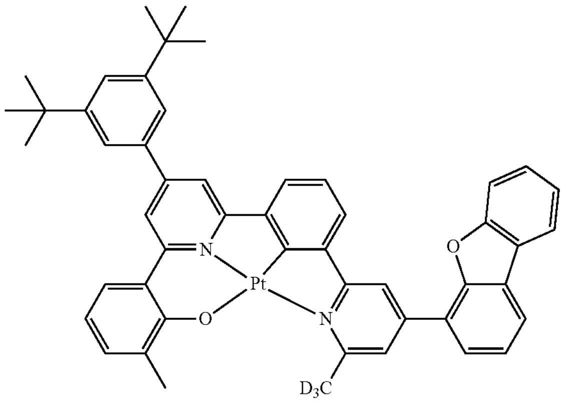
A 43
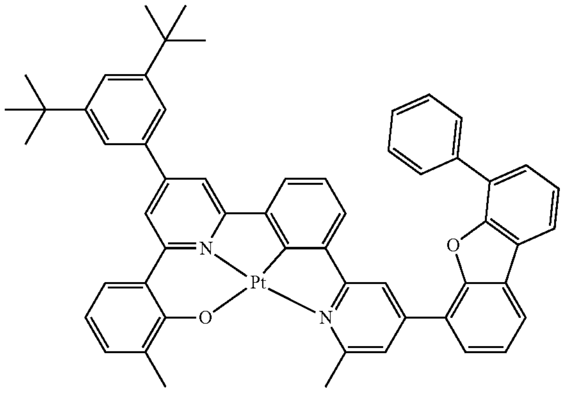

-continued
A 44
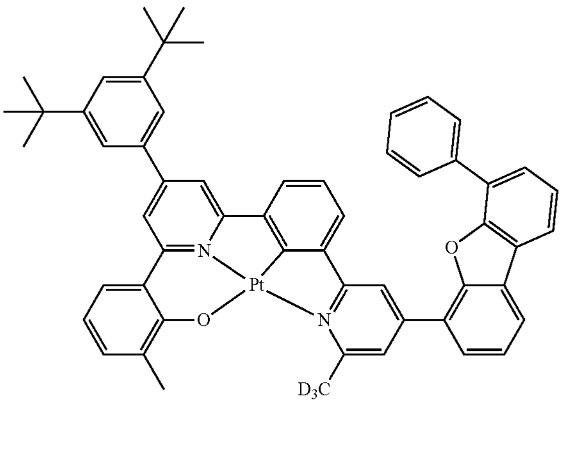
A 45
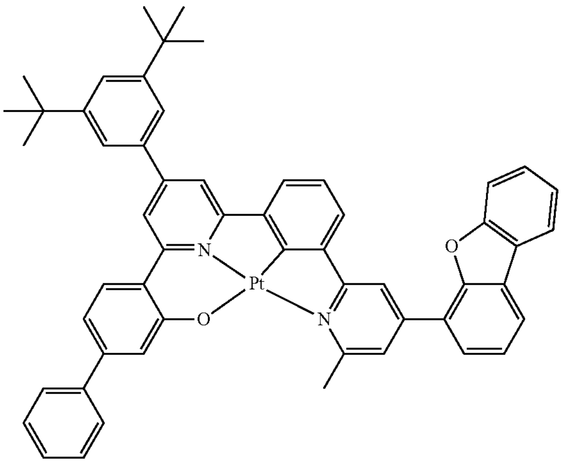
A 46
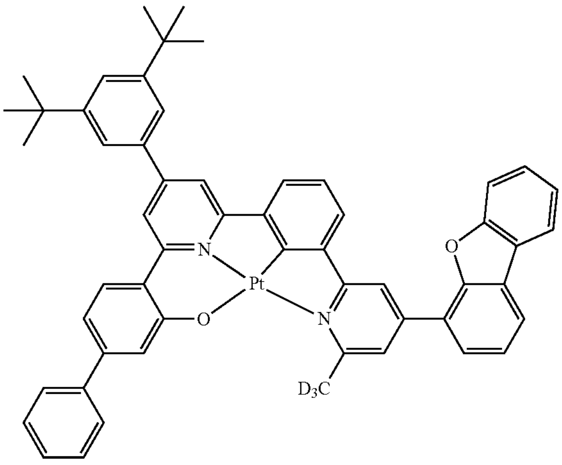
-continued
A 47
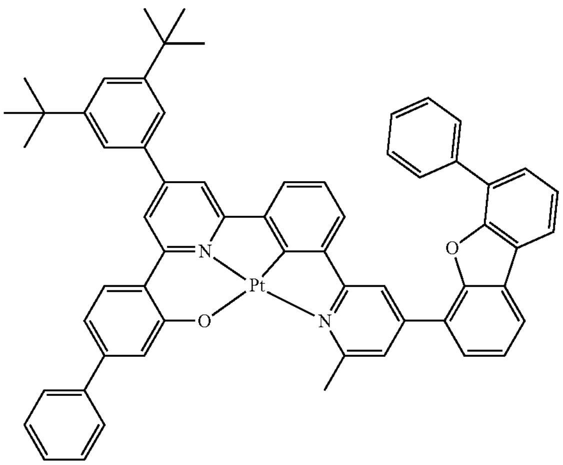
A 48
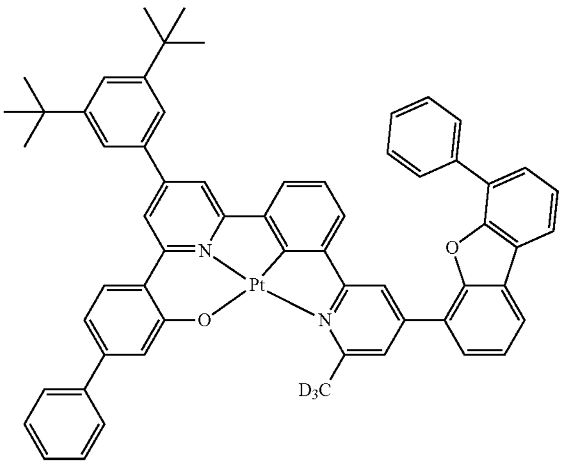
A 49
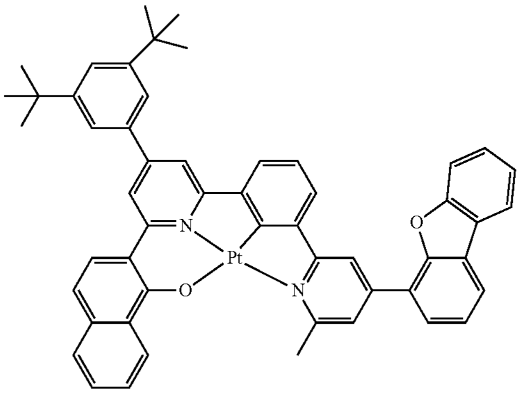

-continued
A 50
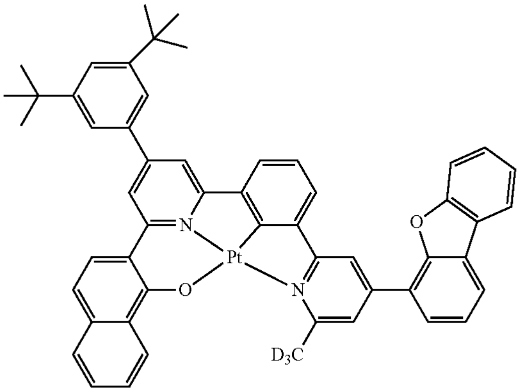
A 51
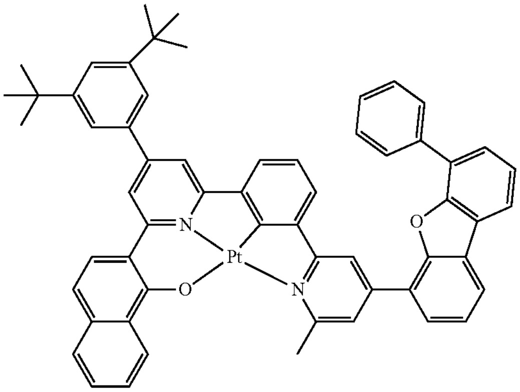
A 52
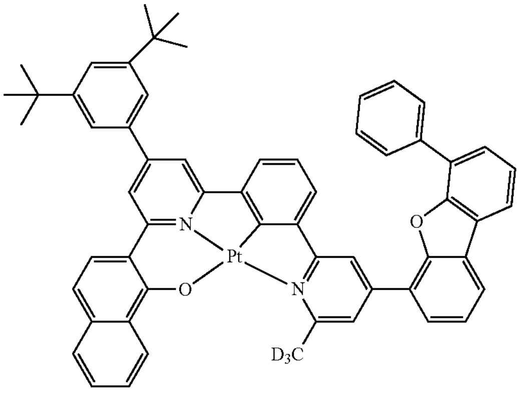
-continued
A 53
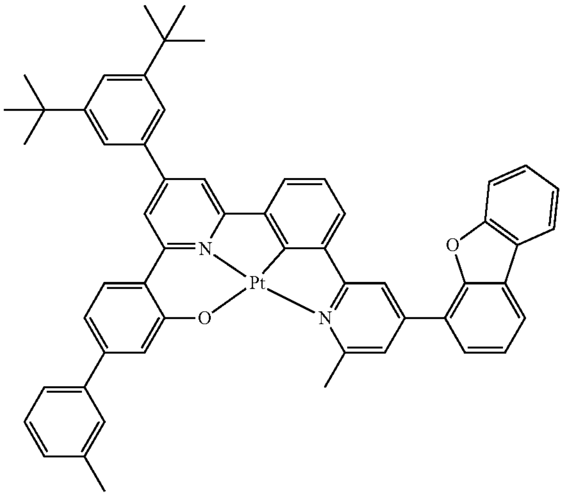
A 54
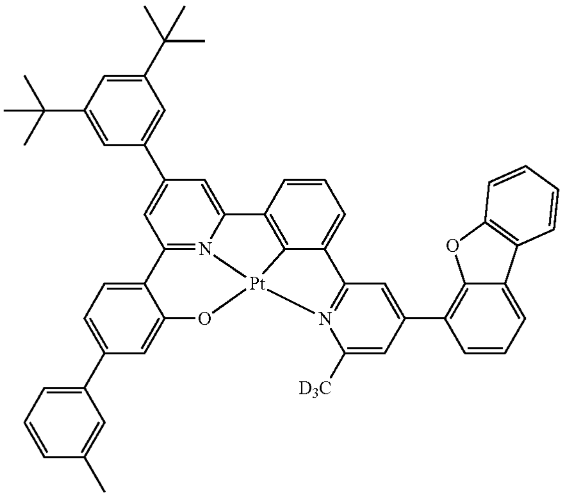
A 55
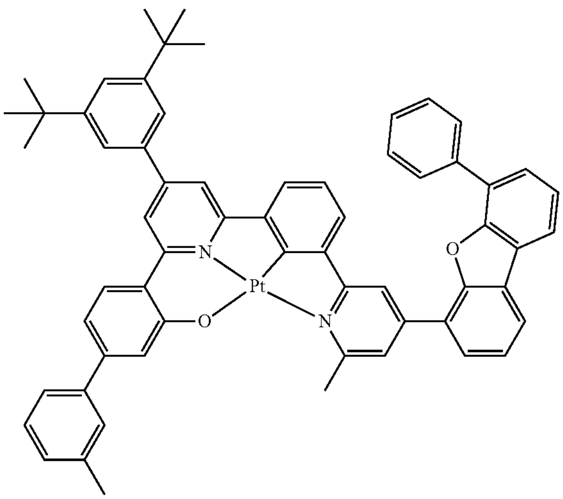

-continued
A 56
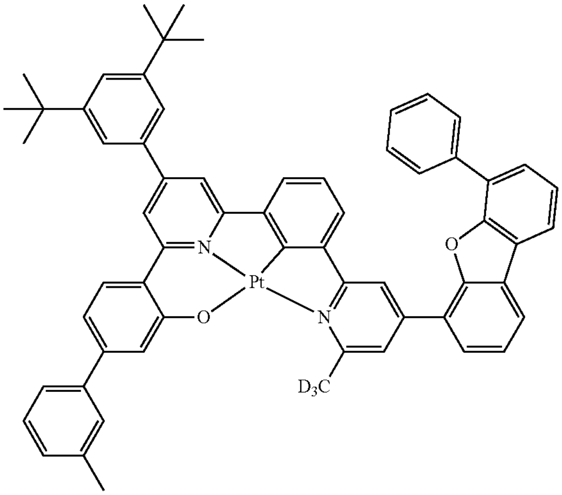
A 57
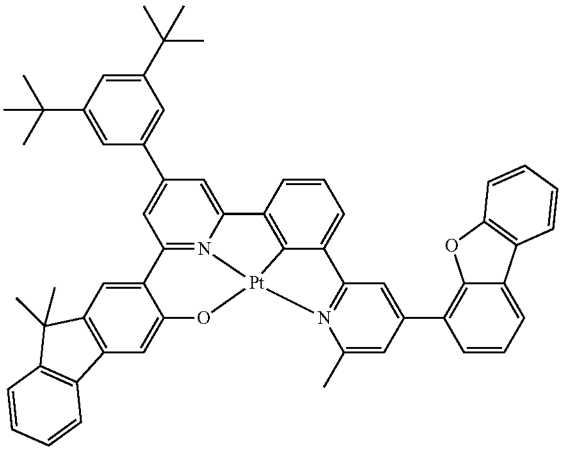
A 58
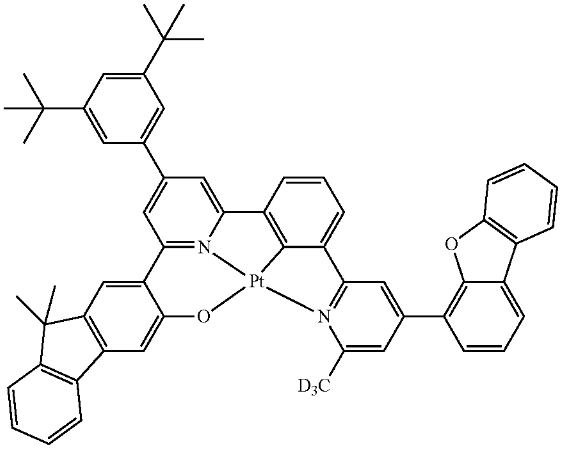
-continued
A 59
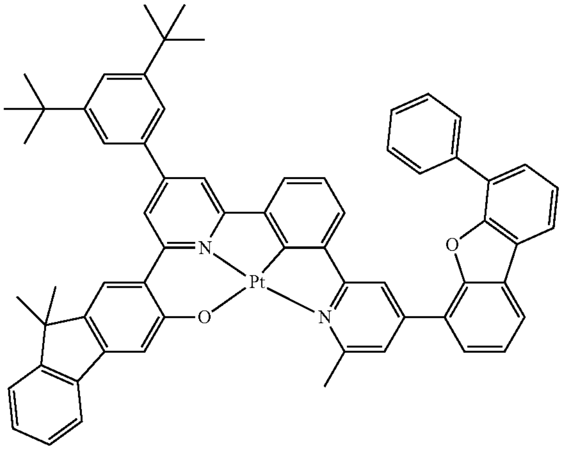
A 60
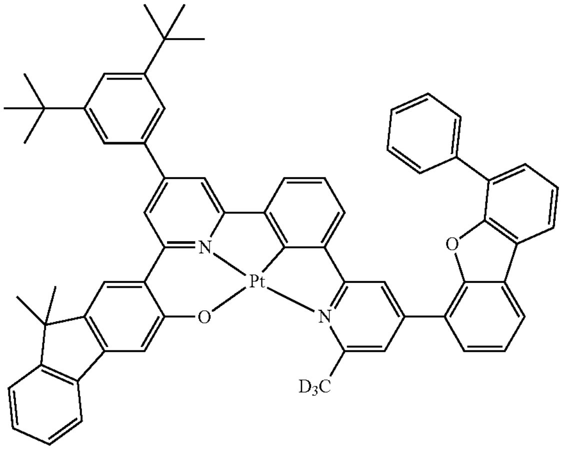
A 61
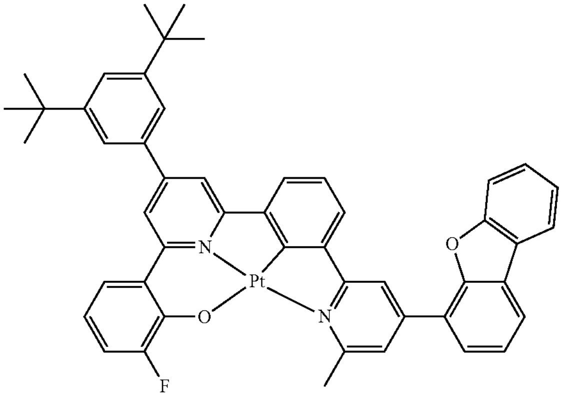

-continued
A 62
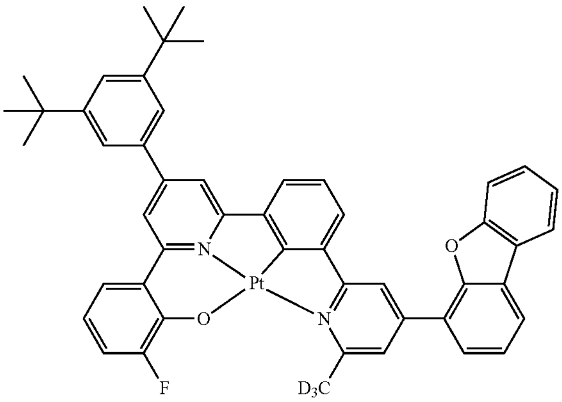
A 63
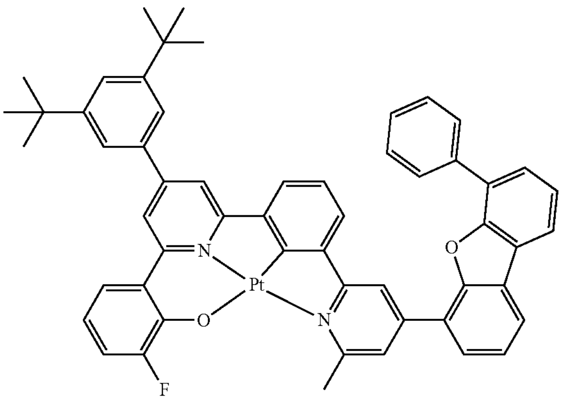
A 64
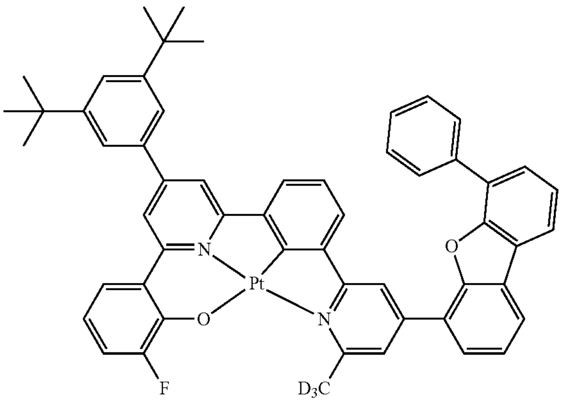
-continued
A 65
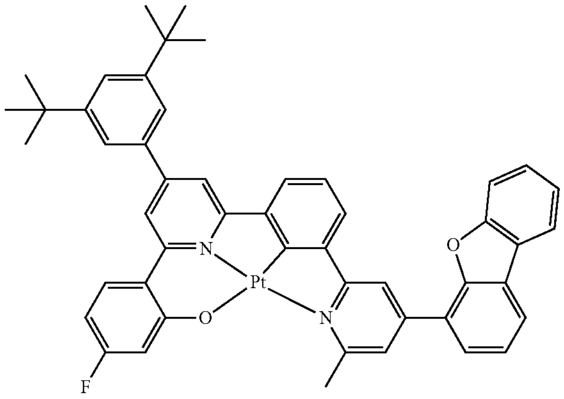
A 66
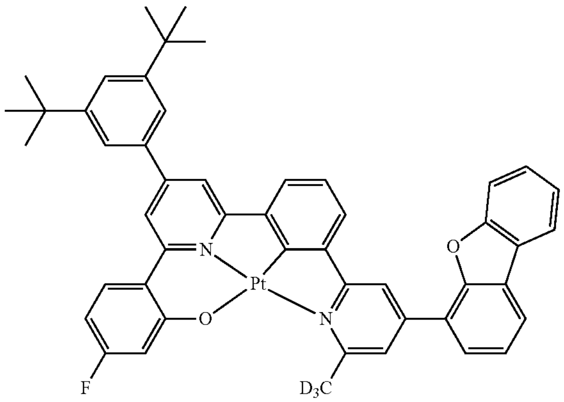
A 67
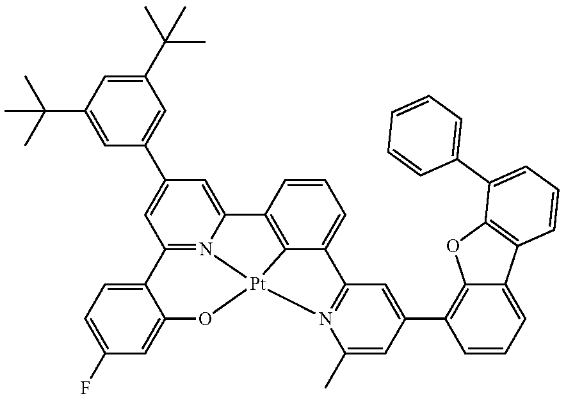

A 68
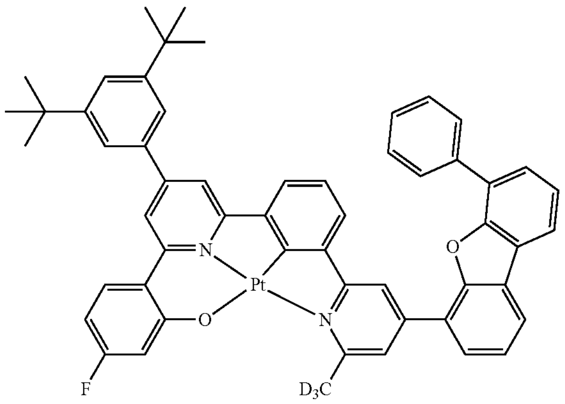
A 69
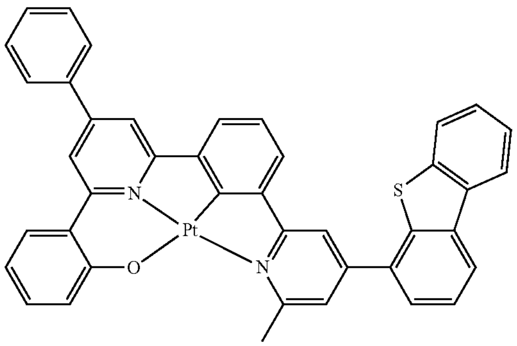
A 70
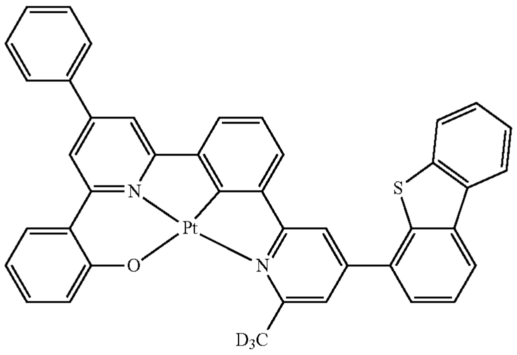
A 71
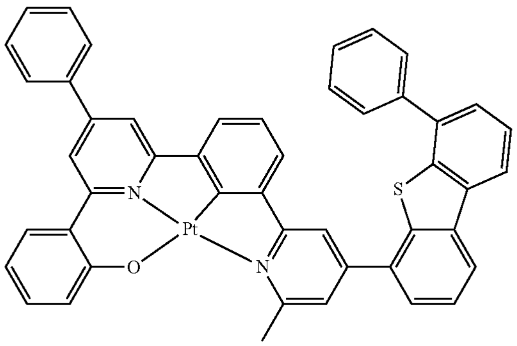
A 72
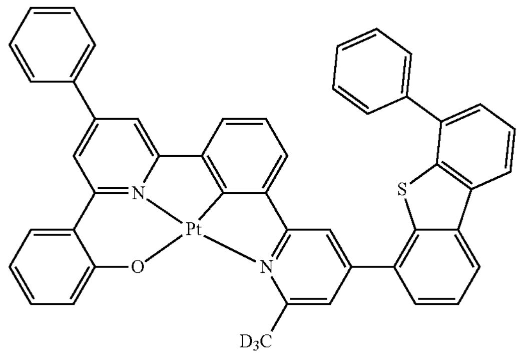
A 73
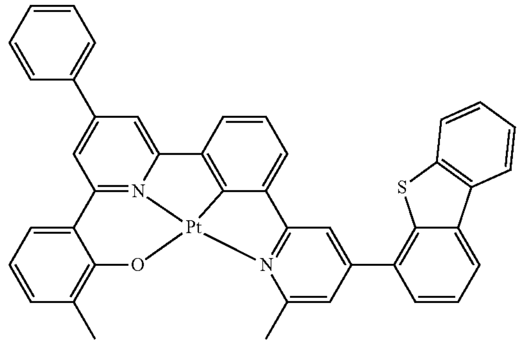
A 74
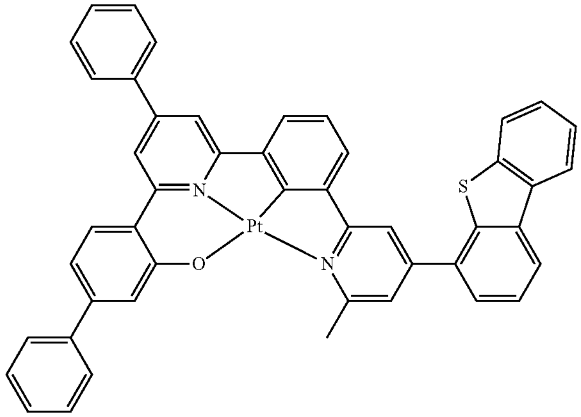
A 75
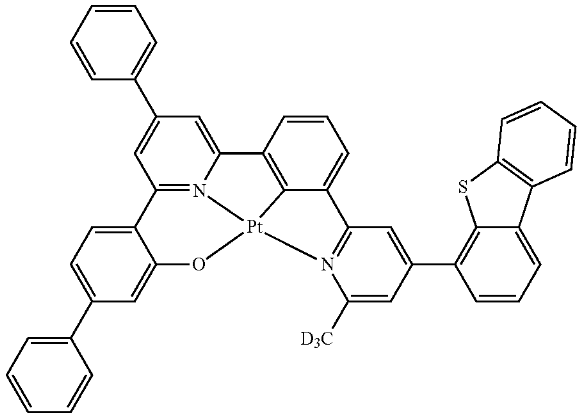

-continued
A 76
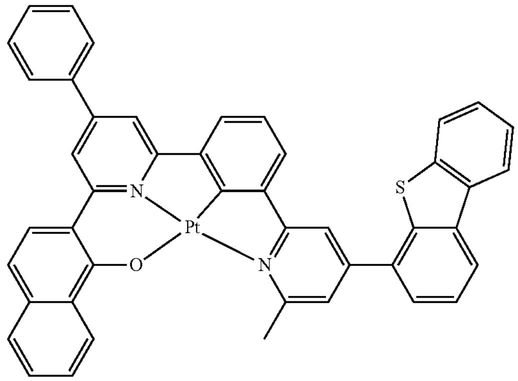
A 77
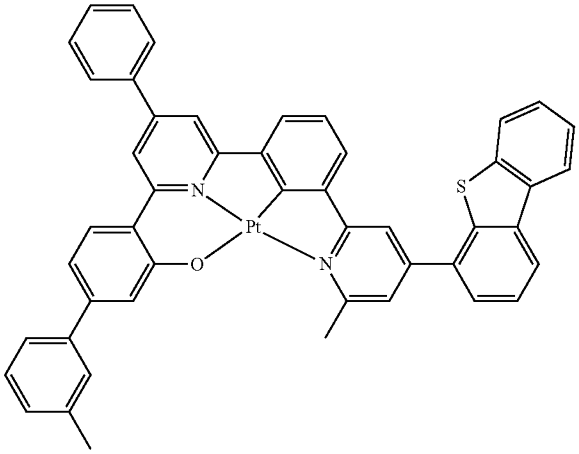
A 78
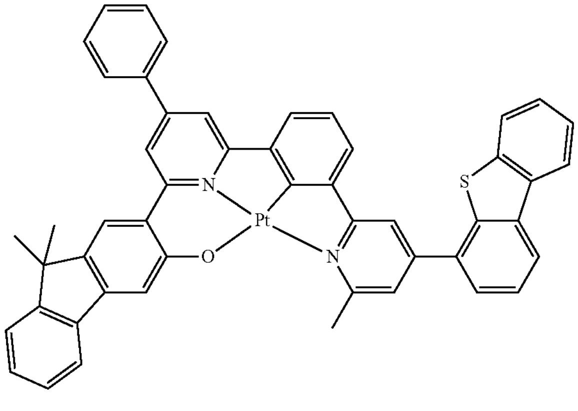
-continued
A 79
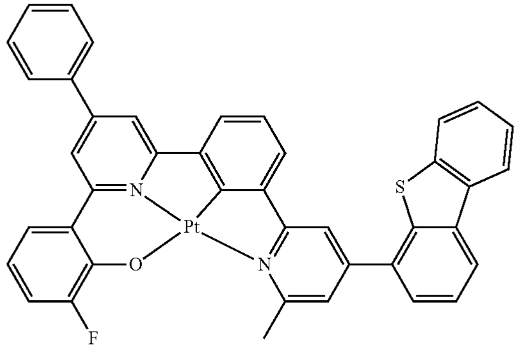
A 80
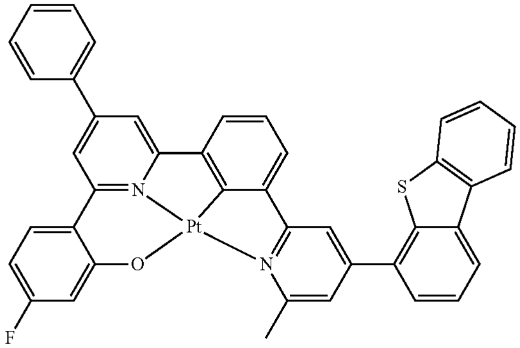
A 81
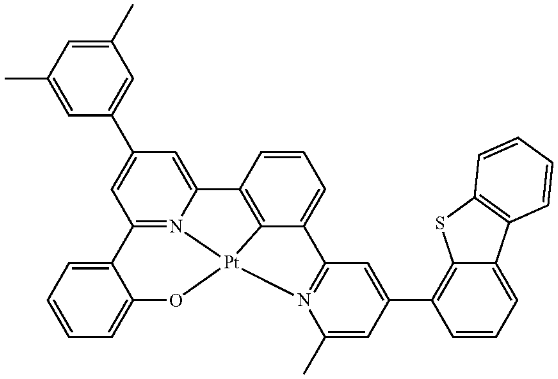
A 82
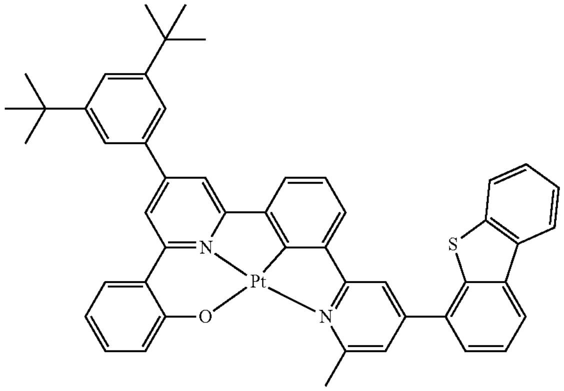

-continued
A 83
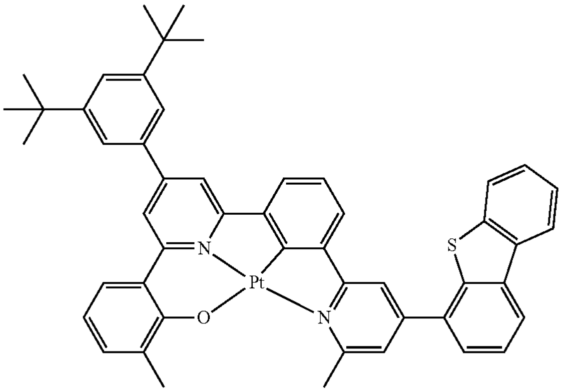
A 84
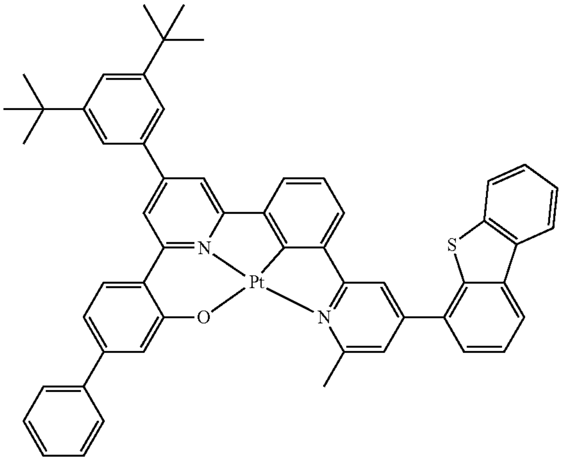
A 85
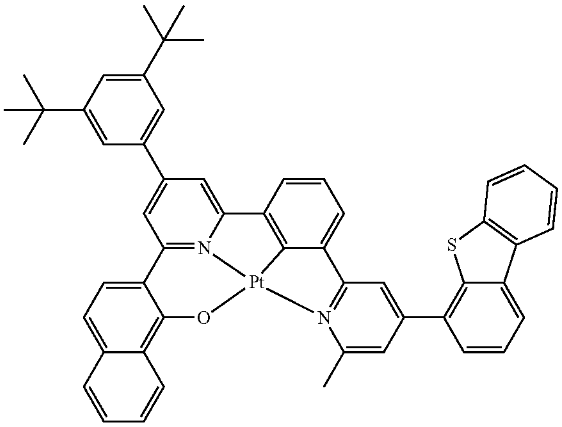
-continued
A 86
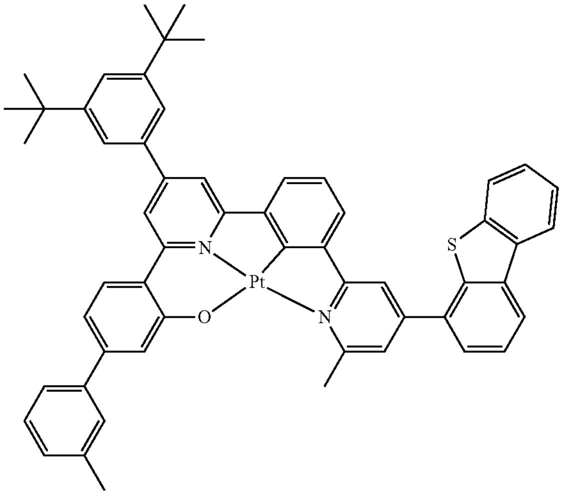
A 87
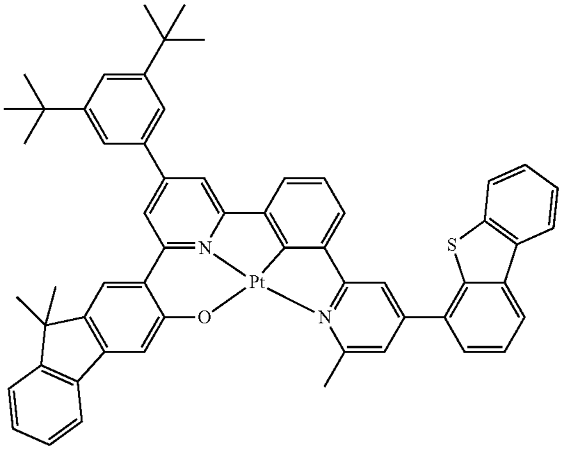
A 88
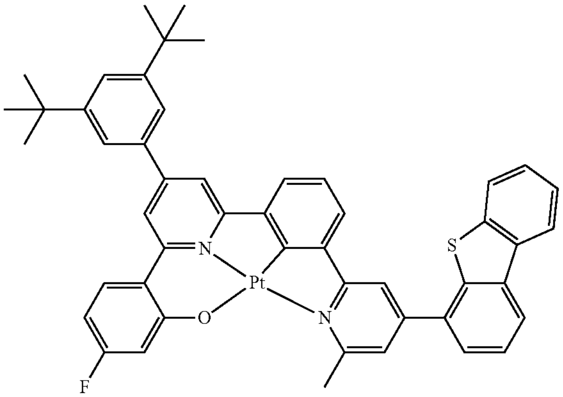

-continued
A 89
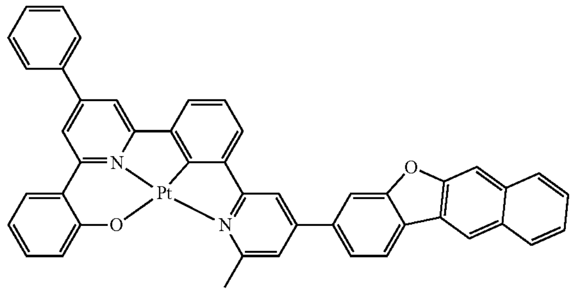
A 90
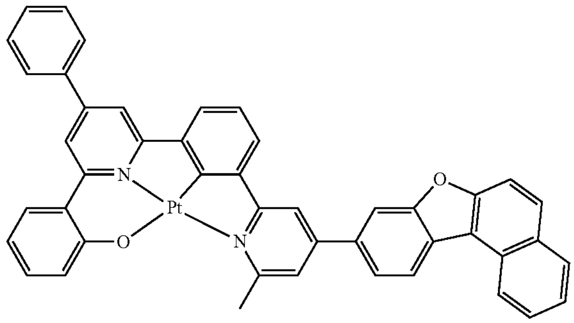
A 91
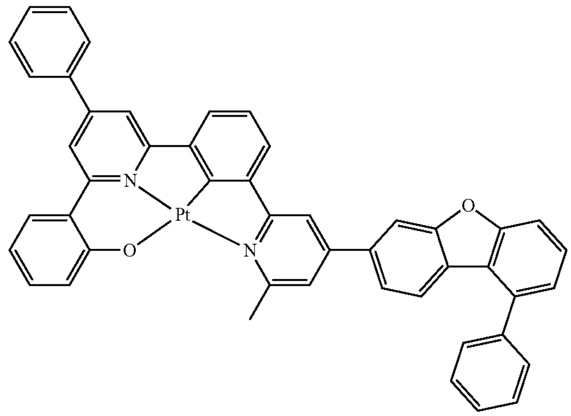
A 92
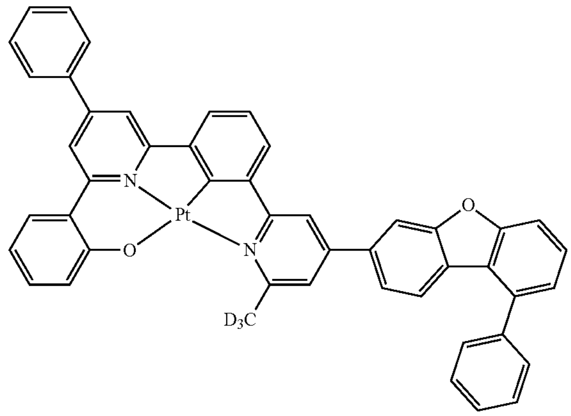
-continued
A 93
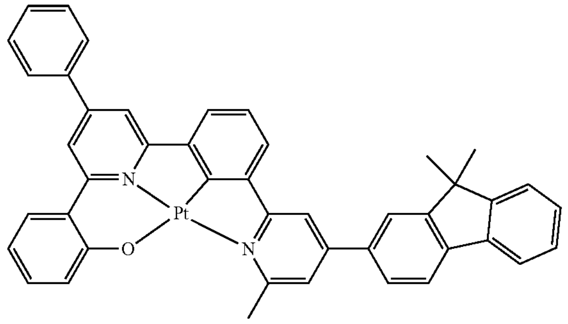
A 94
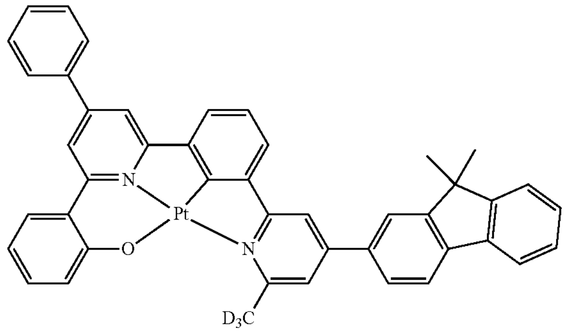
A 95
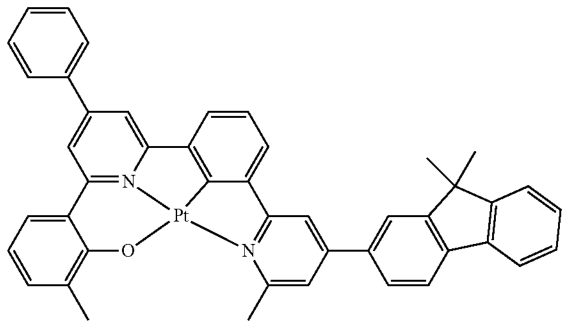
A 96
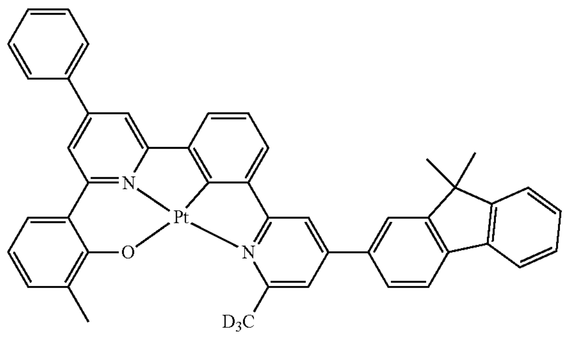

-continued
A 97
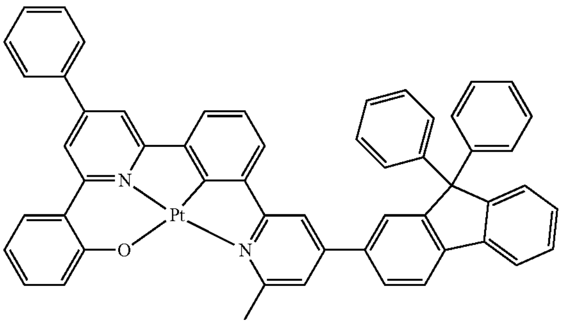
A 98
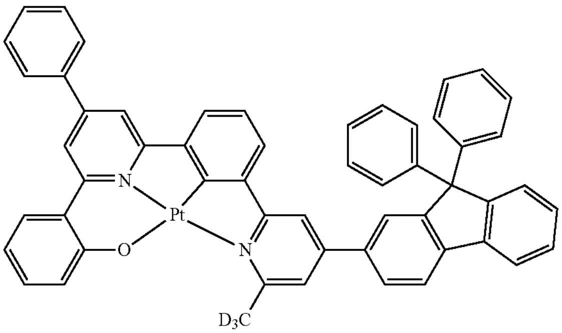
A 99
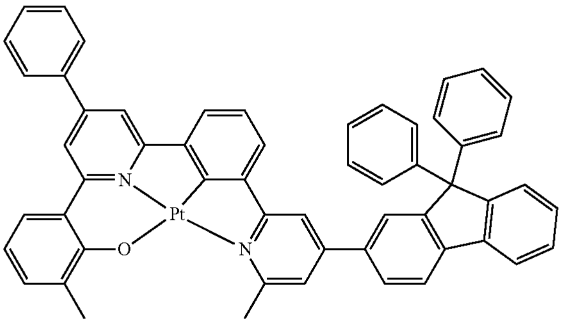
A 100
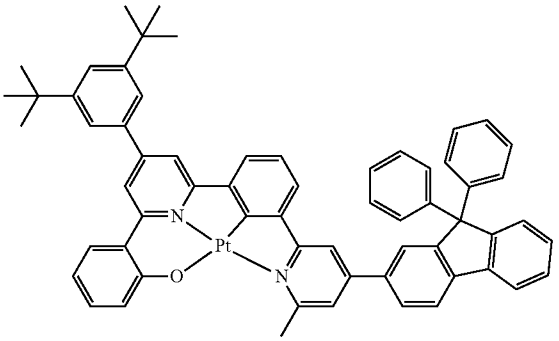
-continued
A 101
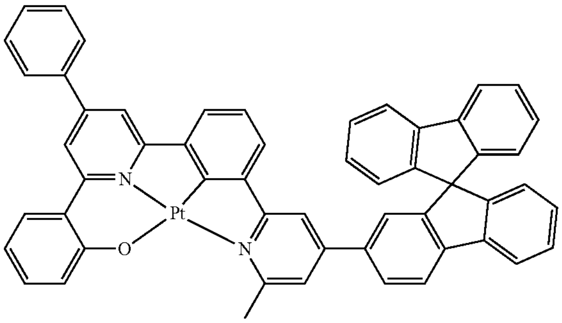
A 102
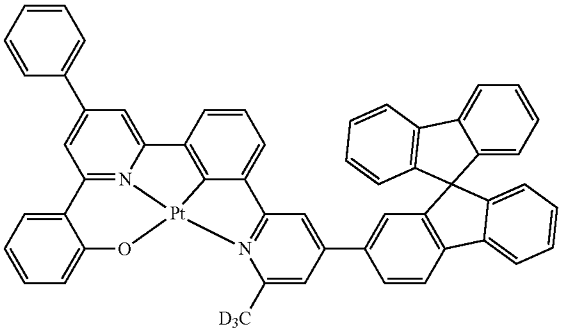
A 103
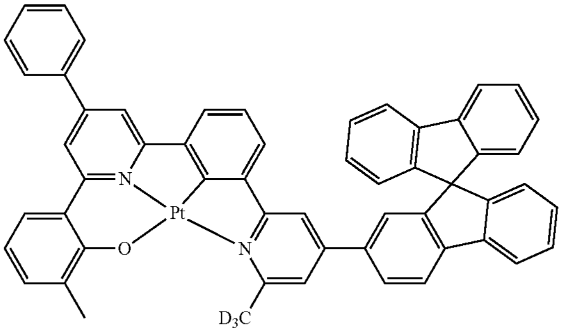
A 104
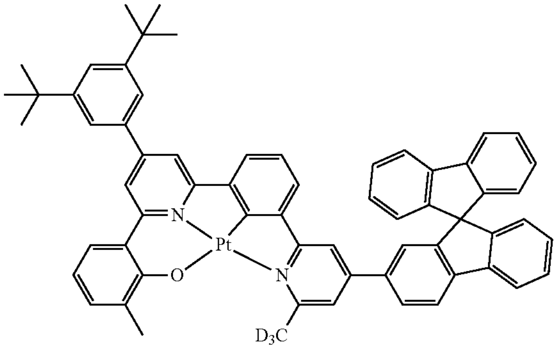

-continued
A 105
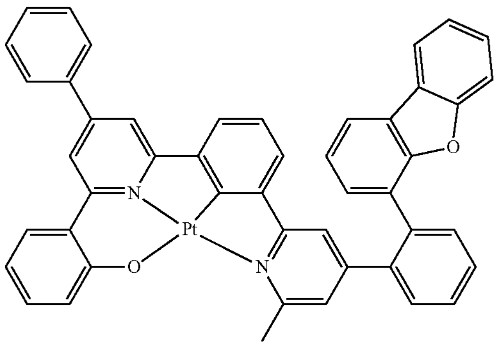
A 106
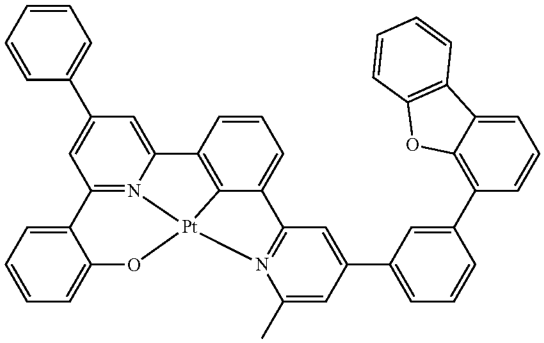
A 107
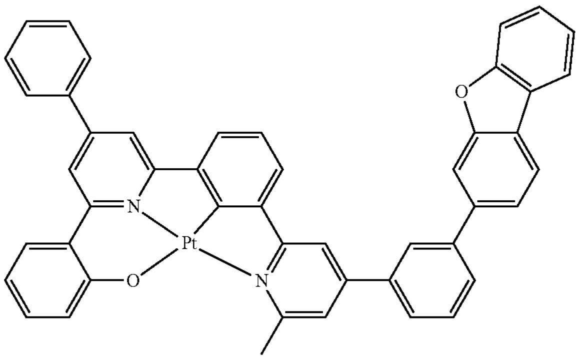
A 108
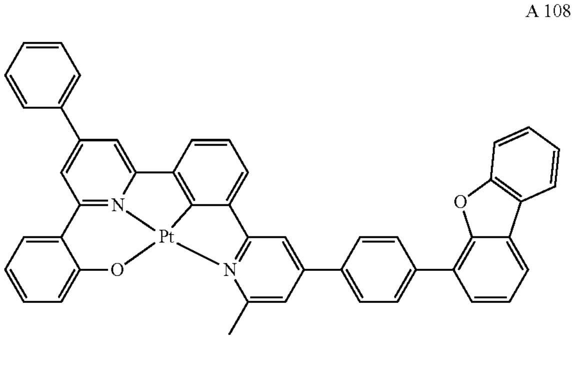
-continued
A 109
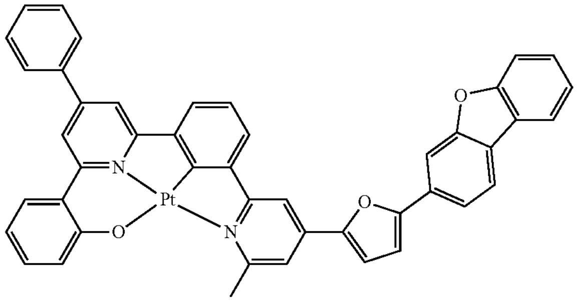
A 110
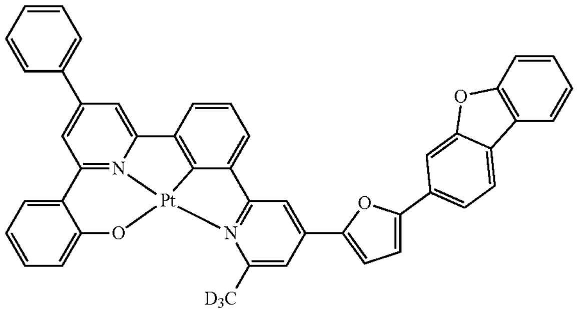
A 111
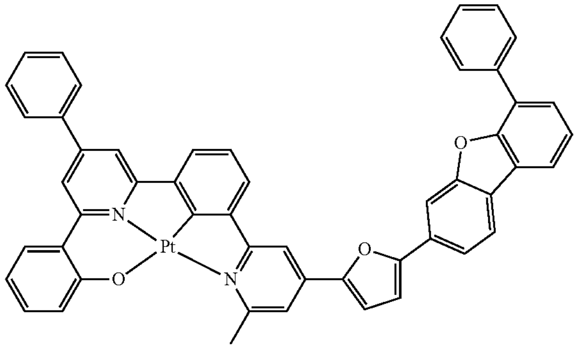
A 112
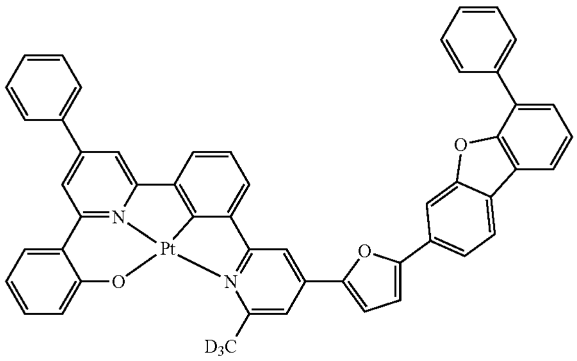

-continued
A 113
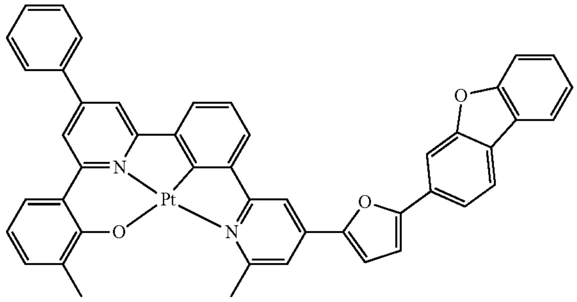
A 114
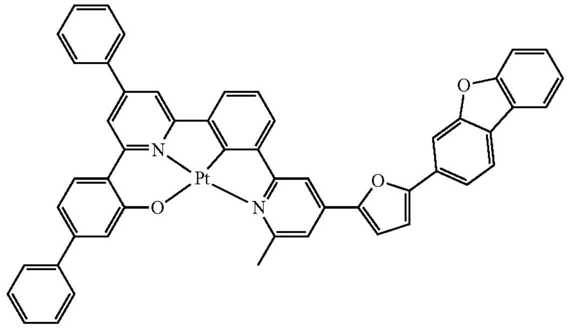
A 115
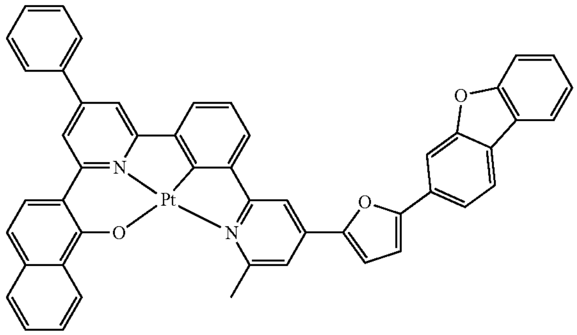
A 116
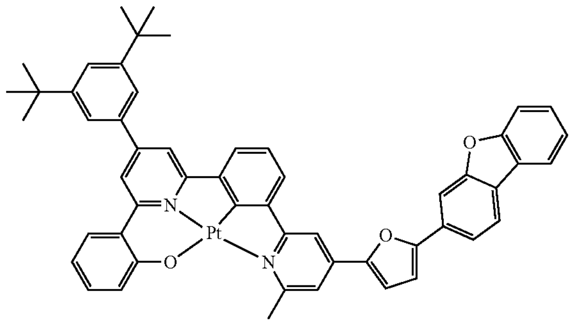
-continued
A 117
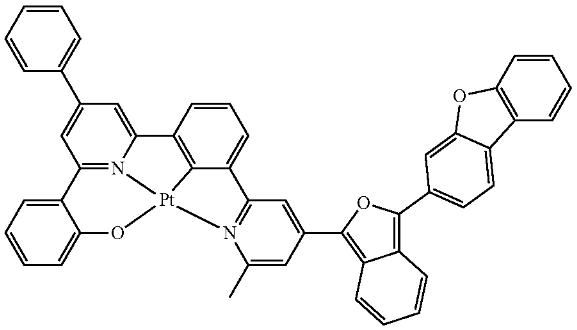
A 118
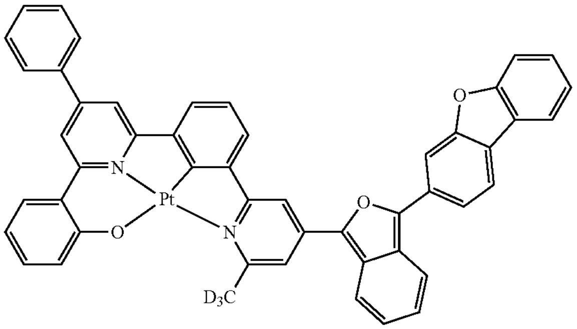
A 119
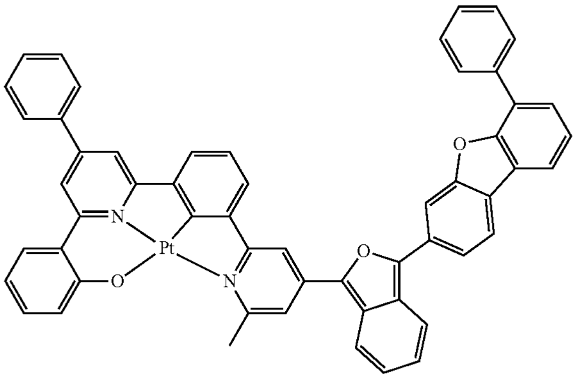
A 120
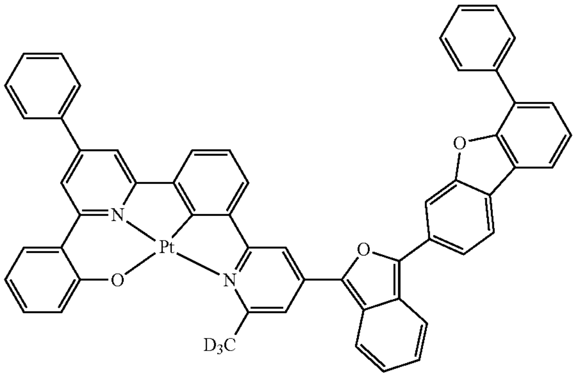

-continued
A 121
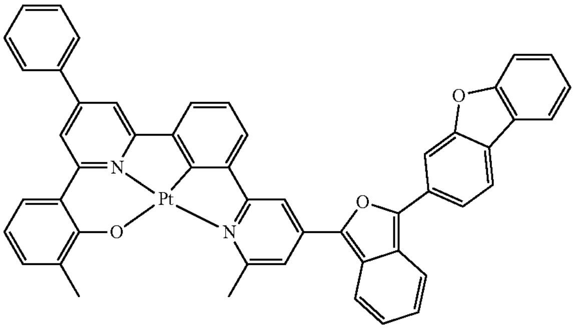
A 122
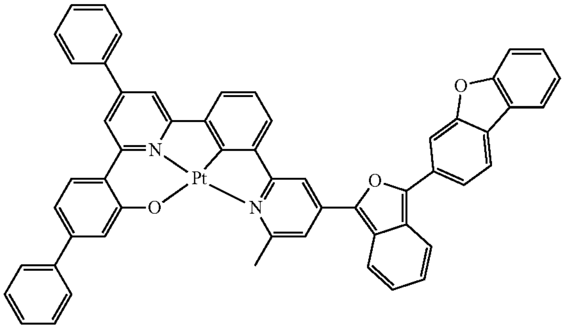
A 123
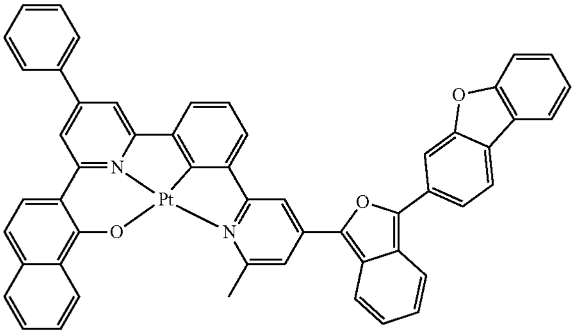
A 124
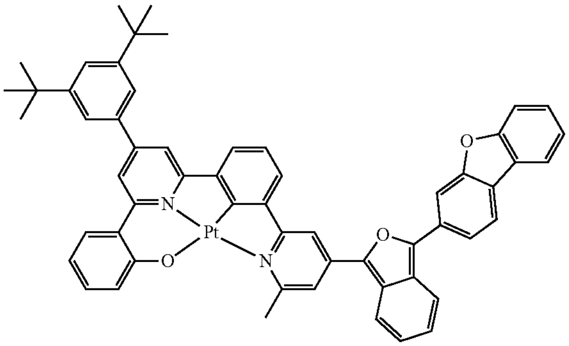
-continued
A 125
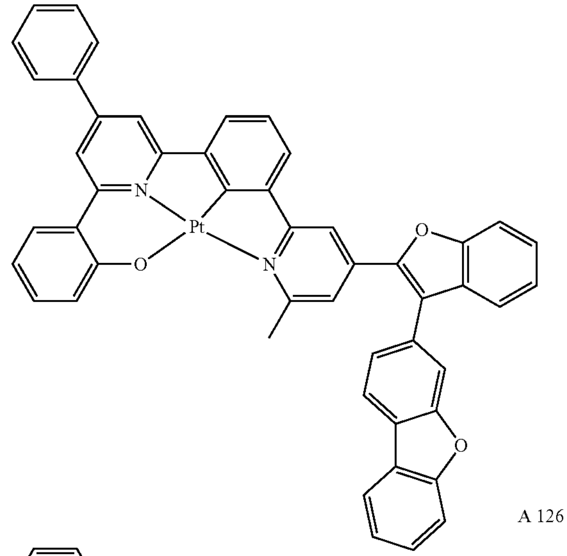
A 126
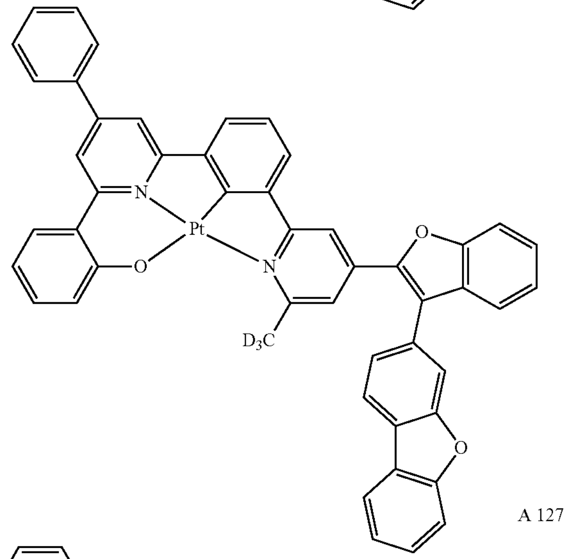
A 127
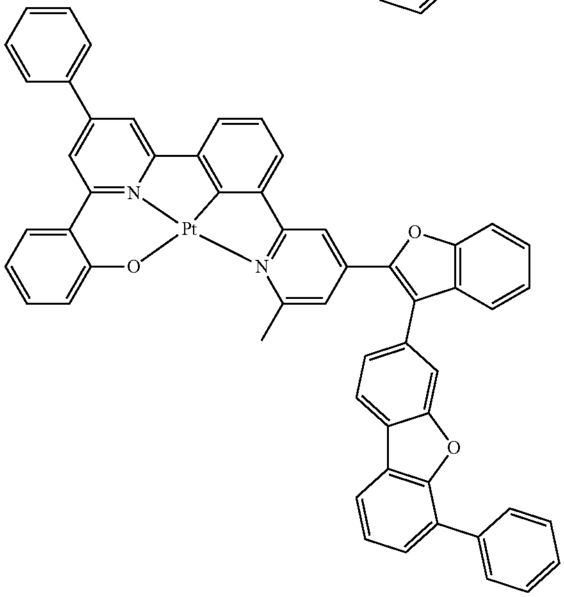

-continued
A 128
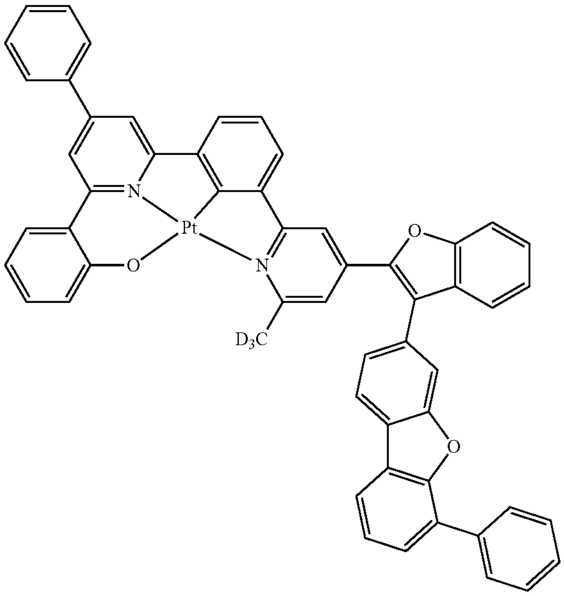
A 129
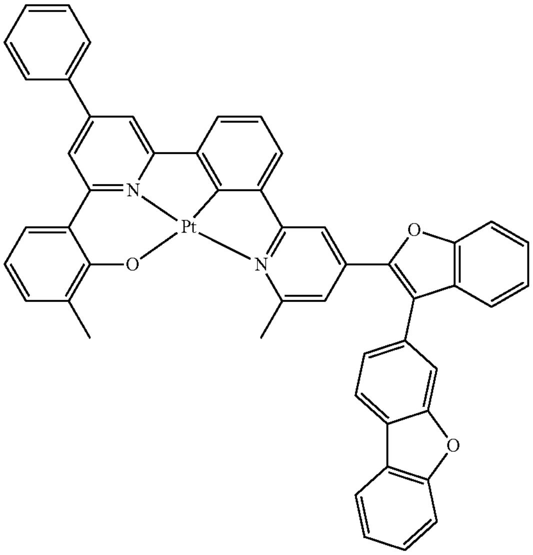
-continued
A 130
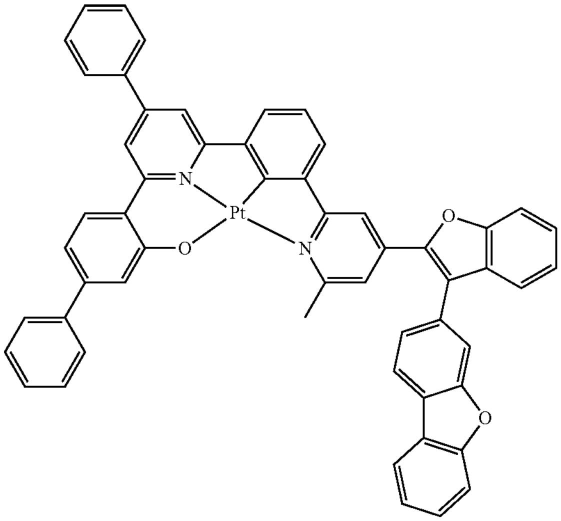
A 131
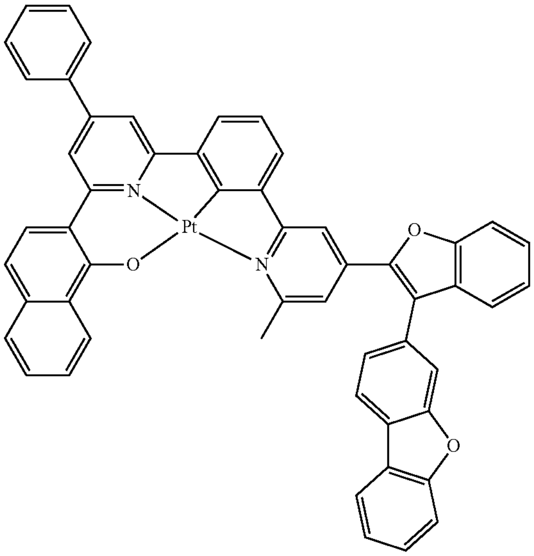

A 132
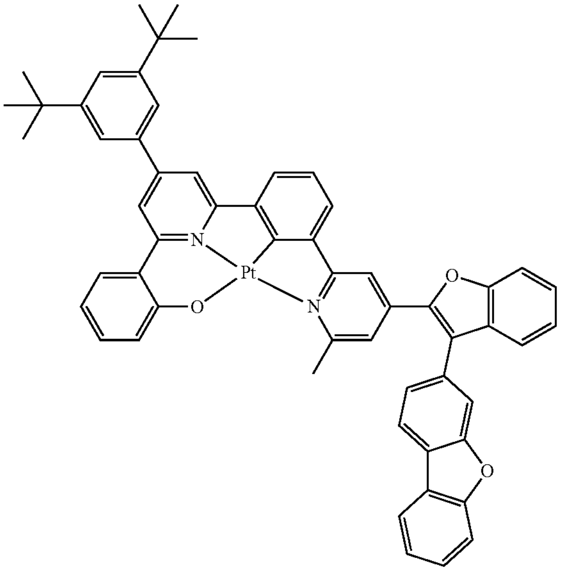
A 133
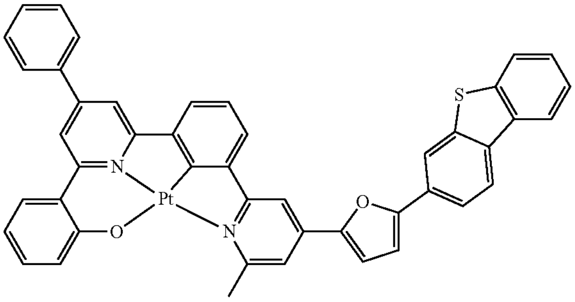
A 134
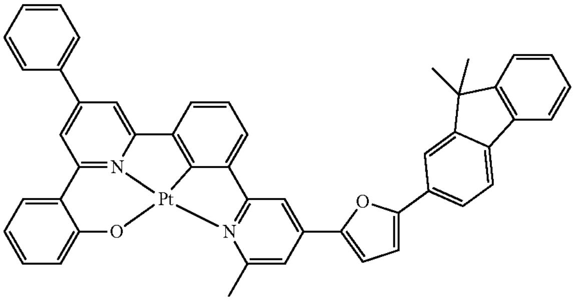
A 135
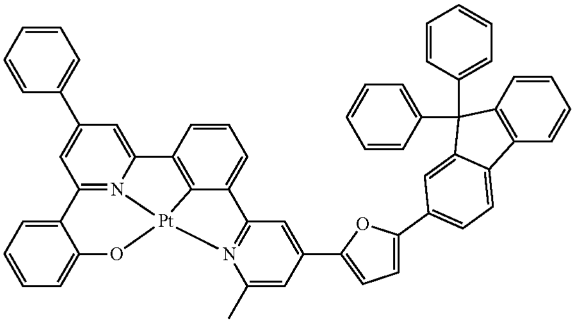
A 136
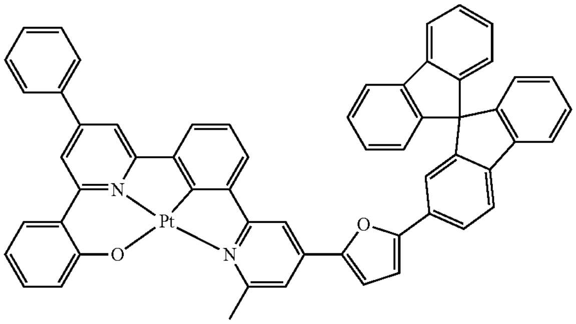
A 137
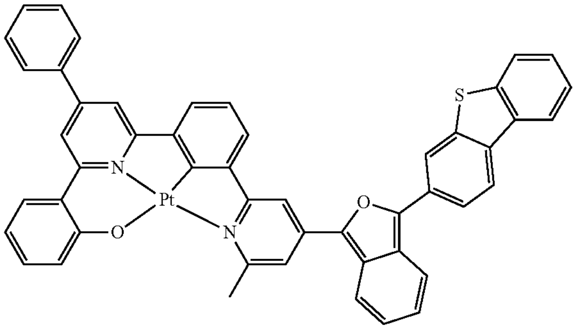
A 138
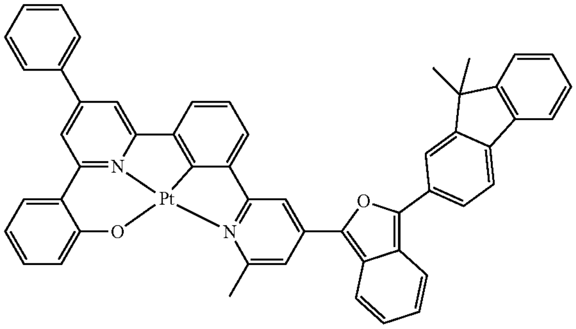
A 139
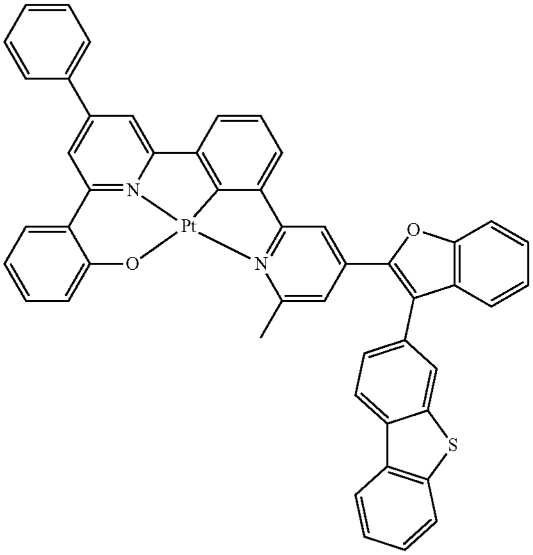

-continued
A 140
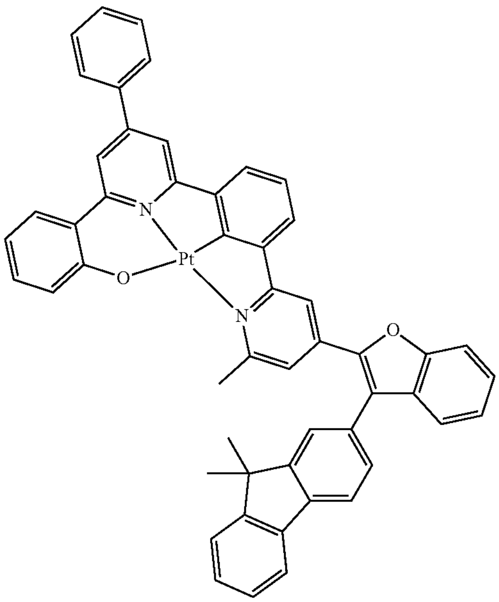
A 141
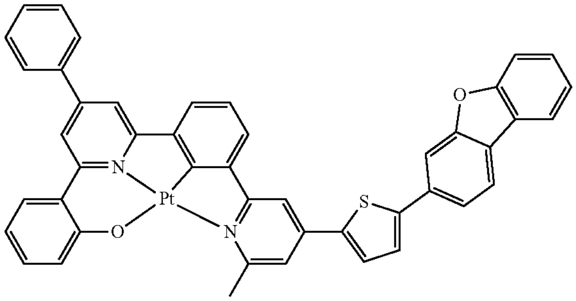
A 142
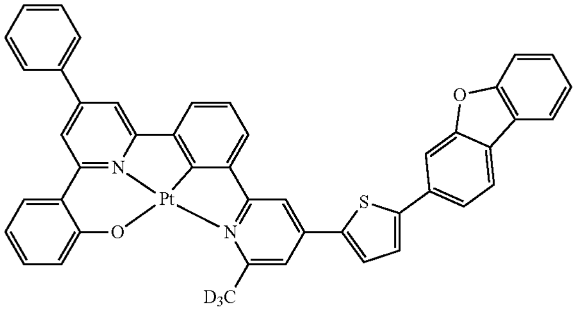
A 143
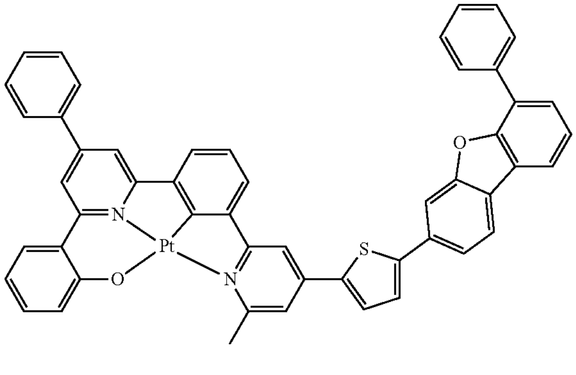
-continued
A 144
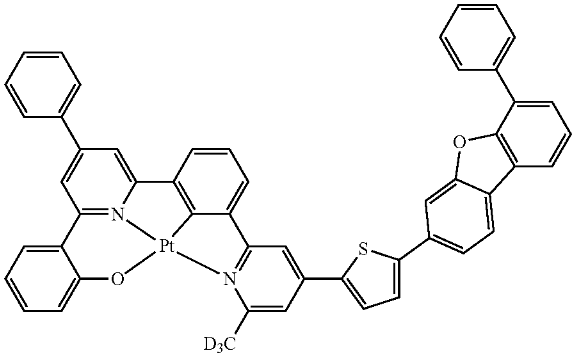
A 145
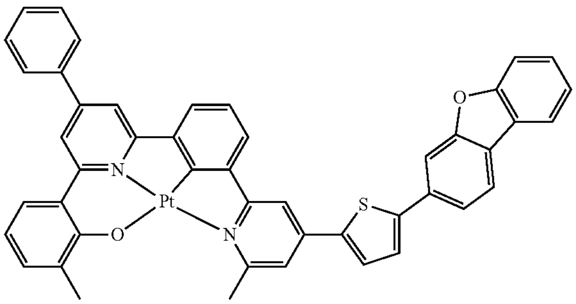
A 146
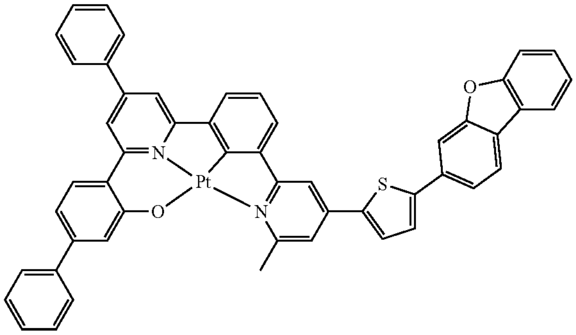
A 147
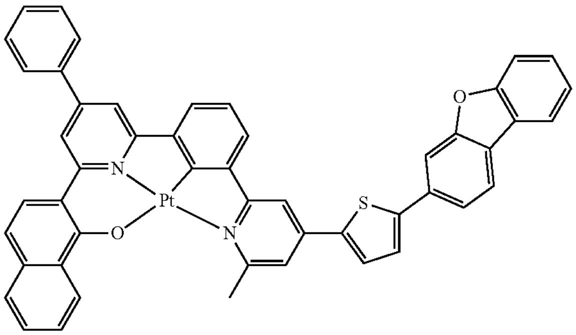

-continued
A 148
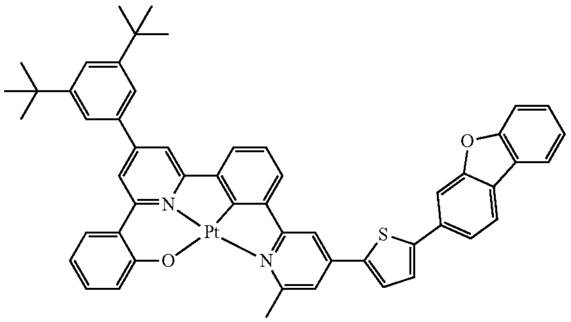
A 149
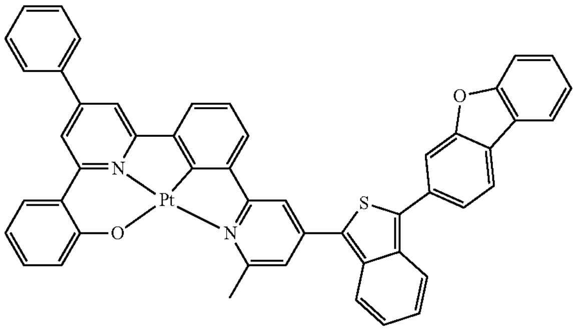
A 150
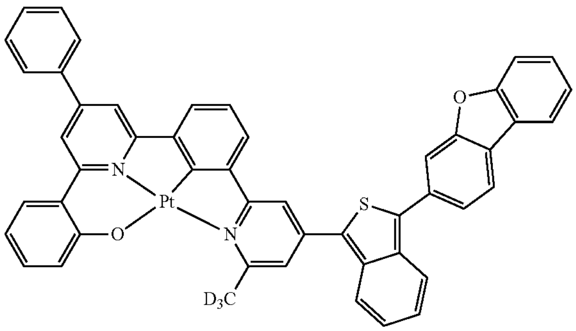
A 151
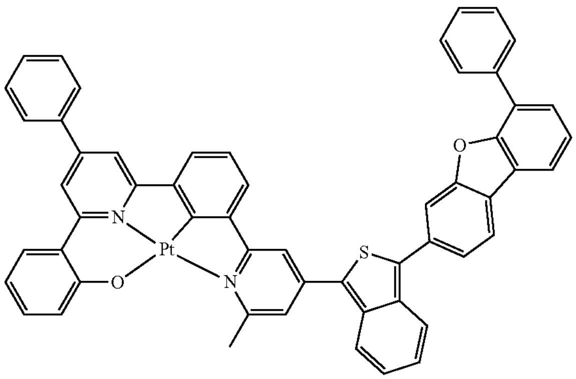
-continued
A 152
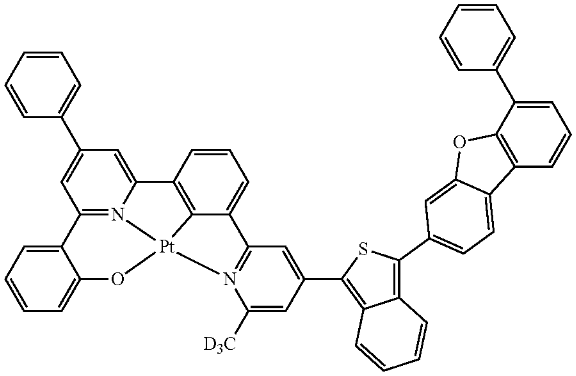
A 153
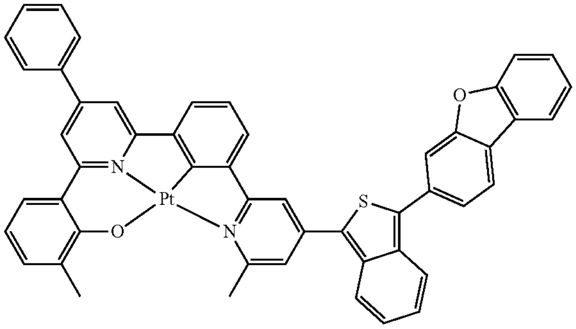
A 154
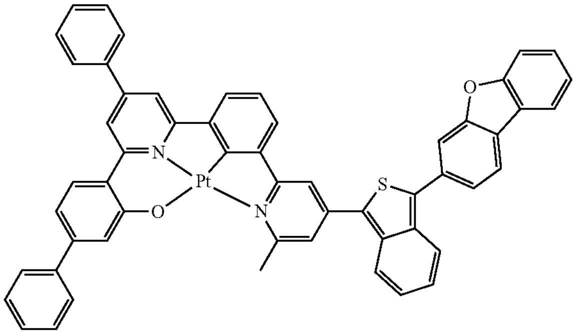
A 155
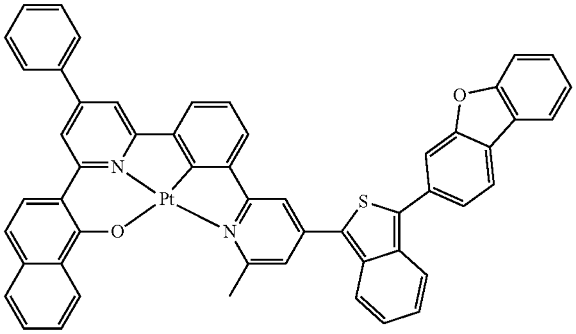

-continued
A 156
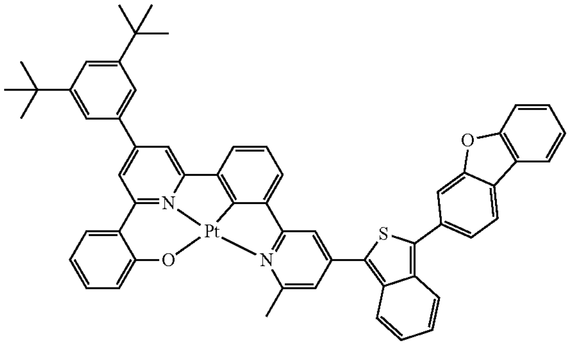
A 157
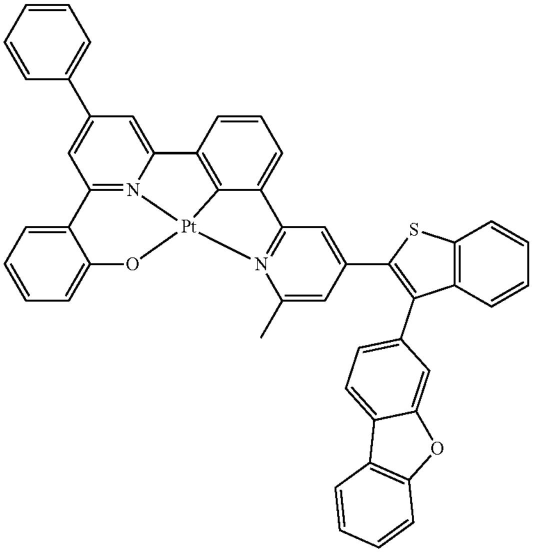
A 158
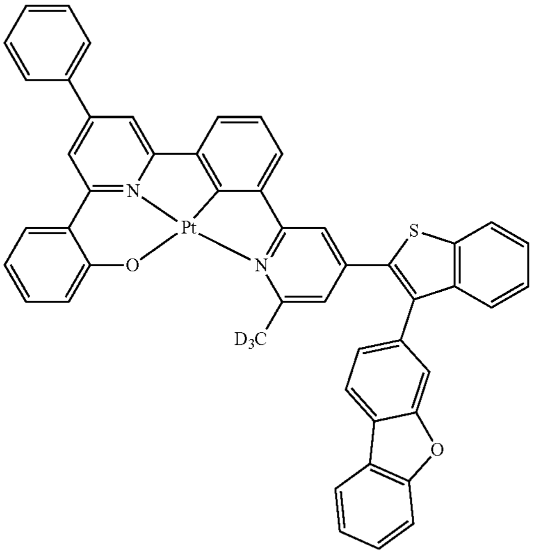
-continued
A 159
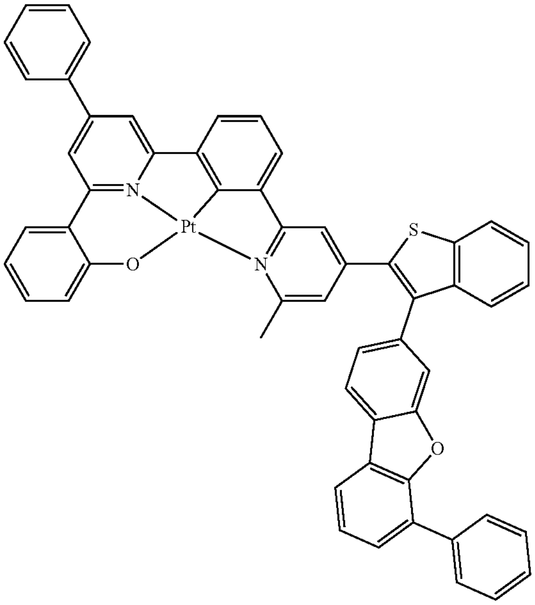
A 160
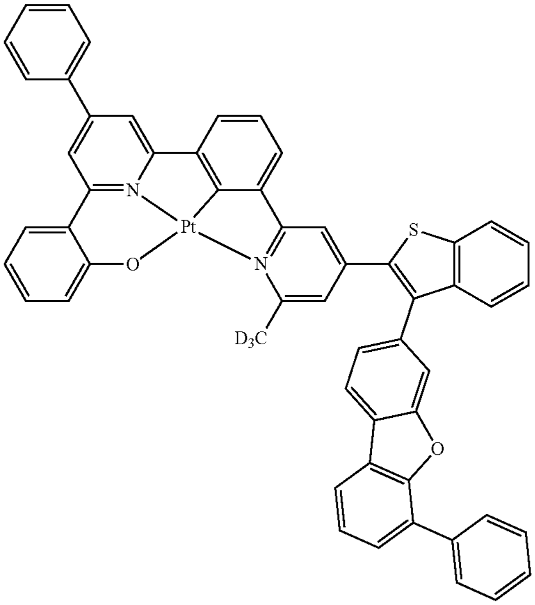

-continued
A 161
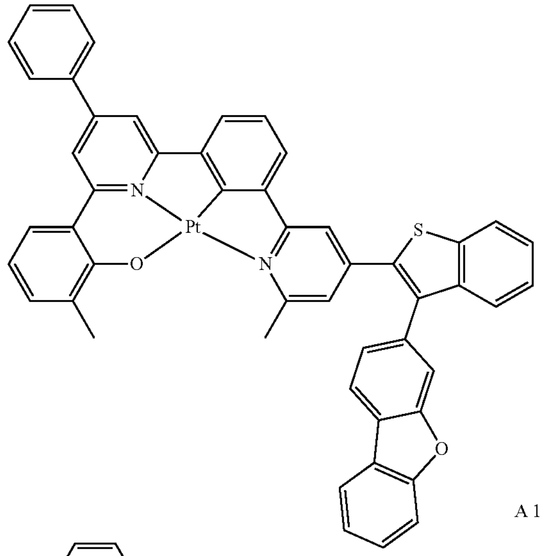
A 162
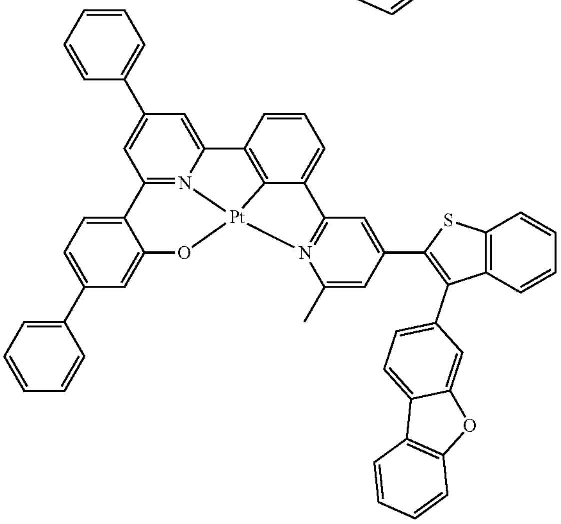
A 163
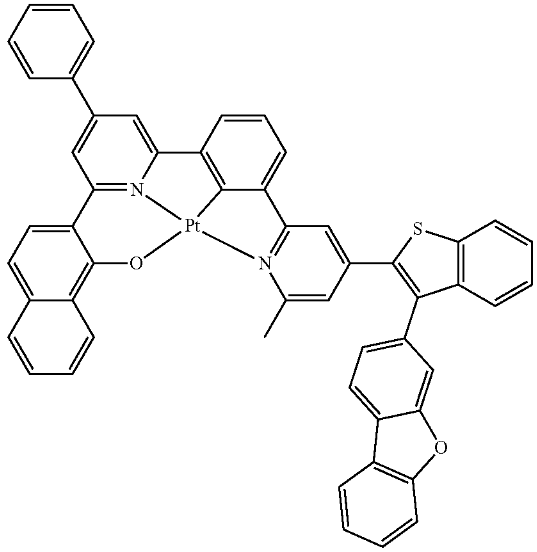
-continued
A 164
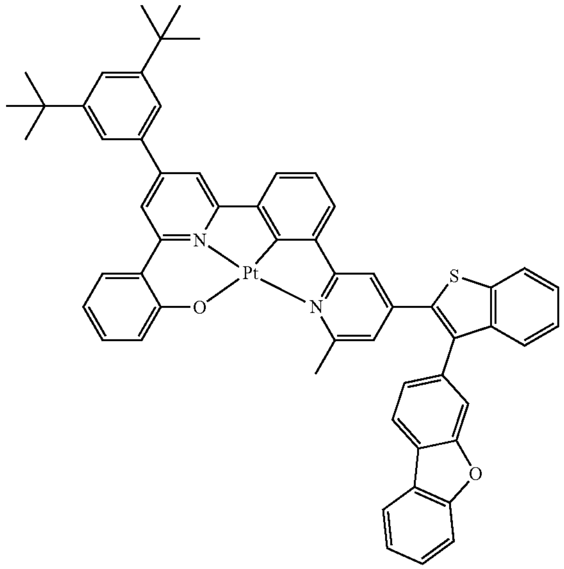
A 165
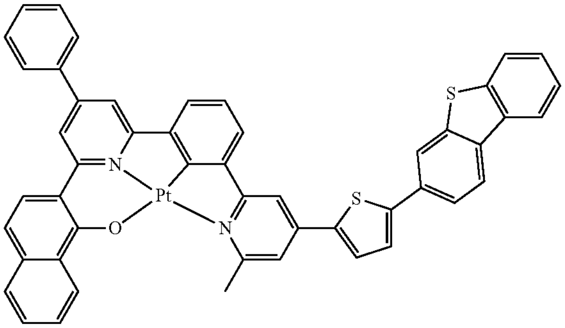
A 166
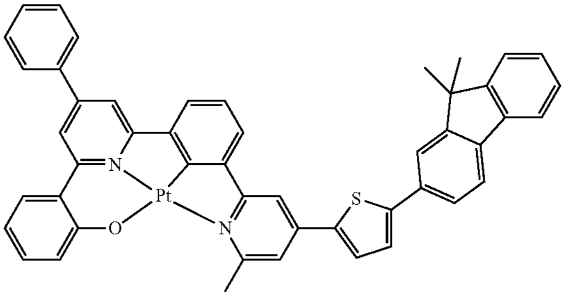
A 167
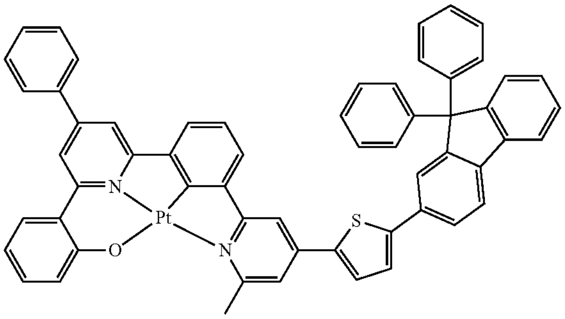

-continued
A 168
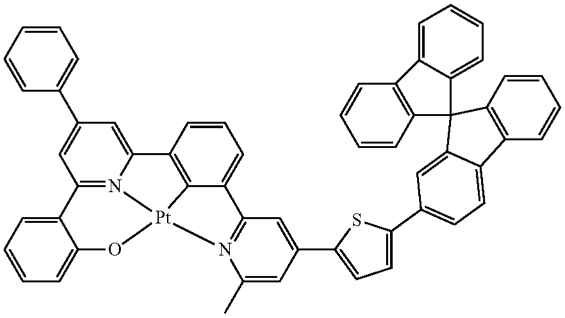
A 169
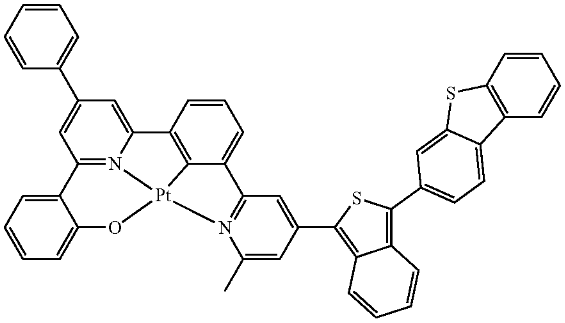
A 170
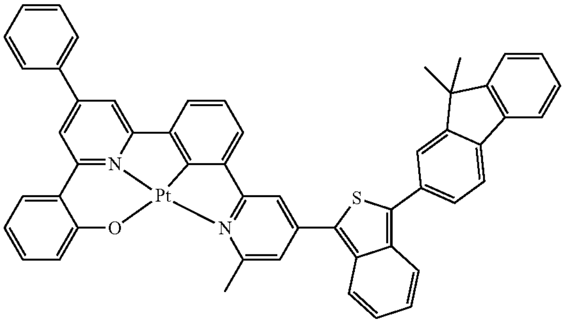
A 171
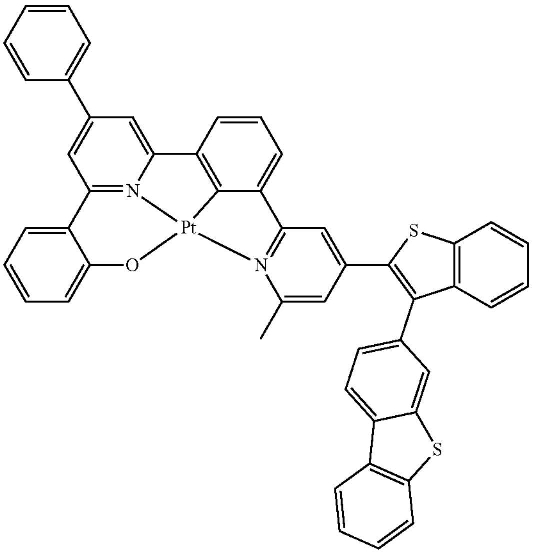
-continued
A 172
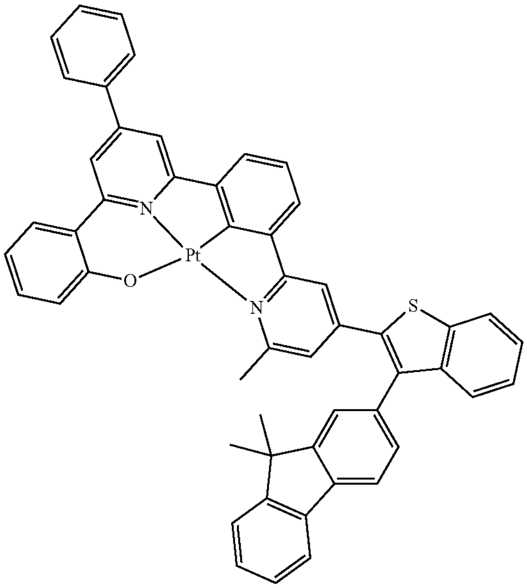
A 173
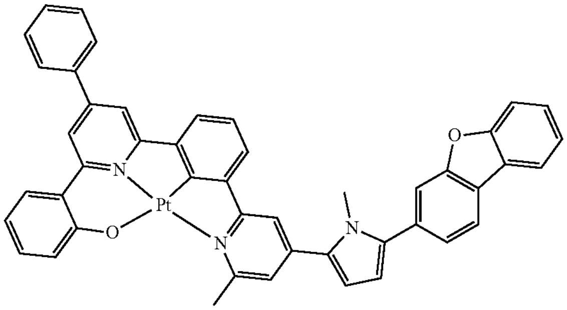
A 174
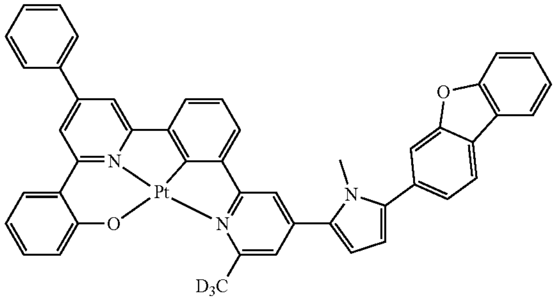
A 175
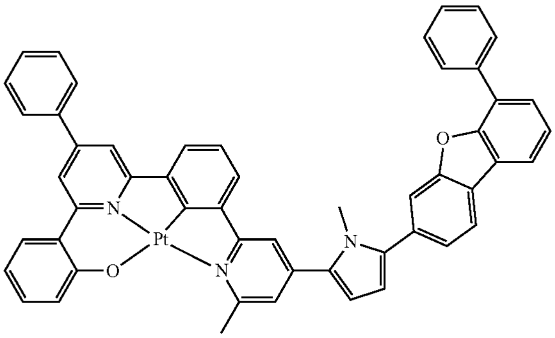

-continued
A 176
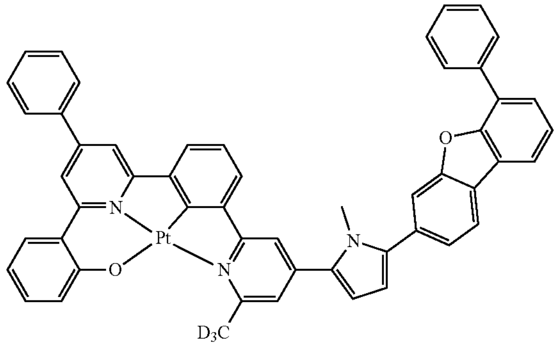
A 177
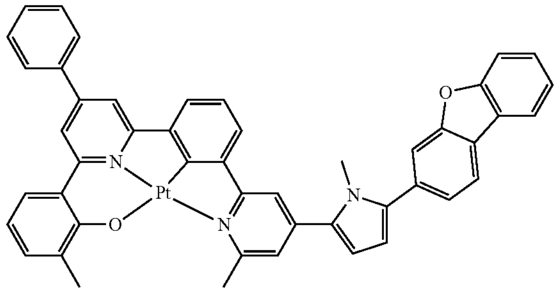
A 178
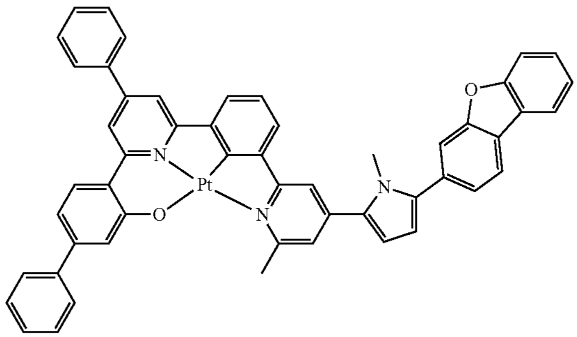
A 179
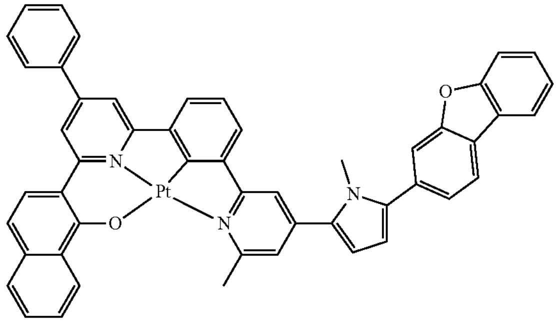
-continued
A 180
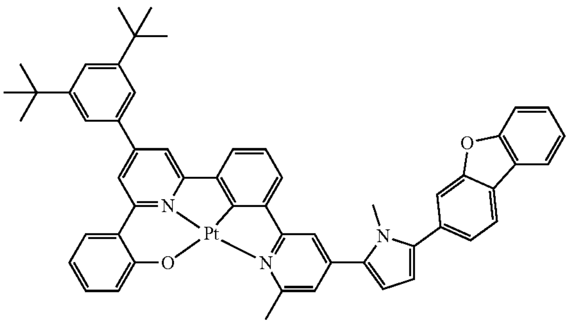
A 181
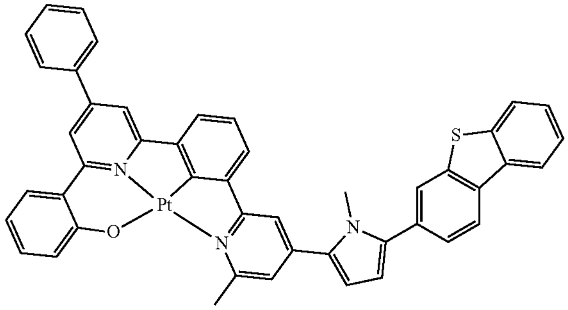
A 182
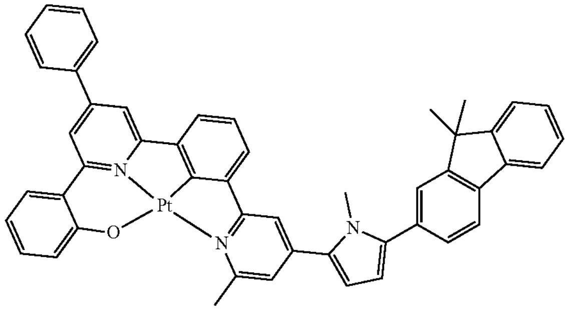
A 183
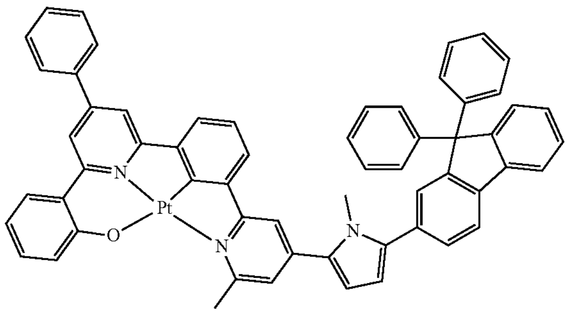

-continued
A 184
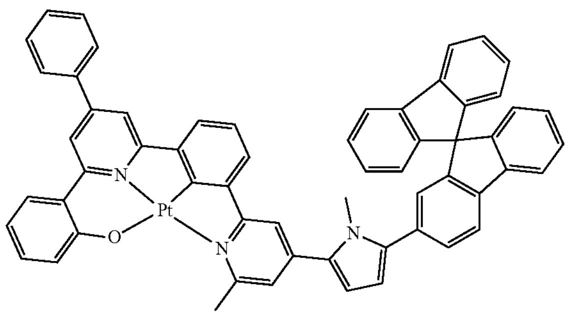
A 185
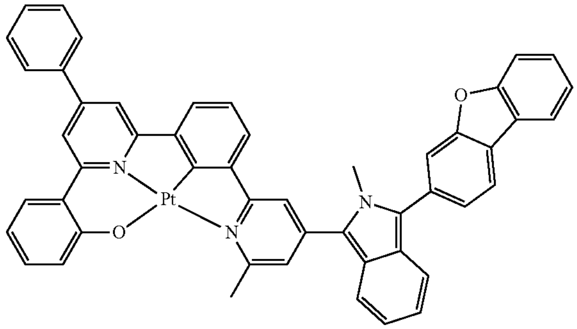
A 186
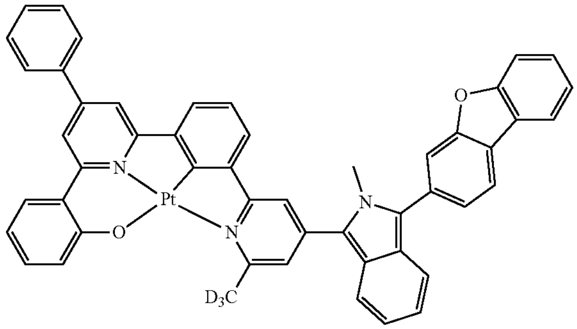
A 187
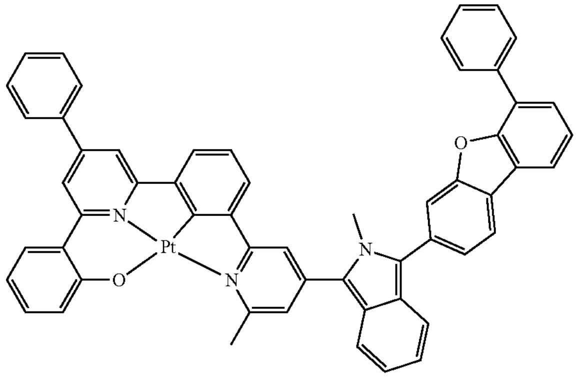
-continued
A 188
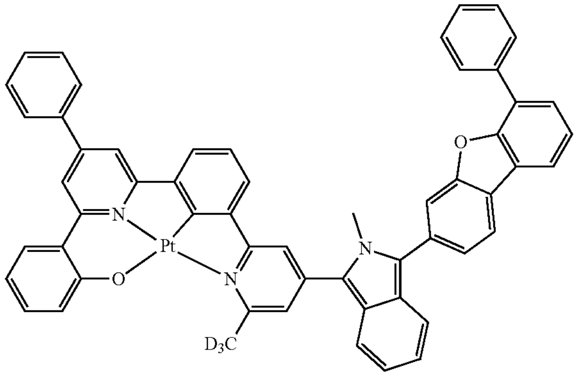
A 189
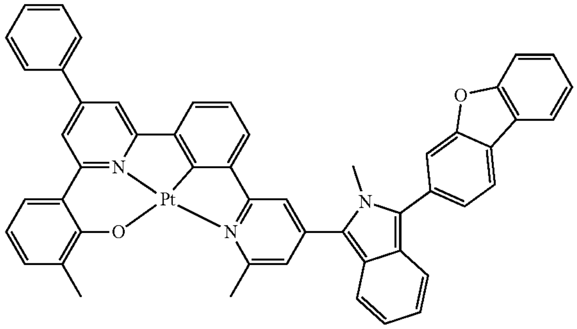
A 190
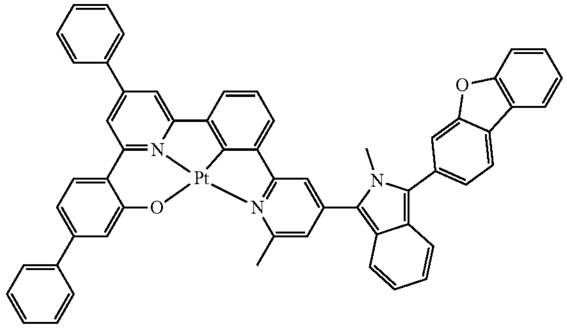
A 191
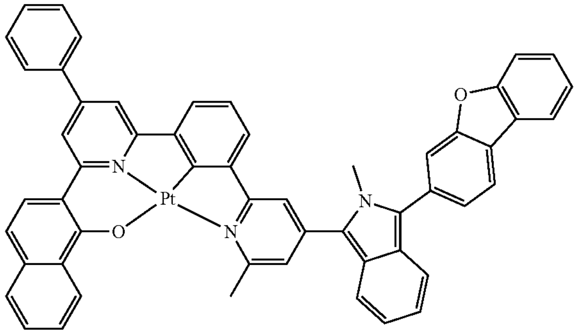

-continued
A 192
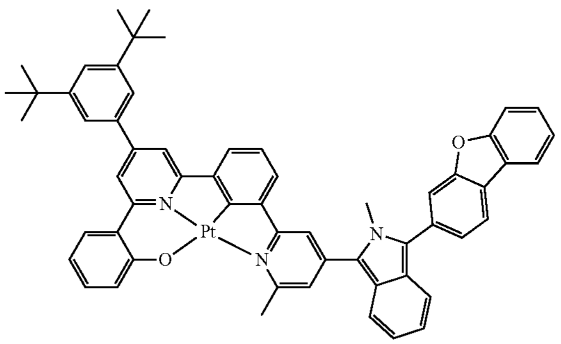
A 193
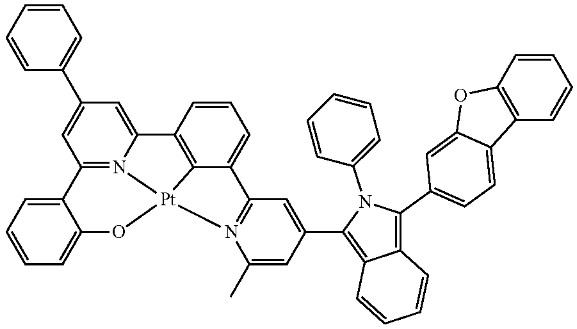
A 194
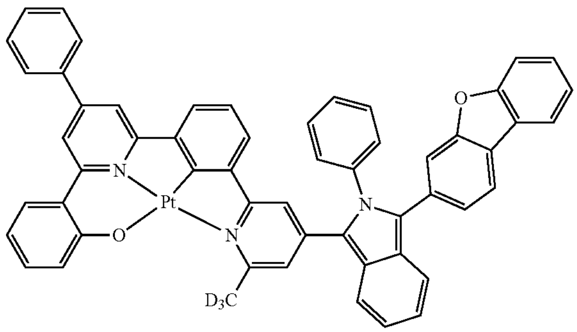
A 195
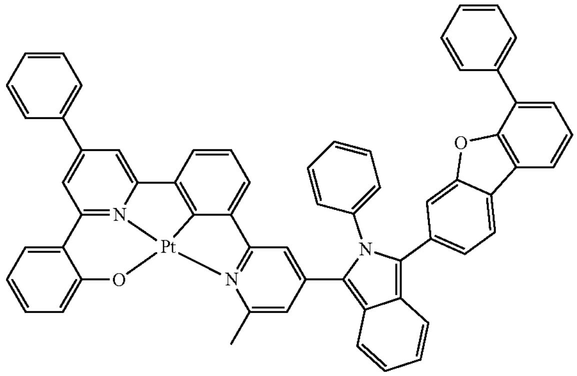
-continued
A 196
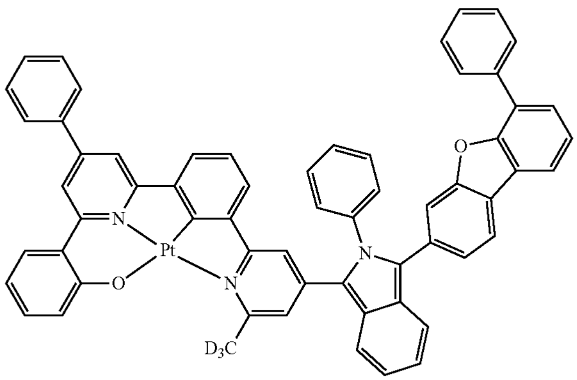
A 197
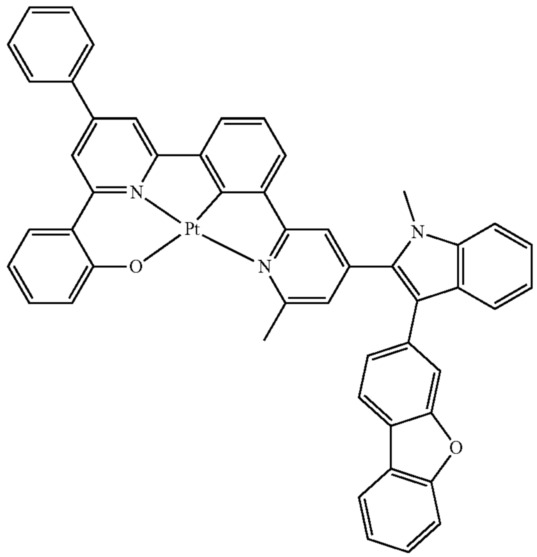
A 198
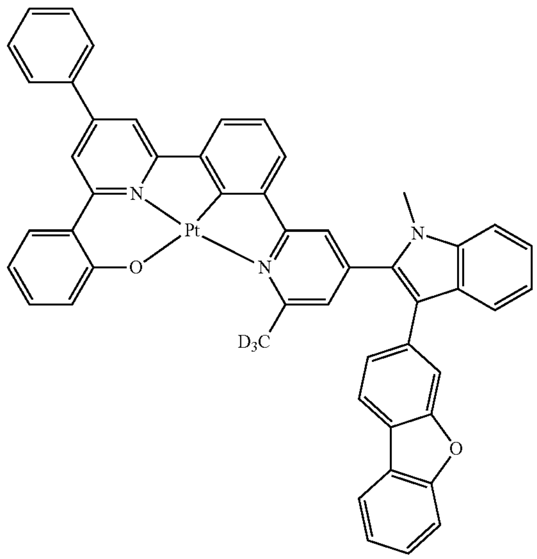

-continued
A 199
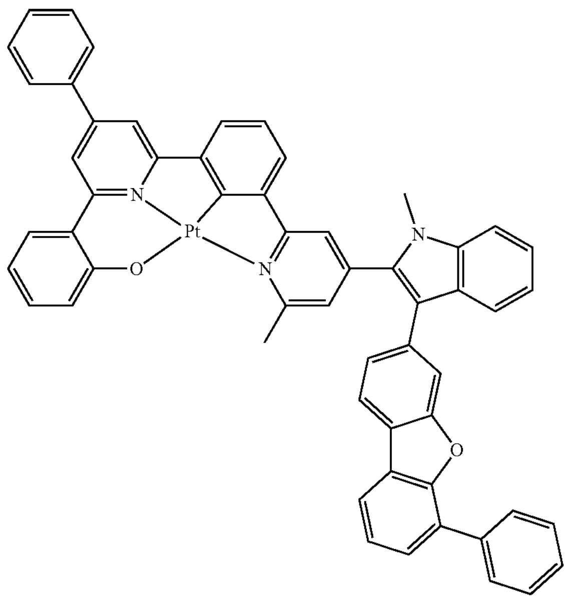
A 200
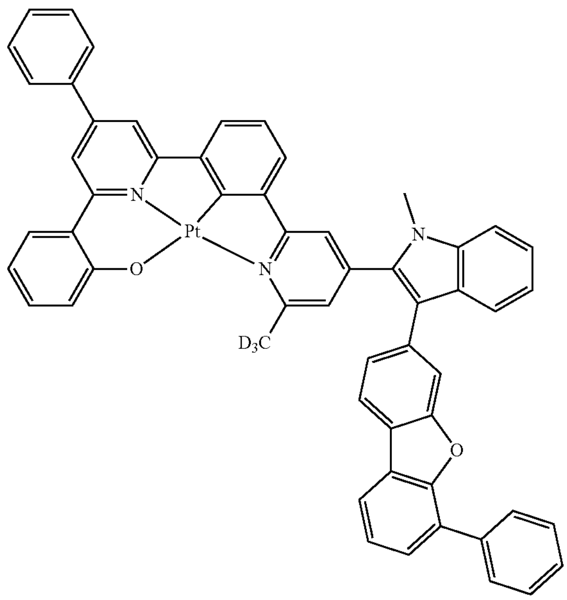
-continued
A 201
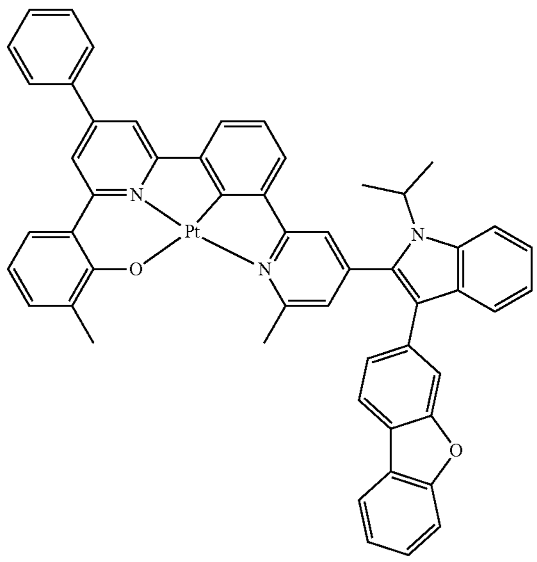
A 202
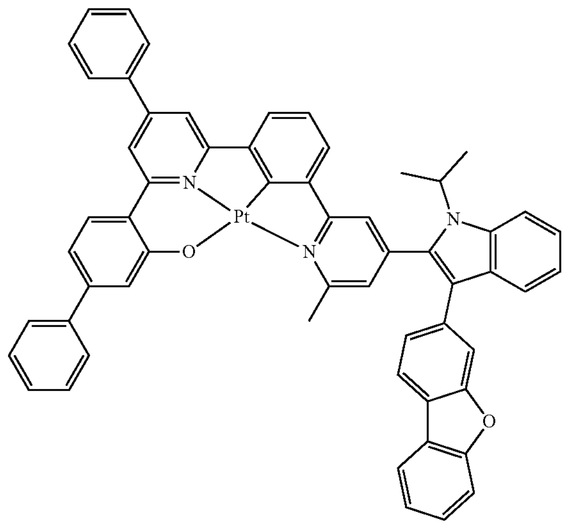

-continued
A 203
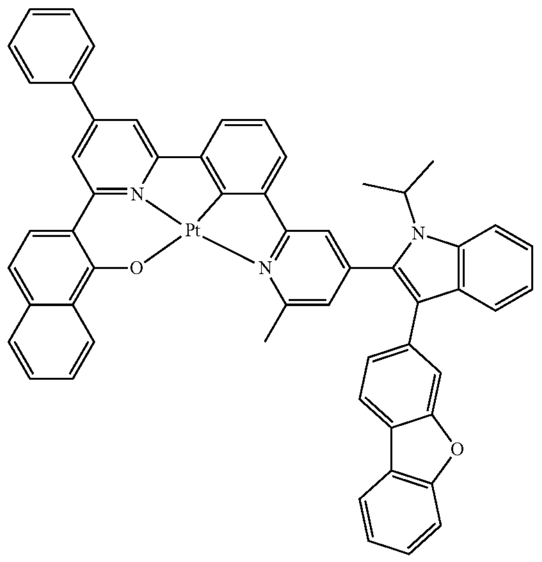
A 204
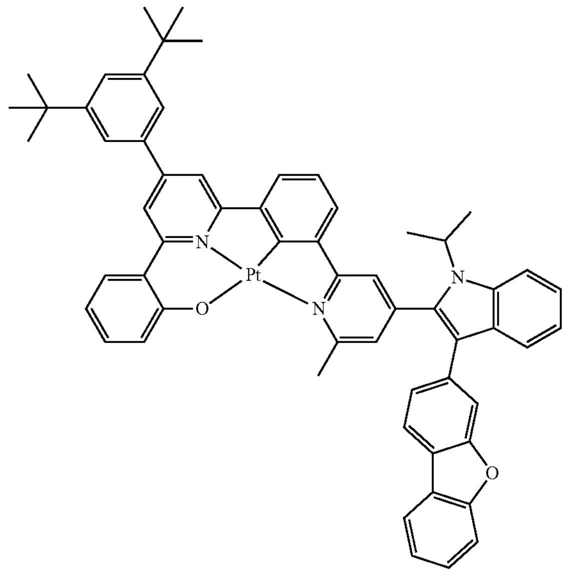
-continued
A 205
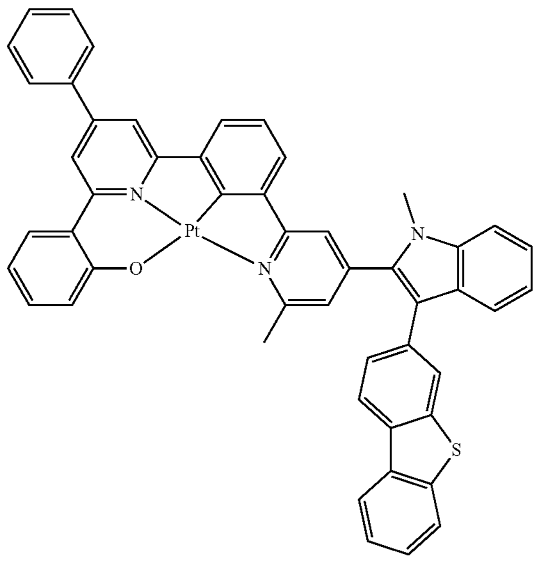
A 206
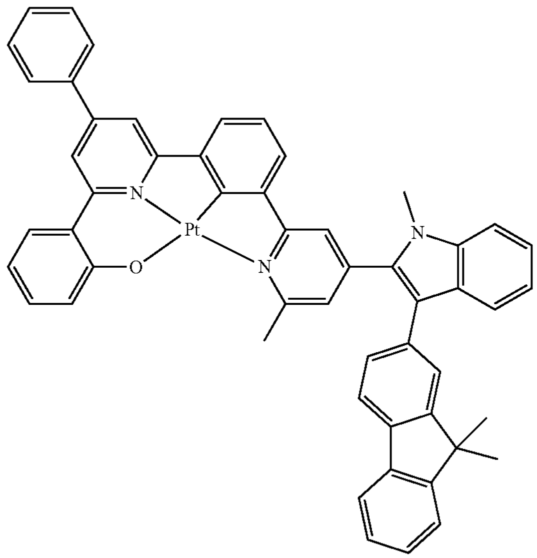

-continued
A 207
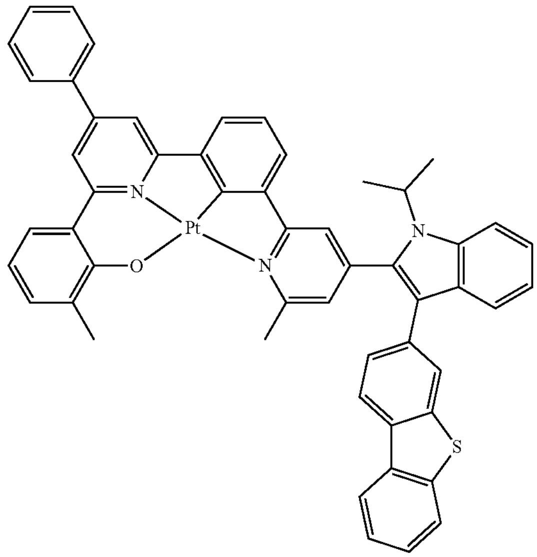
A 208
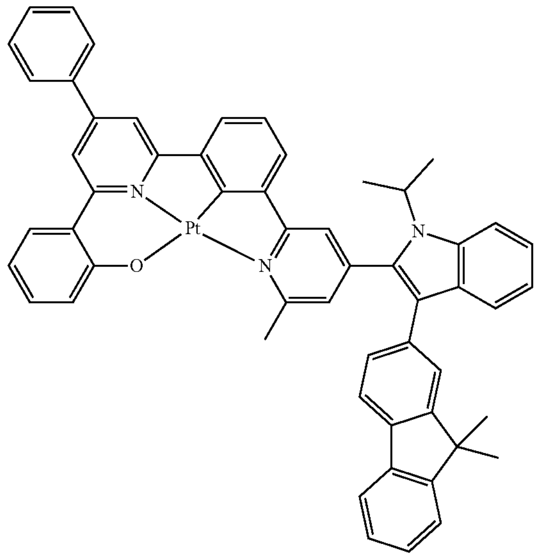
-continued
A 209
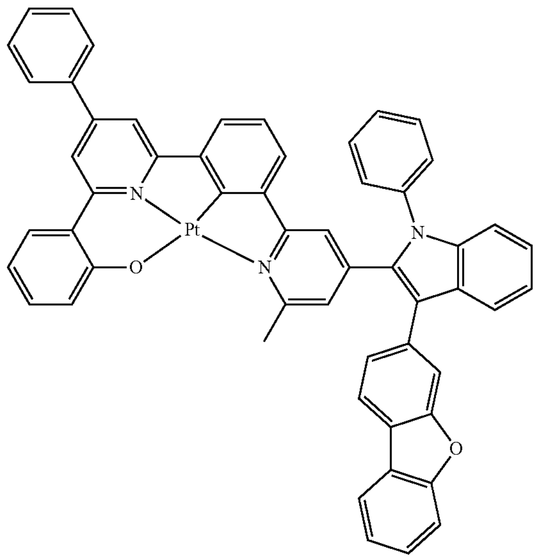
A 210
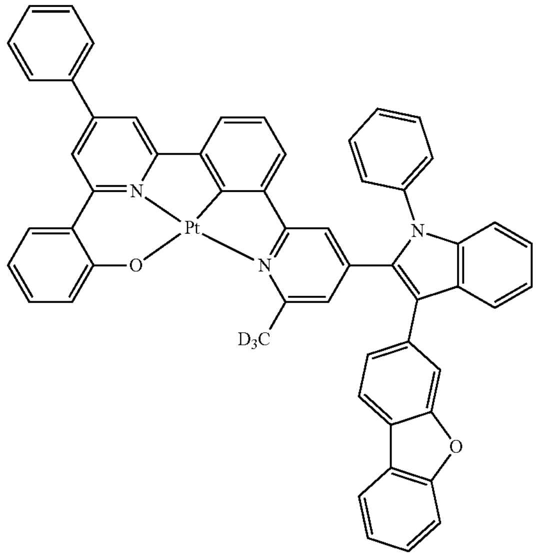

-continued
A 211
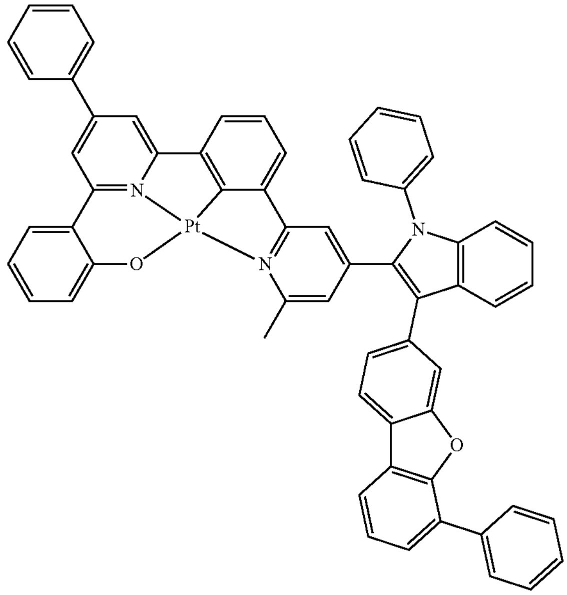
A 212
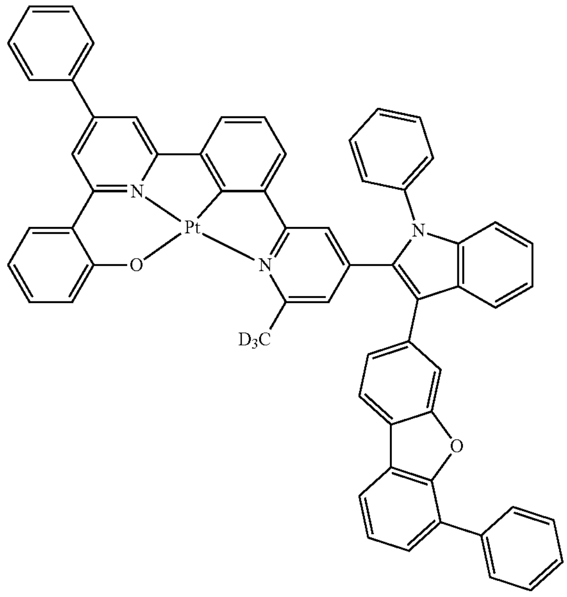
-continued
A 213
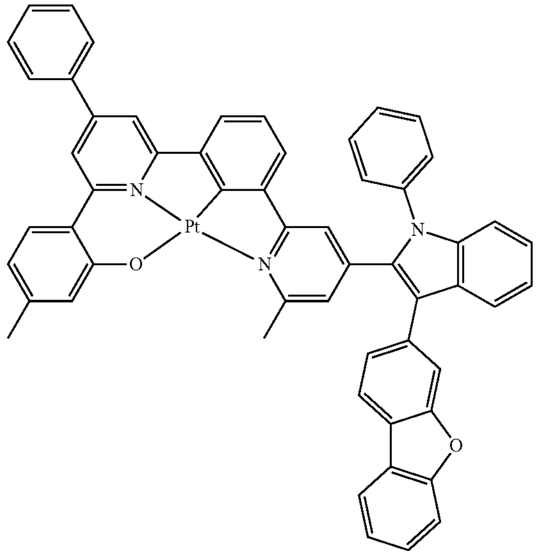
A 214
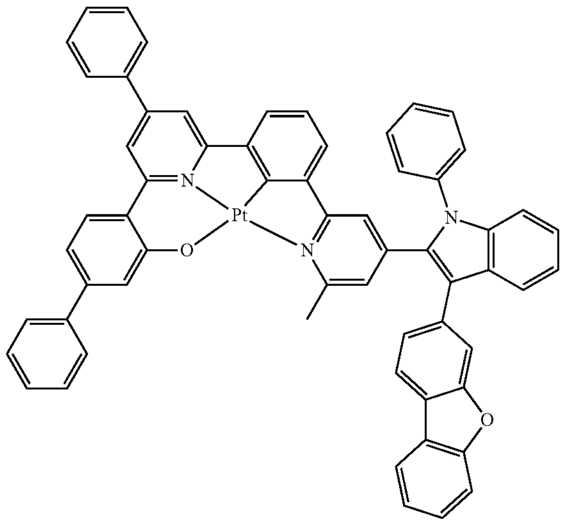

-continued
A 215
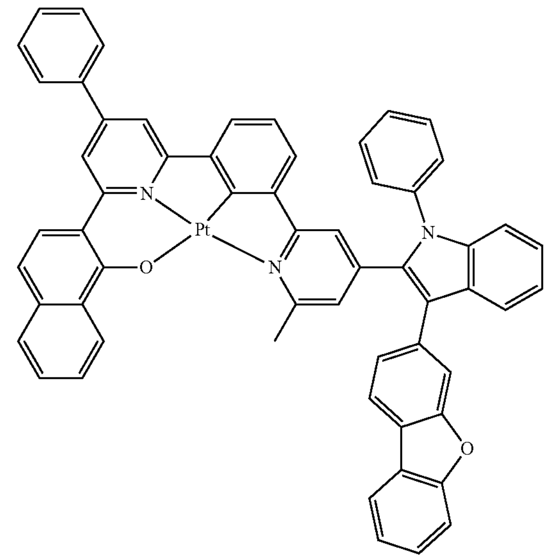
A 216
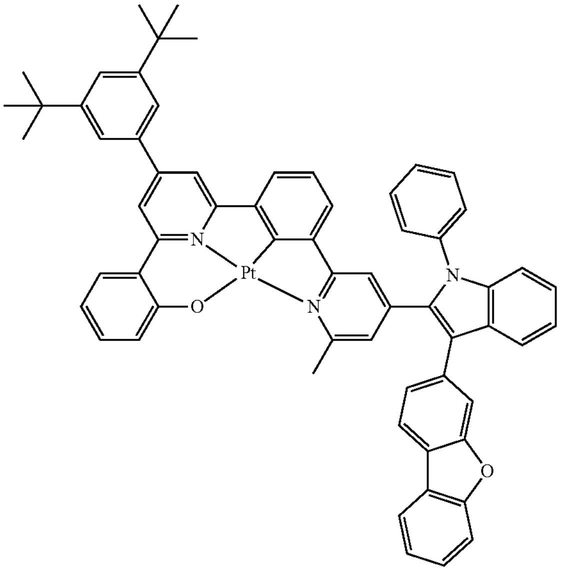
-continued
A 217
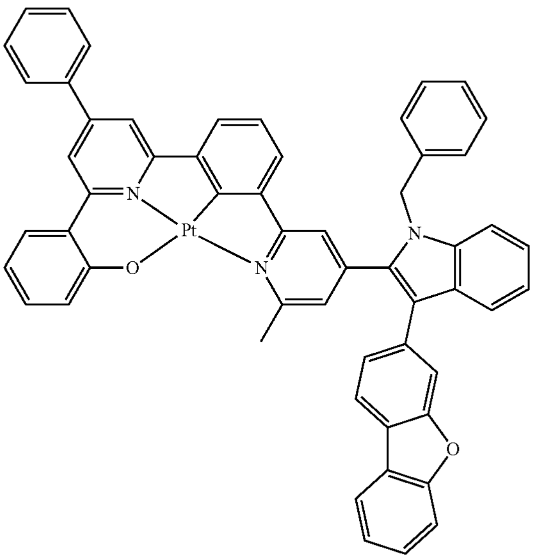
A 218
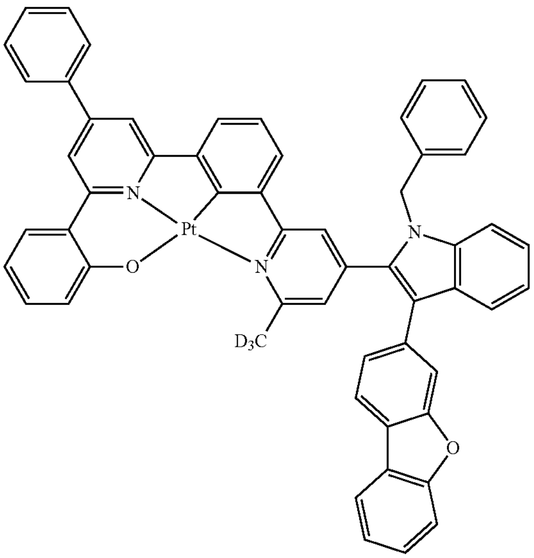

-continued
A 219
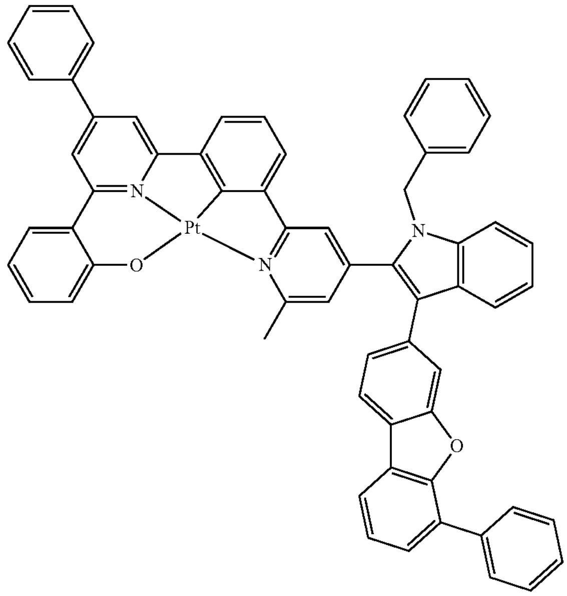
A 220
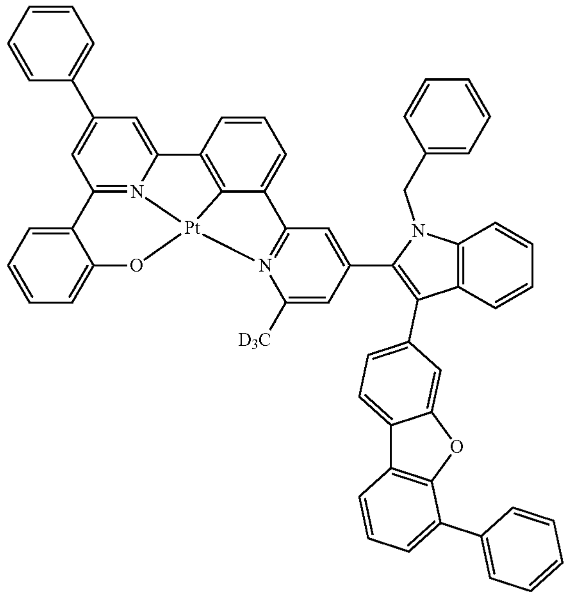
-continued
A 221
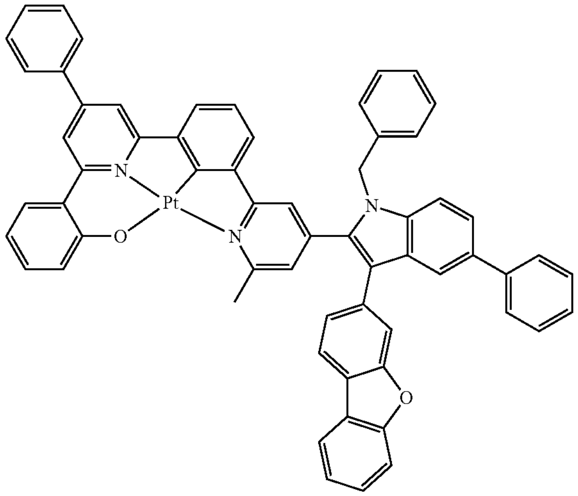
A 222
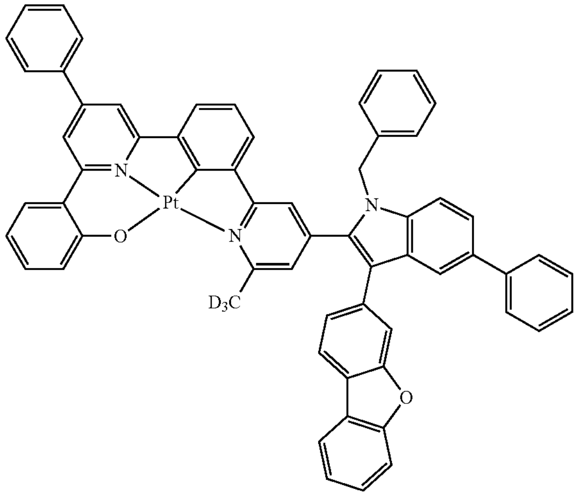
A 223
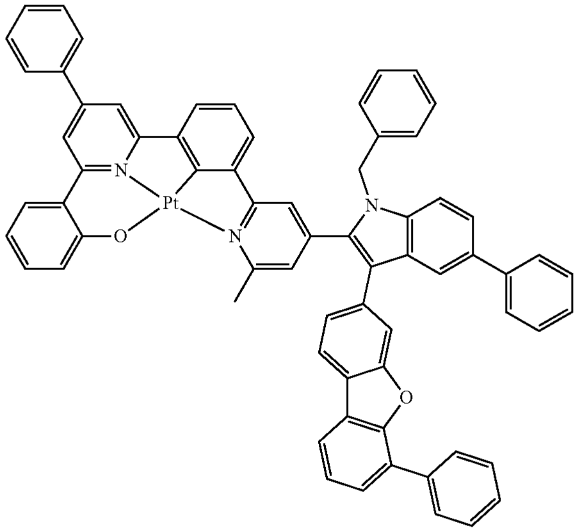

-continued
A 224
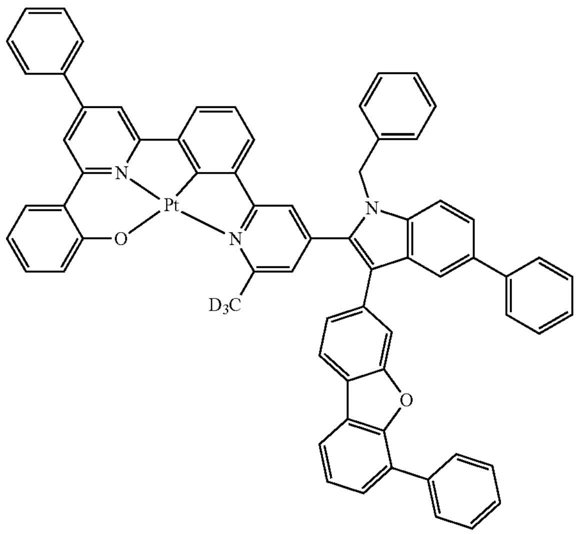
A 225
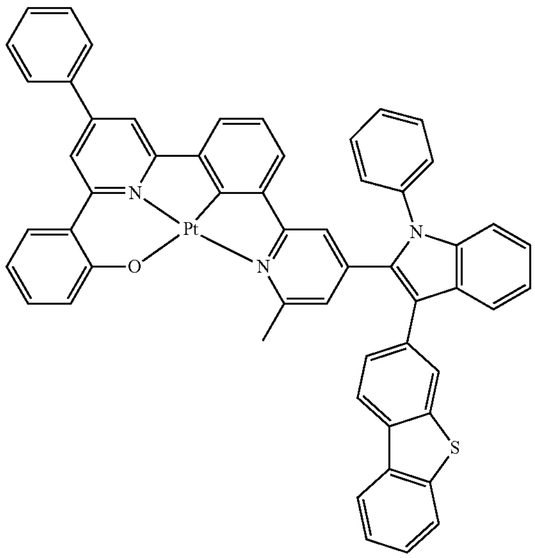
-continued
A 226
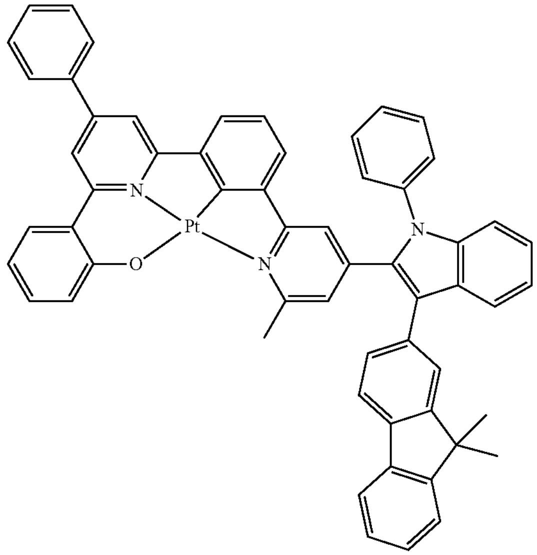
A 227
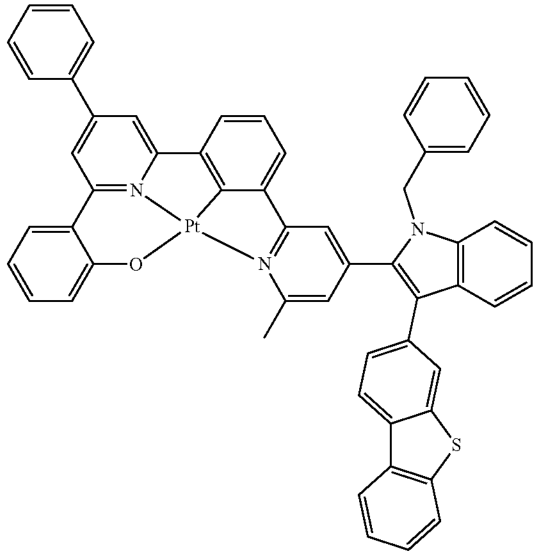

-continued

A 228

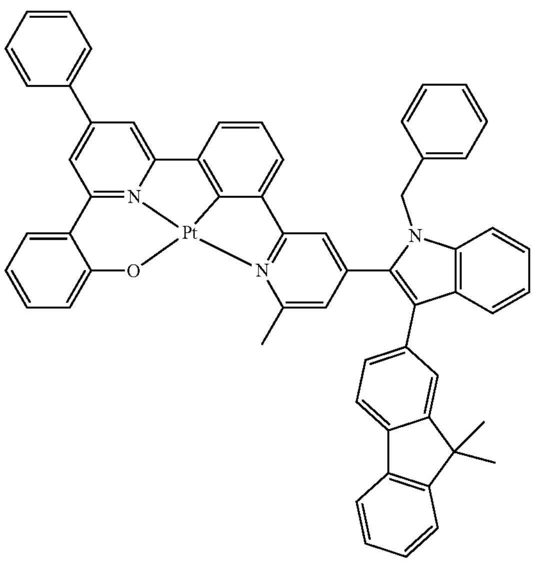

A 229

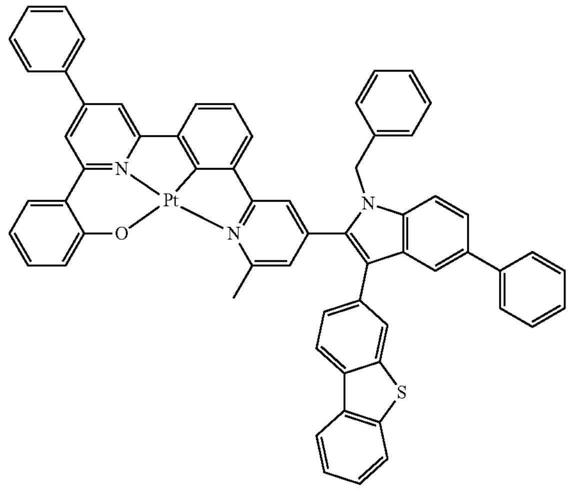

A 230

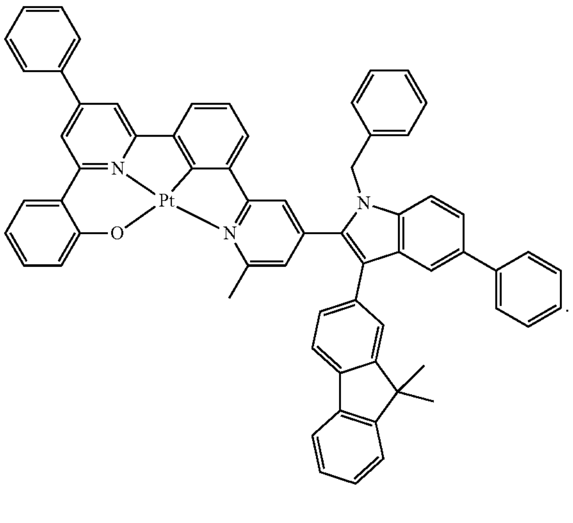

19. An electroluminescent device, comprising a cathode, an anode, and an organic layer arranged between the cathode and the anode, wherein at least one of the organic layer comprises the metal complex according to claim 18.

20. A precursor of the metal complex, having a structure as shown in a formula (5), formula (5)

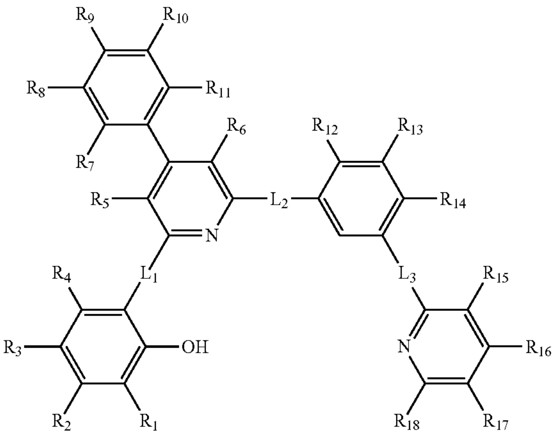

wherein at least one of the $R_1$-$R_{18}$ has a structure shown in the formula (2), formula (2)

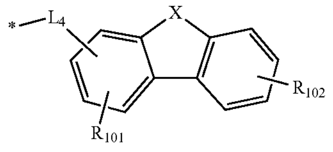

wherein

* represents a position of a linkage to the formula (5);

X independently represents O, S, Se, and CRaRb;

$L_1$-$L_3$ are each independently selected from a direct bonding single bond, O, S, Se, NRc, CRdRe, SO, $SO_2$, and PO (Rf) ($R_g$);

$L_4$ is a single bond, O, substituted or unsubstituted $C_1$-$C_{20}$ alkylene, substituted or unsubstituted $C_3$-$C_{30}$ cycloalkylene, substituted or unsubstituted $C_1$-$C_{20}$ heteroalkylene, substituted or unsubstituted $C_7$-$C_{30}$ aralkylene, substituted or unsubstituted $C_2$-$C_{20}$ alkenylene, substituted or unsubstituted $C_3$-$C_{30}$ alkylidenesilyl, substituted or unsubstituted $C_6$-$C_{30}$ arylene, substituted or unsubstituted $C_3$-$C_{30}$ heteroarylene, substituted or unsubstituted $C_3$-$C_{30}$ arylenesilyl, or substituted or unsubstituted $C_0$-$C_{20}$ imino; and the remaining $R_1$-$R_{18}$, $R_{101}$-$R_{102}$, and $R_a$-$R_g$ are independently selected from hydrogen, deuterium, halogen, substituted or unsubstituted $C_1$-$C_{20}$ alkyl, substituted or unsubstituted $C_3$-$C_{30}$ cycloalkyl, substituted or unsubstituted $C_1$-$C_{20}$ heteroalkyl, substituted or unsubstituted $C_7$-$C_{30}$ aralkyl, substituted or unsubstituted $C_1$-$C_{20}$ alkoxy, substituted or unsubstituted $C_6$-$C_{30}$ aryloxy, substituted or unsubstituted $C_2$-$C_{20}$ alkenyl, substituted or unsubstituted $C_3$-$C_{30}$ alkylsilyl, substituted or unsubstituted $C_6$-$C_{30}$ aryl, substituted or unsubstituted $C_3$-$C_{30}$ heteroaryl, substituted or unsubstituted $C_3$-$C_{30}$ arylsilyl, substituted or unsubstituted $C_0$-$C_{20}$ amine, cyano, nitrile, isonitrile, or phosphino; or a ring structure formed by linking any two adjacent groups with each other; and the "substituted" refers to substitution with deuterium, halogen, $C_1$-$C_4$ alkyl, or cyano; and the substitution number of $R_{101}$ and $R_{102}$ independently represents a range from a non-substitution number to a maximum substitution number.

* * * * *